US008410356B2

(12) United States Patent
Kawasaki et al.

(10) Patent No.: US 8,410,356 B2
(45) Date of Patent: Apr. 2, 2013

(54) PHOTOELECTRIC CONVERSION ELEMENT AND SOLAR CELL

(75) Inventors: Hidekazu Kawasaki, Tokyo (JP); Akihiko Itami, Tokyo (JP); Kazuya Isobe, Tokyo (JP); Hideya Miwa, Tokyo (JP); Kazukuni Nishimura, Tokyo (JP); Mayuko Ushiro, Tokyo (JP)

(73) Assignee: Konica Minolta Business Technologies, Inc., Tokyo (JP)

( * ) Notice: Subject to any disclaimer, the term of this patent is extended or adjusted under 35 U.S.C. 154(b) by 413 days.

(21) Appl. No.: 12/759,474

(22) Filed: Apr. 13, 2010

(65) Prior Publication Data

US 2010/0263726 A1 Oct. 21, 2010

(30) Foreign Application Priority Data

Apr. 17, 2009 (JP) ................................ 2009-100784

(51) Int. Cl.
*H01L 31/00* (2006.01)
(52) U.S. Cl. ...................................................... 136/261
(58) Field of Classification Search .................. 136/261
See application file for complete search history.

(56) References Cited

U.S. PATENT DOCUMENTS

2004/0256002 A1 12/2004 Horiuchi et al.

FOREIGN PATENT DOCUMENTS

| | | |
|---|---|---|
| EP | 1798804 | 6/2007 |
| JP | 2005123033 | 5/2005 |
| JP | 2008-277206 | 11/2008 |
| WO | 2004/083170 | 9/2004 |

OTHER PUBLICATIONS

European Search Report EP 10 15 9699 (6 pages).
L. Bahadur, et al "Spectral sensitization of a sprayed ZnO thin film electrode by a new synthetic dye (2-imidazolin-5-one) in acetonitrile medium", Semiconductor Science and Technology, vol. 10, No. 3, Mar. 1, 1995, pp. 358-364, XP55019923, ISSN: 0268-1242, DOI: 10.1088/0268-1242/10/3/021.
Brian O'Regan & Michael Gratzel, Nature, vol. 353, 737 (1991).

*Primary Examiner* — Nathan M Nutter
(74) *Attorney, Agent, or Firm* — Lucas & Mercanti, LLP

(57) ABSTRACT

Provided is a photoelectric conversion element for which a novel compound (dye) exhibiting excellent adsorption to an oxide semiconductor and exhibiting high photoelectric conversion efficiency is used, and also provided is a solar cell employing the photoelectric conversion element. Disclosed is a dye-sensitizing type photoelectric conversion element possessing at least a pair of facing electrodes, a semiconductor layer possessing a semiconductor and a sensitizing dye supported on the semiconductor, and a charge transport layer, wherein the semiconductor layer and the charge transport layer are provided between the facing electrodes, and wherein the sensitizing dye comprises a compound represented by the following Formula (1).

Formula (1)

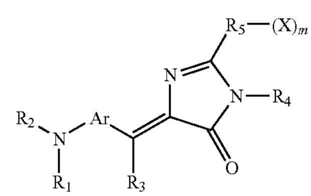

9 Claims, 1 Drawing Sheet

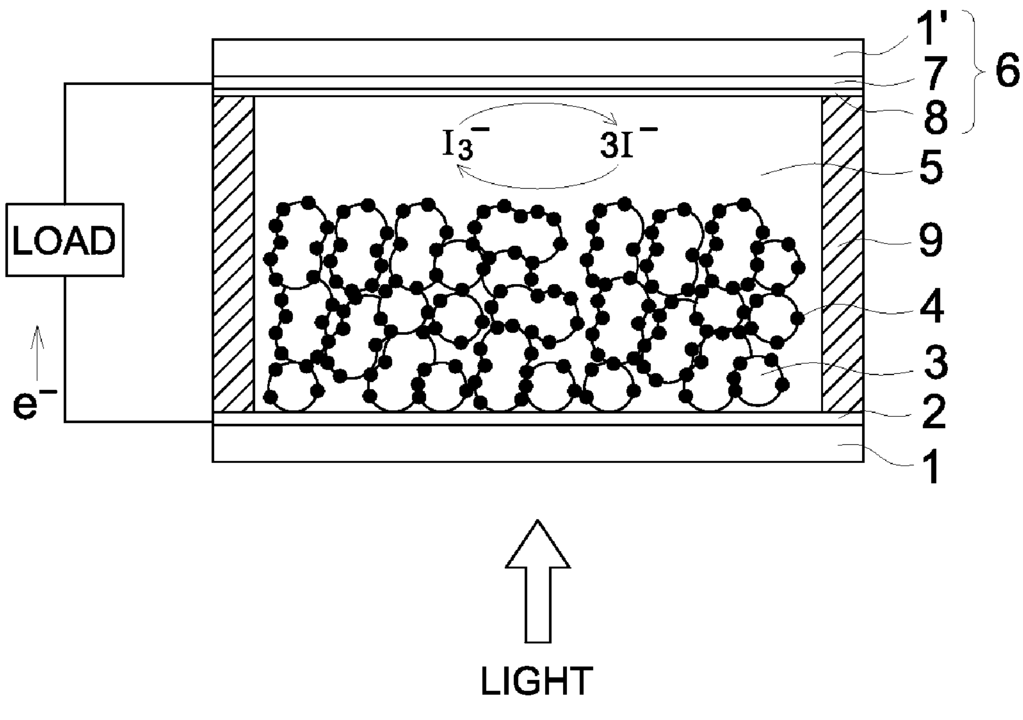
1'
7
6
8
$I_3^-$
$3I^-$
5
LOAD
9
4
3
$e^-$
2
1
LIGHT

PHOTOELECTRIC CONVERSION ELEMENT AND SOLAR CELL

This application claims priority from Japanese Patent Application No. 2009-100784 filed on Apr. 17, 2009, which is incorporated hereinto by reference.

TECHNICAL FIELD

The present invention relates to a photoelectric conversion element for which a novel compound (dye) is used, and to a solar cell employing the photoelectric conversion element.

BACKGROUND

In recent years, application of infinite solar light producing no harmful substances has been actively studied. Inorganic type solar cells such as single crystalline silicon, polycrystalline silicon, amorphous silicon, and cadmium telluride and indium copper selenide for domestic use are provided as those presently available in practical use as a clean energy source in application of solar light.

However, drawbacks of these inorganic type solar cells include in the case of the silicon type, not only extremely high purity is required, but also complicated purification process includes many steps at high production cost.

On the other hand, many solar cells employing an organic material have also been proposed. Examples of the organic solar cell include a Schottky type photoelectric conversion element in which a p-type organic semiconductor and metal having a small work function are joined, and a heterojunction type photoelectric conversion element in which a p-type organic semiconductor and an n-type inorganic semiconductor or a p-type organic semiconductor and an electron acceptable organic compound are joined. The utilized organic semiconductors are synthesized dyes or pigments such as chlorophyll, perylene and so forth, conductive polymers such as polyacetylene and so forth, and the composite material thereof. The material to be used as the cell material is thin-layered by a vacuum evaporation method, a casting method, a dipping method or the like. The organic materials have advantages of low cost and easy production of large area, but there is a problem such as a low conversion efficiency of 1% or less together with insufficient durability.

In such the situation, a solar cell exhibiting favorable properties has been reported by Dr. Gratzel et al. in Switzerland, cf. Non-patent document 1 for example. The proposed cell is a dye sensitizing type solar cell, and a wet type solar cell in which a porous titanium oxide thin film spectrally sensitized by a ruthenium complex is provided as a functional electrode. Advantages of this technique are that purification of an inexpensive oxide semiconductor such as titanium oxide up to high purity is not necessary, and solar light having a large visible light component can be effectively converted into electricity in accordance with usable light covering a wide wavelength of visible light at low cost.

In contrast, ruthenium complex is under threat of its supply in cases where this solar cell is put into practical use, since the ruthenium complex as limited resource is utilized. Further, since ruthenium complex is expensive, and produces a problem in aging stability, this problem can be solved if the ruthenium complex can be replaced by an inexpensive and stable organic dye.

It is disclosed that a compound having a rhodanine moiety-containing amine structure is utilized as the dye to obtain an element exhibiting high photoelectric conversion (refer to Patent Document 1, for example). However, since photoelectric conversion efficiency in this case is lower than in the case of use of a ruthenium complex, even though employing this dye, a sensitizing dye exhibiting high photoelectric conversion efficiency is further desired to be obtained.

PATENT DOCUMENT

Patent Document 1: Japanese Patent O.P.I. Publication 2005-123033

NON-PATENT DOCUMENT

Non-patent Document 1: Brian O'Regan & Michael Grätzel, Nature, Vol. 353, 737 (1991)

SUMMARY

The present invention was made on the basis of the above-described problem, and it is an object of the present invention to provide a photoelectric conversion element for which a novel compound (dye) exhibiting excellent adsorption to an oxide semiconductor and exhibiting high photoelectric conversion efficiency is used, and to provide a solar cell employing the photoelectric conversion element.

BRIEF DESCRIPTION OF THE DRAWINGS

Embodiments will now be described, by way of example only, with reference to the accompanying drawing which is meant to be exemplary, not limiting, and wherein elements are numbered in the FIGURE.

FIG. 1 is a schematic cross-sectional view showing an example of a photoelectric conversion element of the present invention.

DESCRIPTION OF THE PREFERRED EMBODIMENTS

The above-described object of the present invention is accomplished by the following structures.

(Structure 1) A dye-sensitizing type photoelectric conversion element comprising a pair of facing electrodes, a semiconductor layer comprising a semiconductor and a sensitizing dye supported on the semiconductor, and a charge transport layer, wherein the semiconductor layer and the charge transport layer are provided between the facing electrodes, and wherein the sensitizing dye comprises a compound represented by the following Formula (1).

Formula (1)

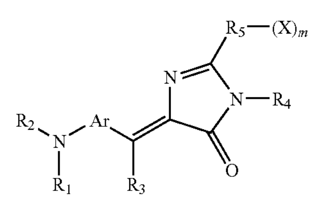

where Ar represents a substituted or unsubstituted arylene group or heterocyclic group; each of $R_1$ and $R_2$ represents a substituted or unsubstituted alkyl group, alkenyl group, alkynyl group, aryl group or heterocyclic group; $R_1$, $R_2$ and Ar may form a cyclic structure via connection to each other; $R_3$ represents a hydrogen atom, a halogen atom, a cyano group, a substituted or unsubstituted alkyl group, an alkenyl group, an alkynyl group, an alkoxy group, an amino group, an aryl group or a heterocyclic group; $R_4$ represents a hydrogen atom, a substituted or unsubstituted alkyl group, an alkenyl group, an alkynyl group, an aryl group or a heterocyclic group; $R_5$ represents an alkyl group, an alkenyl group, an alkynyl group, an alkoxy group, an alkylthio group, an alkylseleno group, an amino group, an aryl group or a heterocyclic group, which is substituted by X, but $R_5$ may have a substituent other than X; X represents an acidic group; m is an integer of at least 1; in the case of m≧2, X may be the same or different; and a carbon-carbon double bond may be a cis type double bond or a trans type double bond.

(Structure 2) The dye-sensitizing type photoelectric conversion element of Structure 1, wherein the compound represented by Formula (1) is a compound represented by the following Formula (2).

Formula (2)

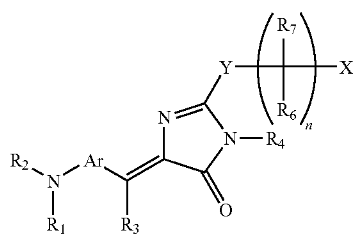

where Ar represents a substituted or unsubstituted arylene group or heterocyclic group; each of $R_1$ and $R_2$ represents a substituted or unsubstituted alkyl group, alkenyl group, alkynyl group, aryl group or heterocyclic group; $R_1$, $R_2$ and Ar may form a cyclic structure via connection to each other; $R_3$ represents a hydrogen atom, a halogen atom, a cyano group, a substituted or unsubstituted alkyl group, an alkenyl group, an alkynyl group, an alkoxy group, an amino group, an aryl group or a heterocyclic group; $R_4$ represents a hydrogen atom, a substituted or unsubstituted alkyl group, an alkenyl group, an alkynyl group, an aryl group or a heterocyclic group; each of $R_6$ and $R_7$ represents a hydrogen atom, a halogen atom, a hydroxyl group, a thiol group, a cyano group, or a substituted or unsubstituted alkyl group, alkenyl group, alkynyl group, alkoxy group, amino group, aryl group or heterocyclic group, and $R_6$ and $R_7$ which may form a cyclic structure via connection to each other; n is an integer of 0 or more; in the case of n≧2, $R_6$ and $R_7$ may be the same or different; Y represents a sulfur atom, an oxygen atom or a selenium atom; X represents an acidic group; and a carbon-carbon double bond may be a cis type double bond or a trans type double bond.

(Structure 3) The dye-sensitizing type photoelectric conversion element of Structure 2, wherein Y in the compound represented by Formula (2) is a sulfur atom, and the compound represented by Formula (2) is a compound represented by the following Formula (3):

Formula (3)

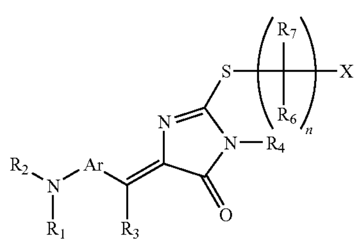

where Ar represents a substituted or unsubstituted arylene group or heterocyclic group; each of $R_1$ and $R_2$ represents a substituted or unsubstituted alkyl group, alkenyl group, alkynyl group, aryl group or heterocyclic group; $R_1$, $R_2$ and Ar may form a cyclic structure via connection to each other; $R_3$ represents a hydrogen atom, a halogen atom, a cyano group, a substituted or unsubstituted alkyl group, an alkenyl group, an alkynyl group, an alkoxy group, an amino group, an aryl group or a heterocyclic group; $R_4$ represents a hydrogen atom, a substituted or unsubstituted alkyl group, an alkenyl group, an alkynyl group, an aryl group or a heterocyclic group; each of $R_6$ and $R_7$ represents a hydrogen atom, a halogen atom, a hydroxyl group, a thiol group, a cyano group, or a substituted or unsubstituted alkyl group, alkenyl group, alkynyl group, alkoxy group, amino group, aryl group or heterocyclic group, and $R_6$ and $R_7$ which may form a cyclic structure via connection to each other; n is an integer of 0 or more; in the case of n≧2, $R_6$ and $R_7$ may be the same or different; X represents an acidic group; and a carbon-carbon double bond may be a cis type double bond or a trans type double bond.

(Structure 4) The dye-sensitizing type photoelectric conversion element of Structure 3, wherein $R_4$ in the compound represented by Formula (3) is a hydrogen atom, and the compound represented by Formula (3) is a compound represented by the following Formula (4).

Formula (4)

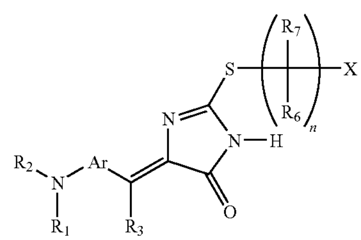

where Ar represents a substituted or unsubstituted arylene group or heterocyclic group; each of $R_1$ and $R_2$ represents a substituted or unsubstituted alkyl group, alkenyl group, alkynyl group, aryl group or heterocyclic group; $R_1$, $R_2$ and Ar may form a cyclic structure via connection to each other; $R_3$ represents a hydrogen atom, a halogen atom, a cyano group, a substituted or unsubstituted alkyl group, an alkenyl group, an alkynyl group, an alkoxy group, an amino group, an aryl group or a heterocyclic group; each of $R_6$ and $R_7$ represents a hydrogen atom, a halogen atom, a hydroxyl group, a thiol group, a cyano group, or a substituted or unsubstituted alkyl group, alkenyl group, alkynyl group, alkoxy group, amino group, aryl group or heterocyclic group, and $R_6$ and $R_7$ which may form a cyclic structure via connection to each other; n is an integer of 0 or more; in the case of n≧2, $R_6$ and $R_7$ may be the same or different; X represents an acidic group; and a carbon-carbon double bond may be a cis type double bond or a trans type double bond.

(Structure 5) The dye-sensitizing type photoelectric conversion element of Structure 4, wherein the compound represented by Formula (4) is a compound represented by the following Formula (5).

Formula (5)

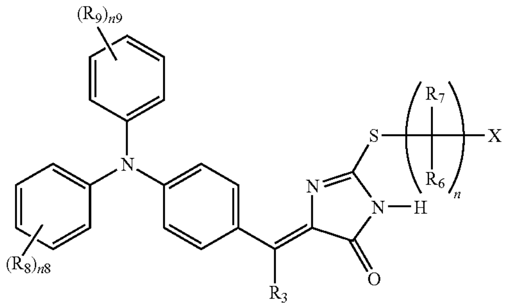

where each of $R_8$ and $R_9$ represents a hydrogen atom, a halogen atom, or a substituted or unsubstituted alkyl group, alkenyl group, alkynyl group, alkoxy group, alkylthio group, alkylseleno group, amino group, aryl group or heterocyclic group; each of n8 and n9 is an integer of 1-5; in the case of n8≧2 and n9≧2, $R_8$ and $R_9$ may be the same or different; $R_3$ represents a hydrogen atom, a halogen atom, a cyano group, a substituted or unsubstituted alkyl group, an alkenyl group, an alkynyl group, an alkoxy group, an amino group, an aryl group or a heterocyclic group; each of $R_6$ and $R_7$ represents a hydrogen atom, a halogen atom, a hydroxyl group, a thiol group, a cyano group, or a substituted or unsubstituted alkyl group, alkenyl group, alkynyl group, alkoxy group, amino group, aryl group or heterocyclic group, and $R_6$ and $R_7$ which may form a cyclic structure via connection to each other; n is an integer of 0 or more; in the case of n≧2, $R_6$ and $R_7$ may be the same or different; X represents an acidic group; and a carbon-carbon double bond may be a cis type double bond or a trans type double bond.

(Structure 6) The dye-sensitizing type photoelectric conversion element of Structure 4, wherein the compound represented by Formula (4) is a compound represented by the following Formula (6).

Formula (6)

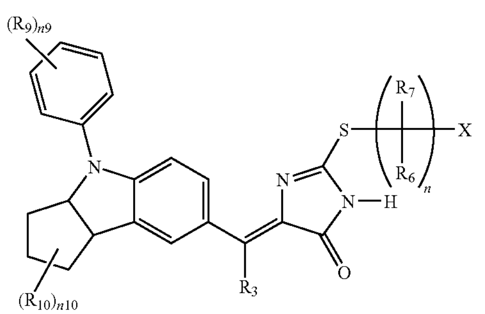

where each of $R_9$ and $R_{10}$ represents a hydrogen atom, a halogen atom, or a substituted or unsubstituted alkyl group, alkenyl group, alkynyl group, alkoxy group, alkylthio group, alkylseleno group, amino group, aryl group or heterocyclic group; n9 is an integer of 1-5; n10 is an integer of 1-8; in the case of n9≧2 and n10≧2, $R_9$ and $R_{10}$ may be the same or different; $R_3$ represents a hydrogen atom, a halogen atom, a cyano group, a substituted or unsubstituted alkyl group, an alkenyl group, an alkynyl group, an alkoxy group, an amino group, an aryl group or a heterocyclic group; each of $R_6$ and $R_7$ represents a hydrogen atom, a halogen atom, a hydroxyl group, a thiol group, a cyano group, or a substituted or unsubstituted alkyl group, alkenyl group, alkynyl group, alkoxy group, amino group, aryl group or heterocyclic group, and $R_6$ and $R_7$ which may form a cyclic structure via connection to each other; n is an integer of 0 or more; in the case of n≧2, $R_6$ and $R_7$ may be the same or different; X represents an acidic group; and a carbon-carbon double bond may be a cis type double bond or a trans type double bond.

(Structure 7) The dye-sensitizing type photoelectric conversion element of any one of Structures 1-6, wherein the sensitizing dye comprises at least two selected from compounds represented by Formula (1).

(Structure 8) The dye-sensitizing type photoelectric conversion element of any one of Structures 1-7, wherein the semiconductor to form the semiconductor layer comprises titanium dioxide.

(Structure 9) A solar cell comprising the dye-sensitizing type photoelectric conversion element of any one of Structures 1-8.

While the preferred embodiments of the present invention have been described using specific terms, such description is for illustrative purposes only, and it is to be understood that changes and variations may be made without departing from the spirit or scope of the appended claims.

DETAILED DESCRIPTION OF THE INVENTION

As previously described, it is known that a compound having a rhodanine moiety-containing amine structure is a dye exhibiting high photoelectric conversion efficiency, but since this dye exhibits inferior photoelectric conversion efficiency to that of the foregoing ruthenium complex dye, photoelectric conversion efficiency is desired to be further improved.

After considerable effort during studies of a compound having an imidazolone moiety-containing amine structure, the inventors have found out that a photoelectric conversion element fitted with this compound exhibits high photoelectric conversion efficiency. Since this new dye exhibits higher molecule absorption coefficient than that of a conventional compound having a rhodanine moiety-containing amine structure, and an electron acceptor portion (imidazolone moiety portion) in the dye molecule exhibits high electronegativity, it is assumed that nucleophilicity of an acidic group (X) in the dye molecule is enhanced, and the new dye is easily bonded and coordinated to a metal molecule on the semiconductor surface, whereby photoelectric conversion efficiency is improved. Further, regarding of a sensitizing dye of the present invention, absorption wavelength is shifted to the long-wavelength range because of development of agglutination caused by an intermolecular interaction, and an adsorbed dye amount is increased, whereby a larger amount of light in the wavelength range is presumably absorbed to improve the photoelectric conversion efficiency.

Next, the present invention will be further described in detail.

[Photoelectric Conversion Element]

The photoelectric conversion element will be described referring to a FIGURE.

FIG. 1 is a schematic cross-sectional view showing an example of a photoelectric conversion element of the present invention.

As shown in FIG. 1, as to the photoelectric conversion element, each of numerals 1 and 1' represents a substrate; each of numerals 2 and 7 represents a transparent conductive film; numeral 3 represents a semiconductor, numeral 4 represents a sensitizing dye, numeral 5 represents a charge transport layer, and numeral 9 represents a partition wall.

Utilized is a photoelectric conversion element of the present invention in which a semiconductor layer having pores formed via sintering of particles of semiconductor 3 is provided on substrate 1 on which transparent conductive film 2 is provided (referred to also as a conductive substrate), and sensitizing dye 4 is adsorbed on the semiconductor layer surface. As for one electrode 6 of a pair of electrodes facing to each other, transparent conductive layer 7 is formed on substrate 1', and platinum 8 is deposited thereon via evaporation, and a charge transport material is filled in between both electrodes for charge transport layer 5. Terminals are provided to transparent conductive layers 2 and 7 to take photocurrent out.

The present invention relates to a novel compound (dye), and a photoelectric conversion element and a solar cell employing the same.

<<Compound Represented by Formula (1)>>

Next, the compound represented by Formula (1) will be described.

In Formula (1), Ar represents a substituted or unsubstituted arylene group or heterocyclic group. Each of $R_1$ and $R_2$ represents a substituted or unsubstituted alkyl group, alkenyl group, alkynyl group, aryl group or heterocyclic group, and $R_1$, $R_2$ and Ar may form a cyclic structure via connection to each other. $R_3$ represents a hydrogen atom, a halogen atom, a cyano group, a substituted or unsubstituted alkyl group, an alkenyl group, an alkynyl group, an alkoxy group, an amino group, an aryl group or a heterocyclic group. $R_4$ represents a hydrogen atom, a substituted or unsubstituted alkyl group, an alkenyl group, an alkynyl group, an aryl group or a heterocyclic group. $R_5$ represents an alkyl group, an alkenyl group, an alkynyl group, an alkoxy group, an alkylthio group, an alkylseleno group, an amino group, an aryl group or a heterocyclic group, which is substituted by X, but $R_5$ may have a substituent other than X. X represents an acidic group, and m is an integer of at least 1. In the case of $m \geqq 2$, X may be the same or different. A carbon-carbon double bond may be a cis type double bond or a trans type double bond.

Examples of the arylene group represented by Ar include a phenylene group and a tolylene group, and examples of the heterocyclic group include a furanyl group, a thienyl group, an imidazolyl group, a thiazolyl group and a morphonyl group.

Examples of the alkyl group represented by $R_1$ and $R_2$ include a methyl group, an ethyl group, a propyl group, an isopropyl group, a tert-butyl group, a pentyl group, a hexyl group, an octyl group, a dodecyl group, a tridecyl group, a tetradecyl group, a pentadecyl group, a cyclopentyl group and a cyclohexyl group. Examples of the alkenyl group include a vinyl group, a 1-propenyl group, a 2-propenyl group, a 2-butenyl group and an allyl group. Examples of the alkynyl group include a propargyl group and a 3-pentynyl group. Examples of the aryl group include a phenyl group, a naphthyl group and an anthracenyl group. Examples of the heterocyclic group include a furanyl group, a thienyl group, an imidazolyl group, a thiazolyl group and a morphonyl group.

Examples of the halogen atom represented by $R_3$ include a chlorine atom, a bromine atom and a fluorine atom. Examples of the alkoxy group include a methoxy group, an ethoxy group, a propoxy group and a butoxy group. Examples of the amino group include an amino group, an ethylamino group, a dimethylamino group, a butylamino group and a cyclopentylamino group.

The alkyl group, the alkenyl group, the alkynyl group, the aryl group and the heterocyclic group which are represented by each of $R_3$, $R_4$ and $R_5$ are synonymous with those groups provided for each of $R_1$ and $R_2$.

Examples of the alkoxy group represented by $R_5$ include a methoxy group, an ethoxy group, a propoxy group and a butoxy group. Examples of the alkylthio group include a methylthio group, an ethylthio group, a propylthio group, an isopropylthio group, a butylthio group, a tert-butylthio group and a hexylthio group. Examples of the alkylseleno group include a methylseleno group, an ethylseleno group, a propylseleno group, a butylseleno group and a hexylseleno group. Examples of the amino group include an amino group, an ethylamino group, a dimethylamino group, a butylamino group and a cyclopentylamino group. An alkyl group, an alkenyl group, an al alkynyl group, an aryl group, a heterocyclic group, an alkoxy group, an alkylthio group, an alkylseleno group or an amino group is substituted by X.

X represents an acidic group, and examples of the acidic group include a carboxyl group, a sulfo group, a sulfino group, a sulfinyl group, a phosphoryl group, a phosphynyl group, a phosphono group, a phosphonyl group, a sulfonyl group and salts thereof, but the carboxyl group and the sulfonyl group are preferable.

Examples of the substituent include an alkyl group such as a methyl group, an ethyl group, a propyl group, an isopropyl group, a tert-butyl group, a pentyl group, a hexyl group, an octyl group, a dodecyl group, a tridecyl group, a tetradecyl group, a pentadecyl group, a cyclopentyl group or a cyclohexyl group; an alkenyl group such as a vinyl group, a 1-propenyl group, a 2-propenyl group, a 2-butenyl group or an allyl group; an aryl group such as a phenyl group, a naphthyl group or an anthracenyl group; a hydroxyl group; an amino group; a thiol group; a cyano group; a halogen atom such as a chlorine atom, a bromine atom or a fluorine atom; and a heterocyclic group such as a pyrrolidyl group, an imidazolidyl group, a morpholyl group, an oxaxolidyl group, a 2-tetrahydrofranyl group, a 2-tetrahydrothienyl group, a 2-tetrahydropyranyl group or a 3-tetrahydropyranyl group. These substituents may form a cycle via plural connection to each other.

<<Compound Represented by Formula (2)>>

Compounds represented by Formula (2) among compounds represented by foregoing Formula (1) preferably exhibit high photoelectric conversion efficiency.

In Formula (2), Ar represents a substituted or unsubstituted arylene group or heterocyclic group. Each of $R_1$ and $R_2$ represents a substituted or unsubstituted alkyl group, alkenyl group, alkynyl group, aryl group or heterocyclic group, and $R_1$, $R_2$ and Ar may form a cyclic structure via connection to each other. $R_3$ represents a hydrogen atom, a halogen atom, a cyano group, a substituted or unsubstituted alkyl group, an alkenyl group, an alkynyl group, an alkoxy group, an amino group, an aryl group or a heterocyclic group. $R_4$ represents a hydrogen atom, a substituted or unsubstituted alkyl group, an alkenyl group, an alkynyl group, an aryl group or a heterocyclic group. Further, each of $R_6$ and $R_7$ which may form a cyclic structure via connection to each other represents a hydrogen atom, a halogen atom, a hydroxyl group, a thiol group, a cyano group, or a substituted or unsubstituted alkyl group, alkenyl group, alkynyl group, alkoxy group, amino group, aryl group or heterocyclic group. Symbol n is an integer of 0 or more; in the case of $n \geqq 2$, $R_6$ and $R_7$ may be the same or different. Y represents a sulfur atom, an oxygen atom or a selenium atom, and X represents an acidic group. A carbon-carbon double bond may be a cis type double bond or a trans type double bond.

A halogen atom and a substituted or unsubstituted alkyl group, aryl group, alkenyl group, alkynyl group, alkoxy group, amino group or a heterocyclic group which are represented by each of $R_6$ and $R_7$ are synonymous with a halogen atom and a substituted or unsubstituted alkyl group, aryl group, alkenyl group, alkynyl group, alkoxy group, amino group or a heterocyclic group which are represented by $R_3$ in Formula (1).

Ar, $R_1$, $R_2$, $R_3$, $R_4$, and X in Formula (2) are synonymous with Ar, $R_1$, $R_2$, $R_3$, $R_4$, and X in Formula (1).

<<Compound Represented by Formula (3)>>

Y in the compound represented by Formula (2) is a sulfur atom, and the compound represented by Formula (2) is preferably a compound represented by the following Formula (3), which exhibits high photoelectric conversion efficiency.

In Formula (3), Ar represents a substituted or unsubstituted arylene group or heterocyclic group. Each of $R_1$ and $R_2$ represents a substituted or unsubstituted alkyl group, alkenyl group, alkynyl group, aryl group or heterocyclic group, and $R_1$, $R_2$ and Ar may form a cyclic structure via connection to each other. Further, $R_3$ represents a hydrogen atom, a halogen atom, a cyano group, a substituted or unsubstituted alkyl group, an alkenyl group, an alkynyl group, an alkoxy group, an amino group, an aryl group or a heterocyclic group. $R_4$ represents a hydrogen atom, a substituted or unsubstituted alkyl group, an alkenyl group, an alkynyl group, an aryl group or a heterocyclic group. Each of $R_6$ and $R_7$ represents a hydrogen atom, a halogen atom, a hydroxyl group, a thiol group, a cyano group, or a substituted or unsubstituted alkyl group, alkenyl group, alkynyl group, alkoxy group, amino group, aryl group or heterocyclic group, and $R_6$ and $R_7$ which may form a cyclic structure via connection to each other. Symbol n is an integer of 0 or more; in the case of $n \geqq 2$, $R_6$ and $R_7$ may be the same or different; X represents an acidic group. A carbon-carbon double bond may be a cis type double bond or a trans type double bond.

Ar, $R_1$, $R_2$, $R_3$, $R_4$, $R_6$, $R_7$ and X in Formula (3) are synonymous with Ar, $R_1$, $R_2$, $R_3$, $R_4$, $R_6$, $R_7$ and X in Formula (2).

<<Compound Represented by Formula (4)>>

$R_4$ in the compound represented by Formula (3) is a hydrogen atom, and the compound represented by Formula (3) is a compound represented by the following Formula (4), which preferably exhibits high photoelectric conversion efficiency.

In Formula (4), Ar represents a substituted or unsubstituted arylene group or heterocyclic group. Each of $R_1$ and $R_2$ represents a substituted or unsubstituted alkyl group, alkenyl group, alkynyl group, aryl group or heterocyclic group, and $R_1$, $R_2$ and Ar may form a cyclic structure via connection to each other. Further, $R_3$ represents a hydrogen atom, a halogen atom, a cyano group, a substituted or unsubstituted alkyl group, an alkenyl group, an alkynyl group, an alkoxy group, an amino group, an aryl group or a heterocyclic group. Each of $R_6$ and $R_7$ represents a hydrogen atom, a halogen atom, a hydroxyl group, a thiol group, a cyano group, or a substituted or unsubstituted alkyl group, alkenyl group, alkynyl group, alkoxy group, amino group, aryl group or heterocyclic group, and $R_6$ and $R_7$ which may form a cyclic structure via connection to each other. Symbol n is an integer of 0 or more; in the case of $n \geqq 2$, $R_6$ and $R_7$ may be the same or different. X represents an acidic group. A carbon-carbon double bond may be a cis type double bond or a trans type double bond.

Ar, $R_1$, $R_2$, $R_3$, $R_6$, $R_7$ and X in Formula (4) are synonymous with Ar, $R_1$, $R_2$, $R_3$, $R_6$, $R_7$ and X in Formula (3).

<<Compound Represented by Formula (5)>>

The compound represented by Formula (4) is preferably a compound represented by foregoing Formula (5)

In Formula (5), each of $R_8$ and $R_9$ represents a hydrogen atom, a halogen atom, or a substituted or unsubstituted alkyl group, alkenyl group, alkynyl group, alkoxy group, alkylthio group, alkylseleno group, amino group, aryl group or heterocyclic group, and each of n8 and n9 is an integer of 1-5. In the case of $n8 \geqq 2$ and $n9 \geqq 2$, $R_8$ and $R_9$ may be the same or different. Further, $R_3$ represents a hydrogen atom, a halogen atom, a cyano group, a substituted or unsubstituted alkyl group, an alkenyl group, an alkynyl group, an alkoxy group, an amino group, an aryl group or a heterocyclic group. Each of $R_6$ and $R_7$ represents a hydrogen atom, a halogen atom, a hydroxyl group, a thiol group, a cyano group, or a substituted or unsubstituted alkyl group, alkenyl group, alkynyl group, alkoxy group, amino group, aryl group or heterocyclic group, and $R_6$ and $R_7$ which may form a cyclic structure via connection to each other. Symbol n is an integer of 0 or more, and in the case of $n \geqq 2$, $R_6$ and $R_7$ may be the same or different. X represents an acidic group. A carbon-carbon double bond may be a cis type double bond or a trans type double bond.

Examples of the alkylthio group include a methylthio group, an ethylthio group, a propylthio group, an isopropylthio group, a butylthio group, a tert-butylthio group and a hexylthio group. Examples of the alkylseleno group include a methylseleno group, an ethylseleno group, a propylseleno group, a butylseleno group and a hexylseleno group. A halogen atom and a substituted or unsubstituted alkyl group, alkenyl group, alkynyl group, alkoxy group, amino group, aryl group or a heterocyclic group are synonymous with a halogen atom and a substituted or unsubstituted alkyl group, alkenyl group, alkynyl group, alkoxy group, amino group, aryl group or a heterocyclic group which are represented by $R_3$ in Formula (4).

$R_3$, $R_6$, $R_7$ and X in Formula (5) are synonymous with $R_3$, $R_6$, $R_7$ and X in Formula (4).

<<Compound Represented by Formula (6)>>

The compound represented by Formula (4) is preferably a compound represented by forgoing Formula (6).

In Formula (6), each of $R_9$ and $R_{10}$ represents a hydrogen atom, a halogen atom, or a substituted or unsubstituted alkyl group, alkenyl group, alkynyl group, alkoxy group, alkylthio group, alkylseleno group, amino group, aryl group or heterocyclic group, n9 is an integer of 1-5, and n10 is an integer of 1-8. In the case of $n9 \geqq 2$ and $n10 \geqq 2$, $R_9$ and $R_{10}$ may be the same or different. Further, $R_3$ represents a hydrogen atom, a halogen atom, a cyano group, a substituted or unsubstituted alkyl group, an alkenyl group, an alkynyl group, an alkoxy group, an amino group, an aryl group or a heterocyclic group. Each of $R_6$ and $R_7$ represents a hydrogen atom, a halogen atom, a hydroxyl group, a thiol group, a cyano group, or a substituted or unsubstituted alkyl group, alkenyl group, alkynyl group, alkoxy group, amino group, aryl group or heterocyclic group, and $R_6$ and $R_7$ which may form a cyclic structure via connection to each other. Symbol n is an integer of 0 or more, and in the case of $n \geqq 2$, $R_6$ and $R_7$ may be the same or different. X represents an acidic group. A carbon-carbon double bond may be a cis type double bond or a trans type double bond.

A halogen atom and a substituted or unsubstituted alkyl group, alkenyl group, alkynyl group, alkoxy group, alkylthio group, alkylseleno group, amino group, aryl group or heterocyclic group which are represented by $R_{10}$ are synonymous with a halogen atom and a substituted or unsubstituted alkyl group, alkenyl group, alkynyl group, alkoxy group, alkylthio group, alkylseleno group, amino group, aryl group or heterocyclic group which are represented by $R_8$ in Formula (5).

$R_3$, $R_6$, $R_7$, $R_9$ and X in Formula (6) are synonymous with $R_3$, $R_6$, $R_7$, $R_9$ and X in Formula (5).

Specific examples of compounds represented by Formulae (1)-(6) are exemplified, but the present invention is not limited thereto. In the following examples, a wavy line portion in a partial structure represents a bonding portion in each of the chemical formulae.

| Dye | $R_1$ | $R_2$ | $R_3$ | $R_4$ | Ar | $-R_5-(X)_m$ |
|---|---|---|---|---|---|---|
| 1 | 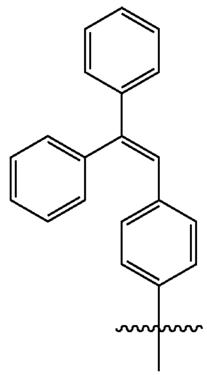 [SMILES: *c1ccc(C=C(c2ccccc2)c2ccccc2)cc1] | 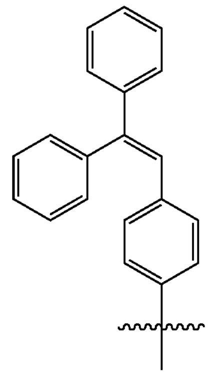 [SMILES: *c1ccc(C=C(c2ccccc2)c2ccccc2)cc1] | H | H | 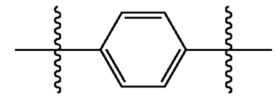 | 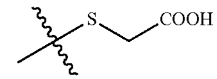 |
| 2 | 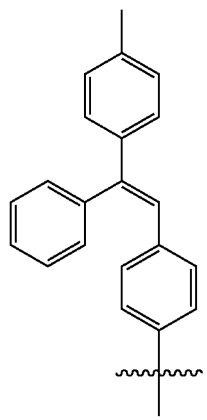 [SMILES: *c1ccc(/C=C(\c2ccccc2)c2ccc(C)cc2)cc1] | 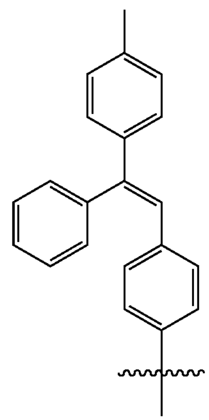 | H | H | 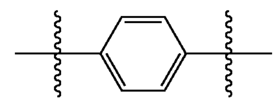 | 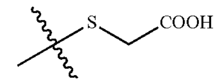 [SMILES: *SCC(=O)O] |

-continued
| Dye | $R_1$ | $R_2$ | $R_3$ | $R_4$ | Ar | 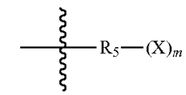 |
|---|---|---|---|---|---|---|
| 3 | 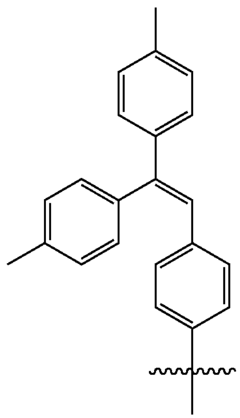 [SMILES: *c1ccc(C=C(c2ccc(C)cc2)c2ccc(C)cc2)cc1] | 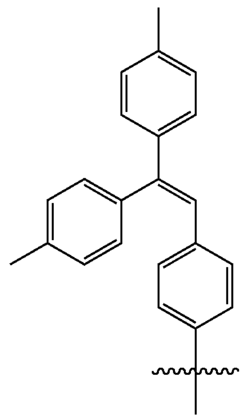 [SMILES: *c1ccc(C=C(c2ccc(C)cc2)c2ccc(C)cc2)cc1] | H | H | 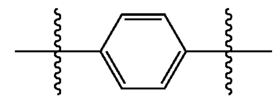 [SMILES: *c1ccc(*)cc1] | 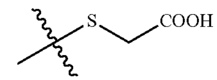 [SMILES: *SCC(=O)O] |
| 4 | 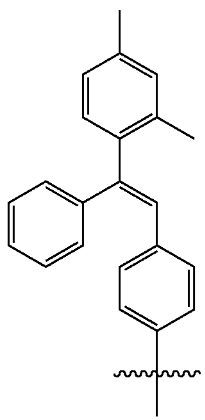 | 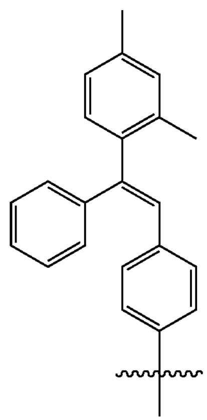 | H | H | 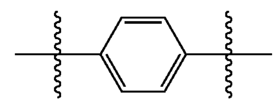 | 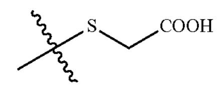 |

-continued
| Dye | $R_1$ | $R_2$ | $R_3$ | $R_4$ | Ar |  $R_5$—$(X)_m$ |
|---|---|---|---|---|---|---|
| 5 | 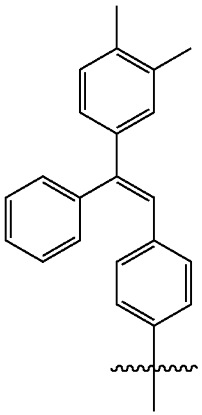 | 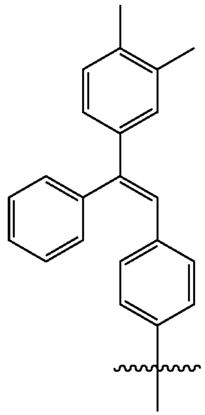 | H | H | 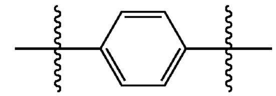 | 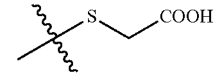  |
| 6 | 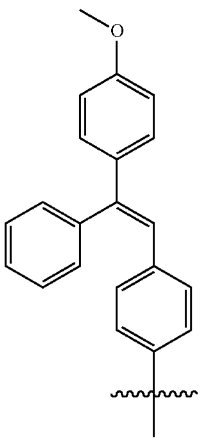 [SMILES: *c1ccc(/C=C(\c2ccccc2)c2ccc(OC)cc2)cc1]  | 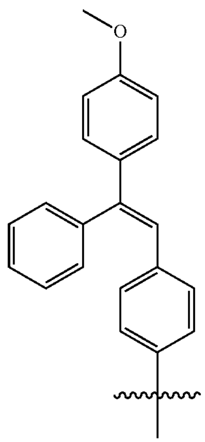 [SMILES: *c1ccc(/C=C(\c2ccccc2)c2ccc(OC)cc2)cc1]  | H | H | 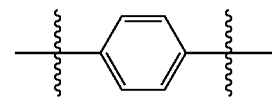 [SMILES: *c1ccc(*)cc1] | 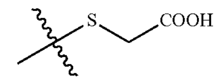 [SMILES: *SCC(=O)O]  |

-continued
| Dye | $R_1$ | $R_2$ | $R_3$ | $R_4$ | Ar | $R_5$—$(X)_m$ |
|---|---|---|---|---|---|---|
| 7 | 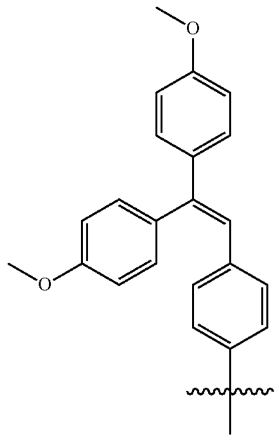 [SMILES: *c1ccc(C=C(c2ccc(OC)cc2)c2ccc(OC)cc2)cc1] | 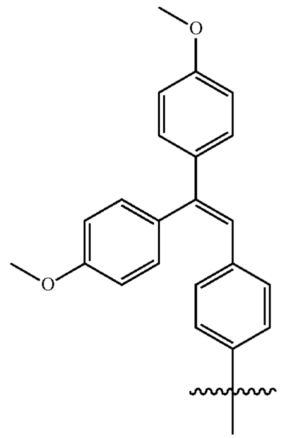 [SMILES: *c1ccc(C=C(c2ccc(OC)cc2)c2ccc(OC)cc2)cc1] | H | H | 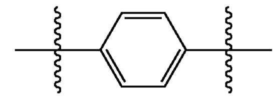 [SMILES: *c1ccc(*)cc1] | 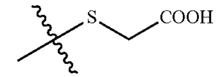 [SMILES: *SCC(=O)O] |
| 8 | 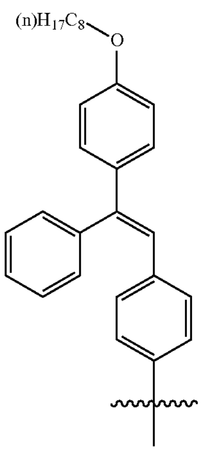 | 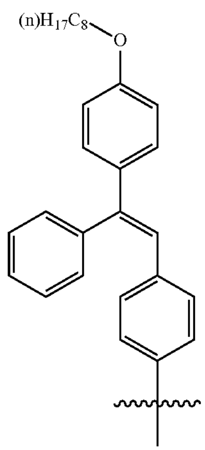 | H | H | 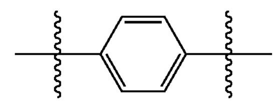 [SMILES: *c1ccc(*)cc1] | 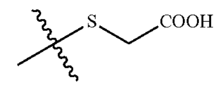 [SMILES: *SCC(=O)O] |

-continued
| Dye | $R_1$ | $R_2$ | $R_3$ | $R_4$ | Ar | 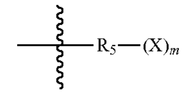 |
|---|---|---|---|---|---|---|
| 9 | 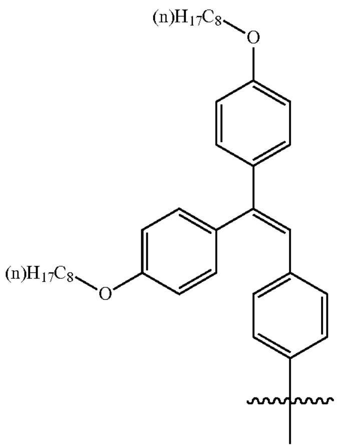 | 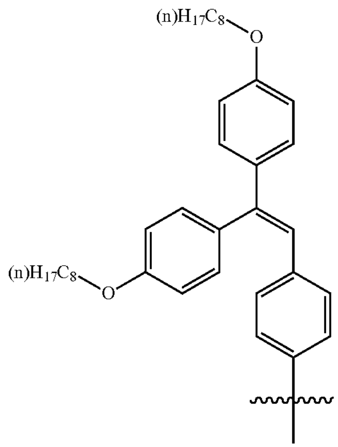 | H | H | 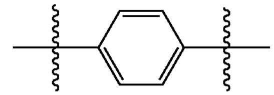 [SMILES: *c1ccc(*)cc1] | 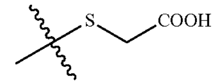 [SMILES: *SCC(=O)O] |
| 10 | 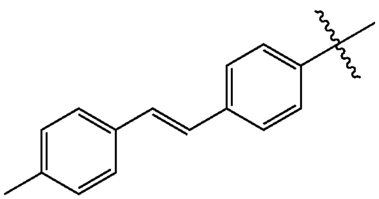 [SMILES: *c1ccc(/C=C/c2ccc(C)cc2)cc1] | 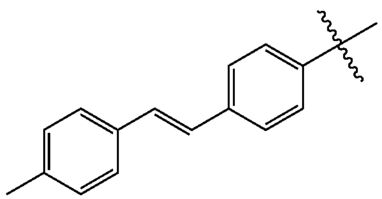 [SMILES: *c1ccc(/C=C/c2ccc(C)cc2)cc1] | H | H | 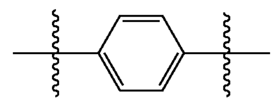 | 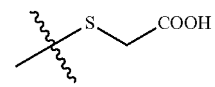 [SMILES: *SCC(=O)O] |
| 11 | 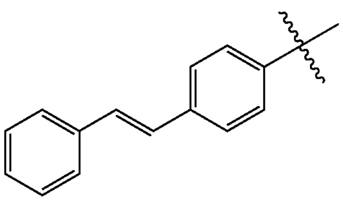 [SMILES: *c1ccc(/C=C/c2ccccc2)cc1] | 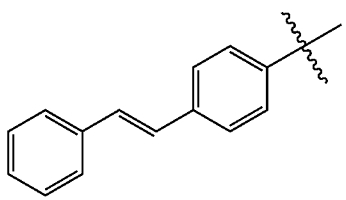 [SMILES: *c1ccc(/C=C/c2ccccc2)cc1] | H | H | 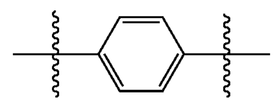 | 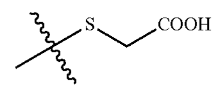 [SMILES: *SCC(=O)O] |

-continued
| Dye | $R_1$ | $R_2$ | $R_3$ | $R_4$ | Ar | 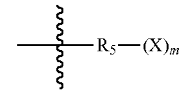 |
|---|---|---|---|---|---|---|
| 12 | 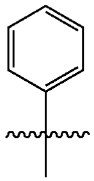 | 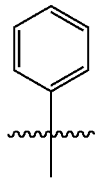 | H | H | 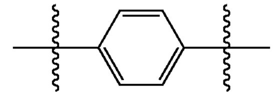 [SMILES: *c1ccc(*)cc1] | 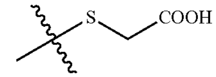 [SMILES: *SCC(=O)O] |
| 13 | 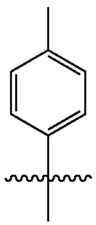 [SMILES: *c1ccc(C)cc1] | 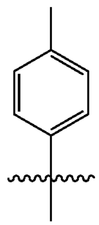 | H | H | 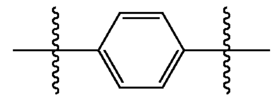 [SMILES: *c1ccc(*)cc1] | 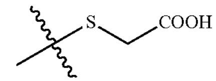 [SMILES: *SCC(=O)O] |
| 14 | 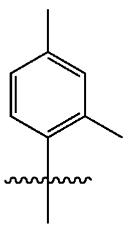 [SMILES: *c1ccc(C)cc1C] | 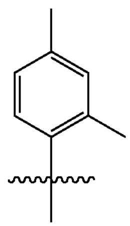 [SMILES: *c1ccc(C)cc1C] | H | H | 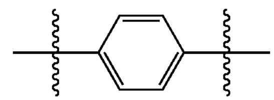 [SMILES: *c1ccc(*)cc1] | 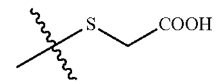 [SMILES: *SCC(=O)O] |
| 15 | 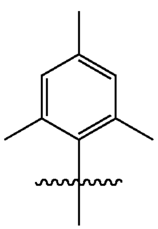 | 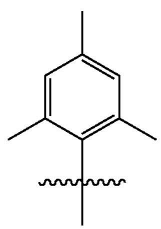 | H | H | 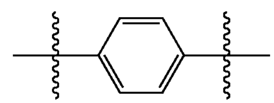 [SMILES: *c1ccc(*)cc1] | 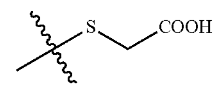 |

-continued
| Dye | $R_1$ | $R_2$ | $R_3$ | $R_4$ | Ar | 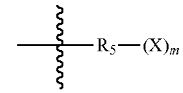 |
|---|---|---|---|---|---|---|
| 16 | 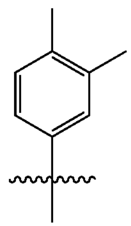 [SMILES: *c1ccc(C)c(C)c1] | 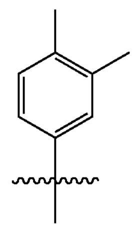 [SMILES: *c1ccc(C)c(C)c1] | H | H | 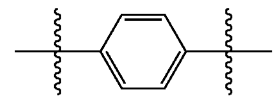 | 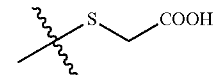 [SMILES: *SCC(=O)O] |
| 17 | 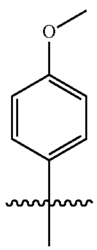 [SMILES: *c1ccc(OC)cc1] | 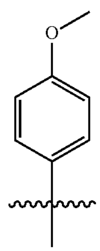 | H | H | 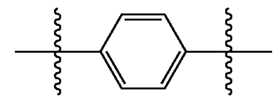 [SMILES: *c1ccc(*)cc1] | 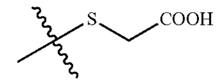 [SMILES: *SCC(=O)O] |
| 18 | 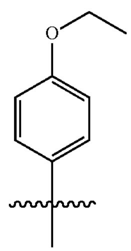 [SMILES: *c1ccc(OCC)cc1] | 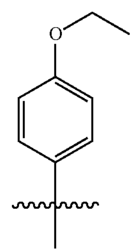 | H | H | 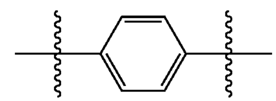 [SMILES: *c1ccc(*)cc1] | 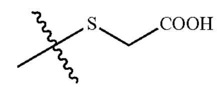 [SMILES: *SCC(=O)O] |
| 19 | 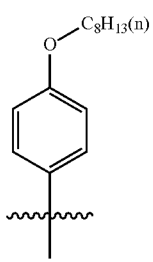 | 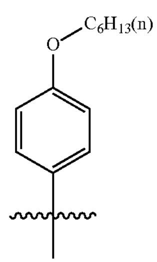 | H | H | 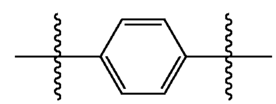 [SMILES: *c1ccc(*)cc1] | 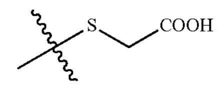 |

-continued
| Dye | $R_1$ | $R_2$ | $R_3$ | $R_4$ | Ar |  $R_5$—$(X)_m$ |
|---|---|---|---|---|---|---|
| 20 | 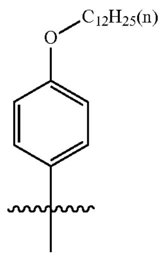 | 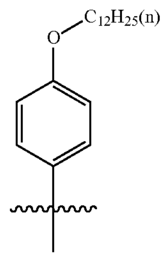 | H | H | 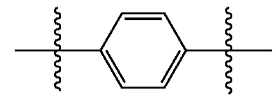 | 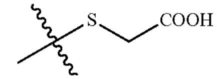 |
| 21 | 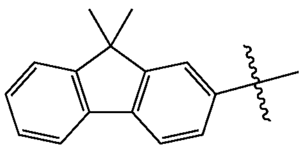 [SMILES: *c1ccc2c(c1)C(C)(C)c1ccccc1-2] | 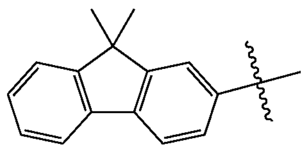 [SMILES: *c1ccc2c(c1)C(C)(C)c1ccccc1-2] | H | H | 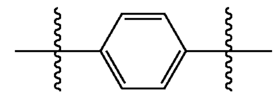 [SMILES: *c1ccc(*)cc1] | 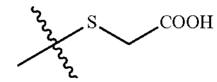 |
| 22 | 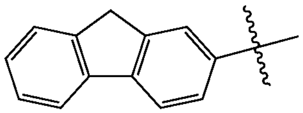 [SMILES: *c1ccc2c(c1)Cc1ccccc1-2] | 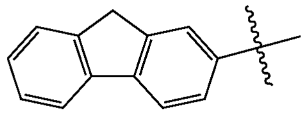 [SMILES: *c1ccc2c(c1)Cc1ccccc1-2] | H | H | 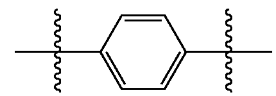 | 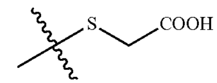 [SMILES: *SCC(=O)O] |
| 23 | 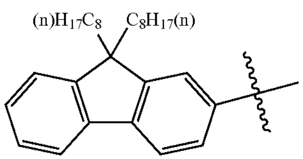 | 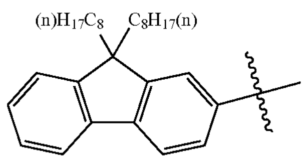 | H | H | 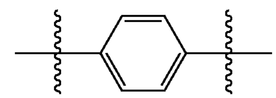 [SMILES: *c1ccc(*)cc1] | 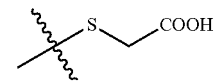 [SMILES: *SCC(=O)O] |
| 24 | 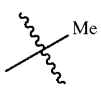 | 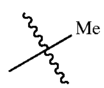 | H | H | 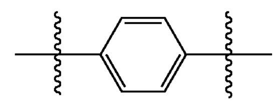 [SMILES: *c1ccc(*)cc1] | 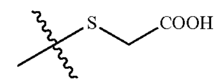 |
| 25 | 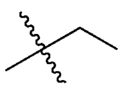 [SMILES: *CC] | 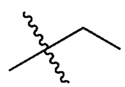 [SMILES: *CC] | H | H | 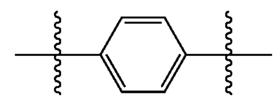 | 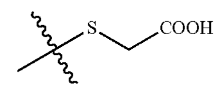 |

-continued
| Dye | $R_1$ | $R_2$ | $R_3$ | $R_4$ | Ar | 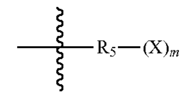  |
|---|---|---|---|---|---|---|
| 26 | 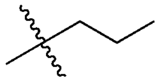 [SMILES: *CCC] |  | H | H | 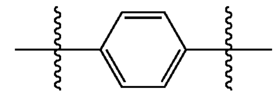 [SMILES: *c1ccc(*)cc1] | 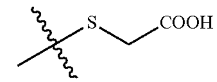  |
| 27 | 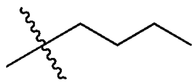 [SMILES: *CCCC] | 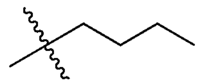 [SMILES: *CCCC] | H | H | 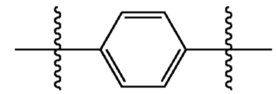 [SMILES: *c1ccc(*)cc1] | 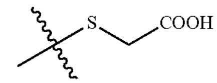  |
| 28 | 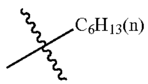  | 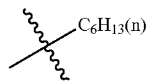  | H | H | 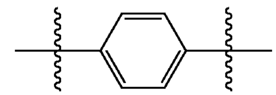 | 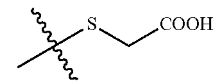  |
| 29 | 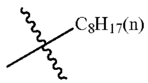  | 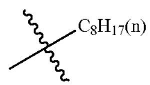  | H | H | 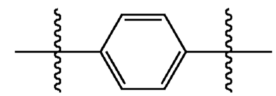 [SMILES: *c1ccc(*)cc1] | 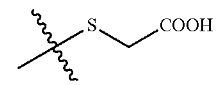  |
| 30 | 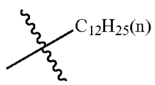  | 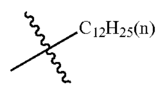  | H | H | 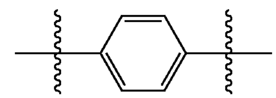 [SMILES: *c1ccc(*)cc1] | 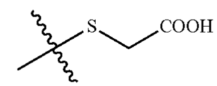  |
| 31 | 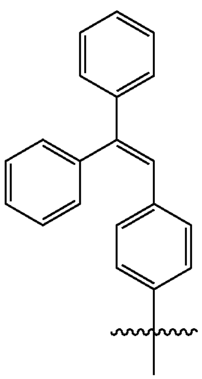 [SMILES: *c1ccc(C=C(c2ccccc2)c2ccccc2)cc1] | 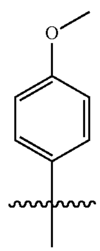 [SMILES: *c1ccc(OC)cc1]  | H | H | 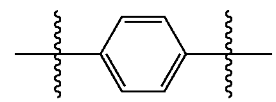 [SMILES: *c1ccc(*)cc1] | 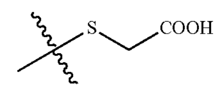  |

-continued
| Dye | $R_1$ | $R_2$ | $R_3$ | $R_4$ | Ar |  $R_5$—$(X)_m$ |
|---|---|---|---|---|---|---|
| 32 | 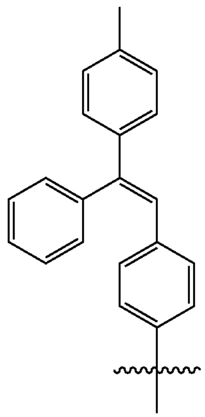 [SMILES: *c1ccc(/C=C(\c2ccccc2)c2ccc(C)cc2)cc1] | 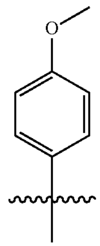 [SMILES: *c1ccc(OC)cc1] | H | H | 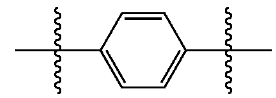 [SMILES: *c1ccc(*)cc1] | 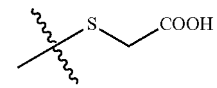 [SMILES: *SCC(=O)O]  |
| 33 | 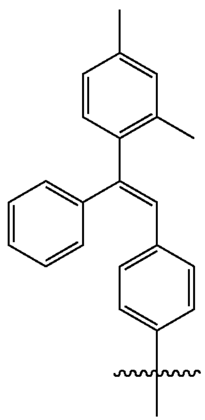 [SMILES: *c1ccc(/C=C(\c2ccccc2)c2ccc(C)cc2C)cc1] | 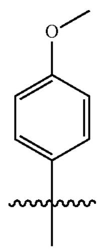 | H | H | 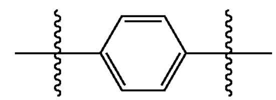 [SMILES: *c1ccc(*)cc1] | 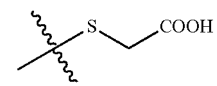  |

-continued
| Dye | $R_1$ | $R_2$ | $R_3$ | $R_4$ | Ar | 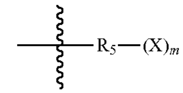 |
| --- | --- | --- | --- | --- | --- | --- |
| 34 | 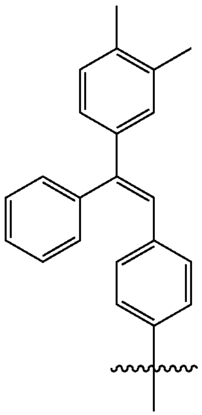 [SMILES: *c1ccc(/C=C(\c2ccccc2)c2ccc(C)c(C)c2)cc1] | 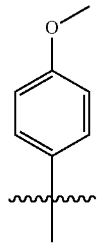 | H | H | 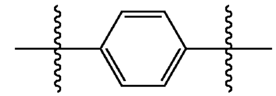 [SMILES: *c1ccc(*)cc1] | 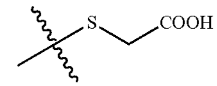 [SMILES: *SCC(=O)O] |
| 35 | 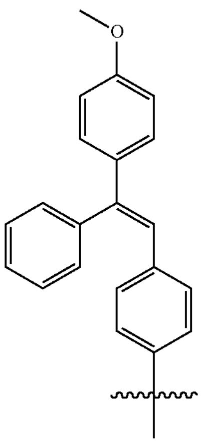 [SMILES: *c1ccc(/C=C(\c2ccccc2)c2ccc(OC)cc2)cc1] | 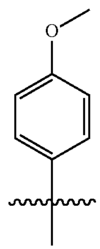 | H | H | 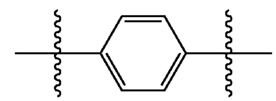 [SMILES: *c1ccc(*)cc1] | 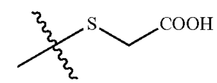 |

-continued
| Dye | $R_1$ | $R_2$ | $R_3$ | $R_4$ | Ar | $R_5-(X)_m$ |
|---|---|---|---|---|---|---|
| 36 | 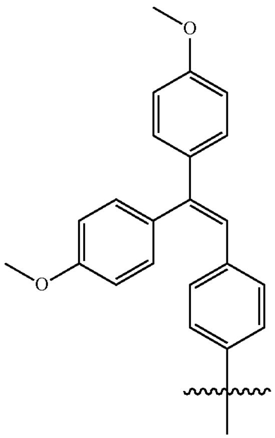 [SMILES: *c1ccc(C=C(c2ccc(OC)cc2)c2ccc(OC)cc2)cc1] | 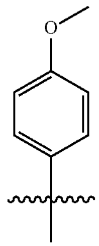 [SMILES: *c1ccc(OC)cc1] | H | H | 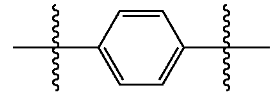 [SMILES: *c1ccc(*)cc1] | 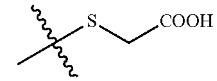 |
| 37 | 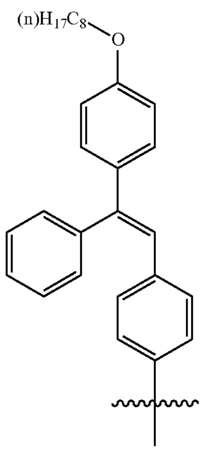 | 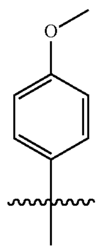 [SMILES: *c1ccc(OC)cc1] | H | H | 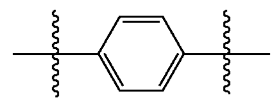 [SMILES: *c1ccc(*)cc1] | 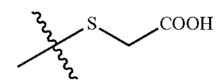 [SMILES: *SCC(=O)O] |

-continued
| Dye | $R_1$ | $R_2$ | $R_3$ | $R_4$ | Ar | 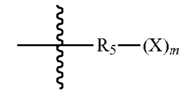 |
|---|---|---|---|---|---|---|
| 38 | 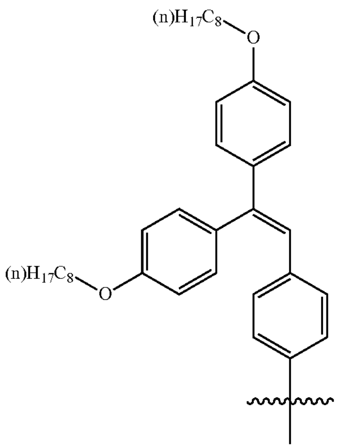 | 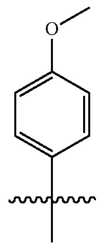 | H | H | 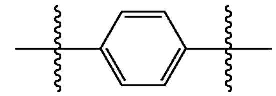 | 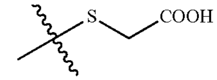 [SMILES: *SCC(=O)O] |
| 39 | 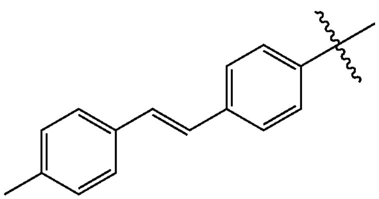 [SMILES: *c1ccc(/C=C/c2ccc(C)cc2)cc1] | 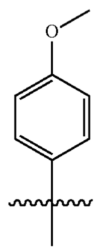 [SMILES: *c1ccc(OC)cc1] | H | H | 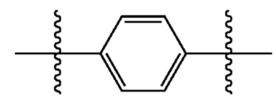 | 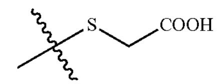 |
| 40 | 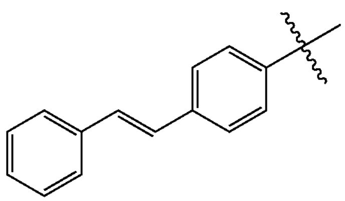 [SMILES: *c1ccc(/C=C/c2ccccc2)cc1] | 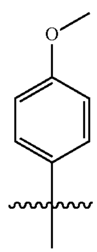 [SMILES: *c1ccc(OC)cc1] | H | H | 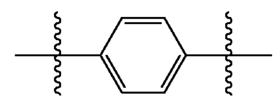 [SMILES: *c1ccc(*)cc1] | 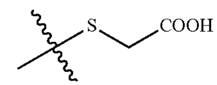 |

-continued
| Dye | $R_1$ | $R_2$ | $R_3$ | $R_4$ | Ar | 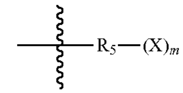 |
|---|---|---|---|---|---|---|
| 41 | 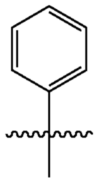 | 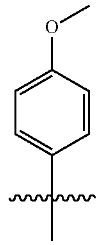 | H | H | 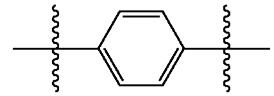 | 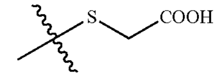 |
| 42 | 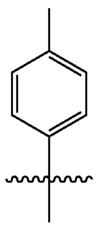 | 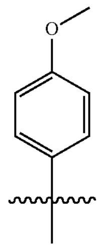 [SMILES: *c1ccc(OC)cc1] | H | H | 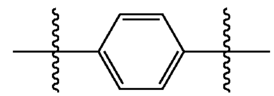 [SMILES: *c1ccc(*)cc1] | 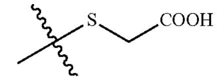 |
| 43 | 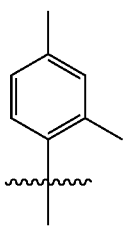 [SMILES: *c1ccc(C)cc1C] | 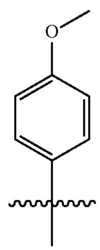 [SMILES: *c1ccc(OC)cc1] | H | H | 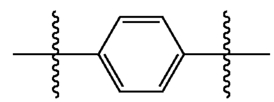 [SMILES: *c1ccc(*)cc1] | 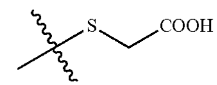 |

-continued
| Dye | $R_1$ | $R_2$ | $R_3$ | $R_4$ | Ar | 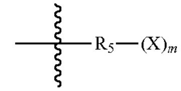 |
|---|---|---|---|---|---|---|
| 44 | 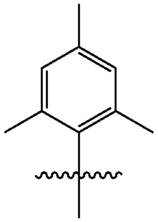 | 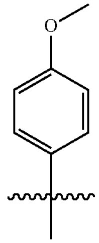 [SMILES: *c1ccc(OC)cc1] | H | H | 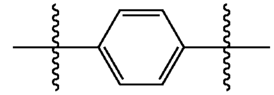 [SMILES: *c1ccc(*)cc1] | 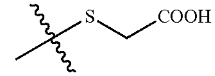 [SMILES: *SCC(=O)O] |
| 45 | 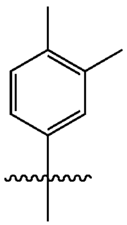 [SMILES: *c1ccc(C)c(C)c1] | 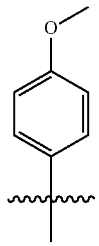 [SMILES: *c1ccc(OC)cc1] | H | H | 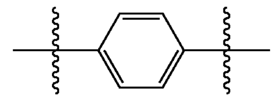 | 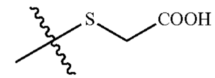 [SMILES: *SCC(=O)O] |
| 46 | 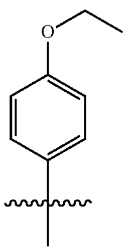 [SMILES: *c1ccc(OCC)cc1] | 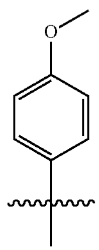 [SMILES: *c1ccc(OC)cc1] | H | H | 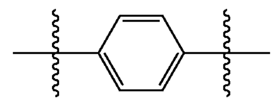 [SMILES: *c1ccc(*)cc1] | 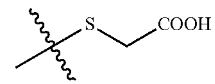 |

-continued
| Dye | $R_1$ | $R_2$ | $R_3$ | $R_4$ | Ar | $—R_5—(X)_m$ |
|---|---|---|---|---|---|---|
| 47 | 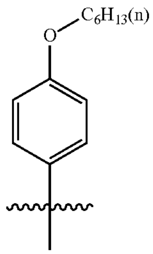 | 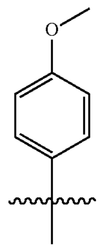 [SMILES: *c1ccc(OC)cc1] | H | H | 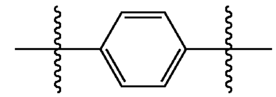 [SMILES: *c1ccc(*)cc1] | 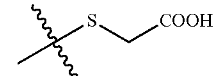 |
| 48 | 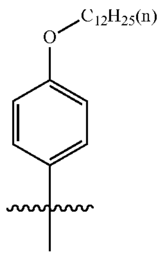 | 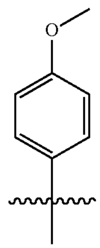 [SMILES: *c1ccc(OC)cc1] | H | H | 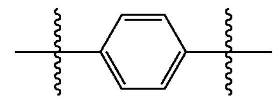 | 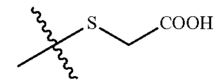 [SMILES: *SCC(=O)O] |
| 49 | 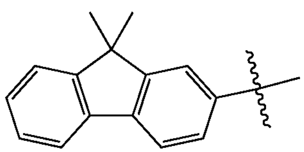 [SMILES: *c1ccc2c(c1)C(C)(C)c1ccccc1-2] | 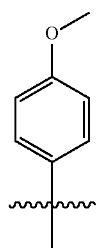 [SMILES: *c1ccc(OC)cc1] | H | H | 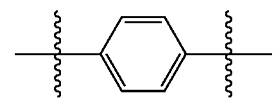 [SMILES: *c1ccc(*)cc1] | 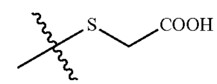 [SMILES: *SCC(=O)O] |

-continued
| Dye | $R_1$ | $R_2$ | $R_3$ | $R_4$ | Ar | $—R_5—(X)_m$ |
|---|---|---|---|---|---|---|
| 50 | 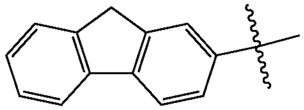 [SMILES: *c1ccc2c(c1)Cc1ccccc1-2] | 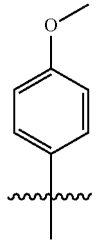 | H | H | 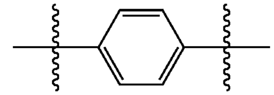 | 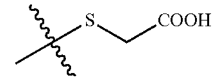 |
| 51 | 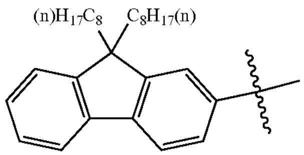 | 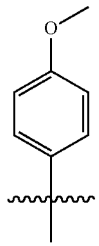 [SMILES: *c1ccc(OC)cc1] | H | H | 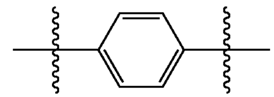 [SMILES: *c1ccc(*)cc1] | 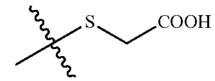 |
| 52 | 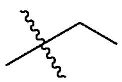 [SMILES: *CC] | 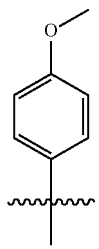 [SMILES: *c1ccc(OC)cc1] | H | H | 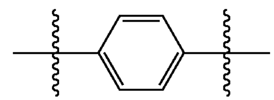 [SMILES: *c1ccc(*)cc1] | 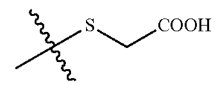 [SMILES: *SCC(=O)O] |

-continued
| Dye | $R_1$ | $R_2$ | $R_3$ | $R_4$ | Ar | 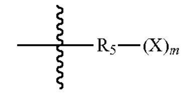 |
|---|---|---|---|---|---|---|
| 53 | 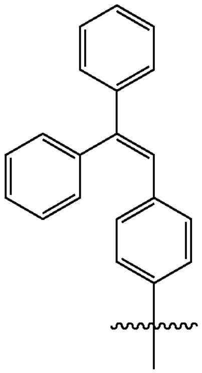 [SMILES: *c1ccc(C=C(c2ccccc2)c2ccccc2)cc1] | 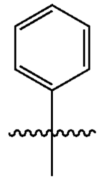 [SMILES: *c1ccccc1] | H | H | 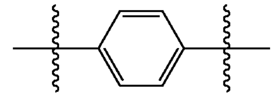 [SMILES: *c1ccc(*)cc1] | 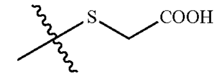 |
| 54 | 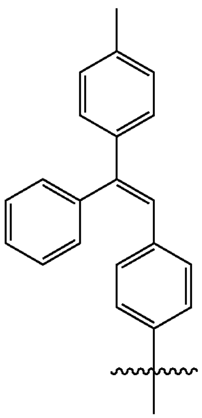 [SMILES: *c1ccc(/C=C(\c2ccccc2)c2ccc(C)cc2)cc1] | 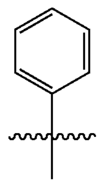 [SMILES: *c1ccccc1] | H | H | 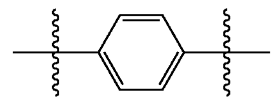 [SMILES: *c1ccc(*)cc1] | 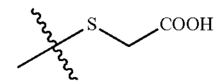 [SMILES: *SCC(=O)O] |

-continued
| Dye | $R_1$ | $R_2$ | $R_3$ | $R_4$ | Ar | 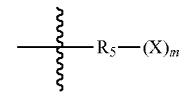 |
|---|---|---|---|---|---|---|
| 55 | 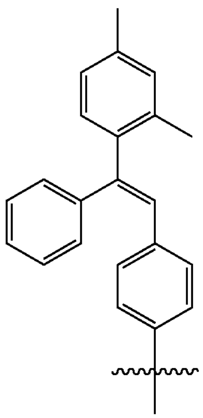 | 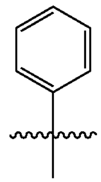 [SMILES: *c1ccccc1] | H | H | 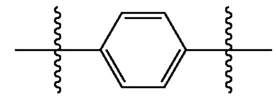 | 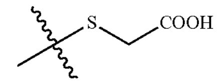 [SMILES: *SCC(=O)O] |
| 56 | 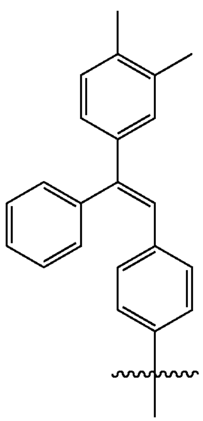 | 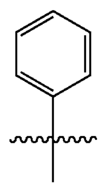 [SMILES: *c1ccccc1] | H | H | 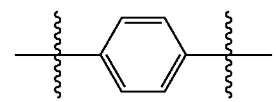 | 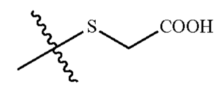 |

-continued
| Dye | $R_1$ | $R_2$ | $R_3$ | $R_4$ | Ar | $R_5—(X)_m$ |
|---|---|---|---|---|---|---|
| 57 | 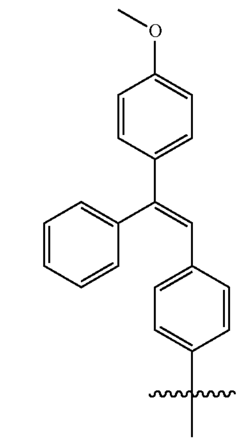 [SMILES: *c1ccc(/C=C(\c2ccccc2)c2ccc(OC)cc2)cc1] | 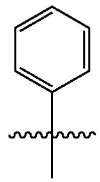 [SMILES: *c1ccccc1] | H | H | 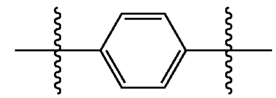 [SMILES: *c1ccc(*)cc1] | 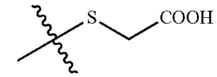 [SMILES: *SCC(=O)O] |
| 58 | 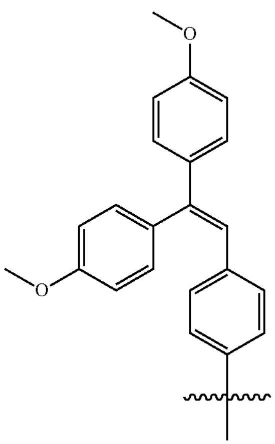 [SMILES: *c1ccc(C=C(c2ccc(OC)cc2)c2ccc(OC)cc2)cc1] | 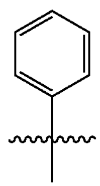 [SMILES: *c1ccccc1] | H | H | 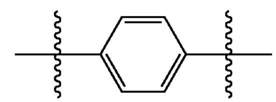 [SMILES: *c1ccc(*)cc1] | 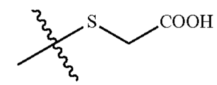 |

-continued
| Dye | $R_1$ | $R_2$ | $R_3$ | $R_4$ | Ar | 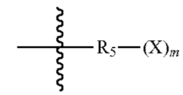 |
|---|---|---|---|---|---|---|
| 59 | 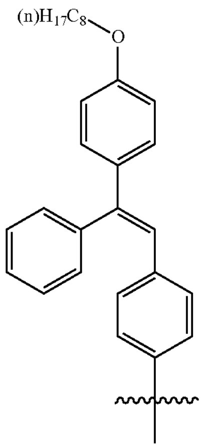 | 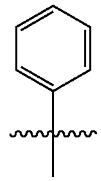 [SMILES: *c1ccccc1] | H | H | 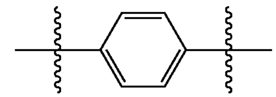 [SMILES: *c1ccc(*)cc1] | 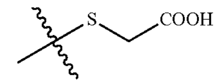 [SMILES: *SCC(=O)O] |
| 60 | 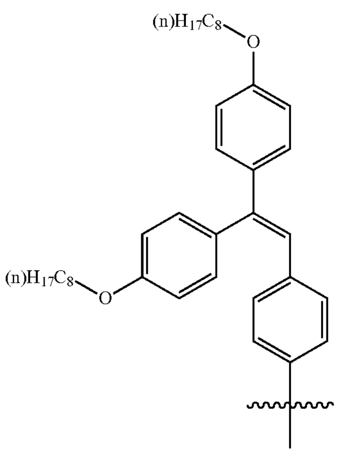 | 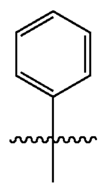 [SMILES: *c1ccccc1] | H | H | 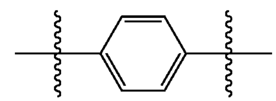 | 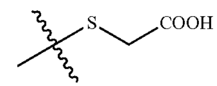 [SMILES: *SCC(=O)O] |

-continued
| Dye | $R_1$ | $R_2$ | $R_3$ | $R_4$ | Ar | $—R_5—(X)_m$ |
|---|---|---|---|---|---|---|
| 61 | 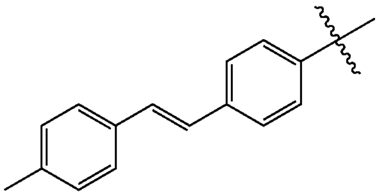 [SMILES: *c1ccc(/C=C/c2ccc(C)cc2)cc1] | 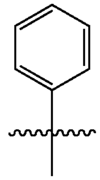 [SMILES: *c1ccccc1] | H | H | 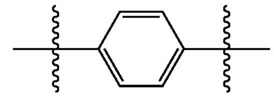 [SMILES: *c1ccc(*)cc1] | 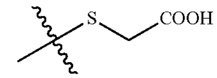 [SMILES: *SCC(=O)O] |
| 62 | 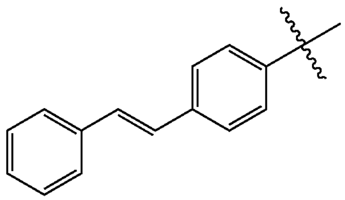 [SMILES: *c1ccc(/C=C/c2ccccc2)cc1] | 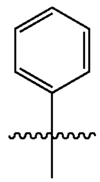 [SMILES: *c1ccccc1] | H | H | 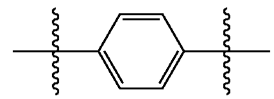 [SMILES: *c1ccc(*)cc1] | 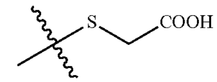 |
| 63 | 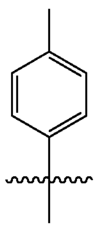 [SMILES: *c1ccc(C)cc1] | 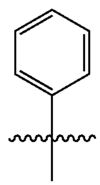 [SMILES: *c1ccccc1] | H | H | 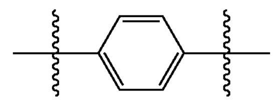 [SMILES: *c1ccc(*)cc1] | 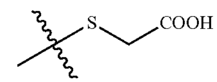 |
| 64 | 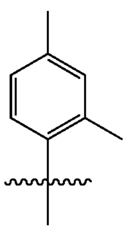 [SMILES: *c1ccc(C)cc1C] | 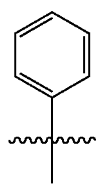 [SMILES: *c1ccccc1] | H | H | 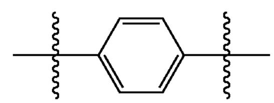 [SMILES: *c1ccc(*)cc1] | 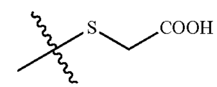 [SMILES: *SCC(=O)O] |

-continued
| Dye | $R_1$ | $R_2$ | $R_3$ | $R_4$ | Ar | $-R_5-(X)_m$ |
|---|---|---|---|---|---|---|
| 65 | 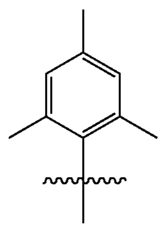 | 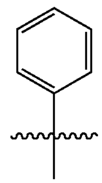 [SMILES: *c1ccccc1] | H | H | 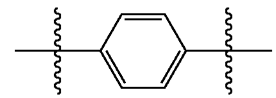 [SMILES: *c1ccc(*)cc1] | 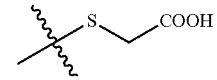 [SMILES: *SCC(=O)O] |
| 66 | 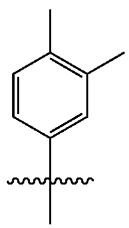 [SMILES: *c1ccc(C)c(C)c1] | 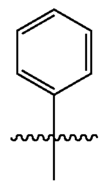 [SMILES: *c1ccccc1] | H | H | 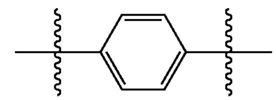 | 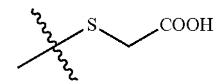 [SMILES: *SCC(=O)O] |
| 67 | 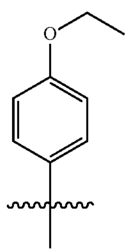 [SMILES: *c1ccc(OCC)cc1] | 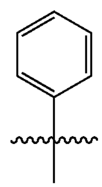 [SMILES: *c1ccccc1] | H | H | 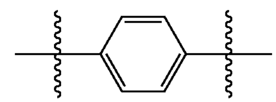 [SMILES: *c1ccc(*)cc1] | 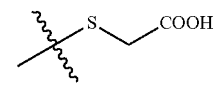 |
| 68 | 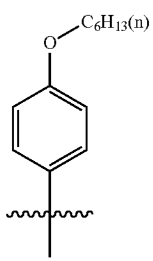 | 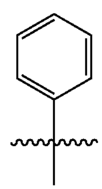 [SMILES: *c1ccccc1] | H | H | 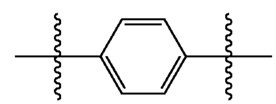 [SMILES: *c1ccc(*)cc1] | 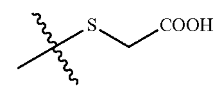 [SMILES: *SCC(=O)O] |

-continued
| Dye | $R_1$ | $R_2$ | $R_3$ | $R_4$ | Ar | 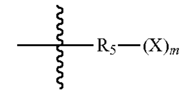 |
|---|---|---|---|---|---|---|
| 69 | 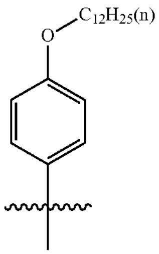 | 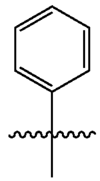 [SMILES: *c1ccccc1] | H | H | 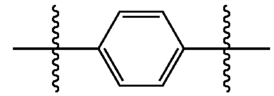 | 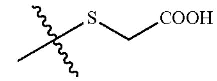 [SMILES: *SCC(=O)O] |
| 70 | 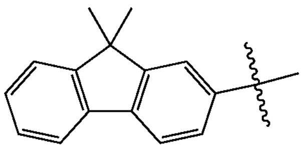 [SMILES: *c1ccc2c(c1)C(C)(C)c1ccccc1-2] | 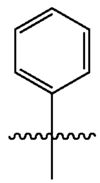 [SMILES: *c1ccccc1] | H | H | 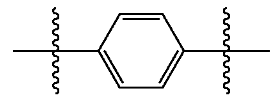 | 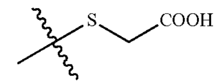 [SMILES: *SCC(=O)O] |
| 71 | 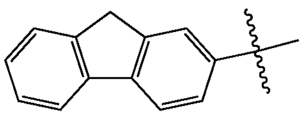 [SMILES: *c1ccc2c(c1)Cc1ccccc1-2] | 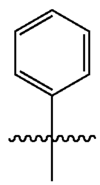 [SMILES: *c1ccccc1] | H | H | 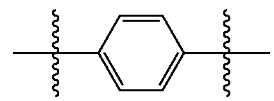 [SMILES: *c1ccc(*)cc1] | 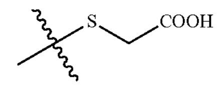 |
| 72 | 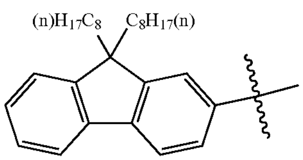 | 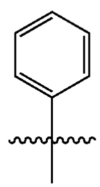 [SMILES: *c1ccccc1] | H | H | 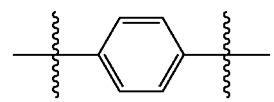 | 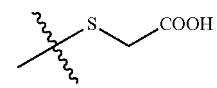 |

-continued
| Dye | $R_1$ | $R_2$ | $R_3$ | $R_4$ | Ar | 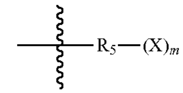 |
|---|---|---|---|---|---|---|
| 73 | 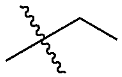 [SMILES: *CC] | 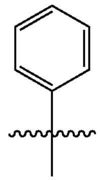 [SMILES: *c1ccccc1] | H | H | 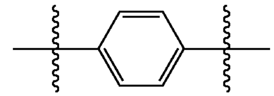 [SMILES: *c1ccc(*)cc1] | 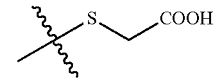 [SMILES: *SCC(=O)O] |
| 74 | 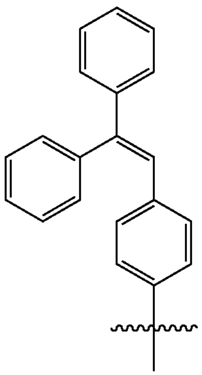 [SMILES: *c1ccc(C=C(c2ccccc2)c2ccccc2)cc1] | 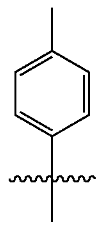 [SMILES: *c1ccc(C)cc1] | H | H | 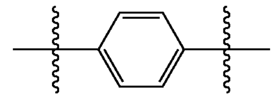 [SMILES: *c1ccc(*)cc1] | 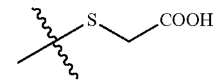 [SMILES: *SCC(=O)O] |
| 75 | 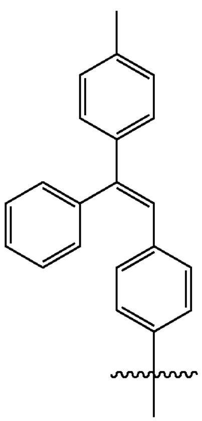 [SMILES: *c1ccc(/C=C(\c2ccccc2)c2ccc(C)cc2)cc1] | 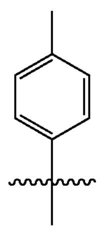 [SMILES: *c1ccc(C)cc1] | H | H | 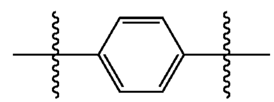 | 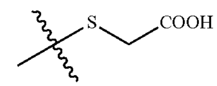 |

-continued
| Dye | $R_1$ | $R_2$ | $R_3$ | $R_4$ | Ar |  $R_5$—$(X)_m$ |
|---|---|---|---|---|---|---|
| 76 | 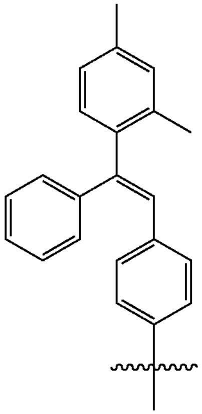 | 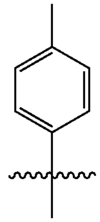 [SMILES: *c1ccc(C)cc1] | H | H | 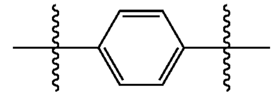 | 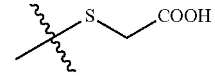 [SMILES: *SCC(=O)O] |
| 77 | 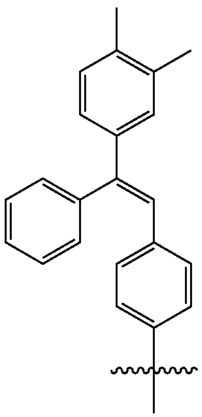 | 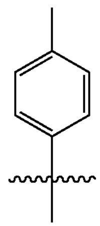 [SMILES: *c1ccc(C)cc1] | H | H | 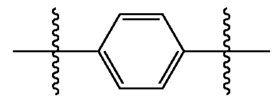 [SMILES: *c1ccc(*)cc1] | 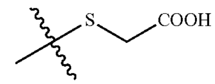 |

-continued
| Dye | $R_1$ | $R_2$ | $R_3$ | $R_4$ | Ar | 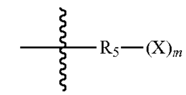 |
|---|---|---|---|---|---|---|
| 78 | 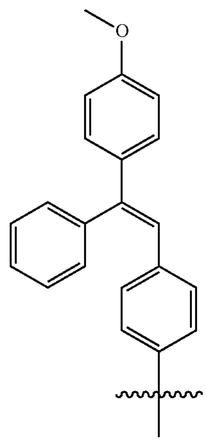 [SMILES: *c1ccc(/C=C(\c2ccccc2)c2ccc(OC)cc2)cc1] | 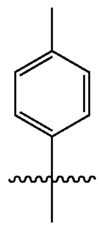 [SMILES: *c1ccc(C)cc1] | H | H | 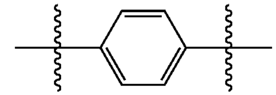 | 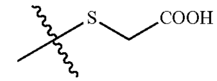 |
| 79 | 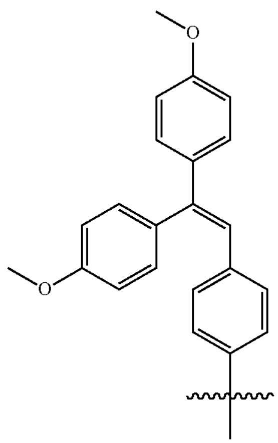 [SMILES: *c1ccc(C=C(c2ccc(OC)cc2)c2ccc(OC)cc2)cc1] | 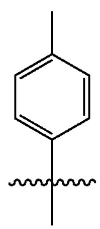 [SMILES: *c1ccc(C)cc1] | H | H | 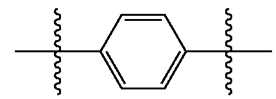 [SMILES: *c1ccc(*)cc1] | 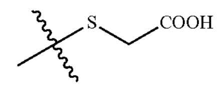 [SMILES: *SCC(=O)O] |

-continued
| Dye | $R_1$ | $R_2$ | $R_3$ | $R_4$ | Ar | $-R_5-(X)_m$ |
|---|---|---|---|---|---|---|
| 80 | 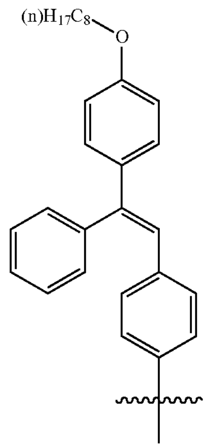 | 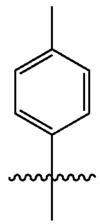 [SMILES: *c1ccc(C)cc1] | H | H | 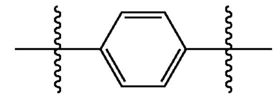 [SMILES: *c1ccc(*)cc1] | 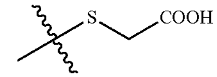 [SMILES: *SCC(=O)O] |
| 81 | 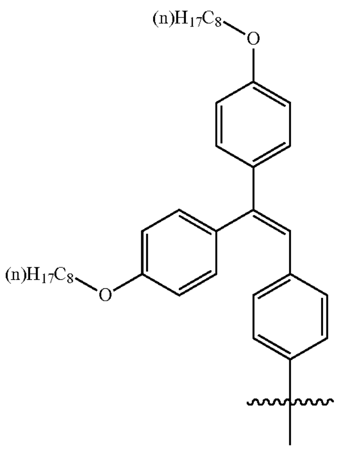 | 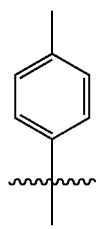 [SMILES: *c1ccc(C)cc1] | H | H | 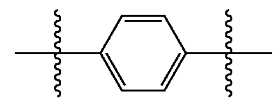 [SMILES: *c1ccc(*)cc1] | 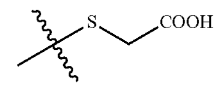 |

-continued
| Dye | $R_1$ | $R_2$ | $R_3$ | $R_4$ | Ar | 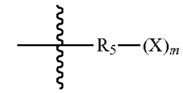 |
|---|---|---|---|---|---|---|
| 82 | 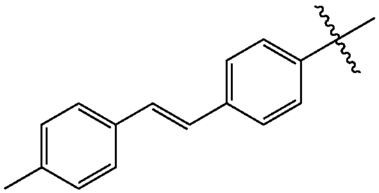 [SMILES: *c1ccc(/C=C/c2ccc(C)cc2)cc1] | 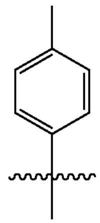 [SMILES: *c1ccc(C)cc1] | H | H | 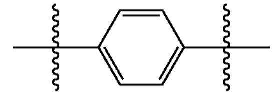 [SMILES: *c1ccc(*)cc1] | 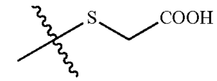 |
| 83 | 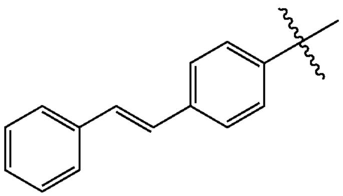 [SMILES: *c1ccc(/C=C/c2ccccc2)cc1] | 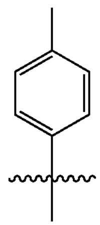 [SMILES: *c1ccc(C)cc1] | H | H | 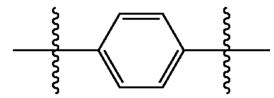 [SMILES: *c1ccc(*)cc1] | 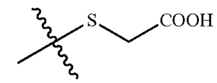 |
| 84 | 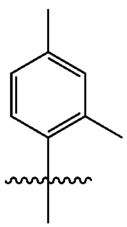 [SMILES: *c1ccc(C)cc1C] | 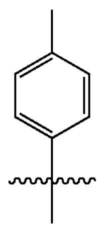 [SMILES: *c1ccc(C)cc1] | H | H | 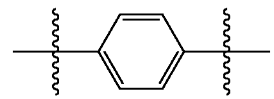 [SMILES: *c1ccc(*)cc1] | 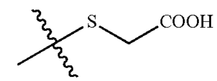 [SMILES: *SCC(=O)O] |
| 85 | 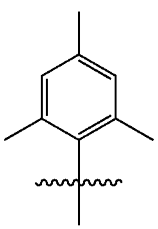 | 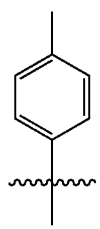 [SMILES: *c1ccc(C)cc1] | H | H | 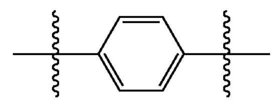 [SMILES: *c1ccc(*)cc1] | 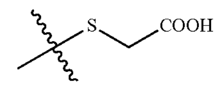 [SMILES: *SCC(=O)O] |

-continued
| Dye | $R_1$ | $R_2$ | $R_3$ | $R_4$ | Ar | 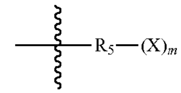 |
|---|---|---|---|---|---|---|
| 86 | 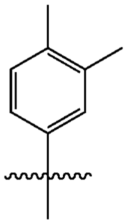 [SMILES: *c1ccc(C)c(C)c1] | 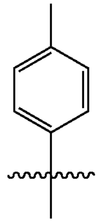 [SMILES: *c1ccc(C)cc1] | H | H | 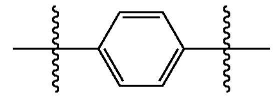 [SMILES: *c1ccc(*)cc1] | 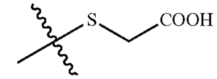 [SMILES: *SCC(=O)O] |
| 87 | 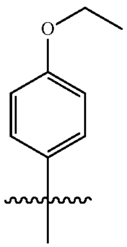 [SMILES: *c1ccc(OCC)cc1] | 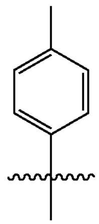 [SMILES: *c1ccc(C)cc1] | H | H | 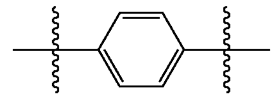 | 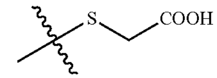 [SMILES: *SCC(=O)O] |
| 88 | 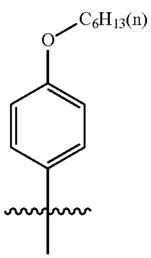 | 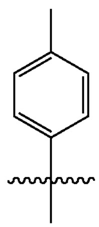 [SMILES: *c1ccc(C)cc1] | H | H | 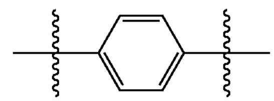 [SMILES: *c1ccc(*)cc1] | 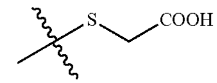 [SMILES: *SCC(=O)O] |
| 89 | 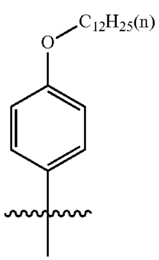 | 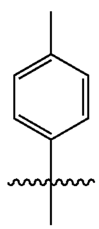 [SMILES: *c1ccc(C)cc1] | H | H | 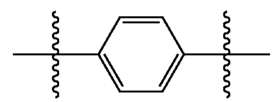 [SMILES: *c1ccc(*)cc1] | 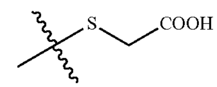 |

-continued
| Dye | $R_1$ | $R_2$ | $R_3$ | $R_4$ | Ar |  $R_5$—$(X)_m$ |
|---|---|---|---|---|---|---|
| 90 | 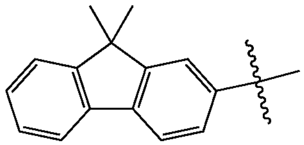 [SMILES: *c1ccc2c(c1)C(C)(C)c1ccccc1-2] | 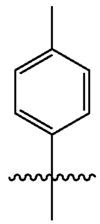 [SMILES: *c1ccc(C)cc1] | H | H | 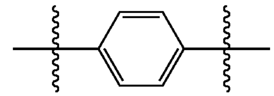 | 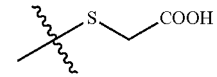 |
| 91 | 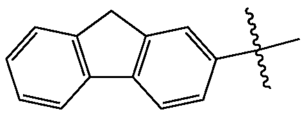 [SMILES: *c1ccc2c(c1)Cc1ccccc1-2] | 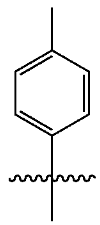 [SMILES: *c1ccc(C)cc1] | H | H | 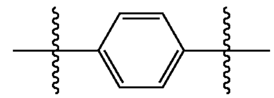 | 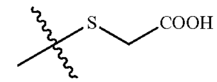 [SMILES: *SCC(=O)O] |
| 92 | 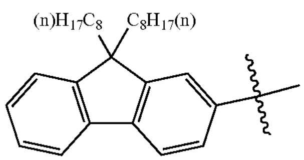 | 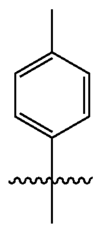 | H | H | 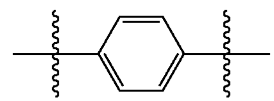 [SMILES: *c1ccc(*)cc1] | 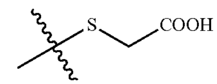 [SMILES: *SCC(=O)O] |
| 93 | 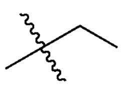 [SMILES: *CC] | 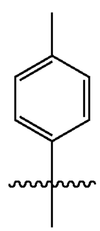 [SMILES: *c1ccc(C)cc1] | H | H | 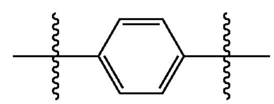 [SMILES: *c1ccc(*)cc1] | 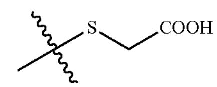 [SMILES: *SCC(=O)O] |

-continued
| Dye | $R_1$ | $R_2$ | $R_3$ | $R_4$ | Ar | 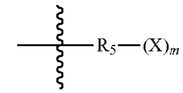 |
|---|---|---|---|---|---|---|
| 94 | 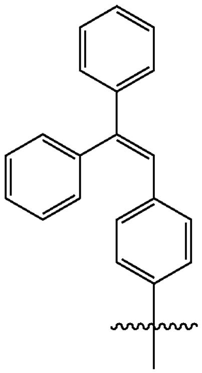 [SMILES: *c1ccc(C=C(c2ccccc2)c2ccccc2)cc1] | 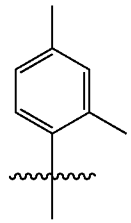 [SMILES: *c1ccc(C)cc1C] | H | H | 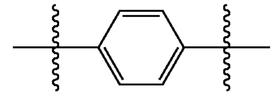 [SMILES: *c1ccc(*)cc1] | 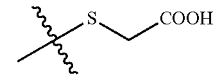 [SMILES: *SCC(=O)O] |
| 95 | 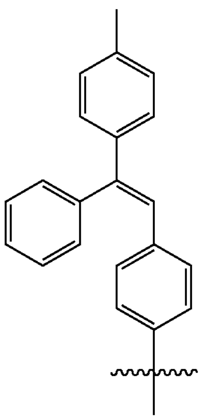 [SMILES: *c1ccc(/C=C(\c2ccccc2)c2ccc(C)cc2)cc1] | 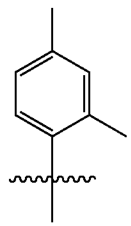 [SMILES: *c1ccc(C)cc1C] | H | H | 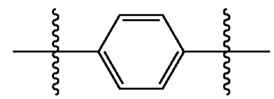 | 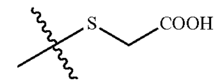 |

-continued
| Dye | $R_1$ | $R_2$ | $R_3$ | $R_4$ | Ar | 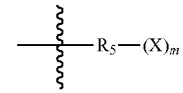 |
|---|---|---|---|---|---|---|
| 96 | 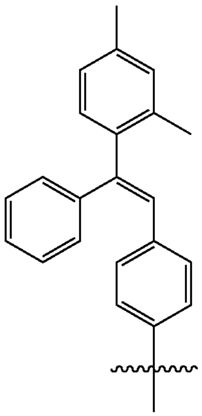 | 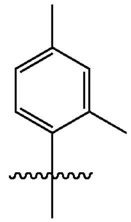 [SMILES: *c1ccc(C)cc1C] | H | H | 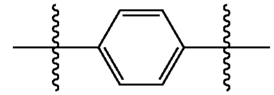 [SMILES: *c1ccc(*)cc1] | 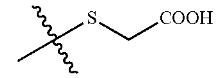 [SMILES: *SCC(=O)O] |
| 97 | 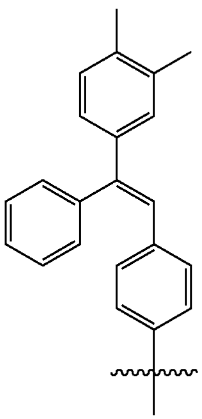 | 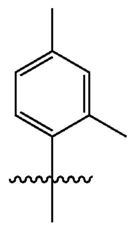 [SMILES: *c1ccc(C)cc1C] | H | H | 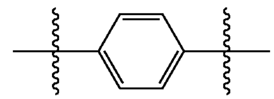 [SMILES: *c1ccc(*)cc1] | 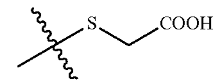 |

-continued
| Dye | $R_1$ | $R_2$ | $R_3$ | $R_4$ | Ar | 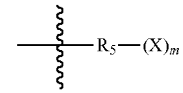 |
|---|---|---|---|---|---|---|
| 98 | 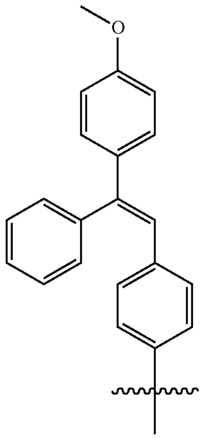 [SMILES: *c1ccc(/C=C(\c2ccccc2)c2ccc(OC)cc2)cc1] | 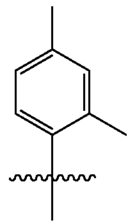 [SMILES: *c1ccc(C)cc1C] | H | H | 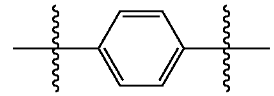 [SMILES: *c1ccc(*)cc1] | 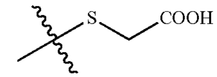 [SMILES: *SCC(=O)O] |
| 99 | 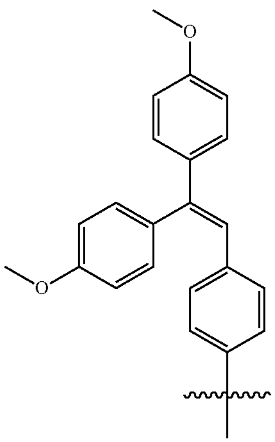 [SMILES: *c1ccc(C=C(c2ccc(OC)cc2)c2ccc(OC)cc2)cc1] | 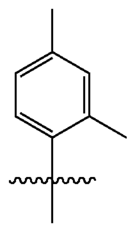 [SMILES: *c1ccc(C)cc1C] | H | H | 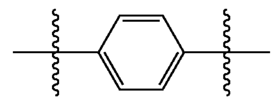 | 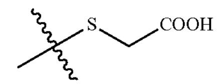 [SMILES: *SCC(=O)O] |

-continued
| Dye | $R_1$ | $R_2$ | $R_3$ | $R_4$ | Ar | $R_5$—$(X)_m$ |
|---|---|---|---|---|---|---|
| 100 | 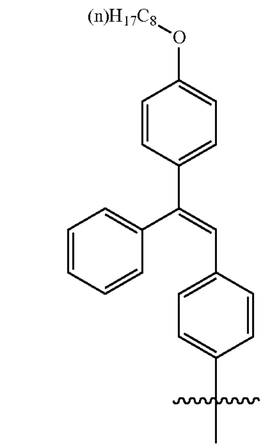 | 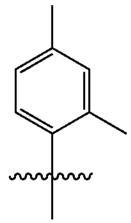 [SMILES: *c1ccc(C)cc1C] | H | H | 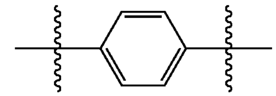 [SMILES: *c1ccc(*)cc1] | 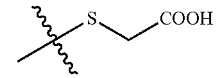 [SMILES: *SCC(=O)O] |
| 101 | 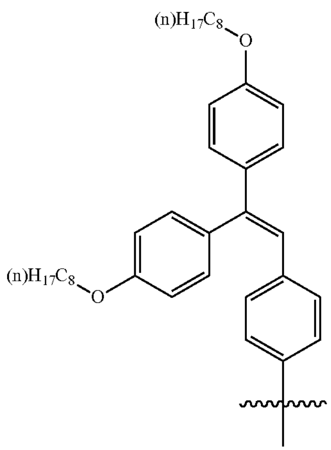 | 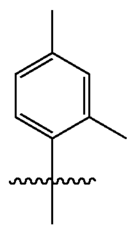 [SMILES: *c1ccc(C)cc1C] | H | H | 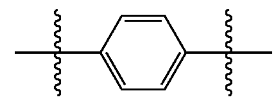 [SMILES: *c1ccc(*)cc1] | 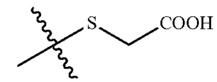 [SMILES: *SCC(=O)O] |

-continued
| Dye | $R_1$ | $R_2$ | $R_3$ | $R_4$ | Ar | 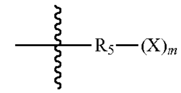 |
|---|---|---|---|---|---|---|
| 102 | 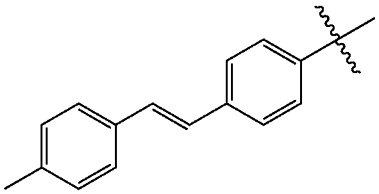 [SMILES: *c1ccc(/C=C/c2ccc(C)cc2)cc1] | 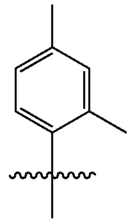 [SMILES: *c1ccc(C)cc1C] | H | H | 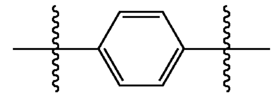 [SMILES: *c1ccc(*)cc1] | 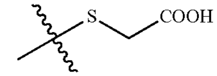 |
| 103 | 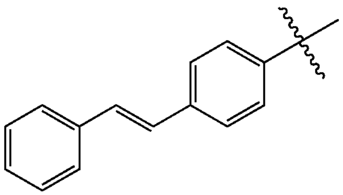 [SMILES: *c1ccc(/C=C/c2ccccc2)cc1] | 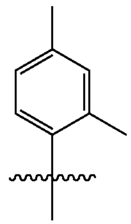 [SMILES: *c1ccc(C)cc1C] | H | H | 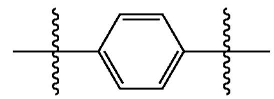 [SMILES: *c1ccc(*)cc1] | 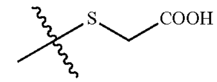 |
| 104 | 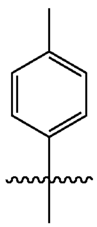 [SMILES: *c1ccc(C)cc1] | 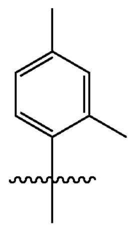 [SMILES: *c1ccc(C)cc1C] | H | H | 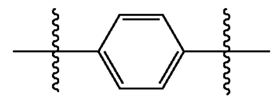 [SMILES: *c1ccc(*)cc1] | 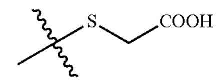 [SMILES: *SCC(=O)O] |
| 105 | 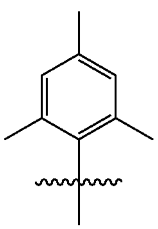 | 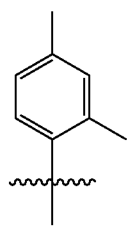 [SMILES: *c1ccc(C)cc1C] | H | H | 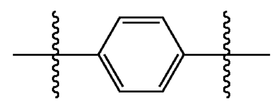 [SMILES: *c1ccc(*)cc1] | 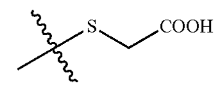 [SMILES: *SCC(=O)O] |

-continued
| Dye | $R_1$ | $R_2$ | $R_3$ | $R_4$ | Ar | 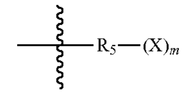 |
|---|---|---|---|---|---|---|
| 106 | 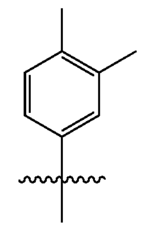 [SMILES: *c1ccc(C)c(C)c1] | 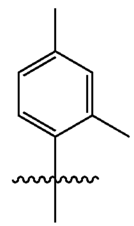 [SMILES: *c1ccc(C)cc1C] | H | H | 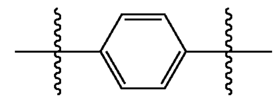 | 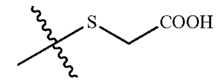 [SMILES: *SCC(=O)O] |
| 107 | 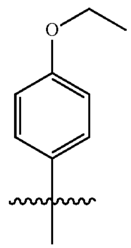 [SMILES: *c1ccc(OCC)cc1] | 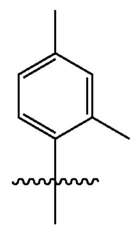 [SMILES: *c1ccc(C)cc1C] | H | H | 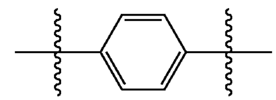 [SMILES: *c1ccc(*)cc1] | 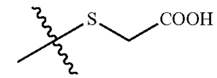 [SMILES: *SCC(=O)O] |
| 108 | 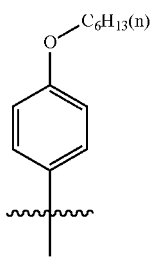 | 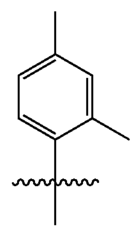 [SMILES: *c1ccc(C)cc1C] | H | H | 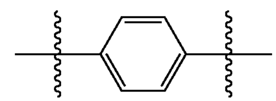 | 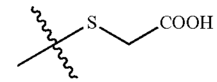 [SMILES: *SCC(=O)O] |
| 109 | 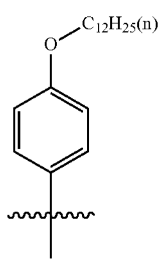 | 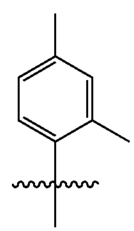 [SMILES: *c1ccc(C)cc1C] | H | H | 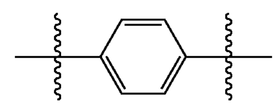 [SMILES: *c1ccc(*)cc1] | 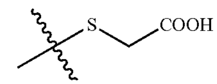 [SMILES: *SCC(=O)O] |

-continued
| Dye | $R_1$ | $R_2$ | $R_3$ | $R_4$ | Ar | 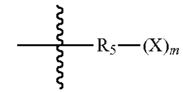 |
|---|---|---|---|---|---|---|
| 110 | 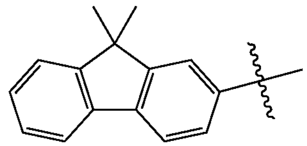 [SMILES: *c1ccc2c(c1)C(C)(C)c1ccccc1-2] | 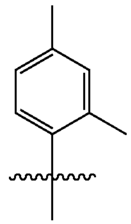 [SMILES: *c1ccc(C)cc1C] | H | H | 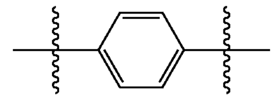 [SMILES: *c1ccc(*)cc1] | 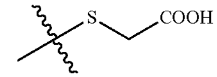 [SMILES: *SCC(=O)O] |
| 111 | 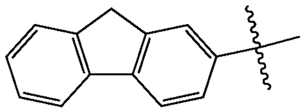 [SMILES: *c1ccc2c(c1)Cc1ccccc1-2] | 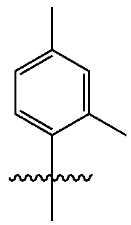 [SMILES: *c1ccc(C)cc1C] | H | H | 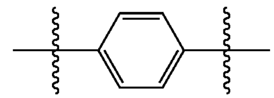 | 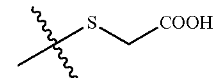 [SMILES: *SCC(=O)O] |
| 112 | 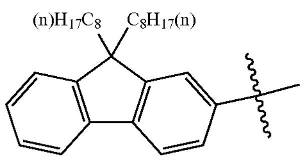 | 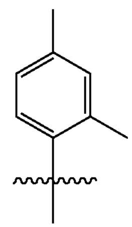 [SMILES: *c1ccc(C)cc1C] | H | H | 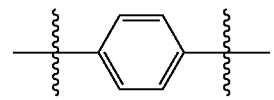 [SMILES: *c1ccc(*)cc1] | 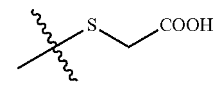 |
| 113 | 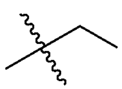 | 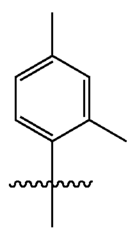 [SMILES: *c1ccc(C)cc1C] | H | H | 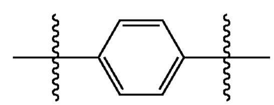 [SMILES: *c1ccc(*)cc1] | 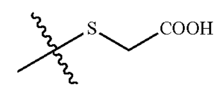 |

-continued
| Dye | $R_1$ | $R_2$ | $R_3$ | $R_4$ | Ar | $—R_5—(X)_m$ |
|---|---|---|---|---|---|---|
| 114 | 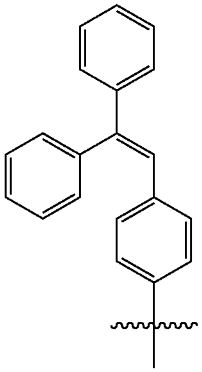 [SMILES: *c1ccc(C=C(c2ccccc2)c2ccccc2)cc1] | 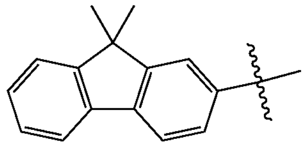 [SMILES: *c1ccc2c(c1)C(C)(C)c1ccccc1-2] | H | H | 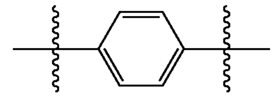 [SMILES: *c1ccc(*)cc1] | 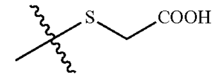 |
| 115 | 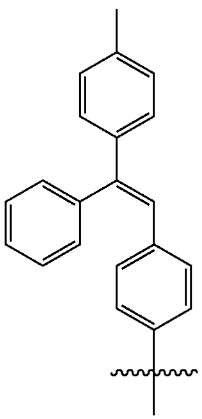 [SMILES: *c1ccc(/C=C(\c2ccccc2)c2ccc(C)cc2)cc1] | 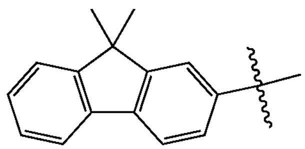 [SMILES: *c1ccc2c(c1)C(C)(C)c1ccccc1-2] | H | H | 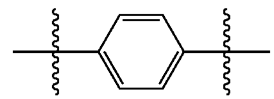 | 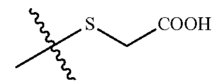 |

-continued
| Dye | $R_1$ | $R_2$ | $R_3$ | $R_4$ | Ar | 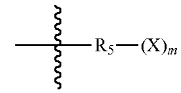  |
|---|---|---|---|---|---|---|
| 116 | 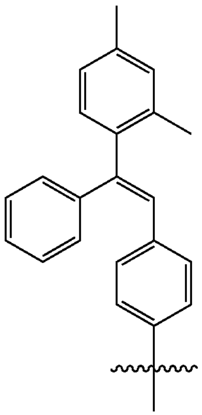 | 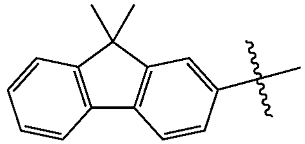 [SMILES: *c1ccc2c(c1)C(C)(C)c1ccccc1-2] | H | H | 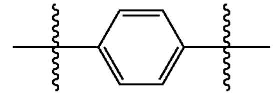 | 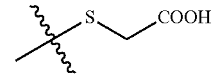 [SMILES: *SCC(=O)O]  |
| 117 | 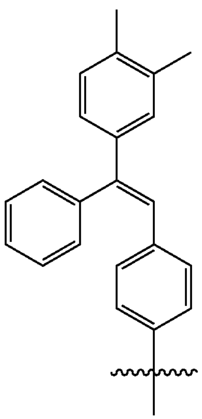 | 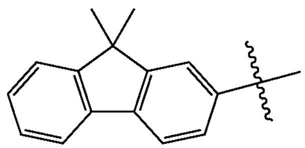 [SMILES: *c1ccc2c(c1)C(C)(C)c1ccccc1-2] | H | H | 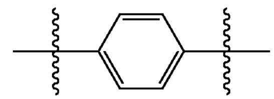 | 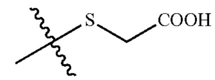  |

-continued
| Dye | $R_1$ | $R_2$ | $R_3$ | $R_4$ | Ar | 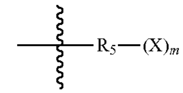 |
|---|---|---|---|---|---|---|
| 118 | 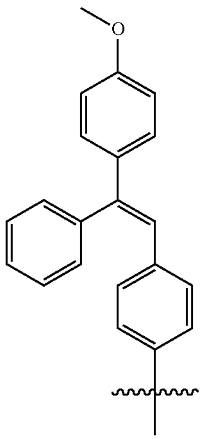 [SMILES: *c1ccc(/C=C(\c2ccccc2)c2ccc(OC)cc2)cc1] | 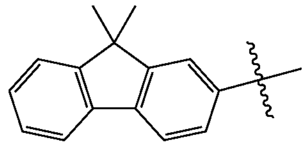 [SMILES: *c1ccc2c(c1)C(C)(C)c1ccccc1-2] | H | H | 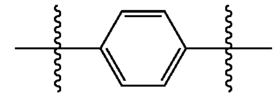 [SMILES: *c1ccc(*)cc1] | 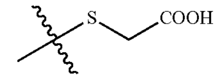 [SMILES: *SCC(=O)O] |
| 119 | 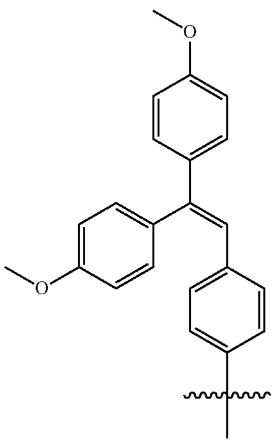 [SMILES: *c1ccc(C=C(c2ccc(OC)cc2)c2ccc(OC)cc2)cc1] | 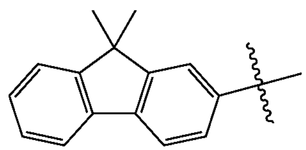 [SMILES: *c1ccc2c(c1)C(C)(C)c1ccccc1-2] | H | H | 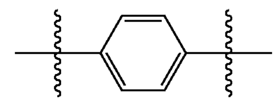 | 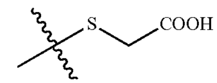 [SMILES: *SCC(=O)O] |

-continued
| Dye | $R_1$ | $R_2$ | $R_3$ | $R_4$ | Ar | 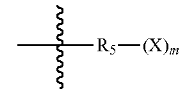 |
|---|---|---|---|---|---|---|
| 120 | 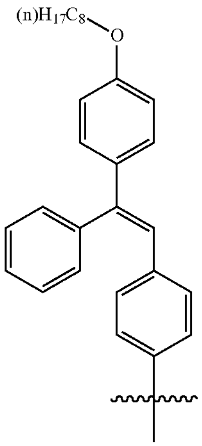 | 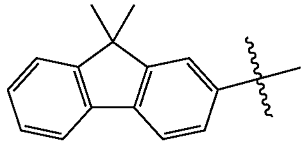 [SMILES: *c1ccc2c(c1)C(C)(C)c1ccccc1-2] | H | H | 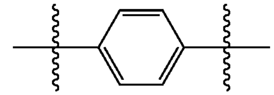 [SMILES: *c1ccc(*)cc1] | 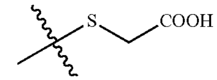 |
| 121 | 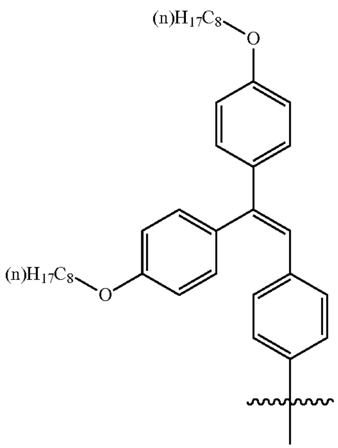 | 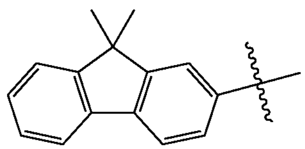 [SMILES: *c1ccc2c(c1)C(C)(C)c1ccccc1-2] | H | H | 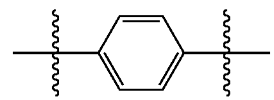 [SMILES: *c1ccc(*)cc1] | 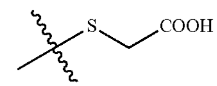 |

-continued
| Dye | $R_1$ | $R_2$ | $R_3$ | $R_4$ | Ar | —$R_5$—$(X)_m$ |
|---|---|---|---|---|---|---|
| 122 | 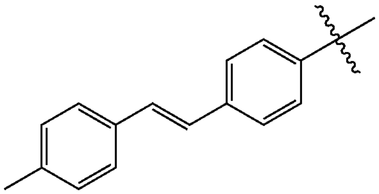 [SMILES: *c1ccc(/C=C/c2ccc(C)cc2)cc1] | 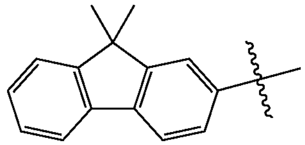 [SMILES: *c1ccc2c(c1)C(C)(C)c1ccccc1-2] | H | H | 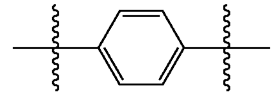 [SMILES: *c1ccc(*)cc1] | 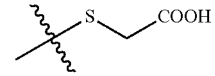 |
| 123 | 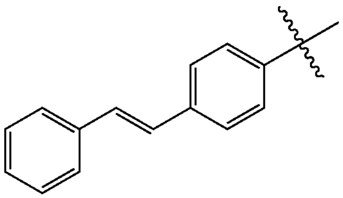 [SMILES: *c1ccc(/C=C/c2ccccc2)cc1] | 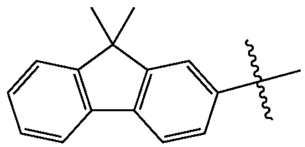 [SMILES: *c1ccc2c(c1)C(C)(C)c1ccccc1-2] | H | H | 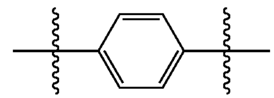 [SMILES: *c1ccc(*)cc1] | 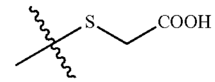 |
| 124 | 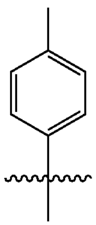 [SMILES: *c1ccc(C)cc1] | 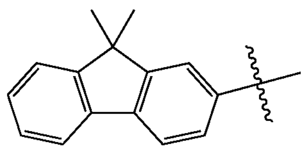 [SMILES: *c1ccc2c(c1)C(C)(C)c1ccccc1-2] | H | H | 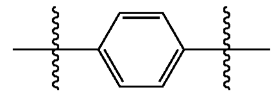 | 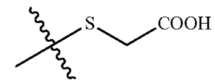 |
| 125 | 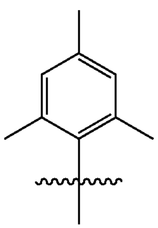 | 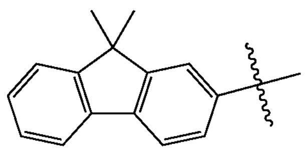 [SMILES: *c1ccc2c(c1)C(C)(C)c1ccccc1-2] | H | H | 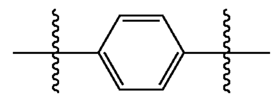 | 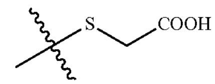 |

-continued
| Dye | $R_1$ | $R_2$ | $R_3$ | $R_4$ | Ar | $-R_5-(X)_m$ |
|---|---|---|---|---|---|---|
| 126 | 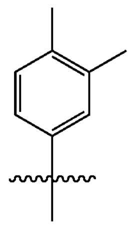 [SMILES: *c1ccc(C)c(C)c1] | 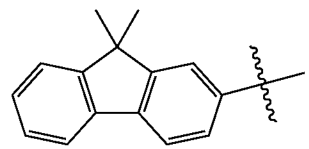 [SMILES: *c1ccc2c(c1)C(C)(C)c1ccccc1-2] | H | H | 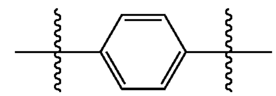 | 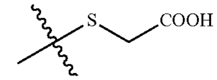 |
| 127 | 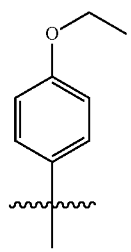 [SMILES: *c1ccc(OCC)cc1] | 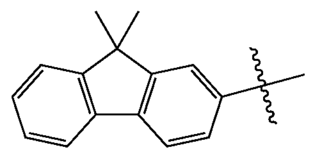 [SMILES: *c1ccc2c(c1)C(C)(C)c1ccccc1-2] | H | H | 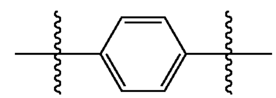 | 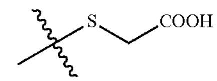 |
| 128 | 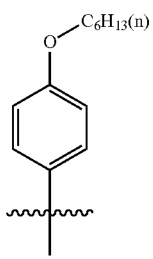 | 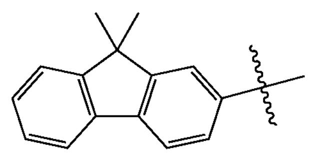 [SMILES: *c1ccc2c(c1)C(C)(C)c1ccccc1-2] | H | H | 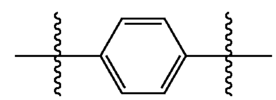 | 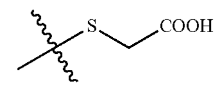 [SMILES: *SCC(=O)O] |
| 129 | 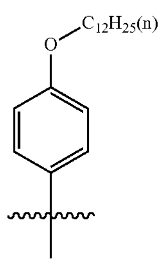 | 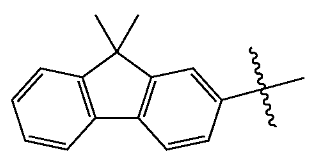 [SMILES: *c1ccc2c(c1)C(C)(C)c1ccccc1-2] | H | H | 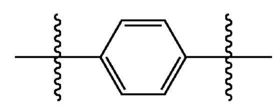 [SMILES: *c1ccc(*)cc1] | 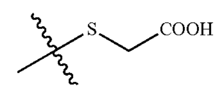 |

-continued
| Dye | $R_1$ | $R_2$ | $R_3$ | $R_4$ | Ar |  $R_5$—$(X)_m$ |
| --- | --- | --- | --- | --- | --- | --- |
| 130 | 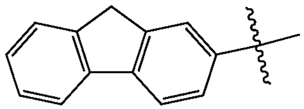 [SMILES: *c1ccc2c(c1)Cc1ccccc1-2] | 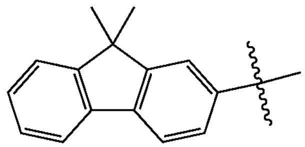 [SMILES: *c1ccc2c(c1)C(C)(C)c1ccccc1-2] | H | H | 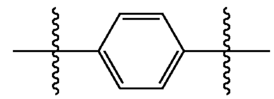 [SMILES: *c1ccc(*)cc1] | 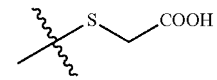 |
| 131 | 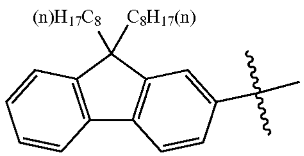 | 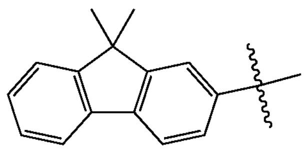 [SMILES: *c1ccc2c(c1)C(C)(C)c1ccccc1-2] | H | H | 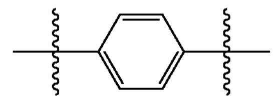 [SMILES: *c1ccc(*)cc1] | 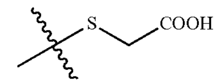 [SMILES: *SCC(=O)O] |
| 132 | 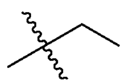 | 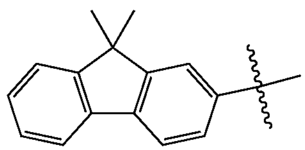 [SMILES: *c1ccc2c(c1)C(C)(C)c1ccccc1-2] | H | H | 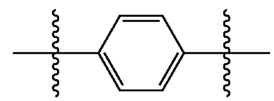 [SMILES: *c1ccc(*)cc1] | 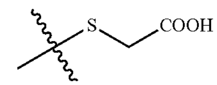 |
| 133 | 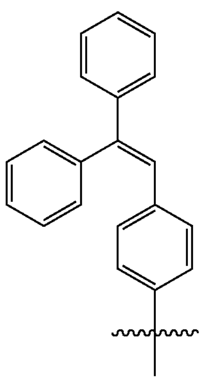 [SMILES: *c1ccc(C=C(c2ccccc2)c2ccccc2)cc1] | 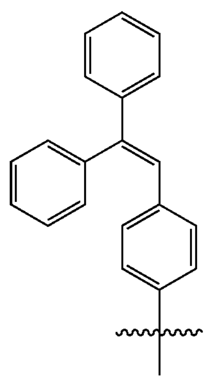 [SMILES: *c1ccc(C=C(c2ccccc2)c2ccccc2)cc1] | H | H | 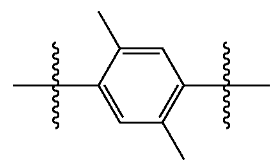 [SMILES: *c1cc(C)c(*)cc1C] | 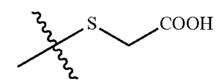 |

-continued
| Dye | $R_1$ | $R_2$ | $R_3$ | $R_4$ | Ar | —$R_5$—$(X)_m$ |
|---|---|---|---|---|---|---|
| 134 | 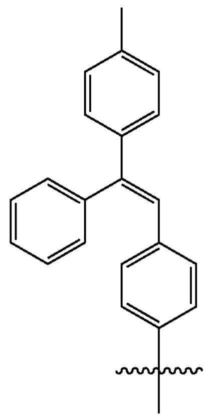 [SMILES: *c1ccc(/C=C(\c2ccccc2)c2ccc(C)cc2)cc1] | 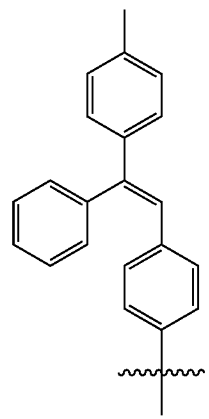 [SMILES: *c1ccc(/C=C(\c2ccccc2)c2ccc(C)cc2)cc1] | H | H | 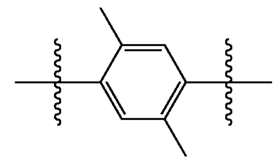 [SMILES: *c1cc(C)c(*)cc1C] | 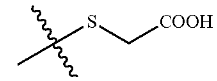 |
| 135 | 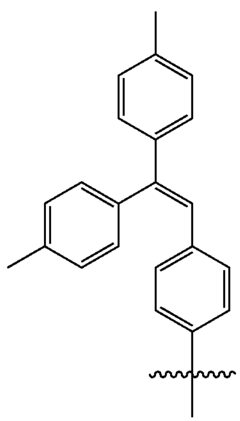 [SMILES: *c1ccc(C=C(c2ccc(C)cc2)c2ccc(C)cc2)cc1] | 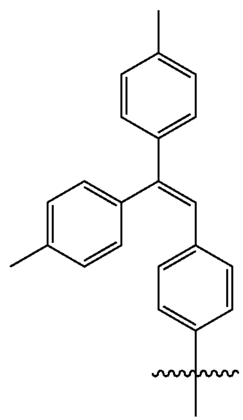 [SMILES: *c1ccc(C=C(c2ccc(C)cc2)c2ccc(C)cc2)cc1] | H | H | 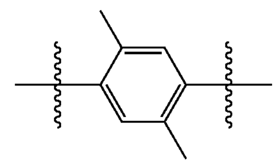 [SMILES: *c1cc(C)c(*)cc1C] | 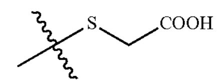 |

-continued
| Dye | $R_1$ | $R_2$ | $R_3$ | $R_4$ | Ar | 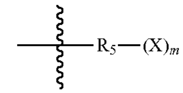  |
|---|---|---|---|---|---|---|
| 136 | 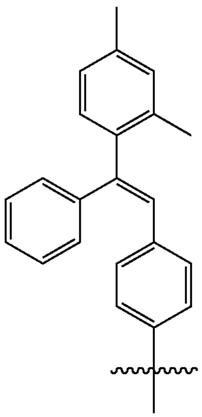 [SMILES: *c1ccc(/C=C(\c2ccccc2)c2ccc(C)cc2C)cc1] | 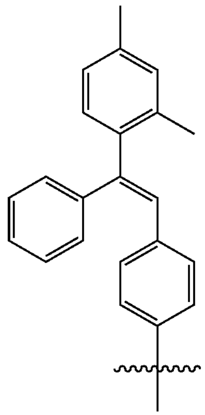 | H | H | 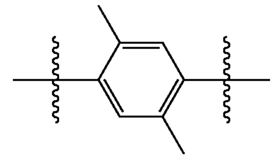 [SMILES: *c1cc(C)c(*)cc1C] | 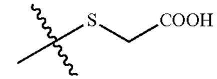  |
| 137 | 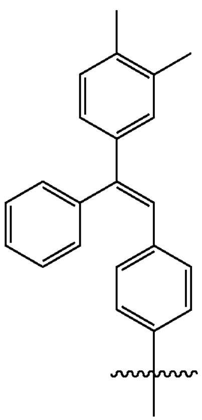 [SMILES: *c1ccc(/C=C(\c2ccccc2)c2ccc(C)c(C)c2)cc1] | 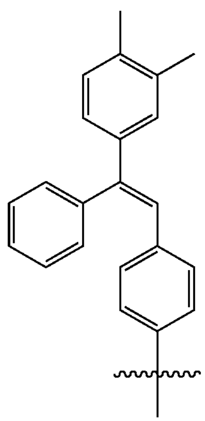 | H | H | 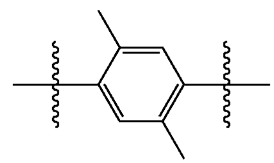 [SMILES: *c1cc(C)c(*)cc1C] | 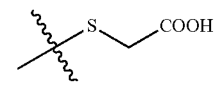 [SMILES: *SCC(=O)O]  |

-continued
| Dye | $R_1$ | $R_2$ | $R_3$ | $R_4$ | Ar | $R_5$—$(X)_m$ |
|---|---|---|---|---|---|---|
| 138 | 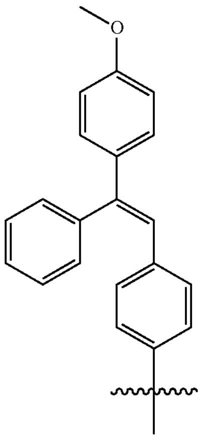 [SMILES: *c1ccc(/C=C(\c2ccccc2)c2ccc(OC)cc2)cc1] | 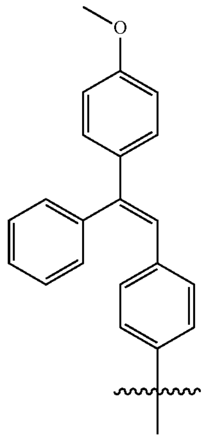 [SMILES: *c1ccc(/C=C(\c2ccccc2)c2ccc(OC)cc2)cc1] | H | H | 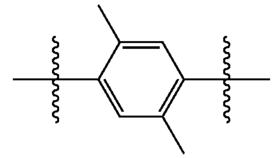 [SMILES: *c1cc(C)c(*)cc1C] | 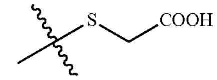 |
| 139 | 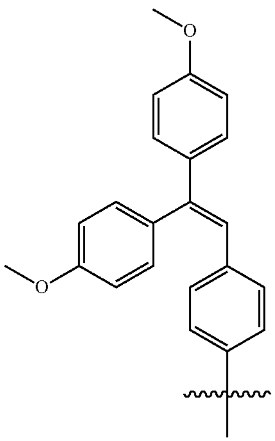 [SMILES: *c1ccc(C=C(c2ccc(OC)cc2)c2ccc(OC)cc2)cc1] | 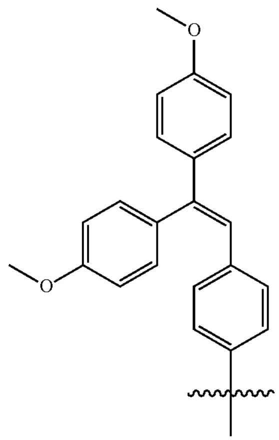 [SMILES: *c1ccc(C=C(c2ccc(OC)cc2)c2ccc(OC)cc2)cc1] | H | H | 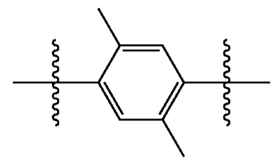 [SMILES: *c1cc(C)c(*)cc1C] | 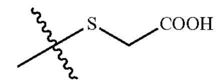 [SMILES: *SCC(=O)O] |

-continued
| Dye | $R_1$ | $R_2$ | $R_3$ | $R_4$ | Ar | 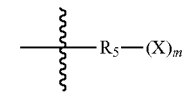 |
|---|---|---|---|---|---|---|
| 140 | 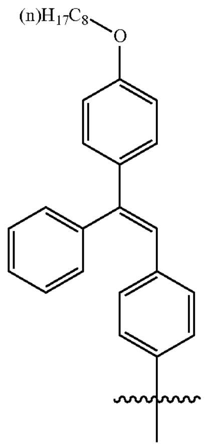 | 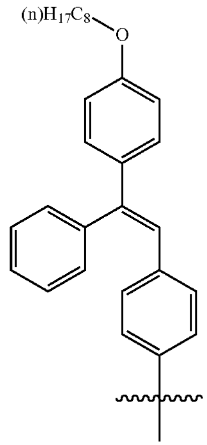 | H | H | 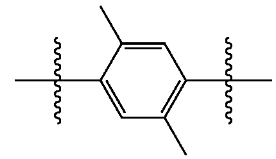 [SMILES: *c1cc(C)c(*)cc1C] | 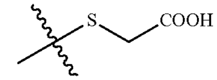 |
| 141 | 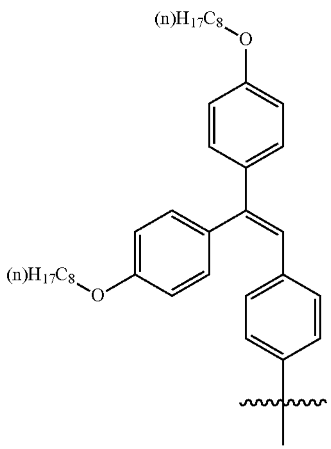 | 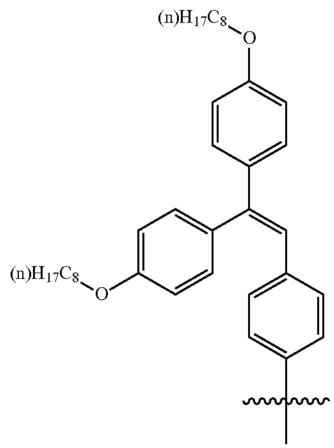 | H | H | 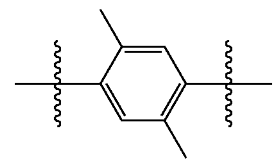 [SMILES: *c1cc(C)c(*)cc1C] | 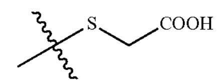 |

-continued
| Dye | $R_1$ | $R_2$ | $R_3$ | $R_4$ | Ar | 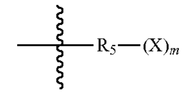 |
|---|---|---|---|---|---|---|
| 142 | 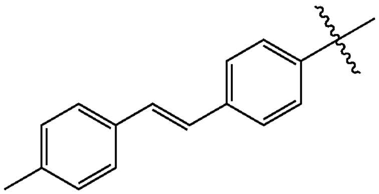 [SMILES: *c1ccc(/C=C/c2ccc(C)cc2)cc1] | 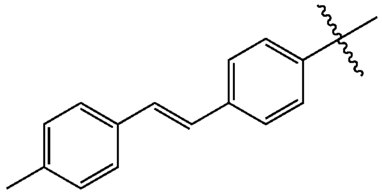 [SMILES: *c1ccc(/C=C/c2ccc(C)cc2)cc1] | H | H | 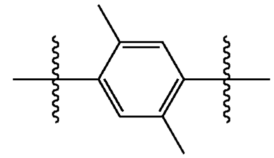 [SMILES: *c1cc(C)c(*)cc1C] | 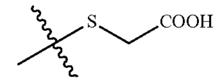 |
| 143 | 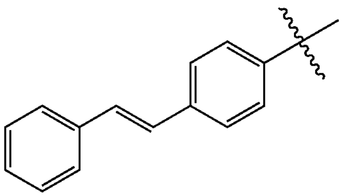 [SMILES: *c1ccc(/C=C/c2ccccc2)cc1] | 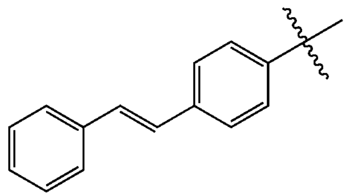 [SMILES: *c1ccc(/C=C/c2ccccc2)cc1] | H | H | 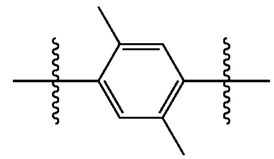 [SMILES: *c1cc(C)c(*)cc1C] | 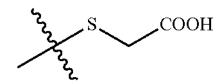 [SMILES: *SCC(=O)O] |
| 144 | 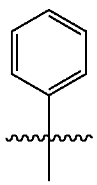 [SMILES: *c1ccccc1] | 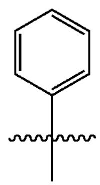 | H | H | 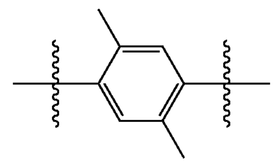 [SMILES: *c1cc(C)c(*)cc1C] | 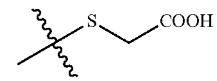 |
| 145 | 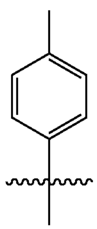 [SMILES: *c1ccc(C)cc1] | 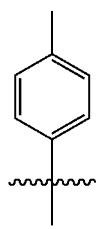 | H | H | 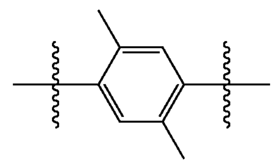 [SMILES: *c1cc(C)c(*)cc1C] | 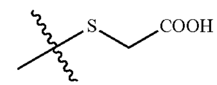 [SMILES: *SCC(=O)O] |

-continued
| Dye | $R_1$ | $R_2$ | $R_3$ | $R_4$ | Ar | 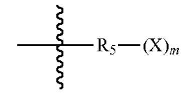 |
|---|---|---|---|---|---|---|
| 146 | 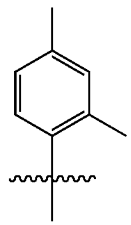 [SMILES: *c1ccc(C)cc1C] | 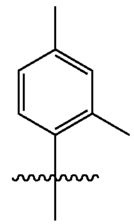 | H | H | 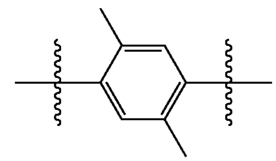 [SMILES: *c1cc(C)c(*)cc1C] | 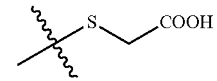 [SMILES: *SCC(=O)O] |
| 147 | 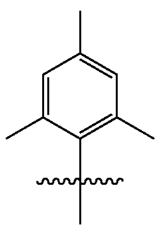 | 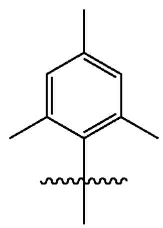 | H | H | 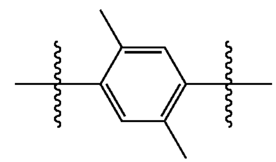 [SMILES: *c1cc(C)c(*)cc1C] | 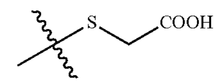 [SMILES: *SCC(=O)O] |
| 148 | 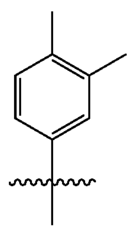 [SMILES: *c1ccc(C)c(C)c1] | 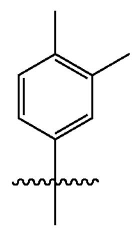 | H | H | 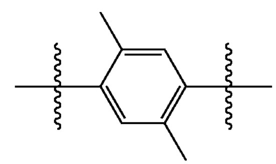 [SMILES: *c1cc(C)c(*)cc1C] | 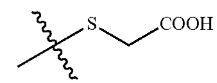 |
| 149 | 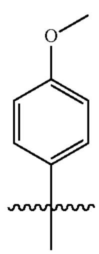 [SMILES: *c1ccc(OC)cc1] | 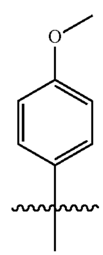 | H | H | 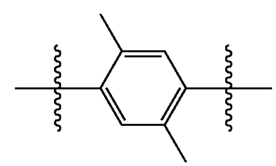 [SMILES: *c1cc(C)c(*)cc1C] | 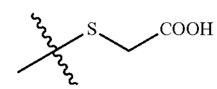 |

-continued
| Dye | $R_1$ | $R_2$ | $R_3$ | $R_4$ | Ar | 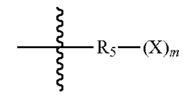 |
|---|---|---|---|---|---|---|
| 150 | 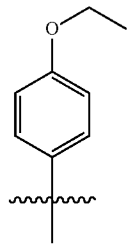 [SMILES: *c1ccc(OCC)cc1] | 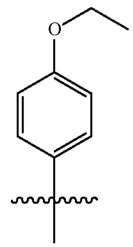 | H | H | 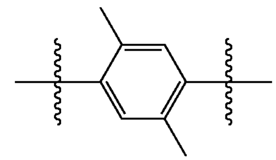 [SMILES: *c1cc(C)c(*)cc1C] | 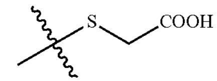 |
| 151 | 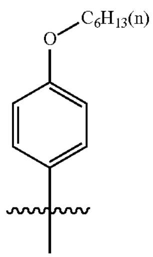 | 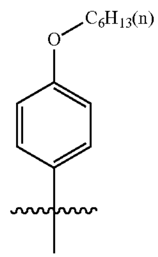 | H | H | 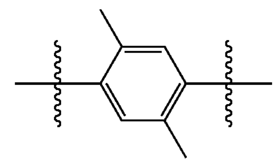 [SMILES: *c1cc(C)c(*)cc1C] | 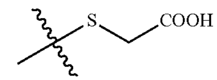 |
| 152 | 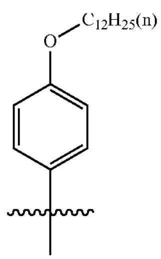 | 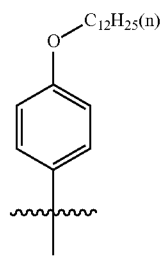 | H | H | 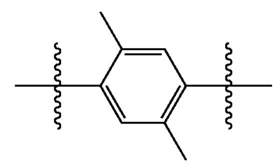 [SMILES: *c1cc(C)c(*)cc1C] | 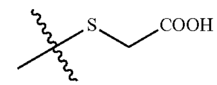 [SMILES: *SCC(=O)O] |
| 153 | 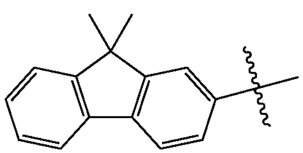 [SMILES: *c1ccc2c(c1)C(C)(C)c1ccccc1-2] | 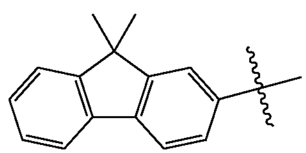 [SMILES: *c1ccc2c(c1)C(C)(C)c1ccccc1-2] | H | H | 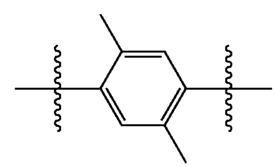 [SMILES: *c1cc(C)c(*)cc1C] | 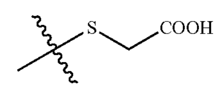 |

-continued
| Dye | $R_1$ | $R_2$ | $R_3$ | $R_4$ | Ar | 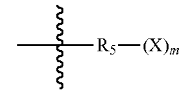 |
|---|---|---|---|---|---|---|
| 154 | 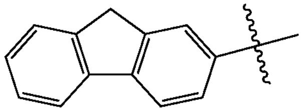 [SMILES: *c1ccc2c(c1)Cc1ccccc1-2] | 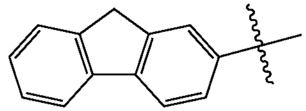 [SMILES: *c1ccc2c(c1)Cc1ccccc1-2] | H | H | 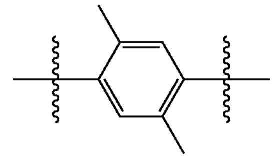 [SMILES: *c1cc(C)c(*)cc1C] | 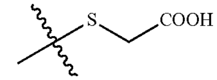 |
| 155 | 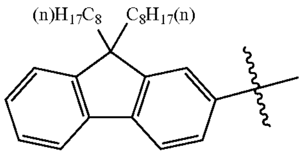 | 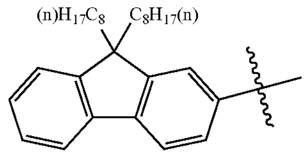 | H | H | 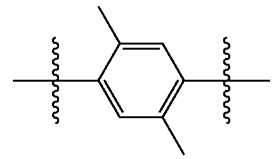 [SMILES: *c1cc(C)c(*)cc1C] | 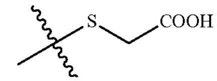 |
| 156 | 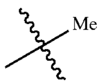 | 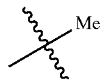 | H | H | 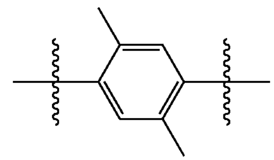 [SMILES: *c1cc(C)c(*)cc1C] | 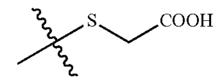 |
| 157 | 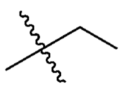 [SMILES: *CC] | 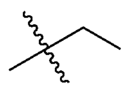 [SMILES: *CC] | H | H | 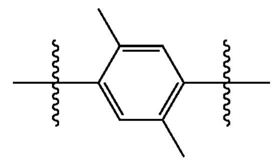 [SMILES: *c1cc(C)c(*)cc1C] | 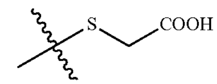 |
| 158 | 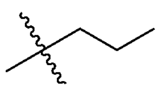 [SMILES: *CCC] | 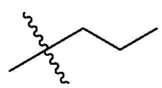 [SMILES: *CCC] | H | H | 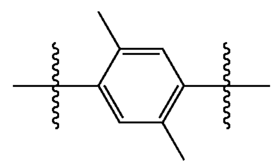 [SMILES: *c1cc(C)c(*)cc1C] | 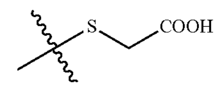 [SMILES: *SCC(=O)O] |

-continued
| Dye | $R_1$ | $R_2$ | $R_3$ | $R_4$ | Ar | 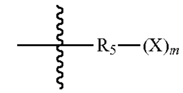 |
|---|---|---|---|---|---|---|
| 159 | 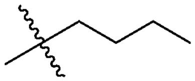 [SMILES: *CCCC] | 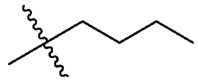 [SMILES: *CCCC] | H | H | 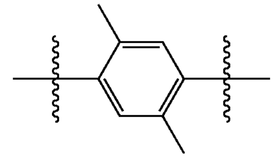 [SMILES: *c1cc(C)c(*)cc1C] | 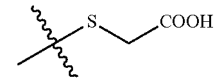 |
| 160 | $C_6H_{13}(n)$ | $C_6H_{13}(n)$ | H | H | 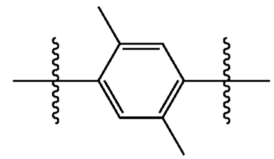 [SMILES: *c1cc(C)c(*)cc1C] | 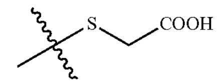 [SMILES: *SCC(=O)O] |
| 161 | $C_8H_{17}(n)$ | $C_8H_{17}(n)$ | H | H | 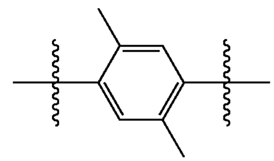 [SMILES: *c1cc(C)c(*)cc1C] | 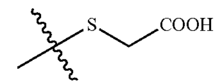 |
| 162 | $C_{12}H_{25}(n)$ | $C_{12}H_{25}(n)$ | H | H | 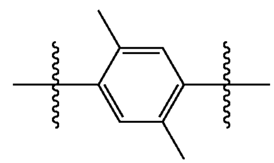 [SMILES: *c1cc(C)c(*)cc1C] | 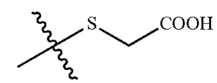 |

-continued
| Dye | $R_1$ | $R_2$ | $R_3$ | $R_4$ | Ar | 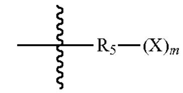 |
|---|---|---|---|---|---|---|
| 163 | 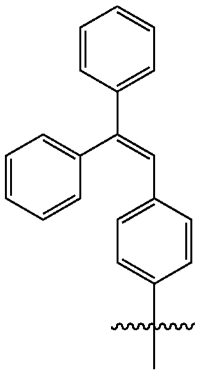 [SMILES: *c1ccc(C=C(c2ccccc2)c2ccccc2)cc1] | 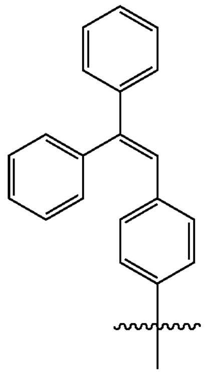 [SMILES: *c1ccc(C=C(c2ccccc2)c2ccccc2)cc1] | H | H | 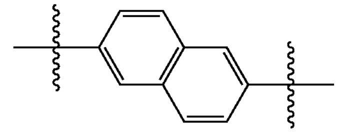 [SMILES: *c1ccc2cc(*)ccc2c1] | 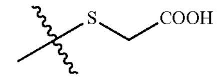 |
| 164 | 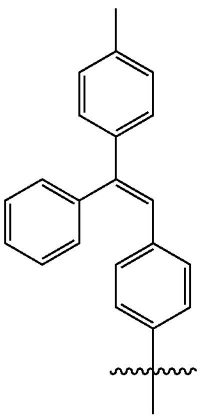 [SMILES: *c1ccc(/C=C(\c2ccccc2)c2ccc(C)cc2)cc1] | 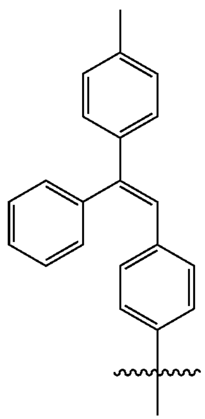 | H | H | 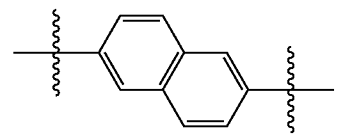 [SMILES: *c1ccc2cc(*)ccc2c1] | 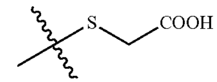 [SMILES: *SCC(=O)O] |

-continued
| Dye | $R_1$ | $R_2$ | $R_3$ | $R_4$ | Ar | 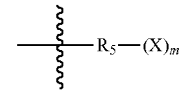 |
|---|---|---|---|---|---|---|
| 165 | 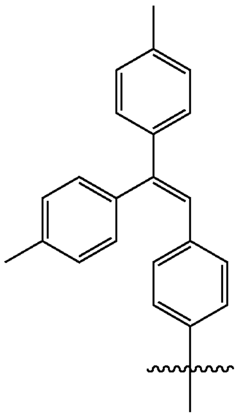 [SMILES: *c1ccc(C=C(c2ccc(C)cc2)c2ccc(C)cc2)cc1] | 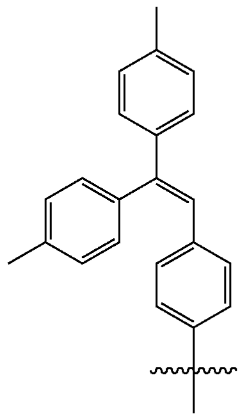 [SMILES: *c1ccc(C=C(c2ccc(C)cc2)c2ccc(C)cc2)cc1] | H | H | 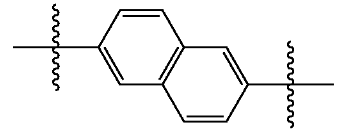 [SMILES: *c1ccc2cc(*)ccc2c1] | 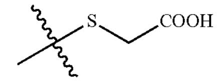 [SMILES: *SCC(=O)O] |
| 166 | 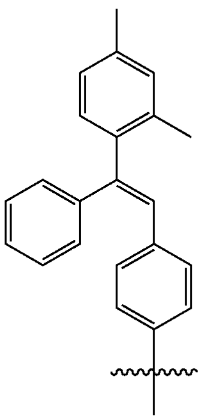 [SMILES: *c1ccc(/C=C(\c2ccccc2)c2ccc(C)cc2C)cc1] | 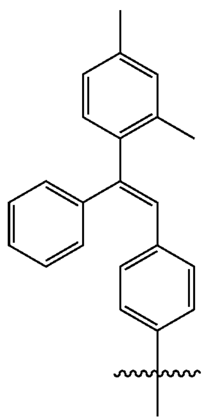 | H | H | 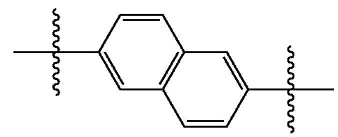 [SMILES: *c1ccc2cc(*)ccc2c1] | 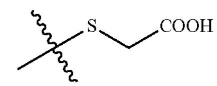 [SMILES: *SCC(=O)O] |

-continued
| Dye | $R_1$ | $R_2$ | $R_3$ | $R_4$ | Ar | 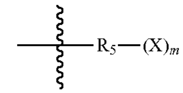 |
|---|---|---|---|---|---|---|
| 167 | 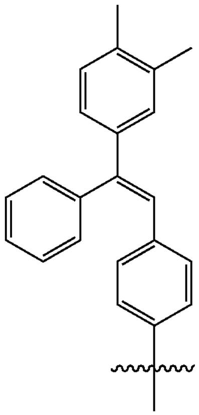 [SMILES: *c1ccc(/C=C(\c2ccccc2)c2ccc(C)c(C)c2)cc1] | 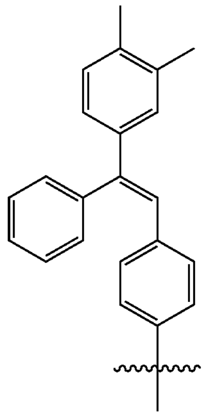 | H | H | 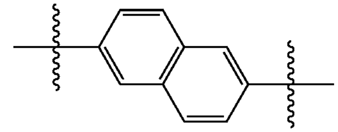 [SMILES: *c1ccc2cc(*)ccc2c1] | 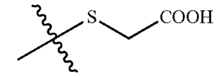 |
| 168 | 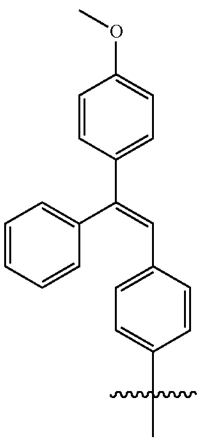 [SMILES: *c1ccc(/C=C(\c2ccccc2)c2ccc(OC)cc2)cc1] | 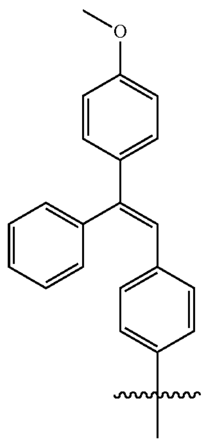 [SMILES: *c1ccc(/C=C(\c2ccccc2)c2ccc(OC)cc2)cc1] | H | H | 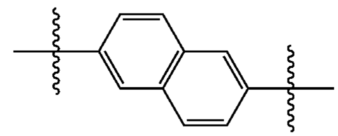 [SMILES: *c1ccc2cc(*)ccc2c1] | 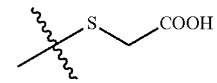 |

-continued
| Dye | R1 | R2 | R3 | R4 | Ar | 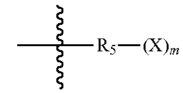 |
|---|---|---|---|---|---|---|
| 169 | 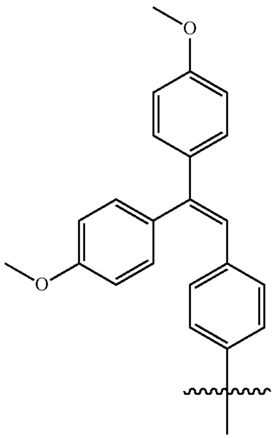 [SMILES: *c1ccc(C=C(c2ccc(OC)cc2)c2ccc(OC)cc2)cc1] | 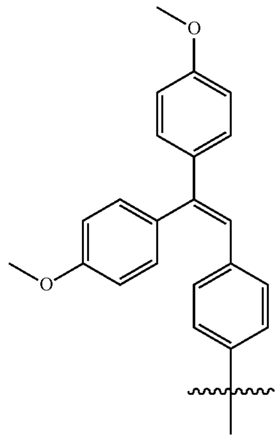 [SMILES: *c1ccc(C=C(c2ccc(OC)cc2)c2ccc(OC)cc2)cc1] | H | H | 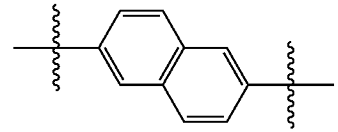 [SMILES: *c1ccc2cc(*)ccc2c1] | 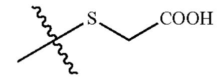 [SMILES: *SCC(=O)O] |
| 170 | 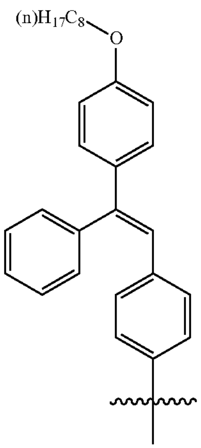 | 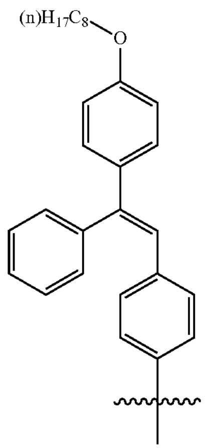 | H | H | 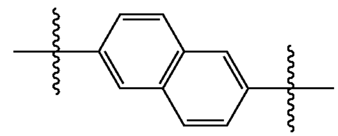 [SMILES: *c1ccc2cc(*)ccc2c1] | 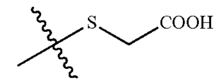 [SMILES: *SCC(=O)O] |

-continued
| Dye | $R_1$ | $R_2$ | $R_3$ | $R_4$ | Ar | 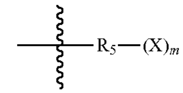 |
|---|---|---|---|---|---|---|
| 171 | 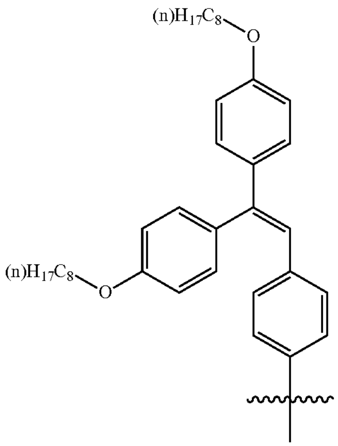 | 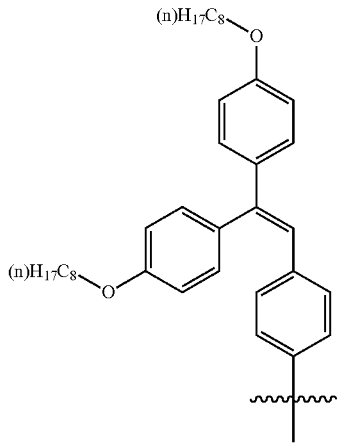 | H | H | 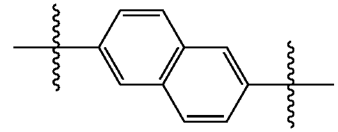 [SMILES: *c1ccc2cc(*)ccc2c1] | 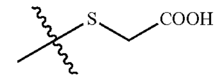 [SMILES: *SCC(=O)O] |
| 172 | 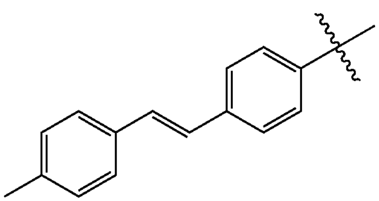 [SMILES: *c1ccc(/C=C/c2ccc(C)cc2)cc1] | 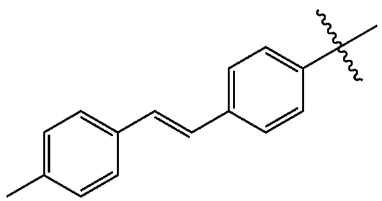 [SMILES: *c1ccc(/C=C/c2ccc(C)cc2)cc1] | H | H | 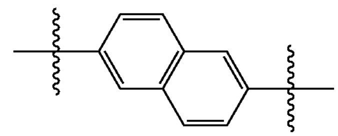 [SMILES: *c1ccc2cc(*)ccc2c1] | 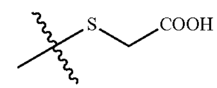 |
| 173 | 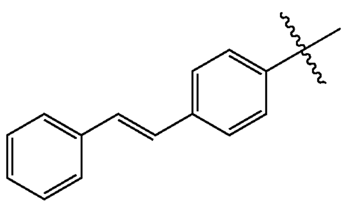 [SMILES: *c1ccc(/C=C/c2ccccc2)cc1] | 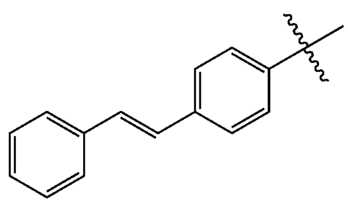 [SMILES: *c1ccc(/C=C/c2ccccc2)cc1] | H | H | 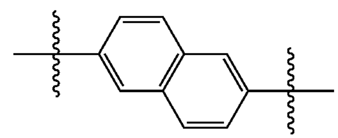 [SMILES: *c1ccc2cc(*)ccc2c1] | 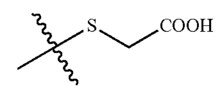 [SMILES: *SCC(=O)O] |

-continued
| Dye | $R_1$ | $R_2$ | $R_3$ | $R_4$ | Ar | $-R_5-(X)_m$ |
|---|---|---|---|---|---|---|
| 174 | 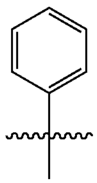 [SMILES: *c1ccccc1] | 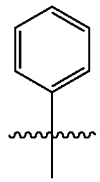 | H | H | 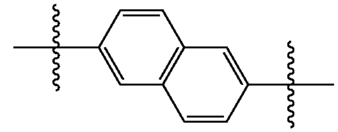 [SMILES: *c1ccc2cc(*)ccc2c1] | 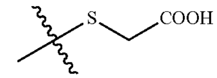 [SMILES: *SCC(=O)O] |
| 175 | 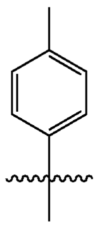 [SMILES: *c1ccc(C)cc1] | 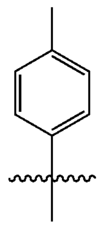 | H | H | 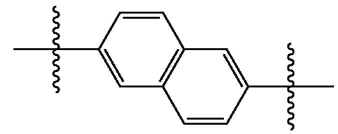 [SMILES: *c1ccc2cc(*)ccc2c1] | 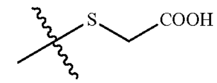 [SMILES: *SCC(=O)O] |
| 176 | 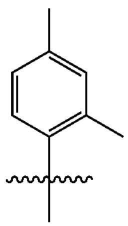 [SMILES: *c1ccc(C)cc1C] | 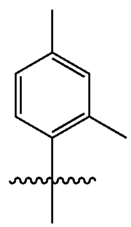 [SMILES: *c1ccc(C)cc1C] | H | H | 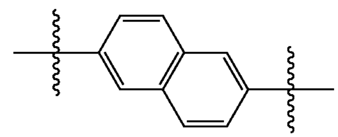 [SMILES: *c1ccc2cc(*)ccc2c1] | 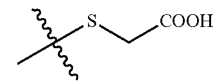 [SMILES: *SCC(=O)O] |
| 177 | 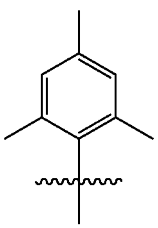 | 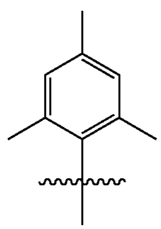 | H | H | 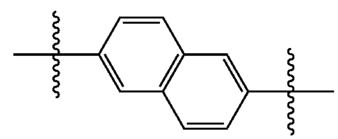 [SMILES: *c1ccc2cc(*)ccc2c1] | 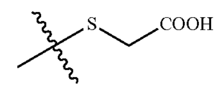 [SMILES: *SCC(=O)O] |

-continued
| Dye | $R_1$ | $R_2$ | $R_3$ | $R_4$ | Ar | 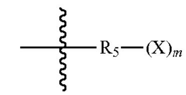 |
|---|---|---|---|---|---|---|
| 178 | 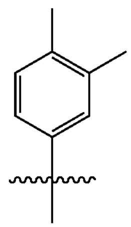 [SMILES: *c1ccc(C)c(C)c1] | 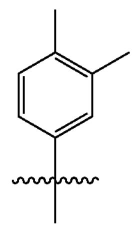 [SMILES: *c1ccc(C)c(C)c1] | H | H | 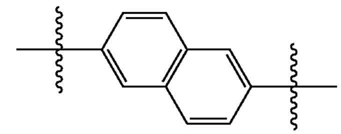 [SMILES: *c1ccc2cc(*)ccc2c1] | 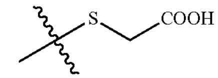 [SMILES: *SCC(=O)O] |
| 179 | 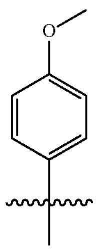 [SMILES: *c1ccc(OC)cc1] | 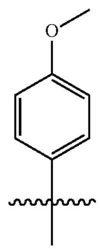 | H | H | 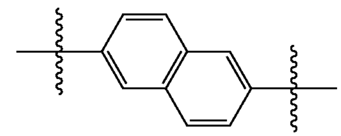 [SMILES: *c1ccc2cc(*)ccc2c1] | 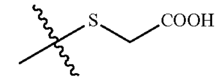 |
| 180 | 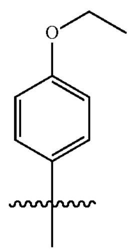 [SMILES: *c1ccc(OCC)cc1] | 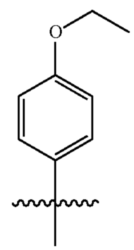 | H | H | 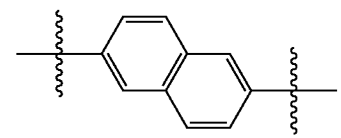 [SMILES: *c1ccc2cc(*)ccc2c1] | 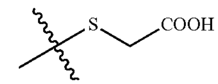 [SMILES: *SCC(=O)O] |
| 181 | 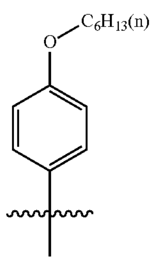 | 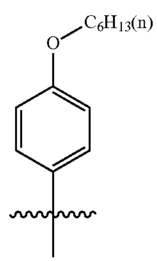 | H | H | 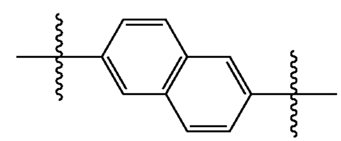 [SMILES: *c1ccc2cc(*)ccc2c1] | 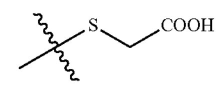 [SMILES: *SCC(=O)O] |

-continued
| Dye | $R_1$ | $R_2$ | $R_3$ | $R_4$ | Ar | $R_5$—$(X)_m$ |
|---|---|---|---|---|---|---|
| 182 | 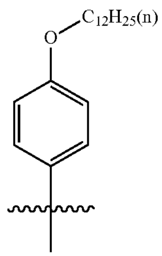 | 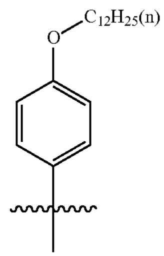 | H | H | 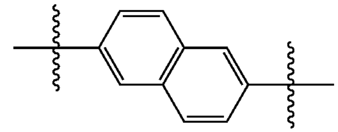 [SMILES: *c1ccc2cc(*)ccc2c1] | 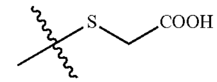 |
| 183 | 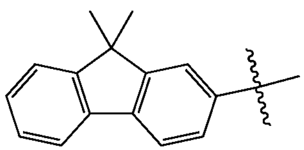 [SMILES: *c1ccc2c(c1)C(C)(C)c1ccccc1-2] | 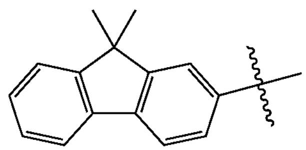 [SMILES: *c1ccc2c(c1)C(C)(C)c1ccccc1-2] | H | H | 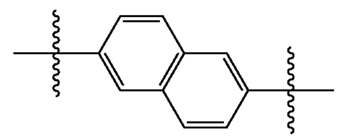 [SMILES: *c1ccc2cc(*)ccc2c1] | 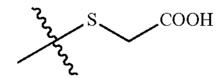 |
| 184 | 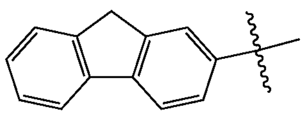 [SMILES: *c1ccc2c(c1)Cc1ccccc1-2] | 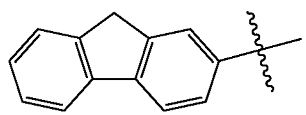 [SMILES: *c1ccc2c(c1)Cc1ccccc1-2] | H | H | 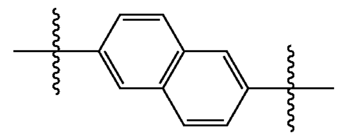 [SMILES: *c1ccc2cc(*)ccc2c1] | 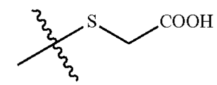 |
| 185 | 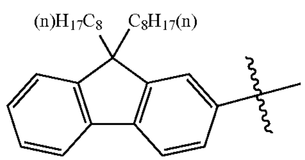 | 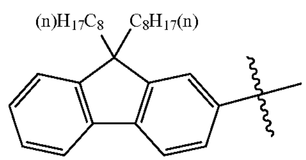 | H | H | 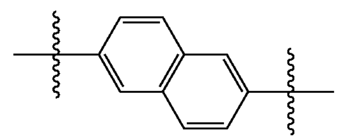 [SMILES: *c1ccc2cc(*)ccc2c1] | 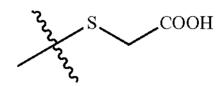 |
| 186 | 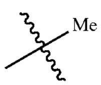 | 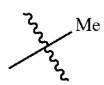 | H | H | 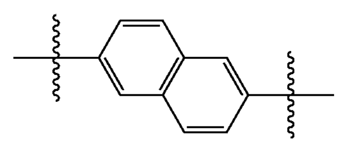 [SMILES: *c1ccc2cc(*)ccc2c1] | 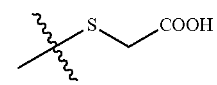 |

-continued
| Dye | $R_1$ | $R_2$ | $R_3$ | $R_4$ | Ar | 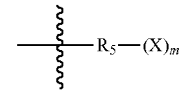 |
|---|---|---|---|---|---|---|
| 187 | 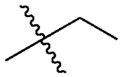 [SMILES: *CC] | 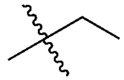 [SMILES: *CC] | H | H | 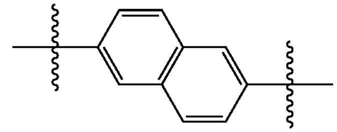 [SMILES: *c1ccc2cc(*)ccc2c1] | 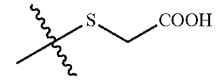 |
| 188 | 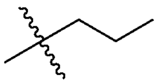 [SMILES: *CCC] | 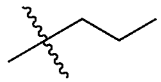 [SMILES: *CCC] | H | H | 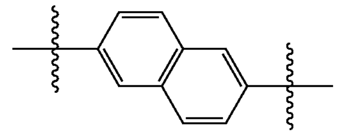 [SMILES: *c1ccc2cc(*)ccc2c1] | 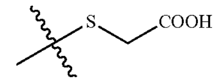 |
| 189 | 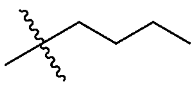 [SMILES: *CCCC] | 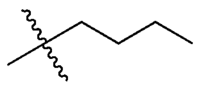 [SMILES: *CCCC] | H | H | 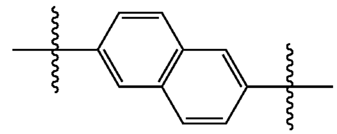 [SMILES: *c1ccc2cc(*)ccc2c1] | 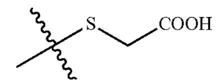 [SMILES: *SCC(=O)O] |
| 190 | 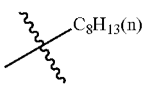 | 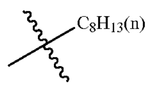 | H | H | 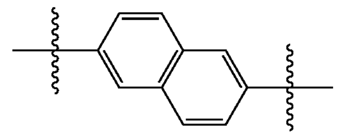 [SMILES: *c1ccc2cc(*)ccc2c1] | 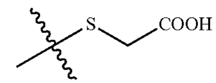 |
| 191 | 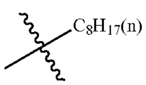 | 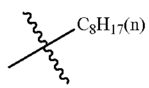 | H | H | 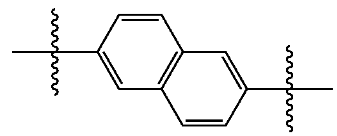 [SMILES: *c1ccc2cc(*)ccc2c1] | 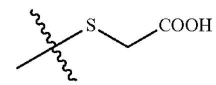 [SMILES: *SCC(=O)O] |
| 192 | 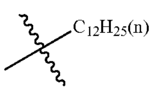 | 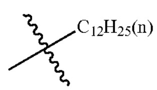 | H | H | 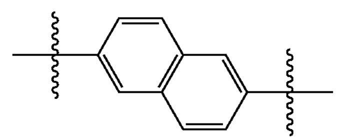 [SMILES: *c1ccc2cc(*)ccc2c1] | 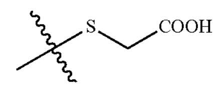 |

-continued
| Dye | $R_1$ | $R_2$ | $R_3$ | $R_4$ | Ar |  $R_5$—$(X)_m$ |
|---|---|---|---|---|---|---|
| 193 | 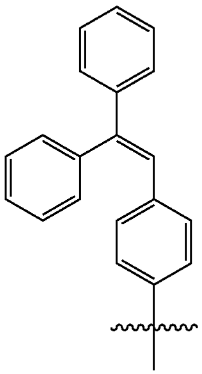 [SMILES: *c1ccc(C=C(c2ccccc2)c2ccccc2)cc1] | 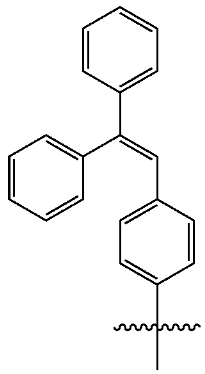 [SMILES: *c1ccc(C=C(c2ccccc2)c2ccccc2)cc1] | H | H | 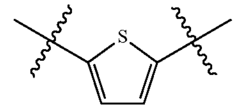 [SMILES: *c1ccc(*)s1] | 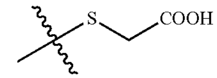 |
| 194 | 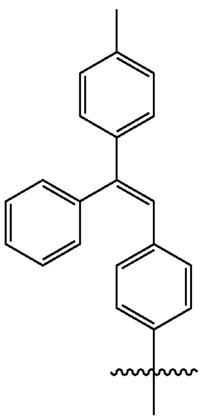 [SMILES: *c1ccc(/C=C(\c2ccccc2)c2ccc(C)cc2)cc1] | 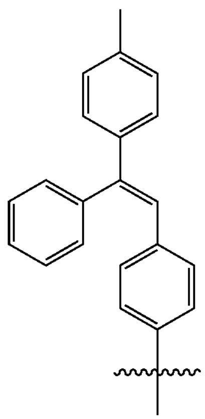 | H | H | 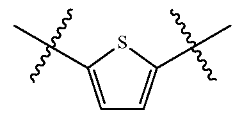 [SMILES: *c1ccc(*)s1] | 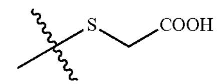 |

-continued
| Dye | $R_1$ | $R_2$ | $R_3$ | $R_4$ | Ar | —$R_5$—$(X)_m$ |
|---|---|---|---|---|---|---|
| 195 | 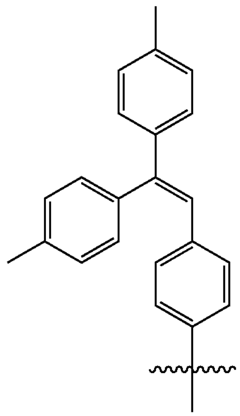 [SMILES: *c1ccc(C=C(c2ccc(C)cc2)c2ccc(C)cc2)cc1] | 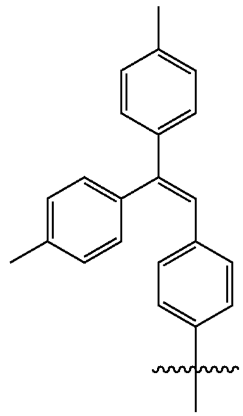 [SMILES: *c1ccc(C=C(c2ccc(C)cc2)c2ccc(C)cc2)cc1] | H | H | 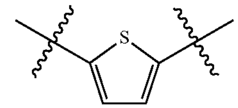 [SMILES: *c1ccc(*)s1] | 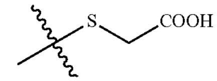 |
| 196 | 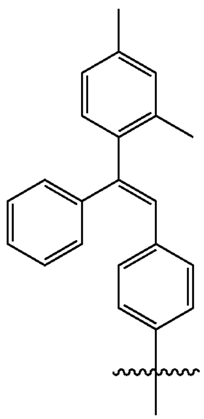 [SMILES: *c1ccc(/C=C(\c2ccccc2)c2ccc(C)cc2C)cc1] | 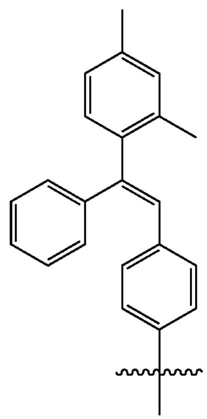 | H | H | 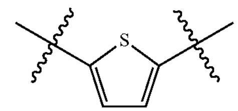 [SMILES: *c1ccc(*)s1] | 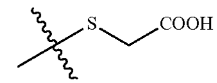 |

-continued
| Dye | $R_1$ | $R_2$ | $R_3$ | $R_4$ | Ar | 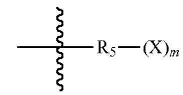 |
|---|---|---|---|---|---|---|
| 197 | 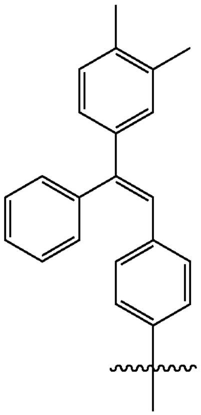 [SMILES: *c1ccc(/C=C(\c2ccccc2)c2ccc(C)c(C)c2)cc1] | 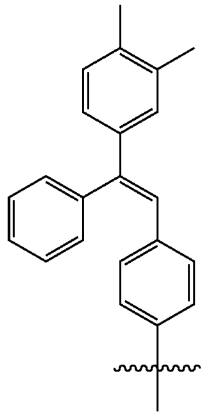 | H | H | 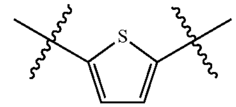 [SMILES: *c1ccc(*)s1] | 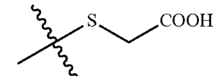 [SMILES: *SCC(=O)O] |
| 198 | 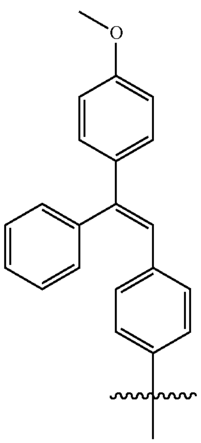 [SMILES: *c1ccc(/C=C(\c2ccccc2)c2ccc(OC)cc2)cc1] | 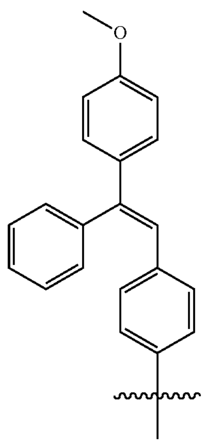 [SMILES: *c1ccc(/C=C(\c2ccccc2)c2ccc(OC)cc2)cc1] | H | H | 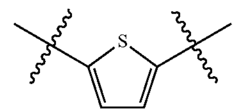 [SMILES: *c1ccc(*)s1] | 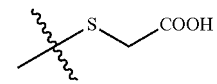 [SMILES: *SCC(=O)O] |

-continued
| Dye | $R_1$ | $R_2$ | $R_3$ | $R_4$ | Ar | 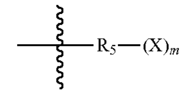 |
| --- | --- | --- | --- | --- | --- | --- |
| 199 | 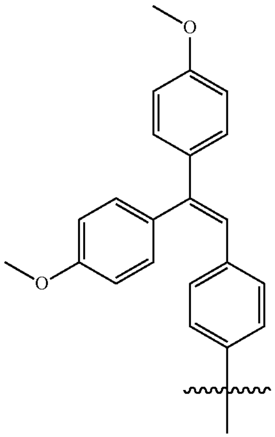 [SMILES: *c1ccc(C=C(c2ccc(OC)cc2)c2ccc(OC)cc2)cc1] | 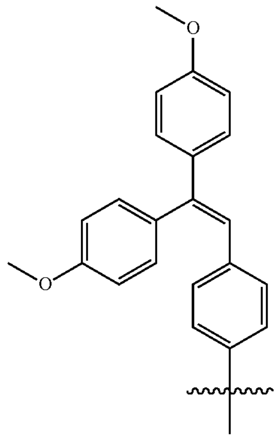 [SMILES: *c1ccc(C=C(c2ccc(OC)cc2)c2ccc(OC)cc2)cc1] | H | H | 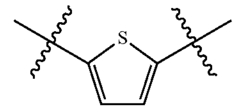 [SMILES: *c1ccc(*)s1] | 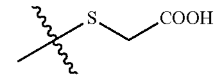 [SMILES: *SCC(=O)O] |
| 200 | 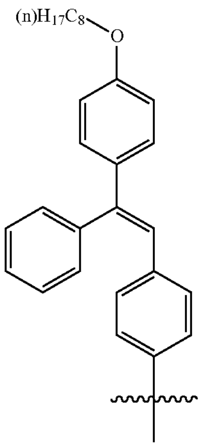 | 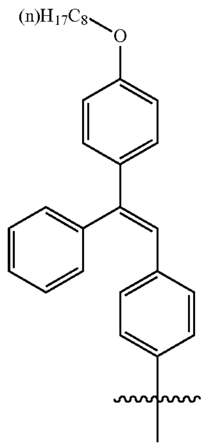 | H | H | 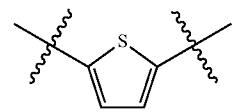 [SMILES: *c1ccc(*)s1] | 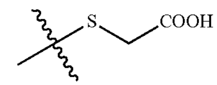 |

-continued
| Dye | $R_1$ | $R_2$ | $R_3$ | $R_4$ | Ar | 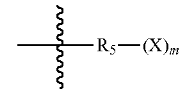 |
|---|---|---|---|---|---|---|
| 201 | 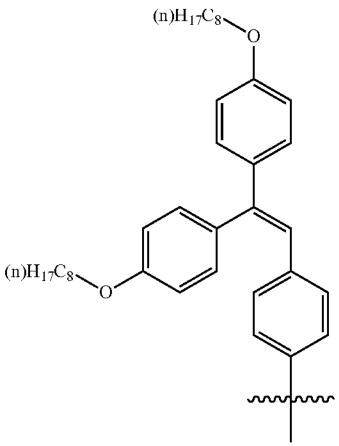 | 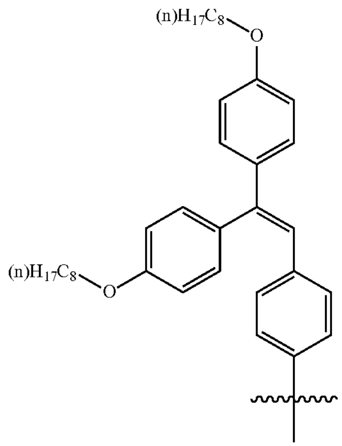 | H | H | 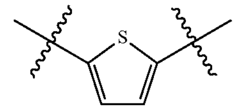 [SMILES: *c1ccc(*)s1] | 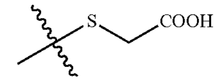 |
| 202 | 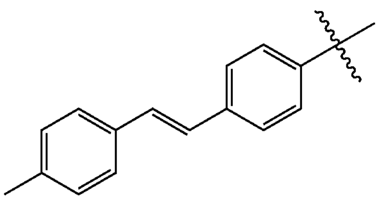 [SMILES: *c1ccc(/C=C/c2ccc(C)cc2)cc1] | 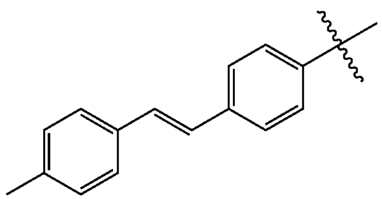 [SMILES: *c1ccc(/C=C/c2ccc(C)cc2)cc1] | H | H | 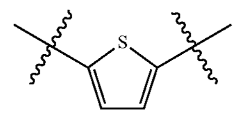 [SMILES: *c1ccc(*)s1] | 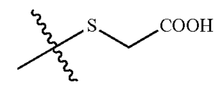 [SMILES: *SCC(=O)O] |
| 203 | 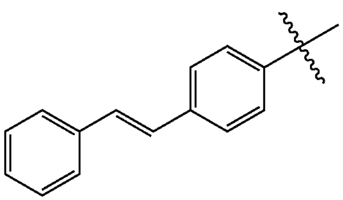 [SMILES: *c1ccc(/C=C/c2ccccc2)cc1] | 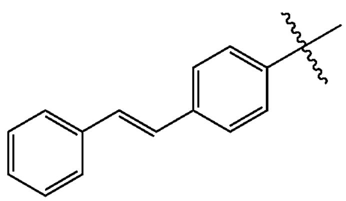 [SMILES: *c1ccc(/C=C/c2ccccc2)cc1] | H | H | 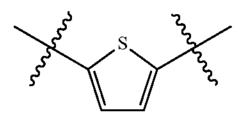 [SMILES: *c1ccc(*)s1] | 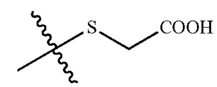 [SMILES: *SCC(=O)O] |

-continued
| Dye | $R_1$ | $R_2$ | $R_3$ | $R_4$ | Ar | 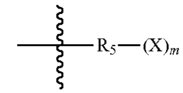 |
|---|---|---|---|---|---|---|
| 204 | 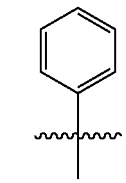 [SMILES: *c1ccccc1] | 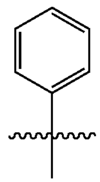 [SMILES: *c1ccccc1] | H | H | 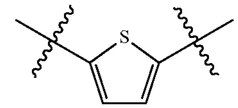 [SMILES: *c1ccc(*)s1] | 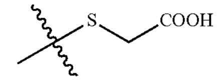 |
| 205 | 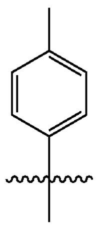 [SMILES: *c1ccc(C)cc1] | 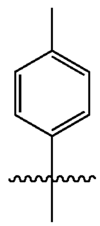 | H | H | 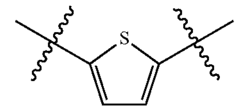 [SMILES: *c1ccc(*)s1] | 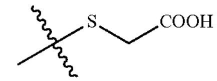 |
| 206 | 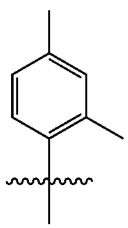 [SMILES: *c1ccc(C)cc1C] | 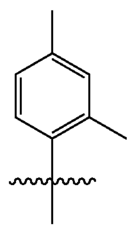 [SMILES: *c1ccc(C)cc1C] | H | H | 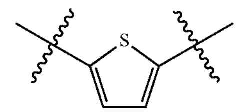 [SMILES: *c1ccc(*)s1] | 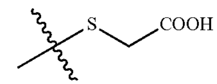 |
| 207 | 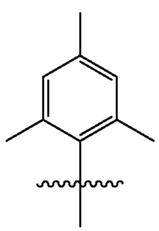 | 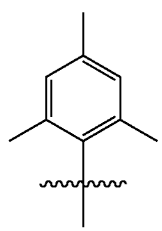 | H | H | 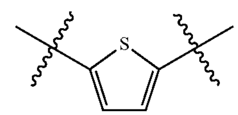 [SMILES: *c1ccc(*)s1] | 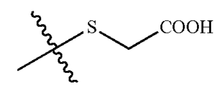 |

-continued
| Dye | $R_1$ | $R_2$ | $R_3$ | $R_4$ | Ar | 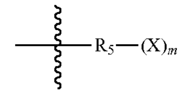 |
|---|---|---|---|---|---|---|
| 208 | 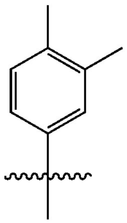 [SMILES: *c1ccc(C)c(C)c1] | 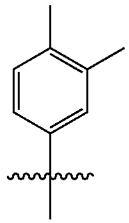 [SMILES: *c1ccc(C)c(C)c1] | H | H | 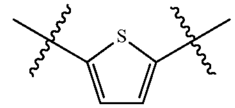 [SMILES: *c1ccc(*)s1] | 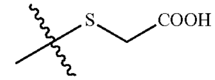 [SMILES: *SCC(=O)O] |
| 209 | 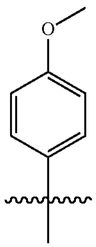 [SMILES: *c1ccc(OC)cc1] | 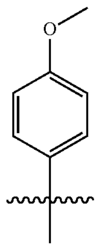 | H | H | 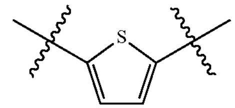 [SMILES: *c1ccc(*)s1] | 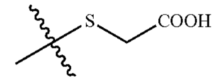 [SMILES: *SCC(=O)O] |
| 210 | 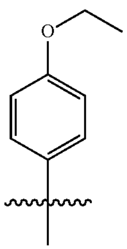 [SMILES: *c1ccc(OCC)cc1] | 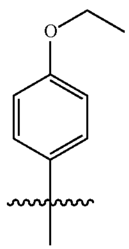 | H | H | 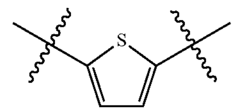 [SMILES: *c1ccc(*)s1] | 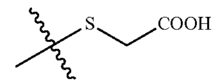 |
| 211 | 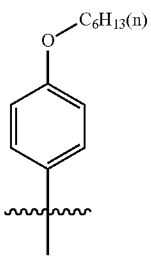 | 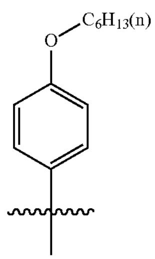 | H | H | 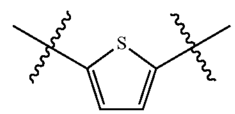 [SMILES: *c1ccc(*)s1] | 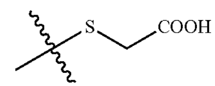 [SMILES: *SCC(=O)O] |

-continued
| Dye | $R_1$ | $R_2$ | $R_3$ | $R_4$ | Ar | 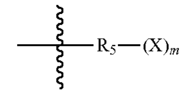 |
|---|---|---|---|---|---|---|
| 212 | 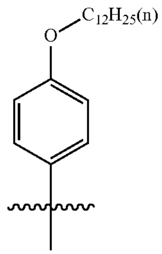 | 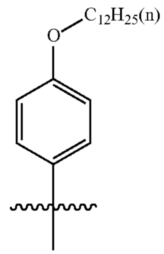 | H | H | 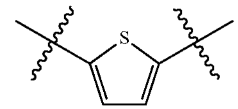 [SMILES: *c1ccc(*)s1] | 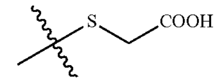 |
| 213 | 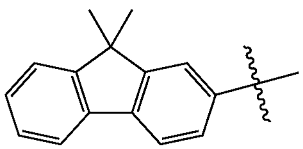 [SMILES: *c1ccc2c(c1)C(C)(C)c1ccccc1-2] | 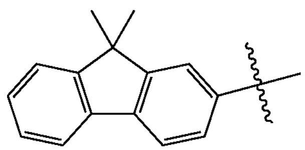 [SMILES: *c1ccc2c(c1)C(C)(C)c1ccccc1-2] | H | H | 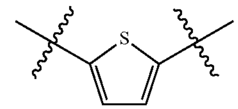 [SMILES: *c1ccc(*)s1] | 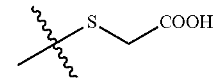 [SMILES: *SCC(=O)O] |
| 214 | 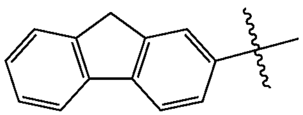 [SMILES: *c1ccc2c(c1)Cc1ccccc1-2] | 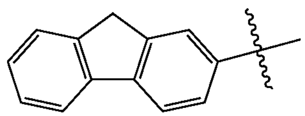 [SMILES: *c1ccc2c(c1)Cc1ccccc1-2] | H | H | 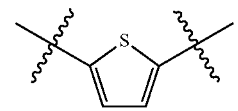 [SMILES: *c1ccc(*)s1] | 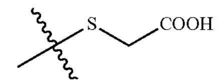 [SMILES: *SCC(=O)O] |
| 215 | 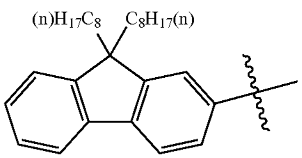 | 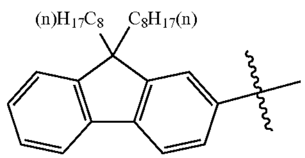 | H | H | 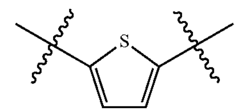 [SMILES: *c1ccc(*)s1] | 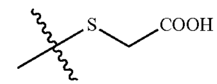 [SMILES: *SCC(=O)O] |
| 216 | 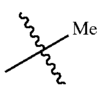 | 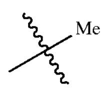 | H | H | 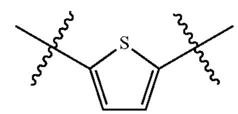 [SMILES: *c1ccc(*)s1] | 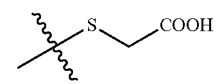 |
| 217 | 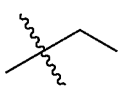 [SMILES: *CC] | 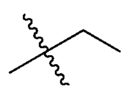 [SMILES: *CC] | H | H | 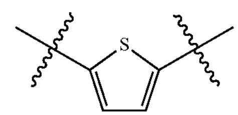 [SMILES: *c1ccc(*)s1] | 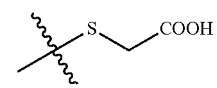 |

-continued
| Dye | $R_1$ | $R_2$ | $R_3$ | $R_4$ | Ar | $—R_5—(X)_m$ |
|---|---|---|---|---|---|---|
| 218 | 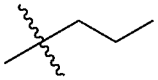 [SMILES: *CCC] |  | H | H | 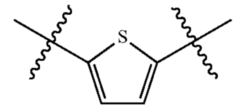 [SMILES: *c1ccc(*)s1] | 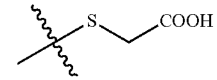 |
| 219 | 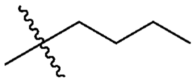 [SMILES: *CCCC] | 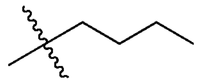 [SMILES: *CCCC] | H | H | 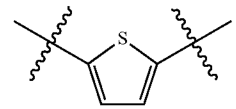 [SMILES: *c1ccc(*)s1] | 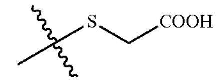 [SMILES: *SCC(=O)O] |
| 220 | 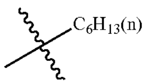 $C_6H_{13}(n)$ | 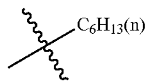 $C_6H_{13}(n)$ | H | H | 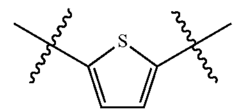 [SMILES: *c1ccc(*)s1] | 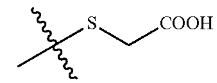 [SMILES: *SCC(=O)O] |
| 221 | 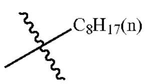 $C_8H_{17}(n)$ | 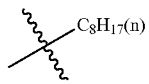 $C_8H_{17}(n)$ | H | H | 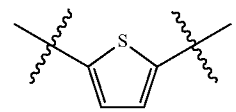 [SMILES: *c1ccc(*)s1] | 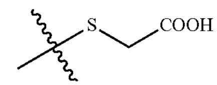 [SMILES: *SCC(=O)O] |
| 222 | 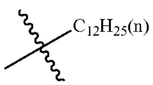 $C_{12}H_{25}(n)$ | 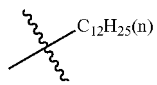 $C_{12}H_{25}(n)$ | H | H | 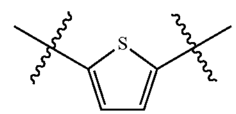 [SMILES: *c1ccc(*)s1] | 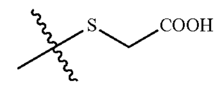 |
| 223 | 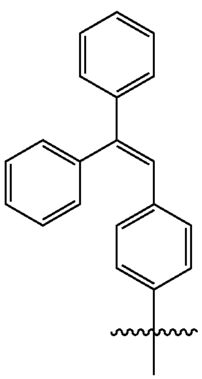 [SMILES: *c1ccc(C=C(c2ccccc2)c2ccccc2)cc1] | 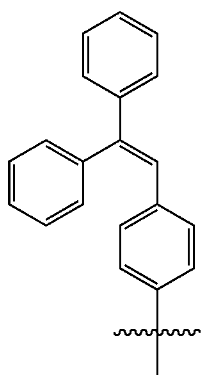 [SMILES: *c1ccc(C=C(c2ccccc2)c2ccccc2)cc1] | 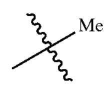 Me | H | 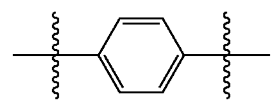 [SMILES: *c1ccc(*)cc1] | 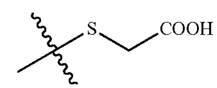 [SMILES: *SCC(=O)O] |

-continued
| Dye | $R_1$ | $R_2$ | $R_3$ | $R_4$ | Ar |  $R_5$—$(X)_m$ |
|---|---|---|---|---|---|---|
| 224 | 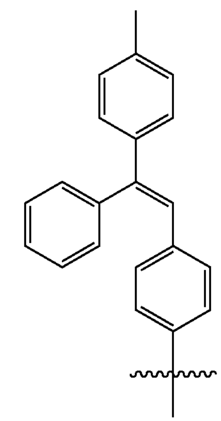 [SMILES: *c1ccc(/C=C(\c2ccccc2)c2ccc(C)cc2)cc1] | 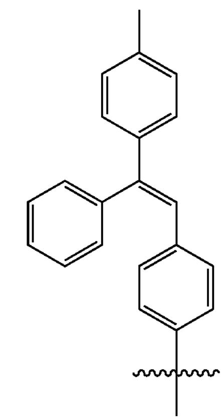 [SMILES: *c1ccc(/C=C(\c2ccccc2)c2ccc(C)cc2)cc1] | 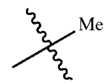 | H | 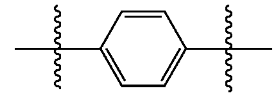 [SMILES: *c1ccc(*)cc1] | 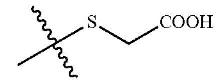 [SMILES: *SCC(=O)O] |
| 225 | 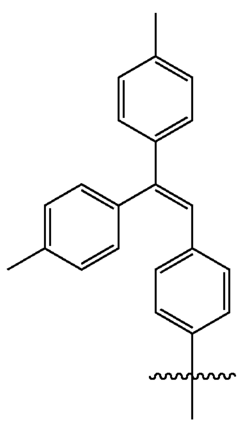 [SMILES: *c1ccc(C=C(c2ccc(C)cc2)c2ccc(C)cc2)cc1] | 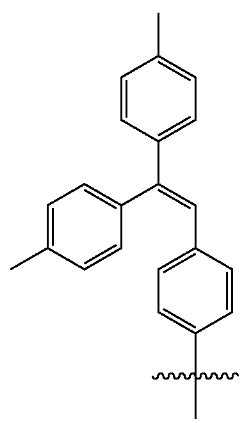 [SMILES: *c1ccc(C=C(c2ccc(C)cc2)c2ccc(C)cc2)cc1] | 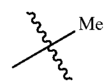 | H | 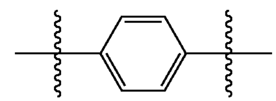 [SMILES: *c1ccc(*)cc1] | 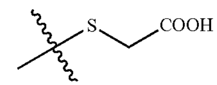 |

-continued
| Dye | $R_1$ | $R_2$ | $R_3$ | $R_4$ | Ar | 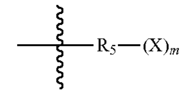 |
|---|---|---|---|---|---|---|
| 226 | 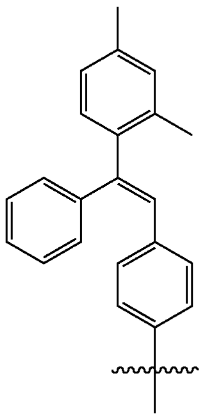 [SMILES: *c1ccc(/C=C(\c2ccccc2)c2ccc(C)cc2C)cc1] | 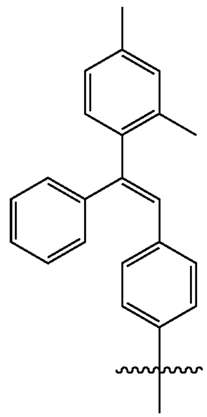 | 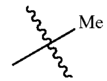 | H | 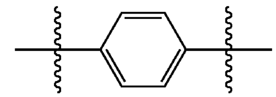 | 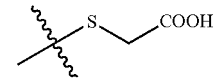 |
| 227 | 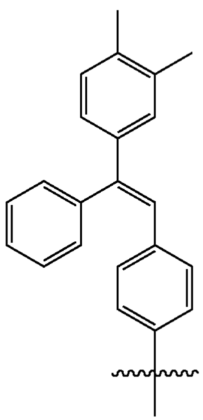 [SMILES: *c1ccc(/C=C(\c2ccccc2)c2ccc(C)c(C)c2)cc1] | 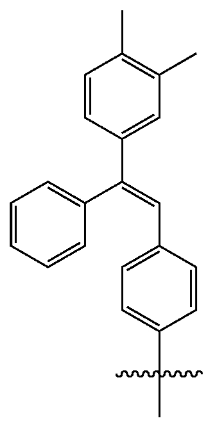 | 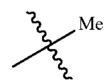 | H | 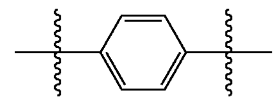 | 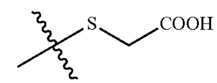 |

-continued
| Dye | $R_1$ | $R_2$ | $R_3$ | $R_4$ | Ar | 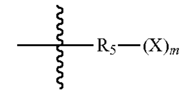 |
|---|---|---|---|---|---|---|
| 228 | 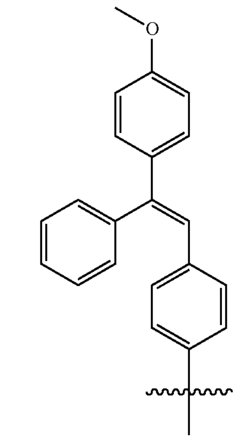 [SMILES: *c1ccc(/C=C(\c2ccccc2)c2ccc(OC)cc2)cc1] | 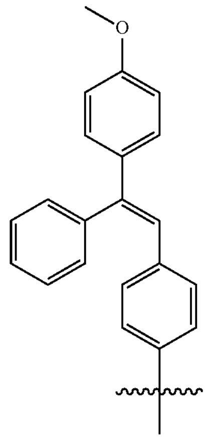 [SMILES: *c1ccc(/C=C(\c2ccccc2)c2ccc(OC)cc2)cc1] | 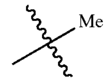 | H | 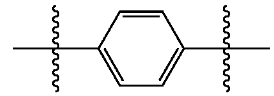 [SMILES: *c1ccc(*)cc1] | 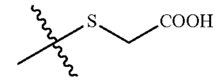 |
| 229 | 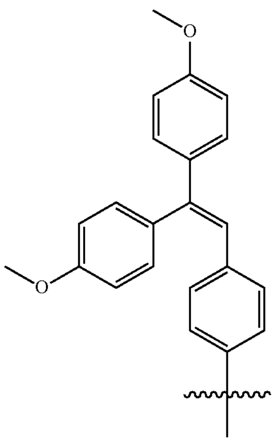 [SMILES: *c1ccc(C=C(c2ccc(OC)cc2)c2ccc(OC)cc2)cc1] | 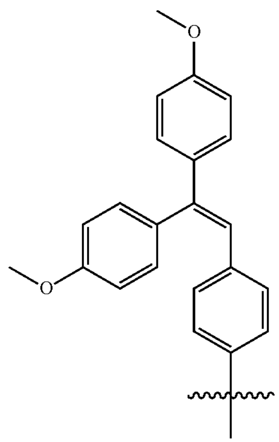 [SMILES: *c1ccc(C=C(c2ccc(OC)cc2)c2ccc(OC)cc2)cc1] |  | H | 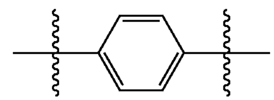 | 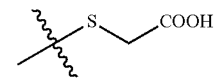 [SMILES: *SCC(=O)O] |

-continued
| Dye | $R_1$ | $R_2$ | $R_3$ | $R_4$ | Ar | 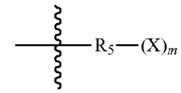 |
|---|---|---|---|---|---|---|
| 230 | 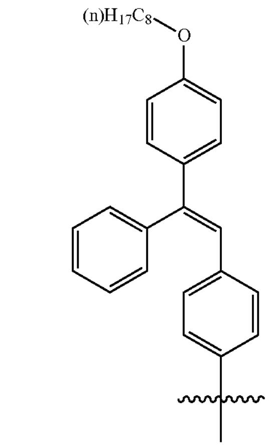 | 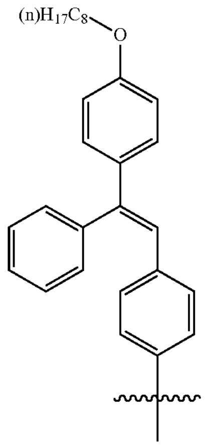 | 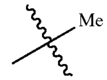 | H | 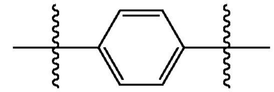 | 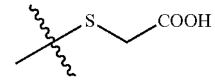 [SMILES: *SCC(=O)O] |
| 231 | 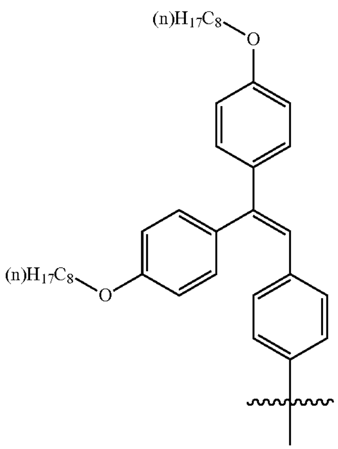 | 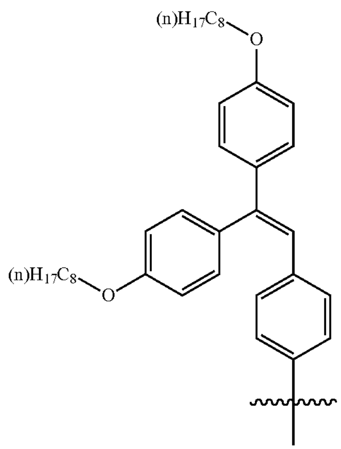 | 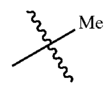 | H | 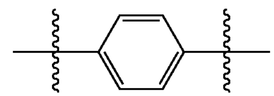 | 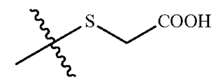 |

-continued
| Dye | $R_1$ | $R_2$ | $R_3$ | $R_4$ | Ar | $R_5—(X)_m$ |
|---|---|---|---|---|---|---|
| 232 | 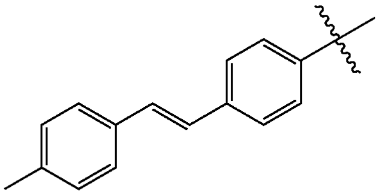 [SMILES: *c1ccc(/C=C/c2ccc(C)cc2)cc1] | 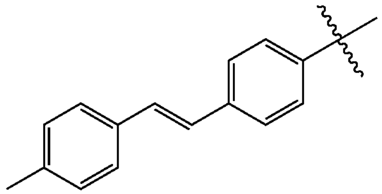 [SMILES: *c1ccc(/C=C/c2ccc(C)cc2)cc1] |  | H | 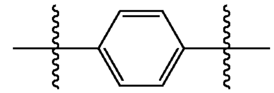 | 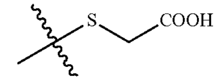 [SMILES: *SCC(=O)O] |
| 233 | 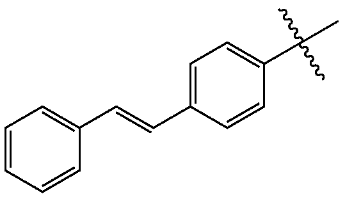 [SMILES: *c1ccc(/C=C/c2ccccc2)cc1] | 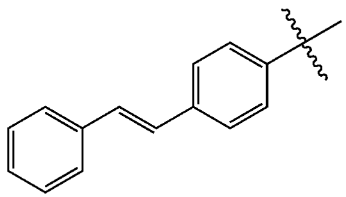 [SMILES: *c1ccc(/C=C/c2ccccc2)cc1] | 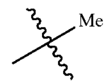 | H | 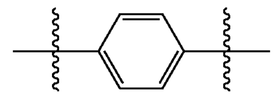 [SMILES: *c1ccc(*)cc1] | 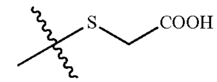 [SMILES: *SCC(=O)O] |
| 234 | 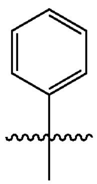 [SMILES: *c1ccccc1] | 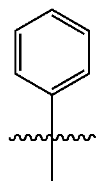 |  | H | 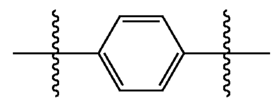 | 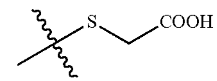 |
| 235 | 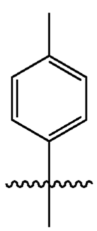 [SMILES: *c1ccc(C)cc1] | 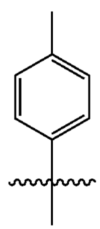 | 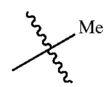 | H | 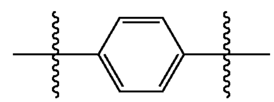 [SMILES: *c1ccc(*)cc1] | 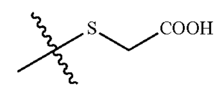 |

-continued
| Dye | $R_1$ | $R_2$ | $R_3$ | $R_4$ | Ar | 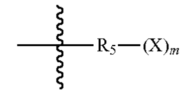 |
|---|---|---|---|---|---|---|
| 236 | 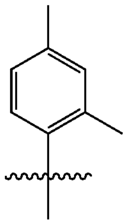 [SMILES: *c1ccc(C)cc1C] | 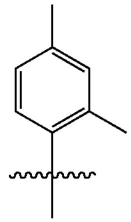 | 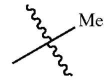 | H | 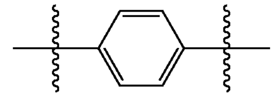 | 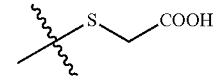 |
| 237 | 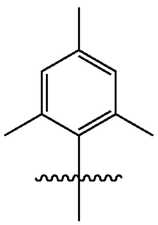 | 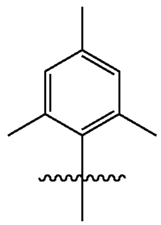 | 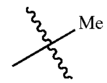 | H | 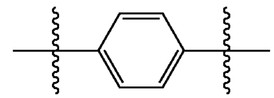 [SMILES: *c1ccc(*)cc1] | 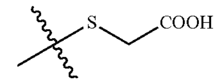 |
| 238 | 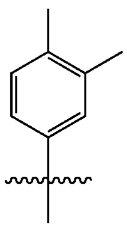 [SMILES: *c1ccc(C)c(C)c1] | 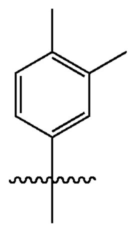 |  | H | 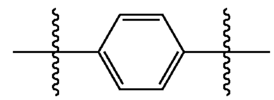 [SMILES: *c1ccc(*)cc1] | 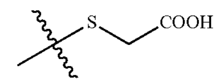 |
| 239 | 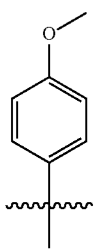 [SMILES: *c1ccc(OC)cc1] | 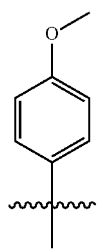 | 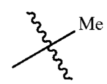 | H | 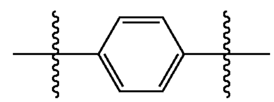 | 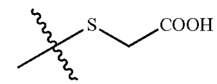 |

-continued
| Dye | $R_1$ | $R_2$ | $R_3$ | $R_4$ | Ar | 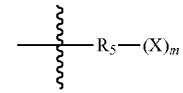 |
|---|---|---|---|---|---|---|
| 240 | 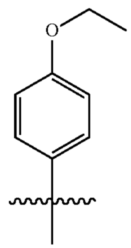 [SMILES: *c1ccc(OCC)cc1] | 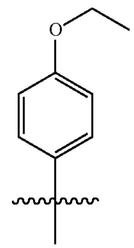 | 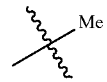 | H | 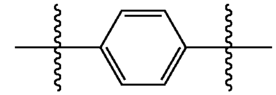 [SMILES: *c1ccc(*)cc1] | 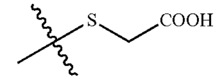 [SMILES: *SCC(=O)O] |
| 241 | 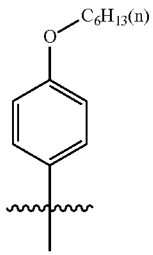 | 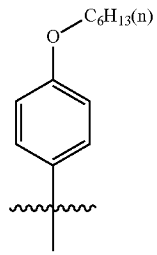 | 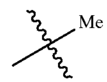 | H | 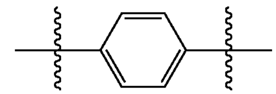 [SMILES: *c1ccc(*)cc1] | 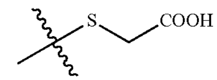 [SMILES: *SCC(=O)O] |
| 242 | 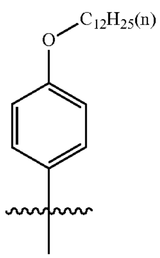 | 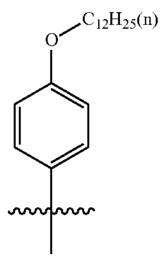 | 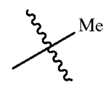 | H | 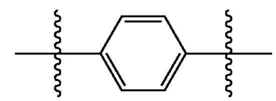 [SMILES: *c1ccc(*)cc1] | 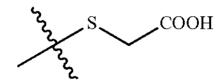 [SMILES: *SCC(=O)O] |
| 243 | 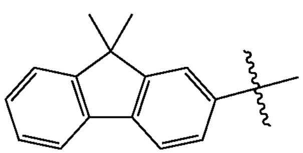 [SMILES: *c1ccc2c(c1)C(C)(C)c1ccccc1-2] | 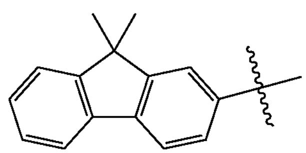 [SMILES: *c1ccc2c(c1)C(C)(C)c1ccccc1-2] | 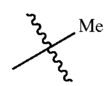 | H | 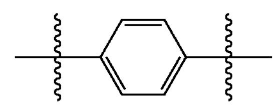 [SMILES: *c1ccc(*)cc1] | 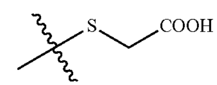 |

-continued
| Dye | R1 | R2 | R3 | R4 | Ar | R5—(X)m |
|---|---|---|---|---|---|---|
| 244 | 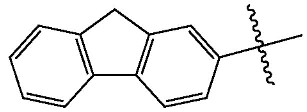 [SMILES: *c1ccc2c(c1)Cc1ccccc1-2] | 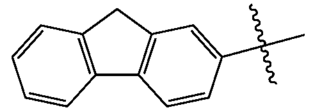 [SMILES: *c1ccc2c(c1)Cc1ccccc1-2] | 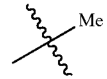 | H | 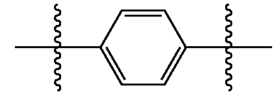 [SMILES: *c1ccc(*)cc1] | 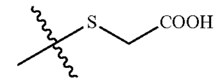 |
| 245 | 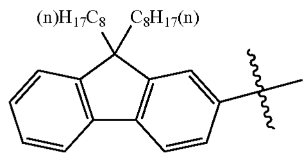 | 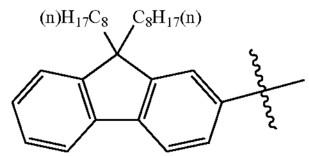 | 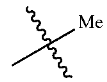 | H | 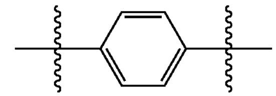 [SMILES: *c1ccc(*)cc1] | 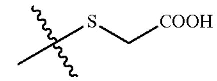 |
| 246 | 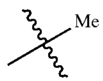 | 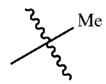 | 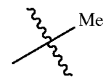 | H | 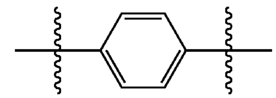 | 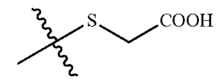 |
| 247 | 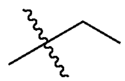 [SMILES: *CC] | 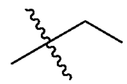 [SMILES: *CC] | 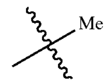 | H | 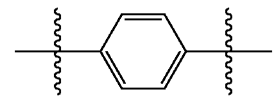 [SMILES: *c1ccc(*)cc1] | 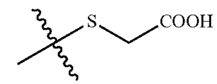 [SMILES: *SCC(=O)O] |
| 248 | 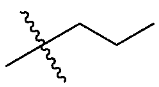 [SMILES: *CCC] | 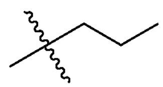 [SMILES: *CCC] | 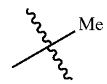 | H | 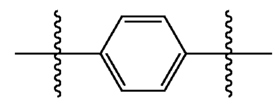 [SMILES: *c1ccc(*)cc1] | 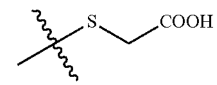 |
| 249 | 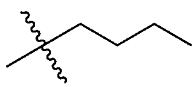 [SMILES: *CCCC] | 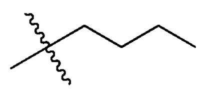 [SMILES: *CCCC] | 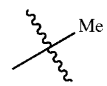 | H | 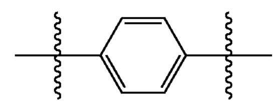 | 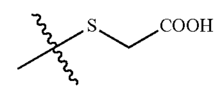 |
| 250 | 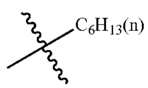 | 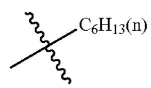 | 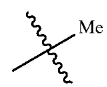 | H | 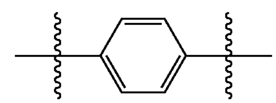 | 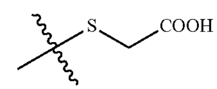 |
| 251 | 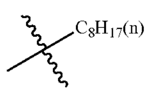 | 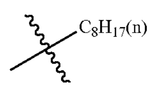 | 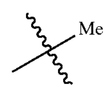 | H | 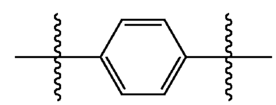 [SMILES: *c1ccc(*)cc1] | 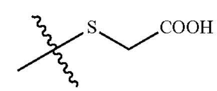 |

-continued
| Dye | $R_1$ | $R_2$ | $R_3$ | $R_4$ | Ar | 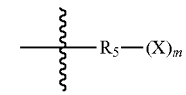  |
|---|---|---|---|---|---|---|
| 252 | 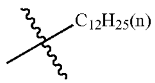  | 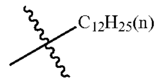  | 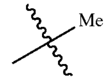  | H | 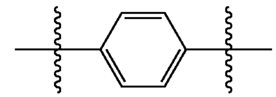 [SMILES: *c1ccc(*)cc1] | 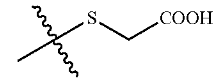  |
| 253 | 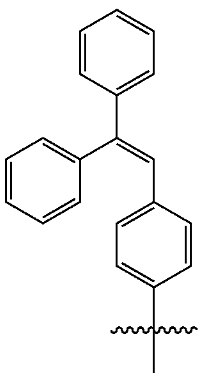 [SMILES: *c1ccc(C=C(c2ccccc2)c2ccccc2)cc1] | 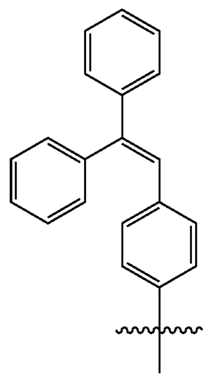 [SMILES: *c1ccc(C=C(c2ccccc2)c2ccccc2)cc1] | H |   | 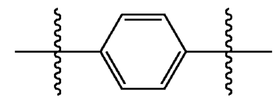 [SMILES: *c1ccc(*)cc1] | 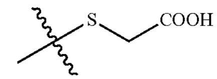 [SMILES: *SCC(=O)O]  |
| 254 | 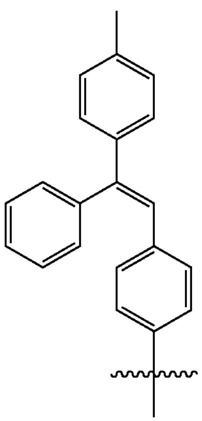 [SMILES: *c1ccc(/C=C(\c2ccccc2)c2ccc(C)cc2)cc1] | 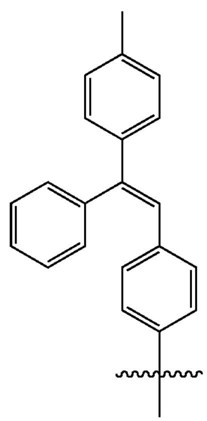 | H | 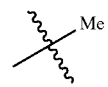  | 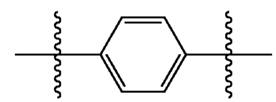 [SMILES: *c1ccc(*)cc1] | 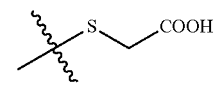 [SMILES: *SCC(=O)O]  |

-continued
| Dye | R1 | R2 | R3 | R4 | Ar | 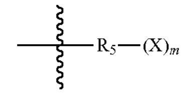 |
|---|---|---|---|---|---|---|
| 255 | 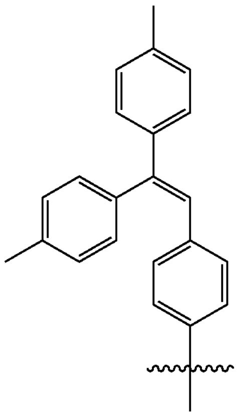 [SMILES: *c1ccc(C=C(c2ccc(C)cc2)c2ccc(C)cc2)cc1] | 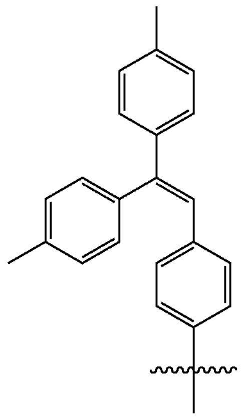 [SMILES: *c1ccc(C=C(c2ccc(C)cc2)c2ccc(C)cc2)cc1] | H | 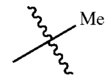 | 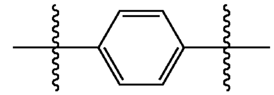 | 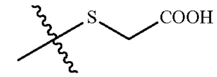 [SMILES: *SCC(=O)O] |
| 256 | 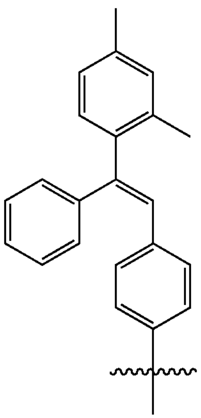 | 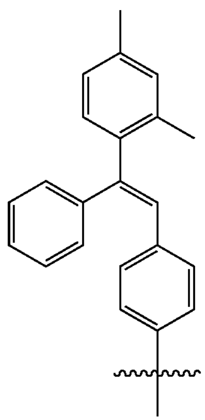 | H | 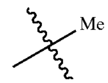 | 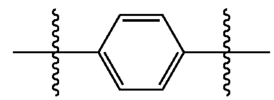 | 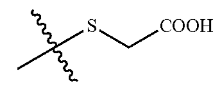 [SMILES: *SCC(=O)O] |

-continued
| Dye | $R_1$ | $R_2$ | $R_3$ | $R_4$ | Ar | 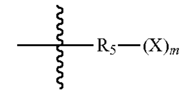 |
|---|---|---|---|---|---|---|
| 257 | 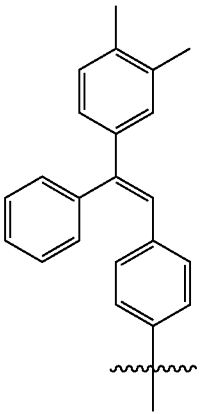 | 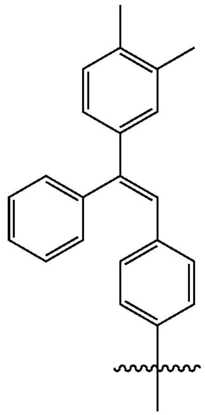 | H | 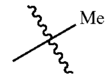 | 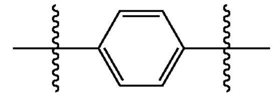 [SMILES: *c1ccc(*)cc1] | 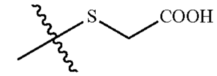 [SMILES: *SCC(=O)O] |
| 258 | 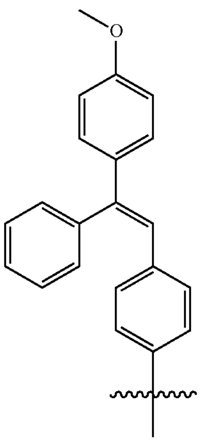 [SMILES: *c1ccc(/C=C(\c2ccccc2)c2ccc(OC)cc2)cc1] | 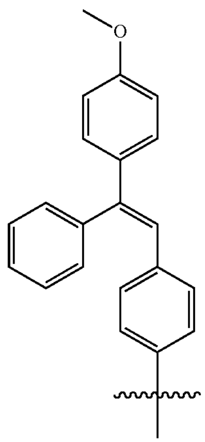 [SMILES: *c1ccc(/C=C(\c2ccccc2)c2ccc(OC)cc2)cc1] | H | 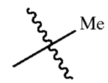 | 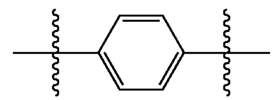 [SMILES: *c1ccc(*)cc1] | 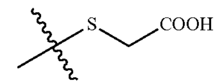 [SMILES: *SCC(=O)O] |

-continued
| Dye | R1 | R2 | R3 | R4 | Ar | 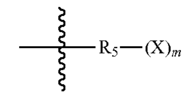 |
|---|---|---|---|---|---|---|
| 259 | 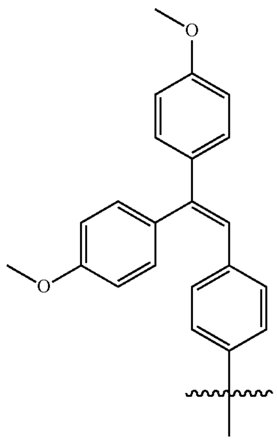 [SMILES: *c1ccc(C=C(c2ccc(OC)cc2)c2ccc(OC)cc2)cc1] | 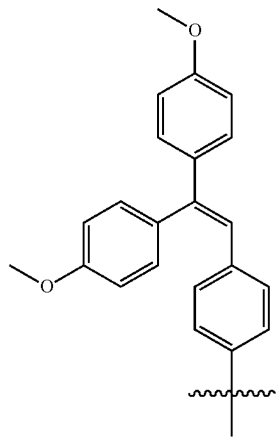 [SMILES: *c1ccc(C=C(c2ccc(OC)cc2)c2ccc(OC)cc2)cc1] | H | 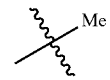 | 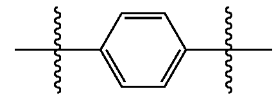 [SMILES: *c1ccc(*)cc1] | 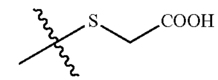 [SMILES: *SCC(=O)O] |
| 260 | 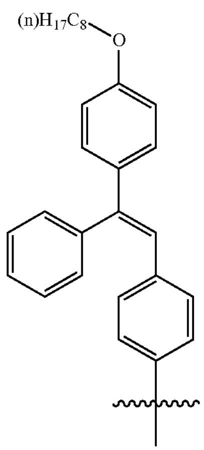 | 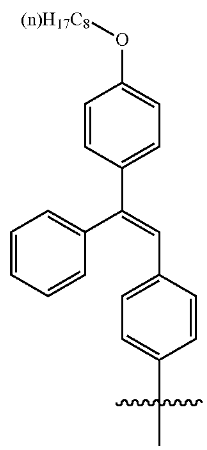 | H | 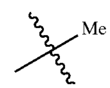 | 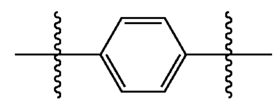 | 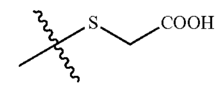 |

-continued
| Dye | $R_1$ | $R_2$ | $R_3$ | $R_4$ | Ar | 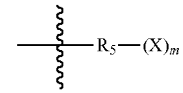 |
|---|---|---|---|---|---|---|
| 261 | 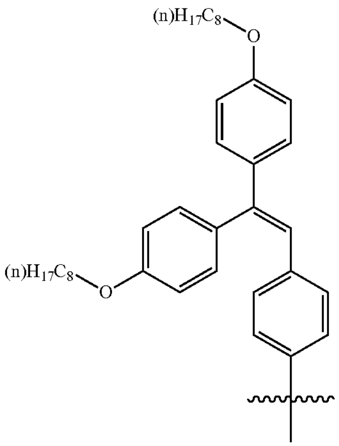 | 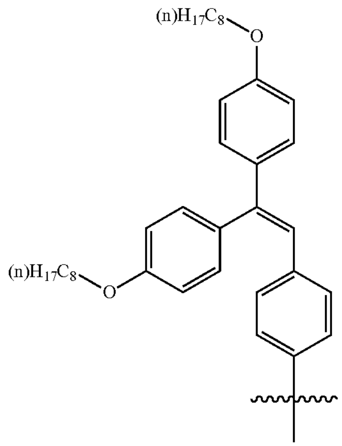 | H |  | 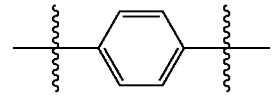 [SMILES: *c1ccc(*)cc1] | 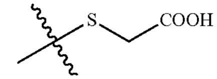 [SMILES: *SCC(=O)O] |
| 262 | 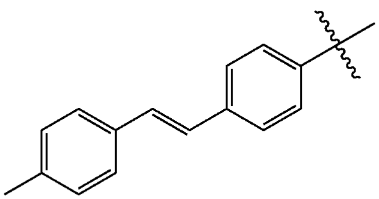 [SMILES: *c1ccc(/C=C/c2ccc(C)cc2)cc1] | 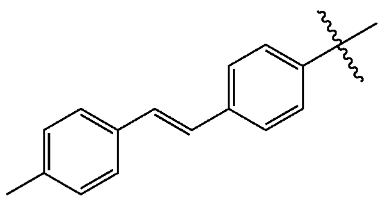 [SMILES: *c1ccc(/C=C/c2ccc(C)cc2)cc1] | H |  | 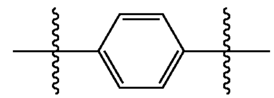 | 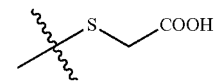 |
| 263 | 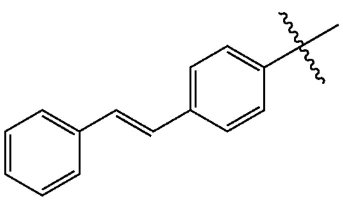 [SMILES: *c1ccc(/C=C/c2ccccc2)cc1] | 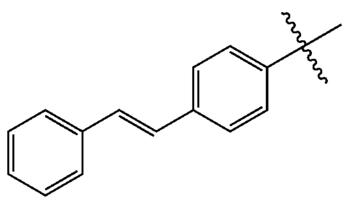 [SMILES: *c1ccc(/C=C/c2ccccc2)cc1] | H |  | 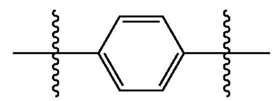 | 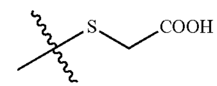 [SMILES: *SCC(=O)O] |

-continued
| Dye | $R_1$ | $R_2$ | $R_3$ | $R_4$ | Ar |  $R_5$—$(X)_m$ |
|---|---|---|---|---|---|---|
| 264 | 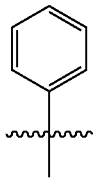 [SMILES: *c1ccccc1] | 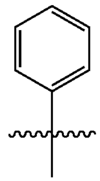 | H | 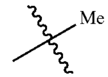 | 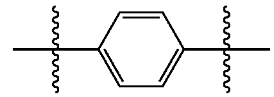 | 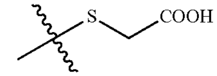 [SMILES: *SCC(=O)O] |
| 265 | 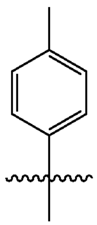 [SMILES: *c1ccc(C)cc1] | 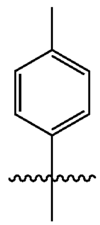 | H |  | 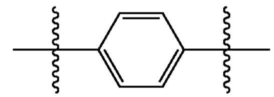 [SMILES: *c1ccc(*)cc1] | 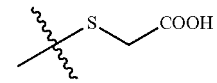 |
| 266 | 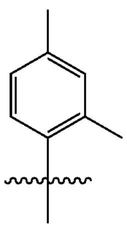 [SMILES: *c1ccc(C)cc1C] | 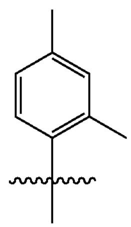 [SMILES: *c1ccc(C)cc1C] | H | 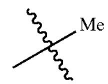 | 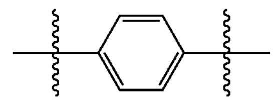 | 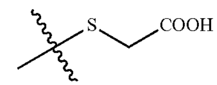 [SMILES: *SCC(=O)O] |
| 267 | 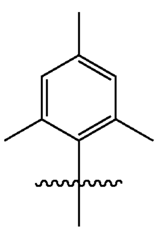 | 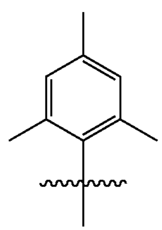 | H | 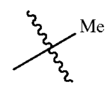 | 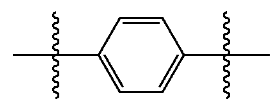 [SMILES: *c1ccc(*)cc1] | 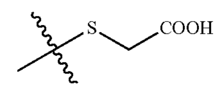 [SMILES: *SCC(=O)O] |

-continued
| Dye | $R_1$ | $R_2$ | $R_3$ | $R_4$ | Ar |  |
|---|---|---|---|---|---|---|
| 268 | 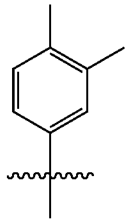 [SMILES: *c1ccc(C)c(C)c1] | 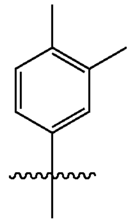 [SMILES: *c1ccc(C)c(C)c1] | H |  | 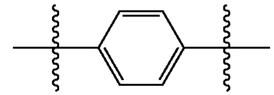 [SMILES: *c1ccc(*)cc1] | 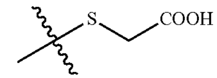 |
| 269 | 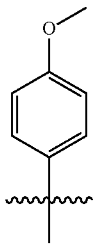 [SMILES: *c1ccc(OC)cc1] | 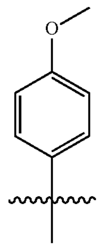 | H | 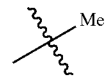 | 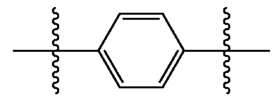 [SMILES: *c1ccc(*)cc1] | 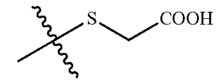 [SMILES: *SCC(=O)O] |
| 270 | 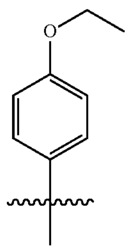 [SMILES: *c1ccc(OCC)cc1] | 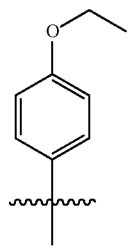 | H | 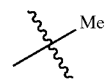 | 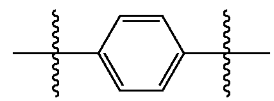 [SMILES: *c1ccc(*)cc1] | 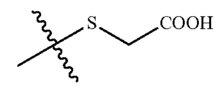 |
| 271 | 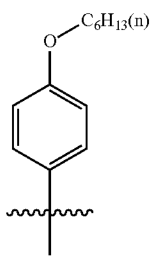 | 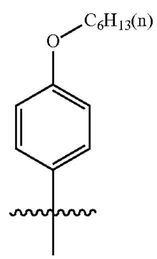 | H | 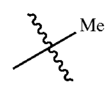 | 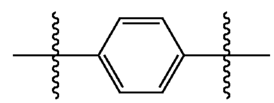 [SMILES: *c1ccc(*)cc1] | 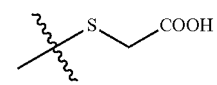 [SMILES: *SCC(=O)O] |

-continued
| Dye | R1 | R2 | R3 | R4 | Ar | 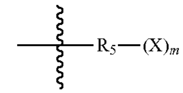 |
| --- | --- | --- | --- | --- | --- | --- |
| 272 | 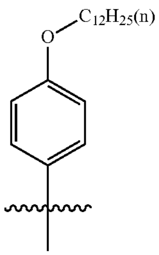 | 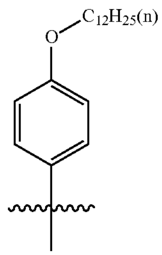 | H | 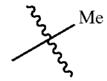 | 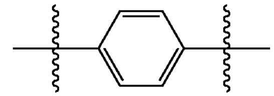 [SMILES: *c1ccc(*)cc1] | 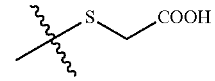 |
| 273 | 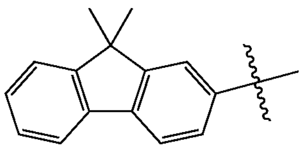 [SMILES: *c1ccc2c(c1)C(C)(C)c1ccccc1-2] | 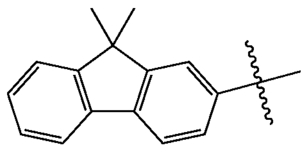 [SMILES: *c1ccc2c(c1)C(C)(C)c1ccccc1-2] | H | 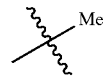 | 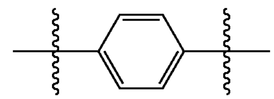 [SMILES: *c1ccc(*)cc1] | 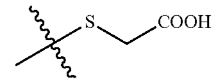 |
| 274 | 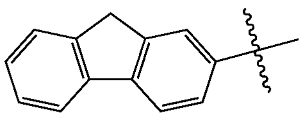 [SMILES: *c1ccc2c(c1)Cc1ccccc1-2] | 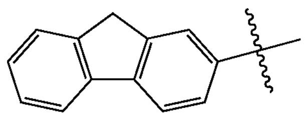 [SMILES: *c1ccc2c(c1)Cc1ccccc1-2] | H | 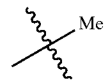 | 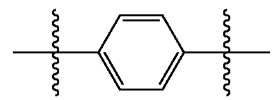 [SMILES: *c1ccc(*)cc1] | 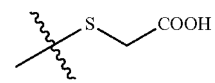 |
| 275 | 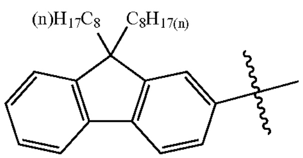 | 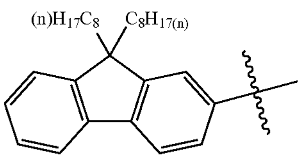 | H | 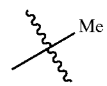 | 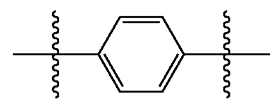 [SMILES: *c1ccc(*)cc1] | 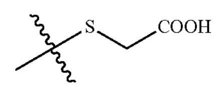 |
| 276 | 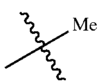 | 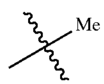 | H | 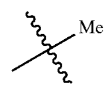 | 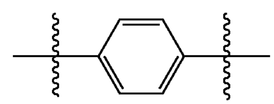 | 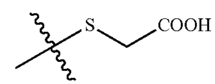 [SMILES: *SCC(=O)O] |
| 277 | 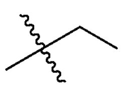 [SMILES: *CC] | 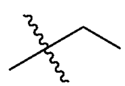 [SMILES: *CC] | H | 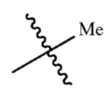 | 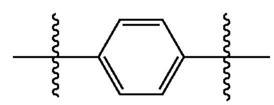 | 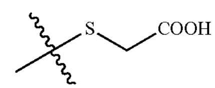 [SMILES: *SCC(=O)O] |

-continued
| Dye | $R_1$ | $R_2$ | $R_3$ | $R_4$ | Ar | 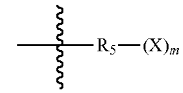  |
| --- | --- | --- | --- | --- | --- | --- |
| 278 | 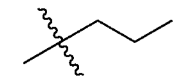 [SMILES: *CCC] |  | H | Me | 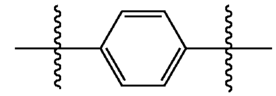 | 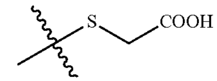 [SMILES: *SCC(=O)O]  |
| 279 | 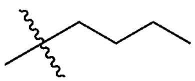 [SMILES: *CCCC] | 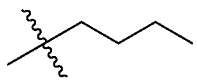 [SMILES: *CCCC] | H | Me | 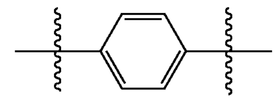 | 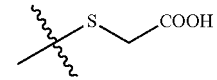  |
| 280 | $C_6H_{13}$(n) | $C_6H_{13}$(n) | H | Me | 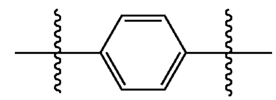 | 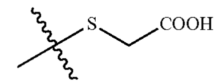 [SMILES: *SCC(=O)O]  |
| 281 | $C_8H_{17}$(n) | $C_8H_{17}$(n) | H | Me | 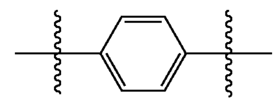 [SMILES: *c1ccc(*)cc1] | 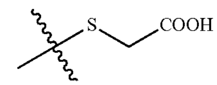 [SMILES: *SCC(=O)O]  |
| 282 | $C_{12}H_{25}$(n) | $C_{12}H_{25}$(n) | H | Me | 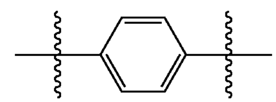 [SMILES: *c1ccc(*)cc1] | 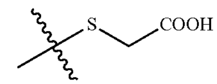 [SMILES: *SCC(=O)O]  |
| 283 | 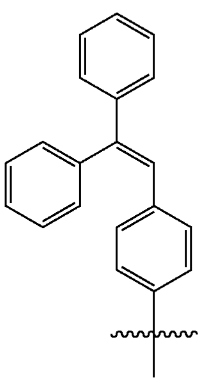 [SMILES: *c1ccc(C=C(c2ccccc2)c2ccccc2)cc1] | 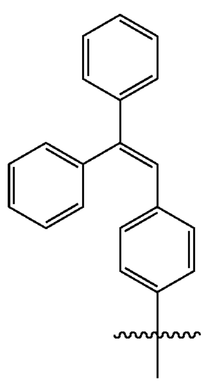 [SMILES: *c1ccc(C=C(c2ccccc2)c2ccccc2)cc1] | Me | Me | 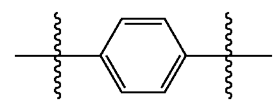 | 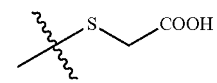 [SMILES: *SCC(=O)O]  |

-continued
| Dye | $R_1$ | $R_2$ | $R_3$ | $R_4$ | Ar | 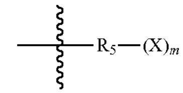 |
| --- | --- | --- | --- | --- | --- | --- |
| 284 | 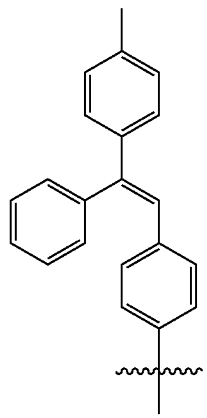 [SMILES: *c1ccc(/C=C(\c2ccccc2)c2ccc(C)cc2)cc1] | 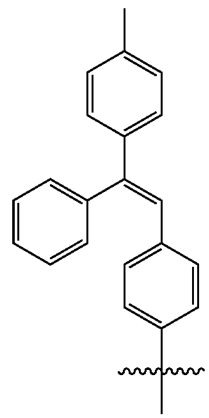 | 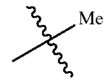 | 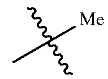 | 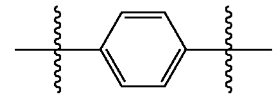 | 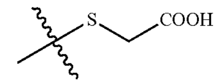 [SMILES: *SCC(=O)O] |
| 285 | 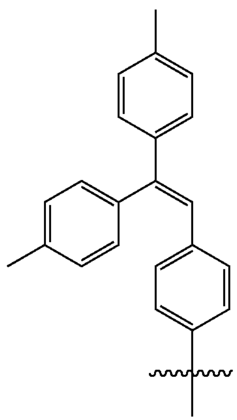 [SMILES: *c1ccc(C=C(c2ccc(C)cc2)c2ccc(C)cc2)cc1] | 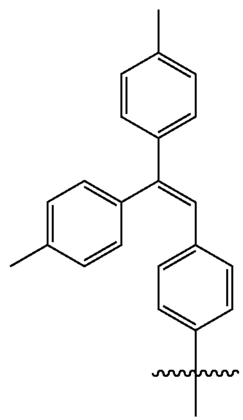 [SMILES: *c1ccc(C=C(c2ccc(C)cc2)c2ccc(C)cc2)cc1] |  | 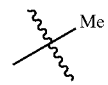 | 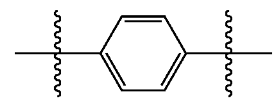 [SMILES: *c1ccc(*)cc1] | 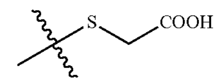 |

-continued
| Dye | $R_1$ | $R_2$ | $R_3$ | $R_4$ | Ar | 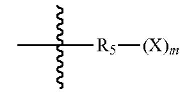 |
|---|---|---|---|---|---|---|
| 286 | 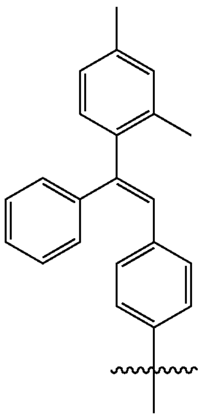 | 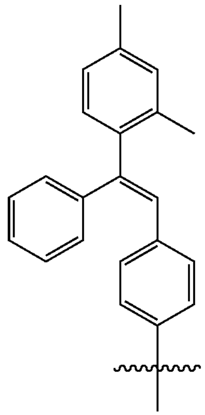 |  | 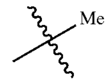 | 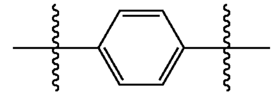 [SMILES: *c1ccc(*)cc1] | 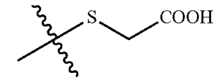 |
| 287 | 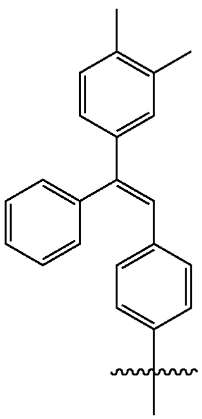 | 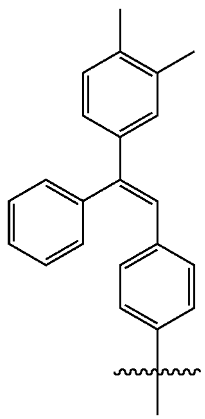 | 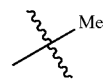 | 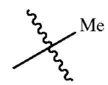 | 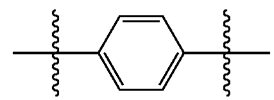 [SMILES: *c1ccc(*)cc1] | 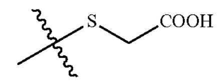 |

-continued
| Dye | $R_1$ | $R_2$ | $R_3$ | $R_4$ | Ar | 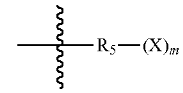 |
|---|---|---|---|---|---|---|
| 288 | 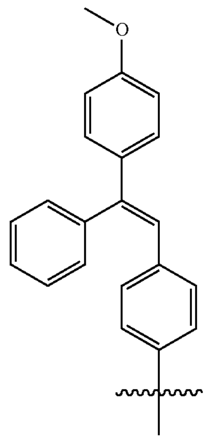 [SMILES: *c1ccc(/C=C(\c2ccccc2)c2ccc(OC)cc2)cc1] | 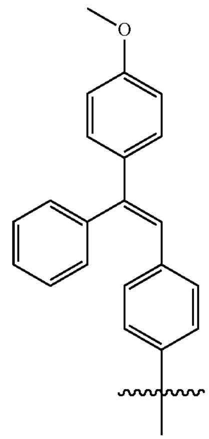 [SMILES: *c1ccc(/C=C(\c2ccccc2)c2ccc(OC)cc2)cc1] | 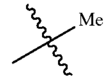 | 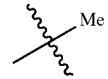 | 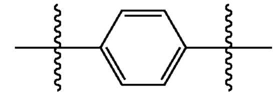 [SMILES: *c1ccc(*)cc1] | 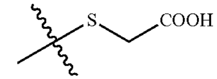 [SMILES: *SCC(=O)O] |
| 289 | 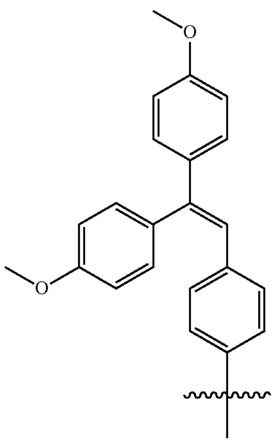 [SMILES: *c1ccc(C=C(c2ccc(OC)cc2)c2ccc(OC)cc2)cc1] | 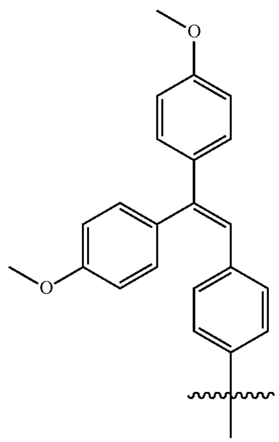 [SMILES: *c1ccc(C=C(c2ccc(OC)cc2)c2ccc(OC)cc2)cc1] | 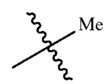 | 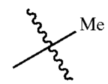 | 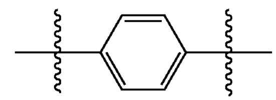 | 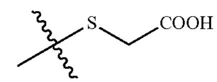 [SMILES: *SCC(=O)O] |

-continued
| Dye | $R_1$ | $R_2$ | $R_3$ | $R_4$ | Ar | 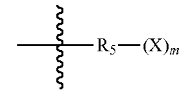 |
|---|---|---|---|---|---|---|
| 290 | 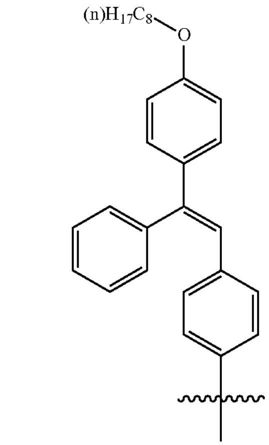 | 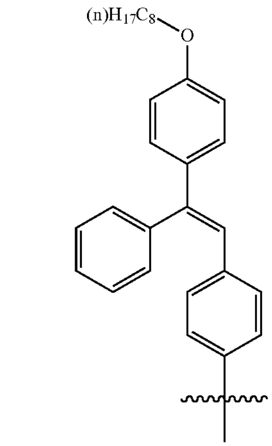 | 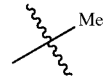 | 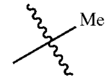 | 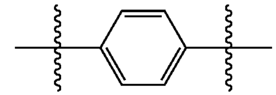 [SMILES: *c1ccc(*)cc1] | 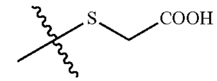 |
| 291 | 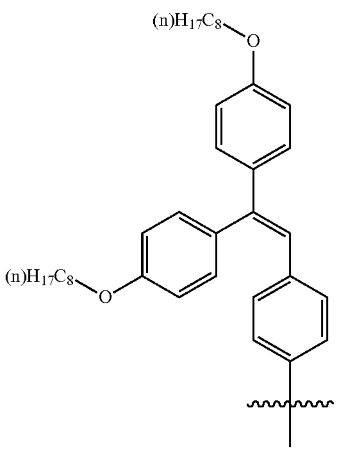 | 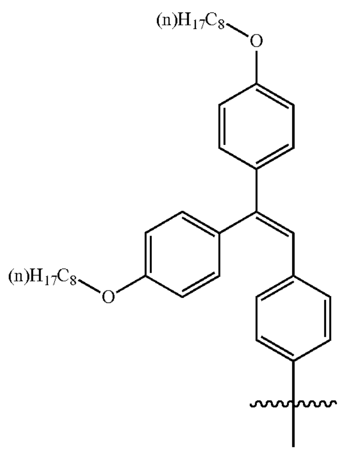 | 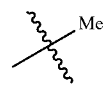 | 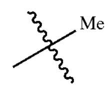 | 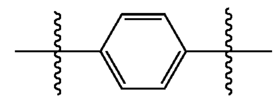 | 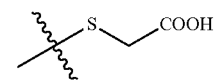 |

-continued
| Dye | $R_1$ | $R_2$ | $R_3$ | $R_4$ | Ar | 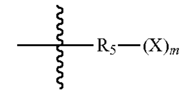  |
|---|---|---|---|---|---|---|
| 292 | 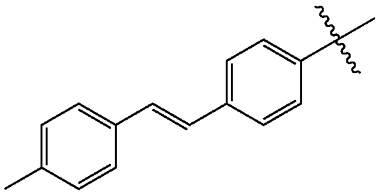 [SMILES: *c1ccc(/C=C/c2ccc(C)cc2)cc1] | 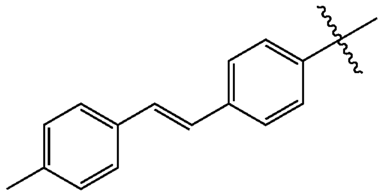 [SMILES: *c1ccc(/C=C/c2ccc(C)cc2)cc1] | 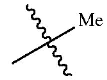  |   | 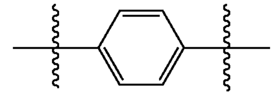 [SMILES: *c1ccc(*)cc1] | 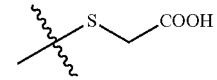  |
| 293 | 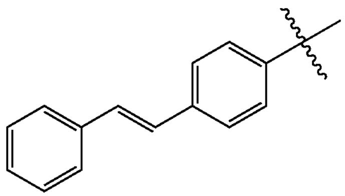 [SMILES: *c1ccc(/C=C/c2ccccc2)cc1] | 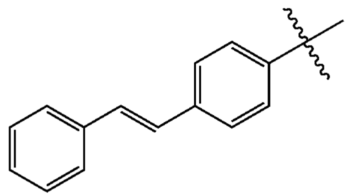 [SMILES: *c1ccc(/C=C/c2ccccc2)cc1] |   |   | 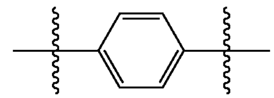 [SMILES: *c1ccc(*)cc1] | 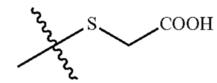  |
| 294 | 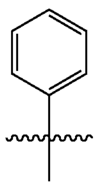 [SMILES: *c1ccccc1] | 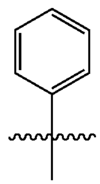 | 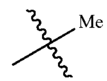  | 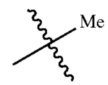  | 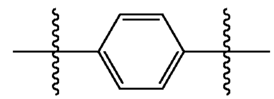 [SMILES: *c1ccc(*)cc1] | 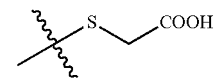 [SMILES: *SCC(=O)O]  |
| 295 | 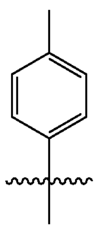 [SMILES: *c1ccc(C)cc1] | 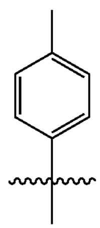 | 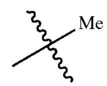  | 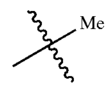  | 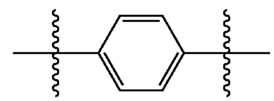 [SMILES: *c1ccc(*)cc1] | 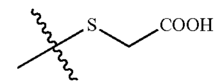  |

-continued
| Dye | $R_1$ | $R_2$ | $R_3$ | $R_4$ | Ar | $R_5$—$(X)_m$ |
|---|---|---|---|---|---|---|
| 296 | 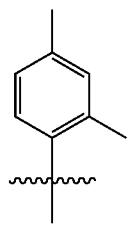 [SMILES: *c1ccc(C)cc1C] | 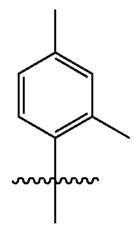 [SMILES: *c1ccc(C)cc1C] | Me | Me | 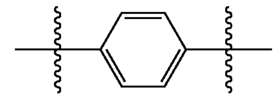 [SMILES: *c1ccc(*)cc1] | 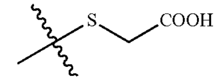 |
| 297 | 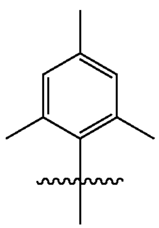 | 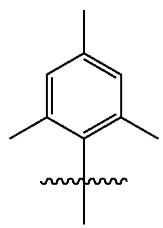 | Me | Me | 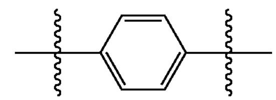 [SMILES: *c1ccc(*)cc1] | 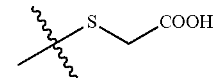 |
| 298 | 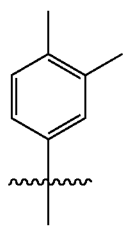 [SMILES: *c1ccc(C)c(C)c1] | 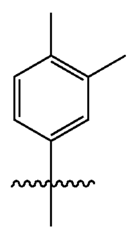 [SMILES: *c1ccc(C)c(C)c1] | Me | Me | 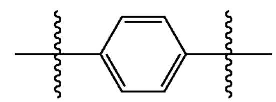 [SMILES: *c1ccc(*)cc1] | 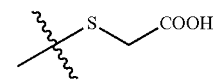 [SMILES: *SCC(=O)O] |
| 299 | 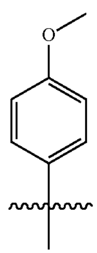 [SMILES: *c1ccc(OC)cc1] | 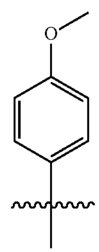 [SMILES: *c1ccc(OC)cc1] | Me | Me | 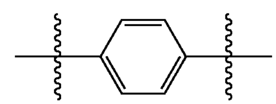 [SMILES: *c1ccc(*)cc1] | 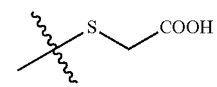 [SMILES: *SCC(=O)O] |

-continued
| Dye | $R_1$ | $R_2$ | $R_3$ | $R_4$ | Ar | 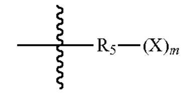 |
|---|---|---|---|---|---|---|
| 300 | 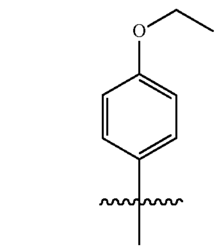 [SMILES: *c1ccc(OCC)cc1] | 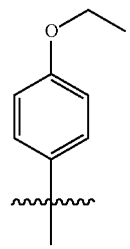 [SMILES: *c1ccc(OCC)cc1] |  | 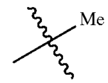 | 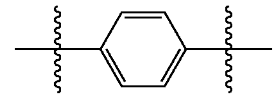 [SMILES: *c1ccc(*)cc1] | 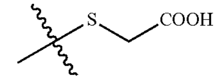 [SMILES: *SCC(=O)O] |
| 301 | 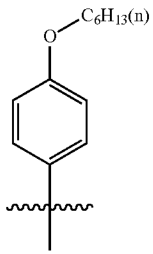 | 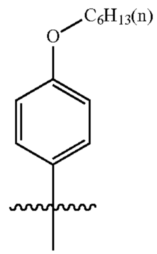 | 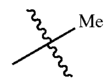 | 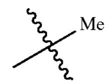 | 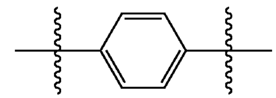 [SMILES: *c1ccc(*)cc1] | 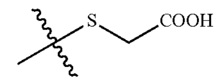 [SMILES: *SCC(=O)O] |
| 302 | 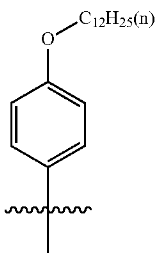 | 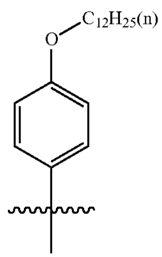 | 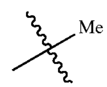 | 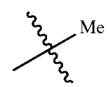 | 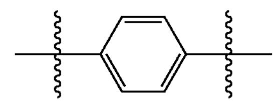 [SMILES: *c1ccc(*)cc1] | 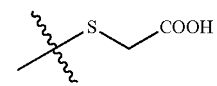 [SMILES: *SCC(=O)O] |
| 303 | 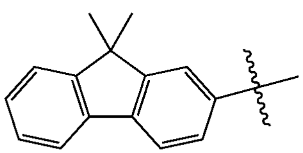 [SMILES: *c1ccc2c(c1)C(C)(C)c1ccccc1-2] | 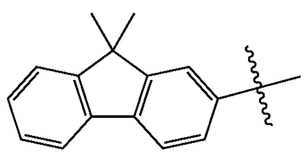 [SMILES: *c1ccc2c(c1)C(C)(C)c1ccccc1-2] | 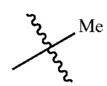 | 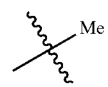 | 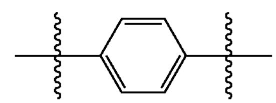 | 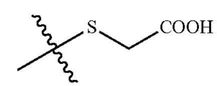 [SMILES: *SCC(=O)O] |

-continued
| Dye | R1 | R2 | R3 | R4 | Ar | 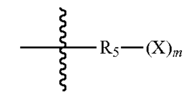 |
|---|---|---|---|---|---|---|
| 304 | 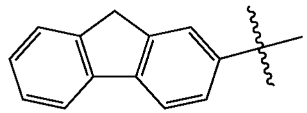 [SMILES: *c1ccc2c(c1)Cc1ccccc1-2] | 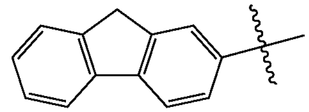 [SMILES: *c1ccc2c(c1)Cc1ccccc1-2] | Me | Me | 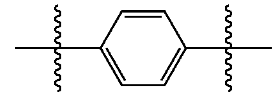 | 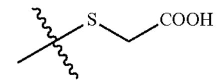 |
| 305 | 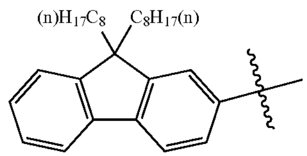 | 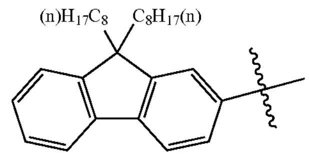 | Me | Me | 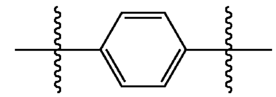 [SMILES: *c1ccc(*)cc1] | 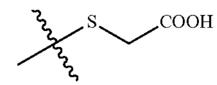 |
| 306 | 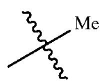 | 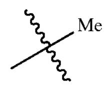 | Me | Me | 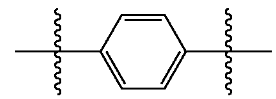 [SMILES: *c1ccc(*)cc1] | 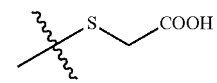 |
| 307 | 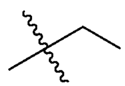 | 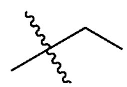 [SMILES: *CC] | Me | Me | 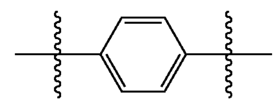 | 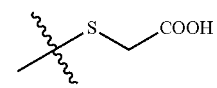 |
| 308 | 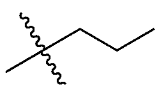 [SMILES: *CCC] | 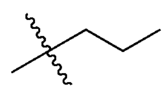 [SMILES: *CCC] | Me | Me | 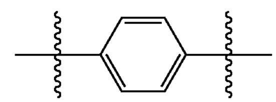 [SMILES: *c1ccc(*)cc1] | 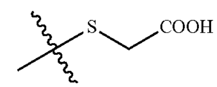 [SMILES: *SCC(=O)O] |
| 309 | 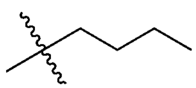 [SMILES: *CCCC] | 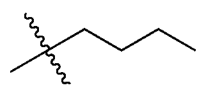 [SMILES: *CCCC] | Me | Me | 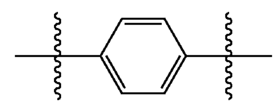 [SMILES: *c1ccc(*)cc1] | 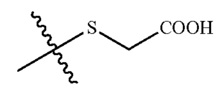 |
| 310 | 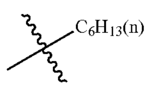 | 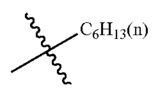 | Me | Me | 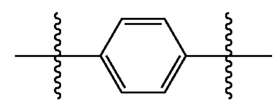 | 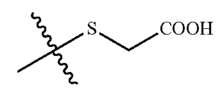 |
| 311 | 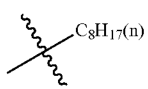 | 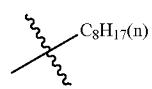 | Me | Me | 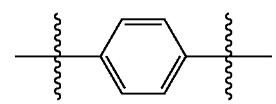 [SMILES: *c1ccc(*)cc1] | 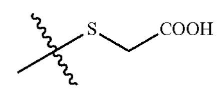 |

-continued
| Dye | $R_1$ | $R_2$ | $R_3$ | $R_4$ | Ar | 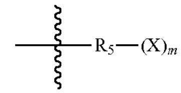 |
|---|---|---|---|---|---|---|
| 312 | 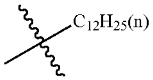 | 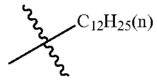 | 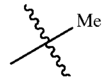 | 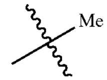 | 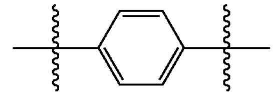 | 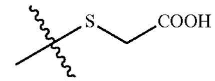 [SMILES: *SCC(=O)O] |
| 313 | 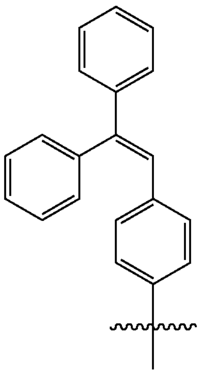 [SMILES: *c1ccc(C=C(c2ccccc2)c2ccccc2)cc1] | 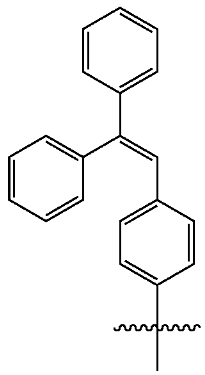 [SMILES: *c1ccc(C=C(c2ccccc2)c2ccccc2)cc1] | 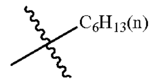 | H | 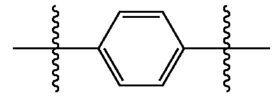 [SMILES: *c1ccc(*)cc1] | 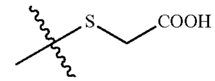 |
| 314 | 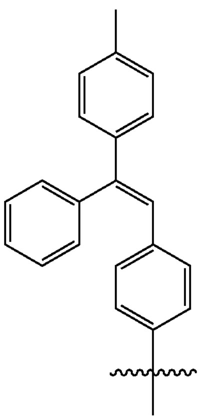 [SMILES: *c1ccc(/C=C(\c2ccccc2)c2ccc(C)cc2)cc1] | 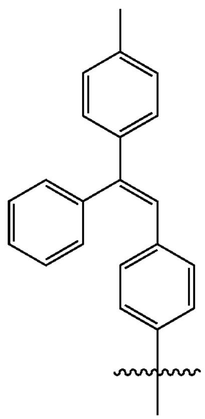 [SMILES: *c1ccc(/C=C(\c2ccccc2)c2ccc(C)cc2)cc1] | 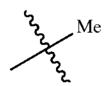 | H | 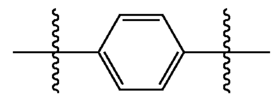 [SMILES: *c1ccc(*)cc1] | 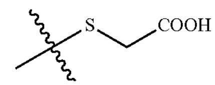 |

-continued
| Dye | R1 | R2 | R3 | R4 | Ar | 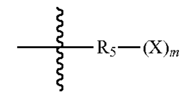 |
|---|---|---|---|---|---|---|
| 315 | 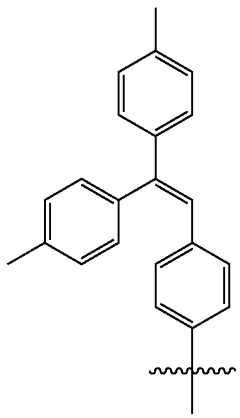 [SMILES: *c1ccc(C=C(c2ccc(C)cc2)c2ccc(C)cc2)cc1] | 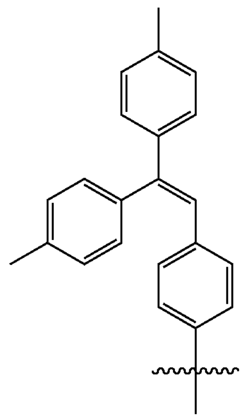 [SMILES: *c1ccc(C=C(c2ccc(C)cc2)c2ccc(C)cc2)cc1] | 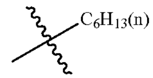 | H | 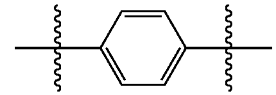 [SMILES: *c1ccc(*)cc1] | 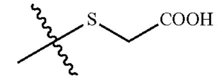 |
| 316 | 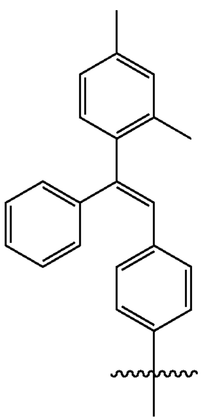 [SMILES: *c1ccc(/C=C(\c2ccccc2)c2ccc(C)cc2C)cc1] | 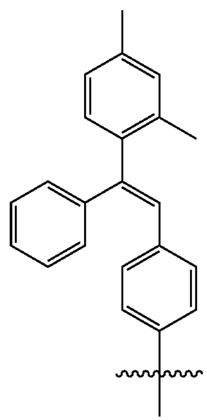 | 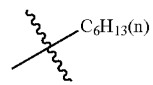 | H | 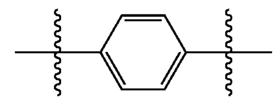 [SMILES: *c1ccc(*)cc1] | 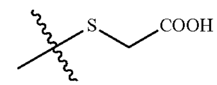 |

-continued
| Dye | $R_1$ | $R_2$ | $R_3$ | $R_4$ | Ar | 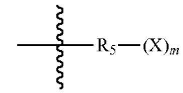 |
|---|---|---|---|---|---|---|
| 317 | 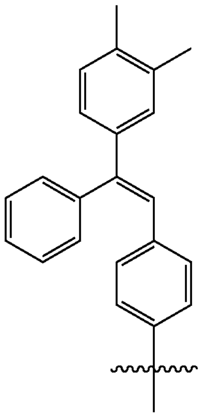 [SMILES: *c1ccc(/C=C(\c2ccccc2)c2ccc(C)c(C)c2)cc1] | 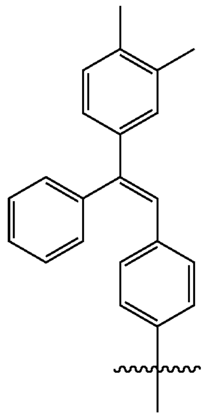 | 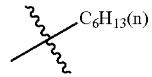 | H | 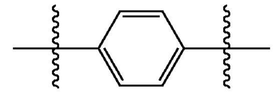 [SMILES: *c1ccc(*)cc1] | 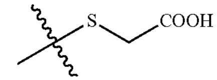 |
| 318 | 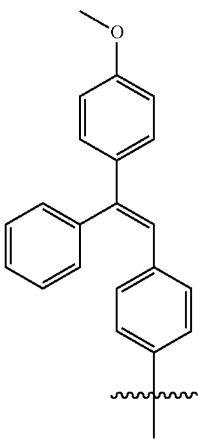 [SMILES: *c1ccc(/C=C(\c2ccccc2)c2ccc(OC)cc2)cc1] | 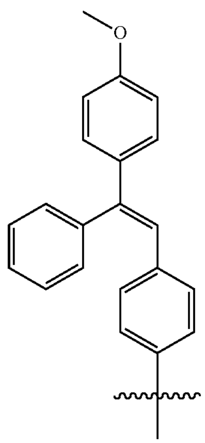 [SMILES: *c1ccc(/C=C(\c2ccccc2)c2ccc(OC)cc2)cc1] | 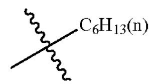 | H | 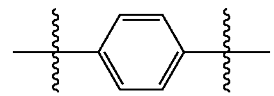 | 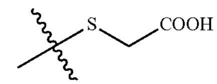 |

-continued
| Dye | R1 | R2 | R3 | R4 | Ar | 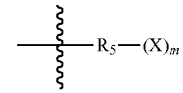 |
|---|---|---|---|---|---|---|
| 319 | 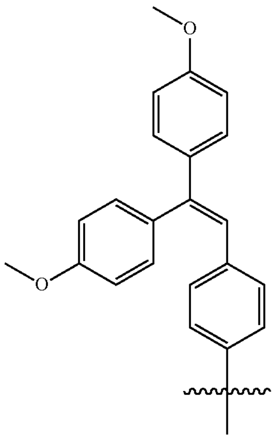 [SMILES: *c1ccc(C=C(c2ccc(OC)cc2)c2ccc(OC)cc2)cc1] | 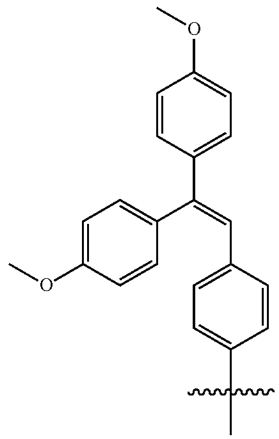 [SMILES: *c1ccc(C=C(c2ccc(OC)cc2)c2ccc(OC)cc2)cc1] | 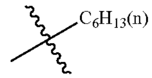 | H | 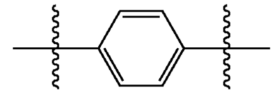 | 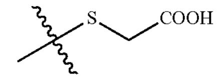 |
| 320 | 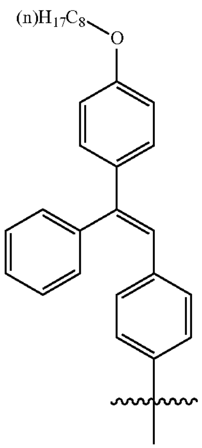 | 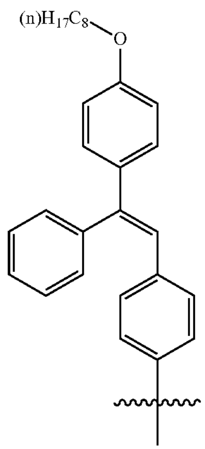 | 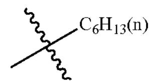 | H | 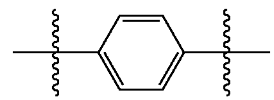 [SMILES: *c1ccc(*)cc1] | 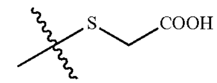 |

-continued
| Dye | $R_1$ | $R_2$ | $R_3$ | $R_4$ | Ar | 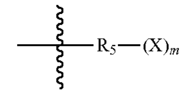 |
|---|---|---|---|---|---|---|
| 321 | 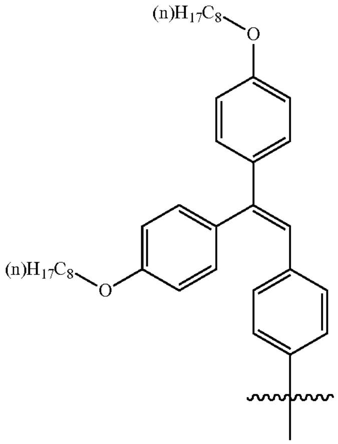 | 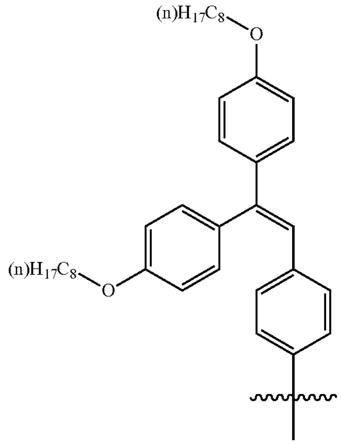 | 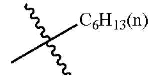 | H | 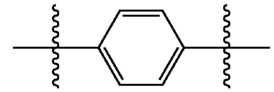 | 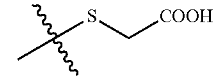 |
| 322 | 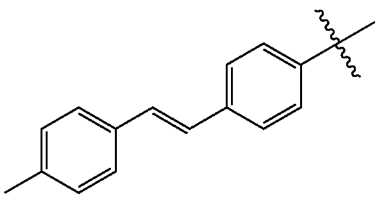 [SMILES: *c1ccc(/C=C/c2ccc(C)cc2)cc1] | 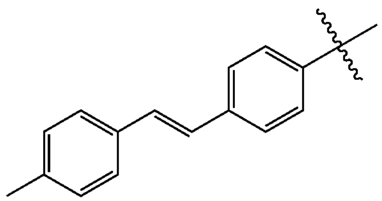 [SMILES: *c1ccc(/C=C/c2ccc(C)cc2)cc1] | 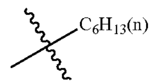 | H | 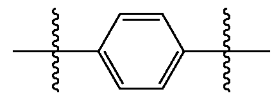 | 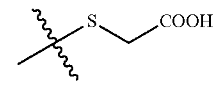 [SMILES: *SCC(=O)O] |
| 323 | 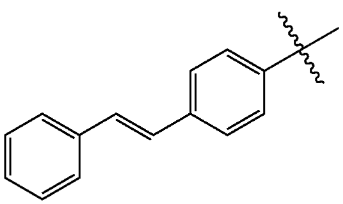 [SMILES: *c1ccc(/C=C/c2ccccc2)cc1] | 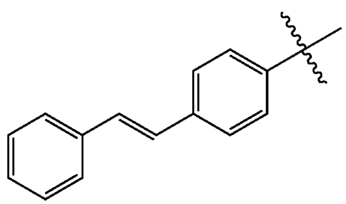 [SMILES: *c1ccc(/C=C/c2ccccc2)cc1] | 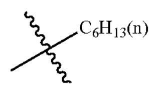 | H | 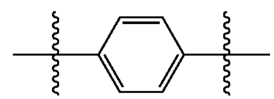 [SMILES: *c1ccc(*)cc1] | 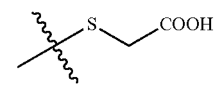 |

-continued
| Dye | $R_1$ | $R_2$ | $R_3$ | $R_4$ | Ar | 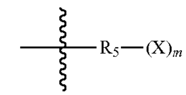  |
|---|---|---|---|---|---|---|
| 324 | 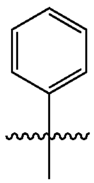 [SMILES: *c1ccccc1] | 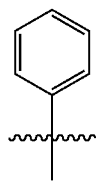 [SMILES: *c1ccccc1] | 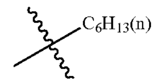  | H | 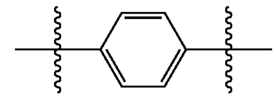 | 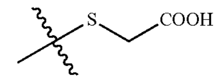  |
| 325 | 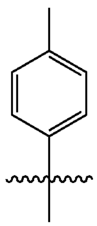 [SMILES: *c1ccc(C)cc1] | 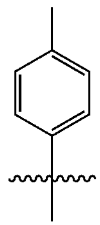 | 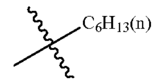  | H | 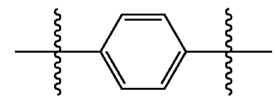 [SMILES: *c1ccc(*)cc1] | 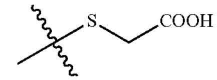  |
| 326 | 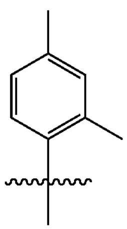 [SMILES: *c1ccc(C)cc1C] | 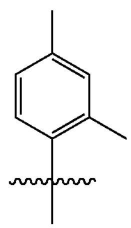 | 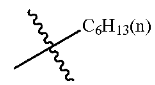  | H | 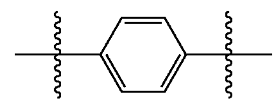 [SMILES: *c1ccc(*)cc1] | 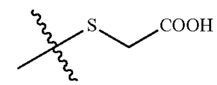  |
| 327 | 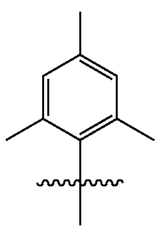 | 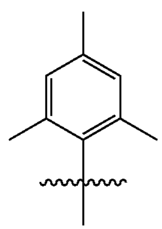 | 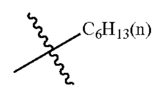  | H | 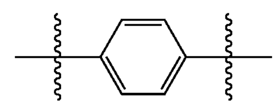 [SMILES: *c1ccc(*)cc1] | 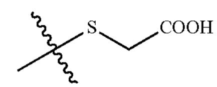 [SMILES: *SCC(=O)O]  |

-continued
| Dye | $R_1$ | $R_2$ | $R_3$ | $R_4$ | Ar | 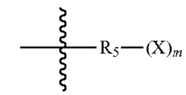 |
|---|---|---|---|---|---|---|
| 328 | 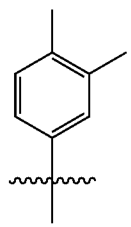 [SMILES: *c1ccc(C)c(C)c1] | 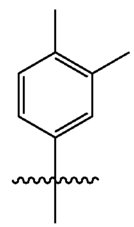 | 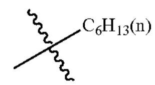 | H | 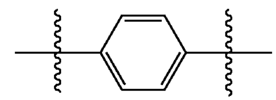 [SMILES: *c1ccc(*)cc1] | 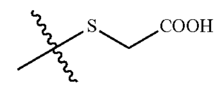 |
| 329 | 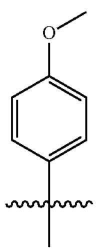 | 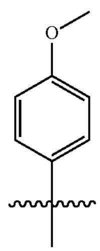 | 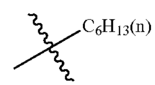 | H | 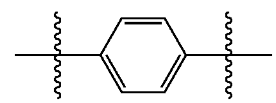 [SMILES: *c1ccc(*)cc1] | 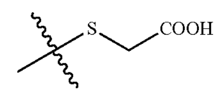 [SMILES: *SCC(=O)O] |
| 330 | 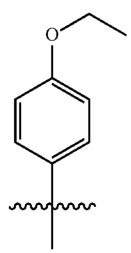 [SMILES: *c1ccc(OCC)cc1] | 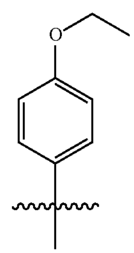 | 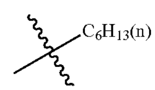 | H | 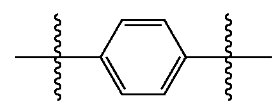 | 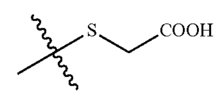 [SMILES: *SCC(=O)O] |
| 331 | 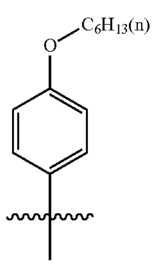 | 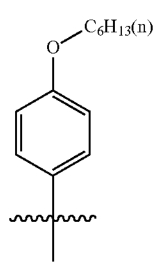 | 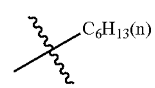 | H | 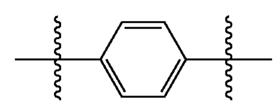 | 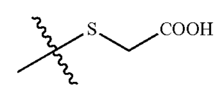 [SMILES: *SCC(=O)O] |

-continued
| Dye | $R_1$ | $R_2$ | $R_3$ | $R_4$ | Ar | 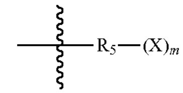  |
|---|---|---|---|---|---|---|
| 332 | 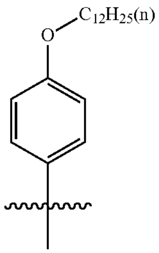  | 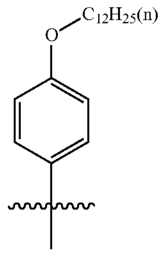  | 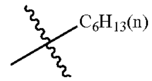  | H | 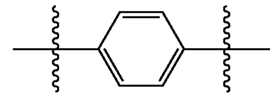 [SMILES: *c1ccc(*)cc1] | 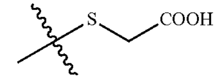  |
| 333 | 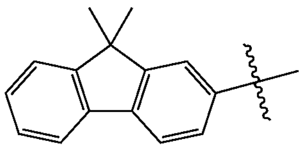 [SMILES: *c1ccc2c(c1)C(C)(C)c1ccccc1-2] | 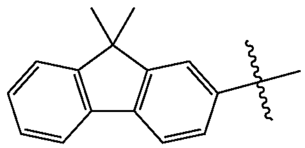 [SMILES: *c1ccc2c(c1)C(C)(C)c1ccccc1-2] | 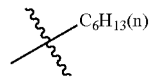  | H | 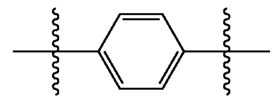 [SMILES: *c1ccc(*)cc1] | 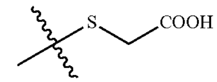 [SMILES: *SCC(=O)O]  |
| 334 | 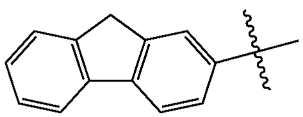 [SMILES: *c1ccc2c(c1)Cc1ccccc1-2] | 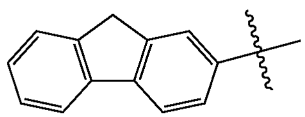 [SMILES: *c1ccc2c(c1)Cc1ccccc1-2] | 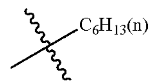  | H | 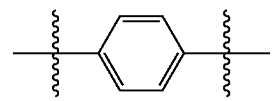 [SMILES: *c1ccc(*)cc1] | 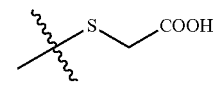  |
| 335 | 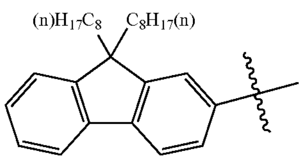  | 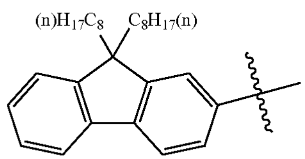  | 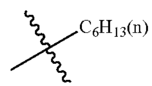  | H | 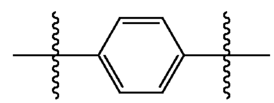 | 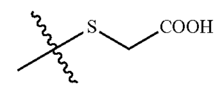 [SMILES: *SCC(=O)O]  |
| 336 | 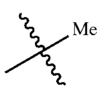  | 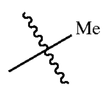  | 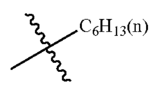  | H | 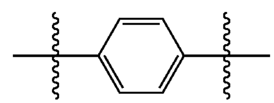 [SMILES: *c1ccc(*)cc1] | 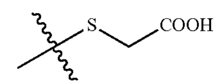  |
| 337 | 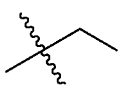 [SMILES: *CC] | 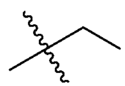 | 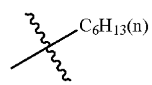  | H | 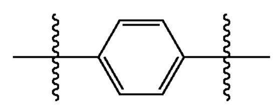 [SMILES: *c1ccc(*)cc1] | 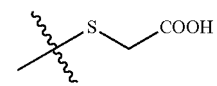  |

-continued
| Dye | $R_1$ | $R_2$ | $R_3$ | $R_4$ | Ar | $R_5$—$(X)_m$ |
|---|---|---|---|---|---|---|
| 338 | 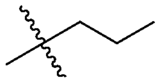 [SMILES: *CCC] |  | $C_6H_{13}$(n) | H | 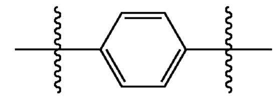 [SMILES: *c1ccc(*)cc1] | 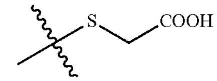 |
| 339 | 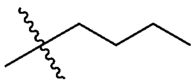 [SMILES: *CCCC] | 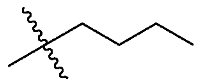 [SMILES: *CCCC] | $C_6H_{13}$(n) | H | 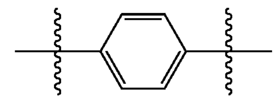 | 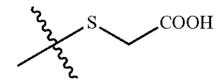 |
| 340 | $C_6H_{13}$(n) | $C_6H_{13}$(n) | $C_6H_{13}$(n) | H | 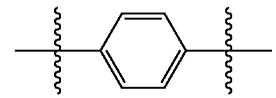 [SMILES: *c1ccc(*)cc1] | 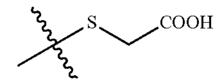 |
| 341 | $C_8H_{17}$(n) | $C_8H_{17}$(n) | $C_6H_{13}$(n) | H | 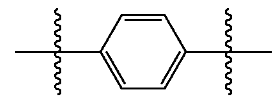 [SMILES: *c1ccc(*)cc1] | 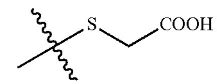 |
| 342 | $C_{12}H_{25}$(n) | $C_{12}H_{25}$(n) | $C_6H_{13}$(n) | H | 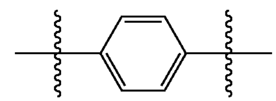 | 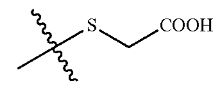 |
| 343 | 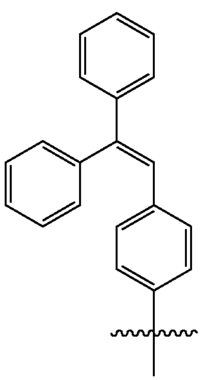 [SMILES: *c1ccc(C=C(c2ccccc2)c2ccccc2)cc1] | 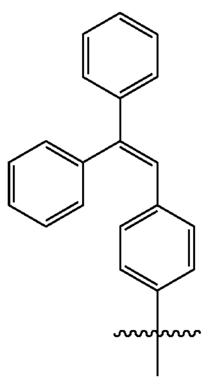 [SMILES: *c1ccc(C=C(c2ccccc2)c2ccccc2)cc1] | CN | H | 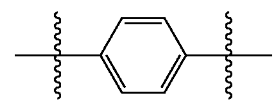 [SMILES: *c1ccc(*)cc1] | 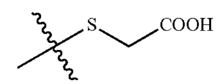 [SMILES: *SCC(=O)O] |

-continued
| Dye | $R_1$ | $R_2$ | $R_3$ | $R_4$ | Ar | 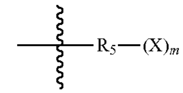 |
|---|---|---|---|---|---|---|
| 344 | 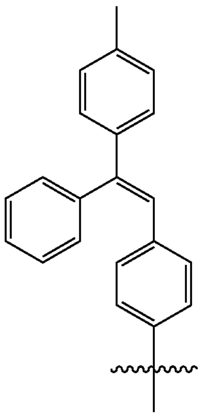 [SMILES: *c1ccc(/C=C(\c2ccccc2)c2ccc(C)cc2)cc1] | 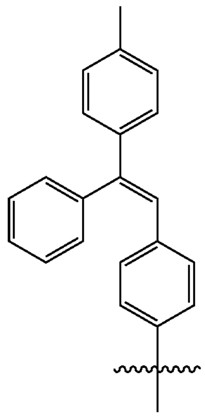 [SMILES: *c1ccc(/C=C(\c2ccccc2)c2ccc(C)cc2)cc1] | 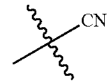 | H | 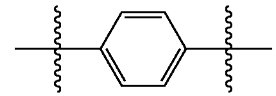 [SMILES: *c1ccc(*)cc1] | 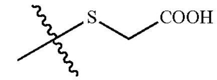 [SMILES: *SCC(=O)O] |
| 345 | 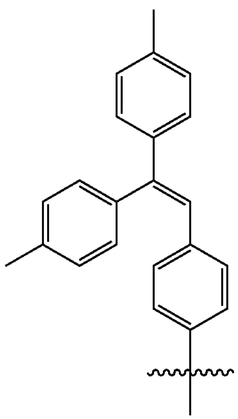 [SMILES: *c1ccc(C=C(c2ccc(C)cc2)c2ccc(C)cc2)cc1] | 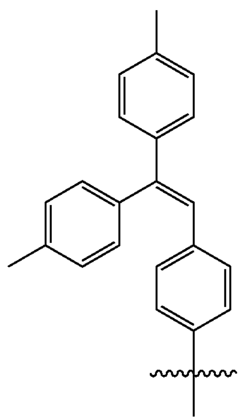 [SMILES: *c1ccc(C=C(c2ccc(C)cc2)c2ccc(C)cc2)cc1] | 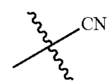 | H | 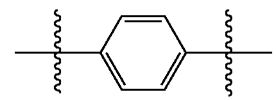 [SMILES: *c1ccc(*)cc1] | 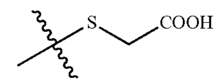 |

-continued
| Dye | $R_1$ | $R_2$ | $R_3$ | $R_4$ | Ar | 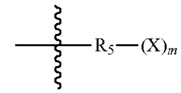 |
|---|---|---|---|---|---|---|
| 346 | 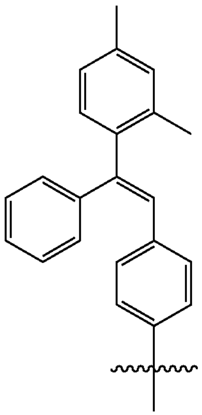 [SMILES: *c1ccc(/C=C(\c2ccccc2)c2ccc(C)cc2C)cc1] | 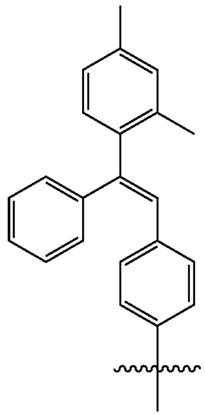 | 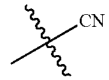 [SMILES: *C#N] | H | 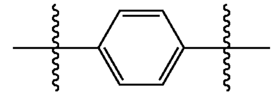 [SMILES: *c1ccc(*)cc1] | 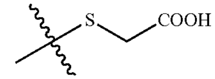 |
| 347 | 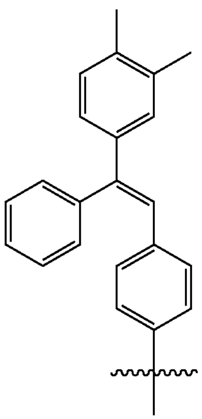 [SMILES: *c1ccc(/C=C(\c2ccccc2)c2ccc(C)c(C)c2)cc1] | 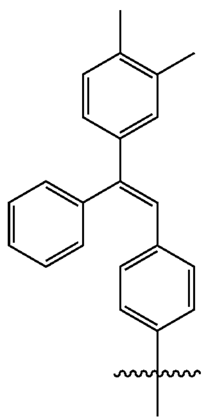 | 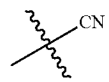 [SMILES: *C#N] | H | 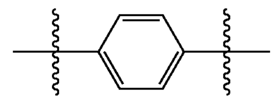 [SMILES: *c1ccc(*)cc1] | 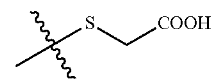 [SMILES: *SCC(=O)O] |

-continued
| Dye | $R_1$ | $R_2$ | $R_3$ | $R_4$ | Ar | 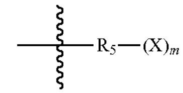 |
|---|---|---|---|---|---|---|
| 348 | 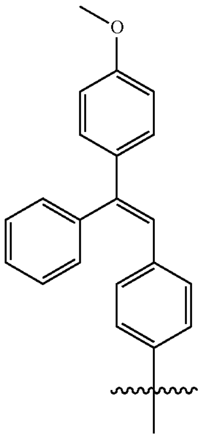 [SMILES: *c1ccc(/C=C(\c2ccccc2)c2ccc(OC)cc2)cc1] | 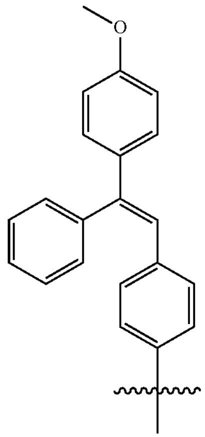 [SMILES: *c1ccc(/C=C(\c2ccccc2)c2ccc(OC)cc2)cc1] | 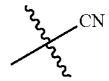 | H | 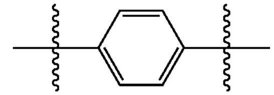 [SMILES: *c1ccc(*)cc1] | 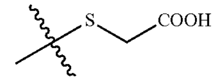 |
| 349 | 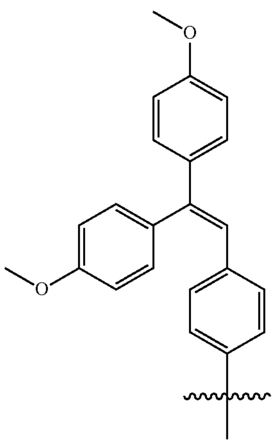 [SMILES: *c1ccc(C=C(c2ccc(OC)cc2)c2ccc(OC)cc2)cc1] | 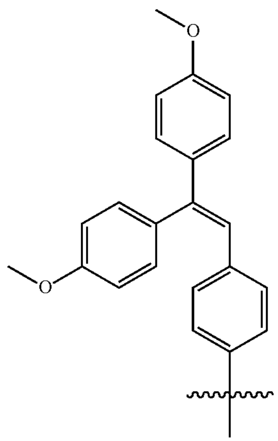 [SMILES: *c1ccc(C=C(c2ccc(OC)cc2)c2ccc(OC)cc2)cc1] | 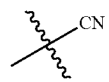 [SMILES: *C#N] | H | 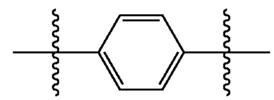 [SMILES: *c1ccc(*)cc1] | 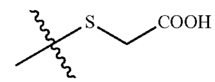 |

-continued
| Dye | $R_1$ | $R_2$ | $R_3$ | $R_4$ | Ar | $—R_5—(X)_m$ |
| --- | --- | --- | --- | --- | --- | --- |
| 350 | 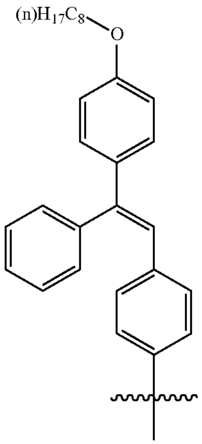 | 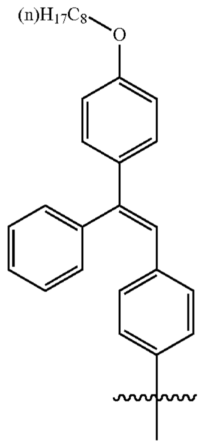 | 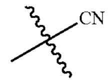 [SMILES: *C#N] | H | 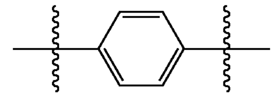 [SMILES: *c1ccc(*)cc1] | 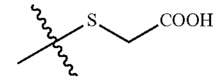 |
| 351 | 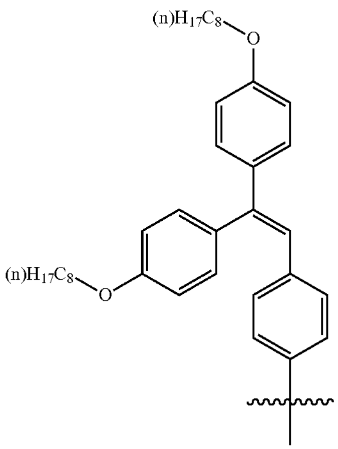 | 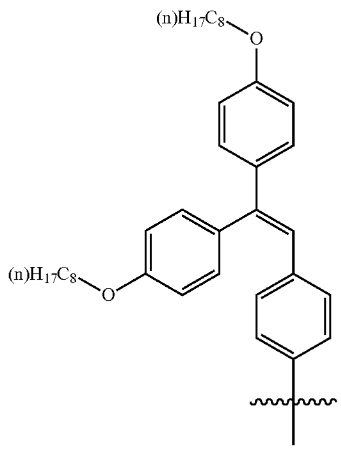 | 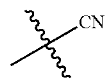 | H | 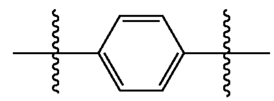 | 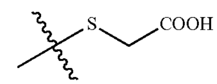 [SMILES: *SCC(=O)O] |

-continued
| Dye | $R_1$ | $R_2$ | $R_3$ | $R_4$ | Ar | 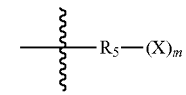 |
|---|---|---|---|---|---|---|
| 352 | 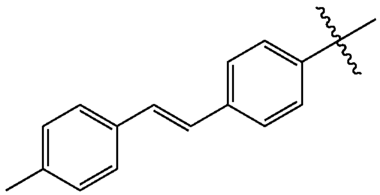 [SMILES: *c1ccc(/C=C/c2ccc(C)cc2)cc1] | 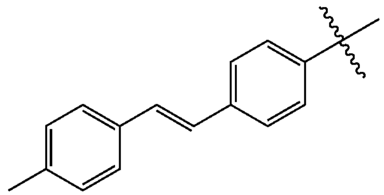 [SMILES: *c1ccc(/C=C/c2ccc(C)cc2)cc1] | 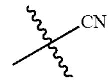 | H | 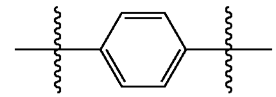 [SMILES: *c1ccc(*)cc1] | 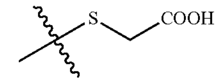 [SMILES: *SCC(=O)O] |
| 353 | 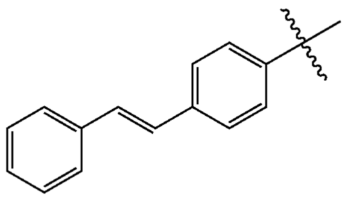 [SMILES: *c1ccc(/C=C/c2ccccc2)cc1] | 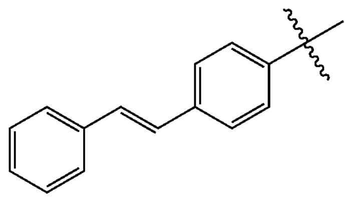 [SMILES: *c1ccc(/C=C/c2ccccc2)cc1] | 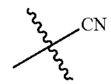 [SMILES: *C#N] | H | 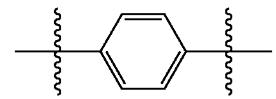 [SMILES: *c1ccc(*)cc1] | 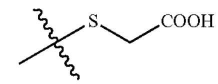 [SMILES: *SCC(=O)O] |
| 354 | 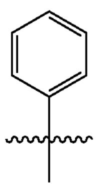 [SMILES: *c1ccccc1] | 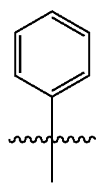 [SMILES: *c1ccccc1] | 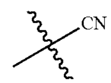 [SMILES: *C#N] | H | 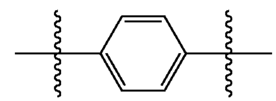 [SMILES: *c1ccc(*)cc1] | 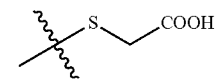 [SMILES: *SCC(=O)O] |
| 355 | 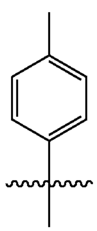 [SMILES: *c1ccc(C)cc1] | 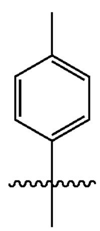 | 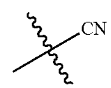 | H | 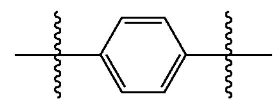 [SMILES: *c1ccc(*)cc1] | 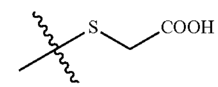 |

-continued
| Dye | $R_1$ | $R_2$ | $R_3$ | $R_4$ | Ar | 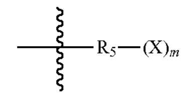 |
|---|---|---|---|---|---|---|
| 356 | 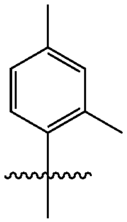 [SMILES: *c1ccc(C)cc1C] | 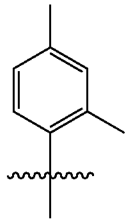 [SMILES: *c1ccc(C)cc1C] | 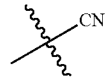 | H | 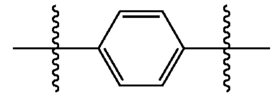 | 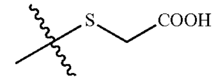 [SMILES: *SCC(=O)O] |
| 357 | 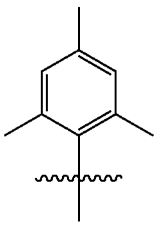 | 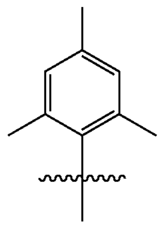 | 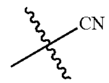 | H | 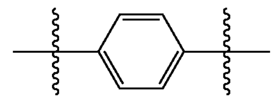 [SMILES: *c1ccc(*)cc1] | 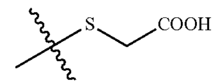 [SMILES: *SCC(=O)O] |
| 358 | 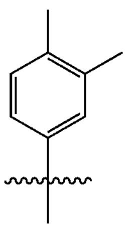 [SMILES: *c1ccc(C)c(C)c1] | 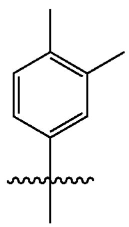 [SMILES: *c1ccc(C)c(C)c1] | 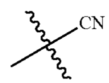 | H | 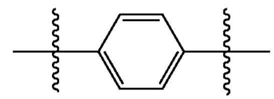 | 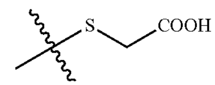 [SMILES: *SCC(=O)O] |
| 359 | 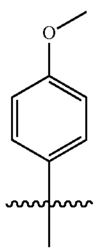 [SMILES: *c1ccc(OC)cc1] | 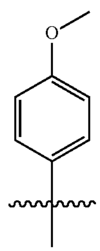 | 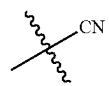 [SMILES: *C#N] | H | 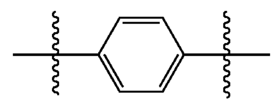 [SMILES: *c1ccc(*)cc1] | 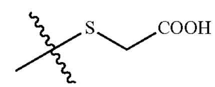 [SMILES: *SCC(=O)O] |

-continued
| Dye | $R_1$ | $R_2$ | $R_3$ | $R_4$ | Ar |  |
|---|---|---|---|---|---|---|
| 360 | 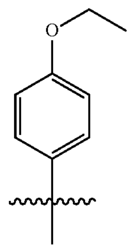 [SMILES: *c1ccc(OCC)cc1] | 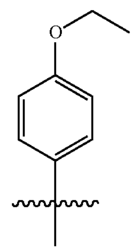 | 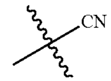 [SMILES: *C#N] | H | 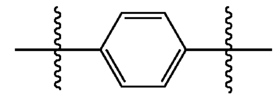 | 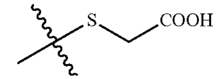 |
| 361 | 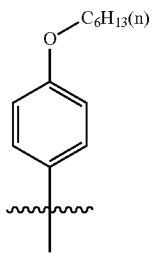 | 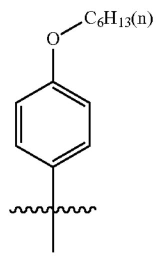 | 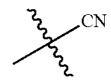 | H | 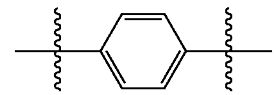 [SMILES: *c1ccc(*)cc1] | 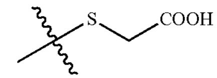 [SMILES: *SCC(=O)O] |
| 362 | 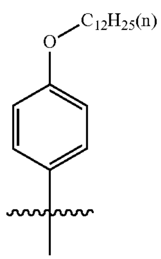 | 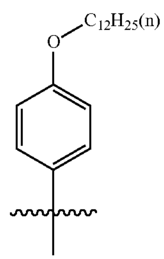 | 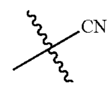 | H | 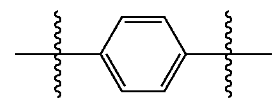 [SMILES: *c1ccc(*)cc1] | 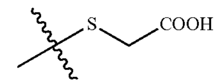 [SMILES: *SCC(=O)O] |
| 363 | 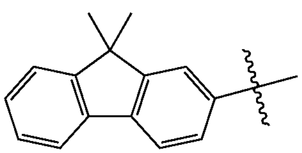 [SMILES: *c1ccc2c(c1)C(C)(C)c1ccccc1-2] | 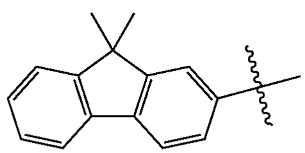 [SMILES: *c1ccc2c(c1)C(C)(C)c1ccccc1-2] | 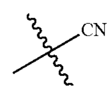 | H | 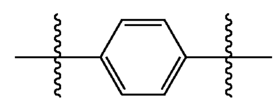 [SMILES: *c1ccc(*)cc1] | 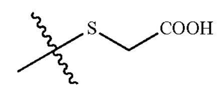 |

-continued
| Dye | $R_1$ | $R_2$ | $R_3$ | $R_4$ | Ar | $—R_5—(X)_m$ |
|---|---|---|---|---|---|---|
| 364 | 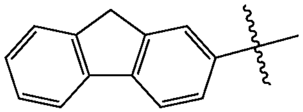 [SMILES: *c1ccc2c(c1)Cc1ccccc1-2] | 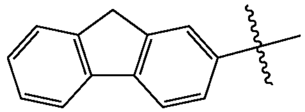 [SMILES: *c1ccc2c(c1)Cc1ccccc1-2] | 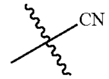 | H | 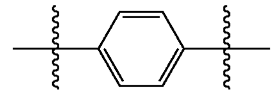 | 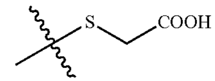 |
| 365 | 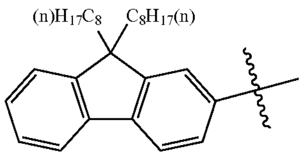 | 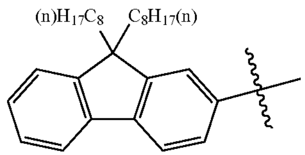 | 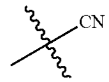 [SMILES: *C#N] | H | 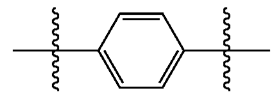 [SMILES: *c1ccc(*)cc1] | 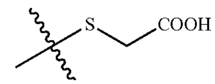 |
| 366 | 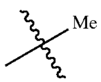 | 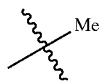 | 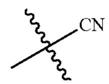 | H | 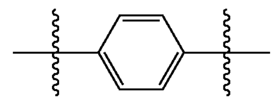 | 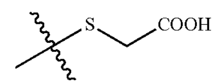 |
| 367 | 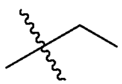 [SMILES: *CC] | 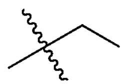 [SMILES: *CC] | 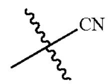 | H | 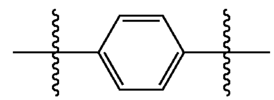 [SMILES: *c1ccc(*)cc1] | 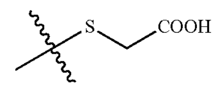 |
| 368 | 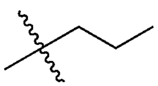 [SMILES: *CCC] | 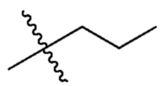 [SMILES: *CCC] | 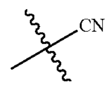 | H | 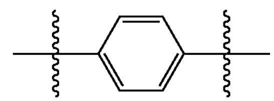 | 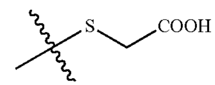 |
| 369 | 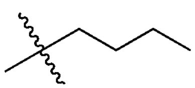 [SMILES: *CCCC] | 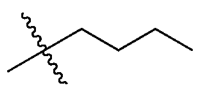 [SMILES: *CCCC] | 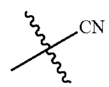 | H | 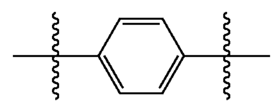 | 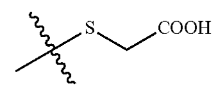 |
| 370 | 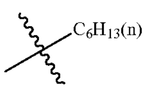 | 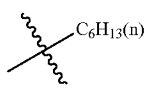 | 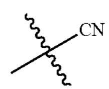 [SMILES: *C#N] | H | 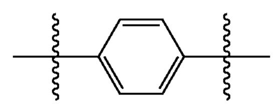 | 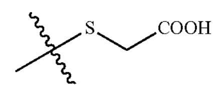 |
| 371 | 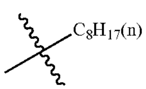 | 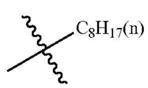 | 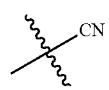 | H | 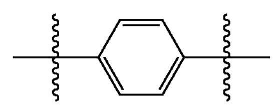 [SMILES: *c1ccc(*)cc1] | 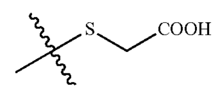 |

-continued
| Dye | $R_1$ | $R_2$ | $R_3$ | $R_4$ | Ar | 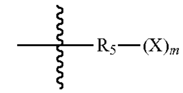 |
|---|---|---|---|---|---|---|
| 372 | 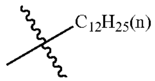 | 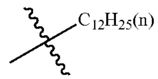 | 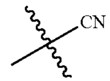 [SMILES: *C#N] | H | 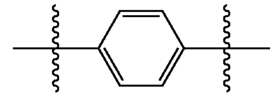 [SMILES: *c1ccc(*)cc1] | 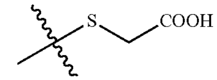 |
| 373 | 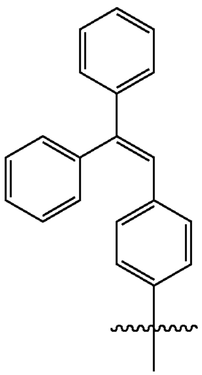 [SMILES: *c1ccc(C=C(c2ccccc2)c2ccccc2)cc1] | 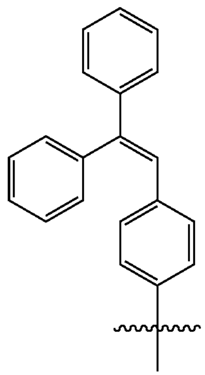 [SMILES: *c1ccc(C=C(c2ccccc2)c2ccccc2)cc1] | H | H | 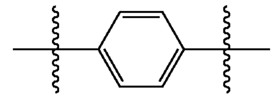 [SMILES: *c1ccc(*)cc1] | 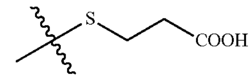 [SMILES: *SCCC(=O)O] |
| 374 | 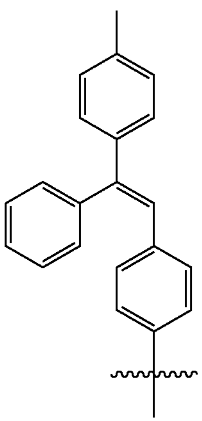 [SMILES: *c1ccc(/C=C(\c2ccccc2)c2ccc(C)cc2)cc1] | 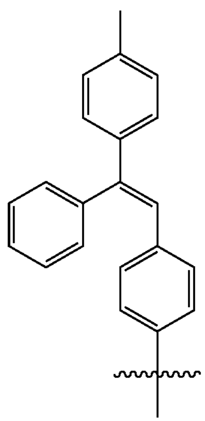 [SMILES: *c1ccc(/C=C(\c2ccccc2)c2ccc(C)cc2)cc1] | H | H | 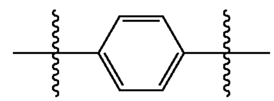 [SMILES: *c1ccc(*)cc1] | 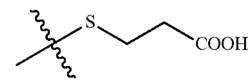 [SMILES: *SCCC(=O)O] |

-continued
| Dye | $R_1$ | $R_2$ | $R_3$ | $R_4$ | Ar | 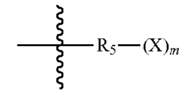 |
|---|---|---|---|---|---|---|
| 375 | 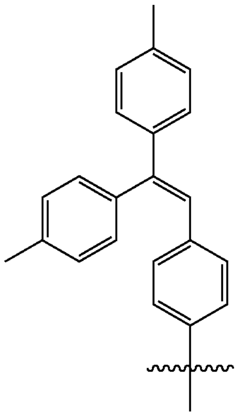 [SMILES: *c1ccc(C=C(c2ccc(C)cc2)c2ccc(C)cc2)cc1] | 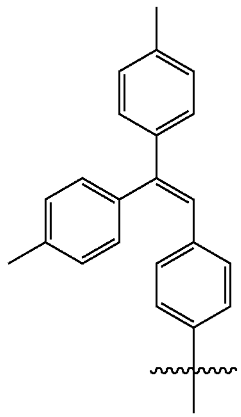 [SMILES: *c1ccc(C=C(c2ccc(C)cc2)c2ccc(C)cc2)cc1] | H | H | 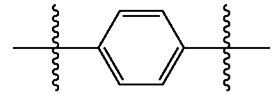 [SMILES: *c1ccc(*)cc1] | 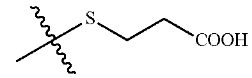 [SMILES: *SCCC(=O)O] |
| 376 | 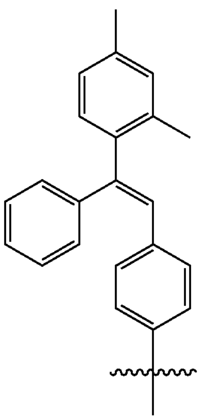 [SMILES: *c1ccc(/C=C(\c2ccccc2)c2ccc(C)cc2C)cc1] | 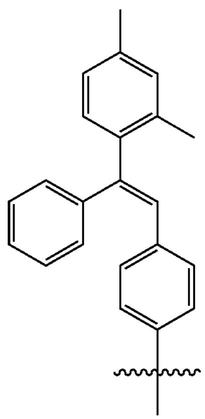 | H | H | 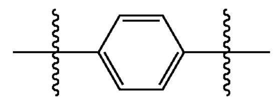 [SMILES: *c1ccc(*)cc1] | 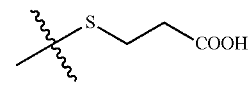 |

-continued
| Dye | $R_1$ | $R_2$ | $R_3$ | $R_4$ | Ar | 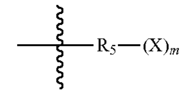 |
|---|---|---|---|---|---|---|
| 377 | 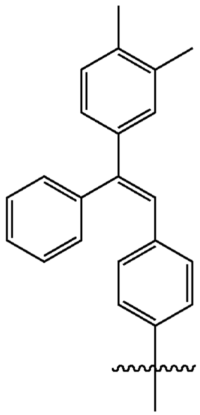 [SMILES: *c1ccc(/C=C(\c2ccccc2)c2ccc(C)c(C)c2)cc1] | 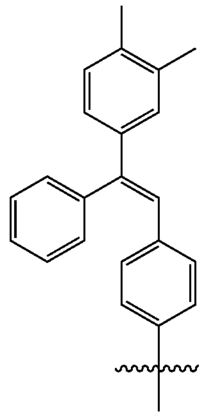 [SMILES: *c1ccc(/C=C(\c2ccccc2)c2ccc(C)c(C)c2)cc1] | H | H | 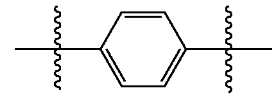 [SMILES: *c1ccc(*)cc1] | 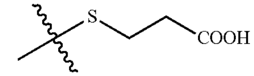 [SMILES: *SCCC(=O)O] |
| 378 | 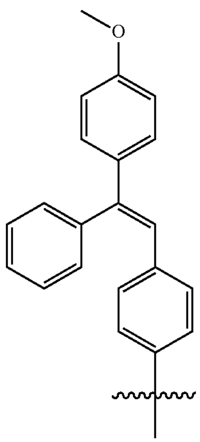 [SMILES: *c1ccc(/C=C(\c2ccccc2)c2ccc(OC)cc2)cc1] | 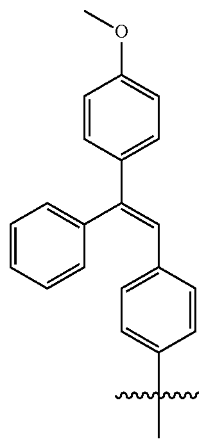 [SMILES: *c1ccc(/C=C(\c2ccccc2)c2ccc(OC)cc2)cc1] | H | H | 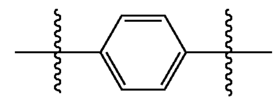 [SMILES: *c1ccc(*)cc1] | 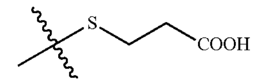 [SMILES: *SCCC(=O)O] |

-continued
| Dye | $R_1$ | $R_2$ | $R_3$ | $R_4$ | Ar |   |
|---|---|---|---|---|---|---|
| 379 | 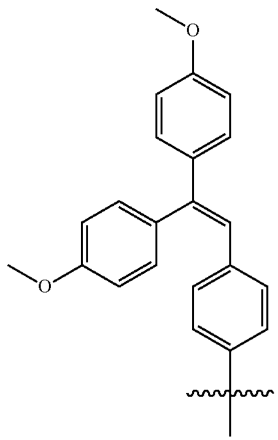 [SMILES: *c1ccc(C=C(c2ccc(OC)cc2)c2ccc(OC)cc2)cc1] | 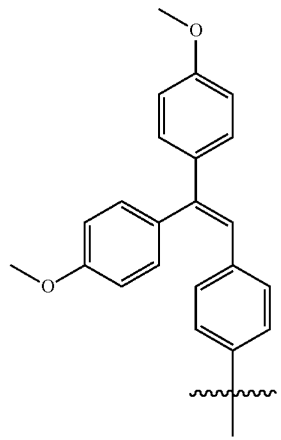 [SMILES: *c1ccc(C=C(c2ccc(OC)cc2)c2ccc(OC)cc2)cc1] | H | H | 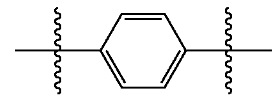 [SMILES: *c1ccc(*)cc1] | 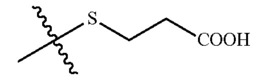 [SMILES: *SCCC(=O)O]  |
| 380 | 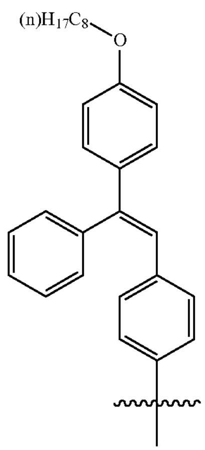  | 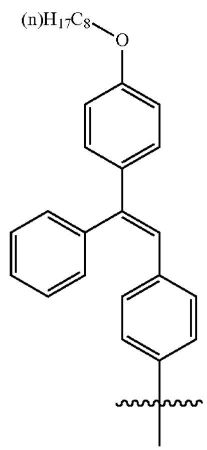  | H | H | 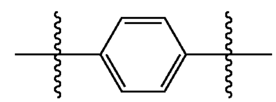 [SMILES: *c1ccc(*)cc1] | 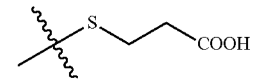 [SMILES: *SCCC(=O)O]  |

-continued
| Dye | $R_1$ | $R_2$ | $R_3$ | $R_4$ | Ar | 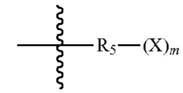 |
|---|---|---|---|---|---|---|
| 381 | 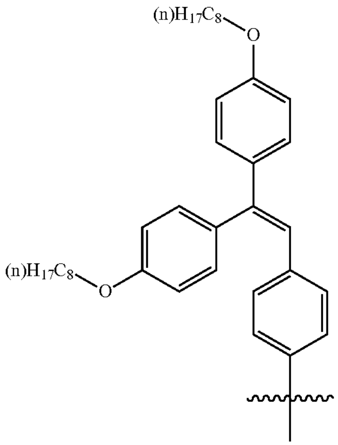 | 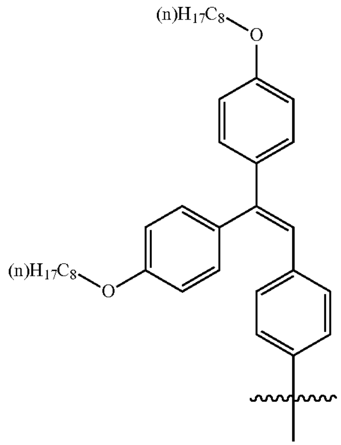 | H | H | 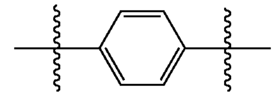 [SMILES: *c1ccc(*)cc1] | 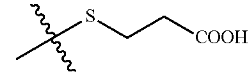 [SMILES: *SCCC(=O)O] |
| 382 | 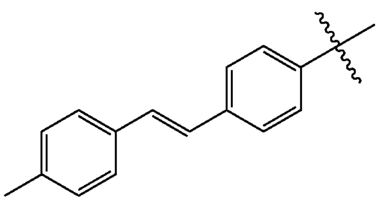 [SMILES: *c1ccc(/C=C/c2ccc(C)cc2)cc1] | 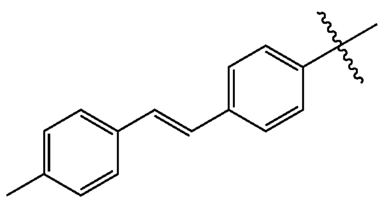 [SMILES: *c1ccc(/C=C/c2ccc(C)cc2)cc1] | H | H | 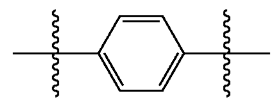 [SMILES: *c1ccc(*)cc1] | 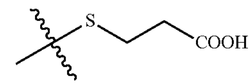 [SMILES: *SCCC(=O)O] |
| 383 | 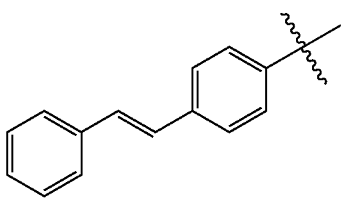 [SMILES: *c1ccc(/C=C/c2ccccc2)cc1] | 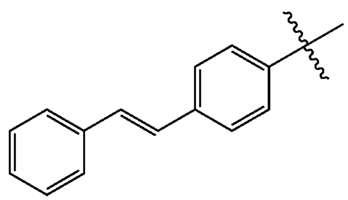 [SMILES: *c1ccc(/C=C/c2ccccc2)cc1] | H | H | 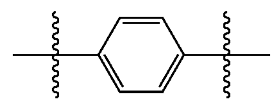 [SMILES: *c1ccc(*)cc1] | 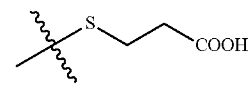 [SMILES: *SCCC(=O)O] |

-continued
| Dye | $R_1$ | $R_2$ | $R_3$ | $R_4$ | Ar | $R_5—(X)_m$ |
|---|---|---|---|---|---|---|
| 384 | 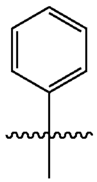 | 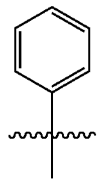 | H | H | 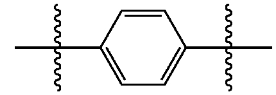 | 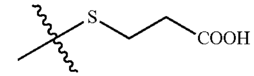 [SMILES: *SCCC(=O)O] |
| 385 | 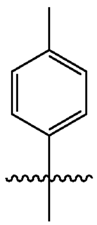 | 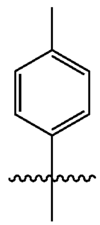 | H | H | 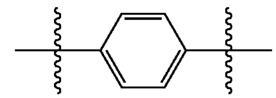 [SMILES: *c1ccc(*)cc1] | 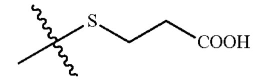 [SMILES: *SCCC(=O)O] |
| 386 | 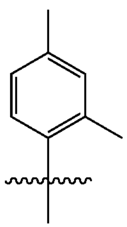 [SMILES: *c1ccc(C)cc1C] | 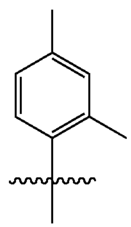 [SMILES: *c1ccc(C)cc1C] | H | H | 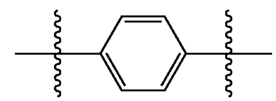 | 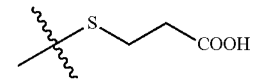 [SMILES: *SCCC(=O)O] |
| 387 | 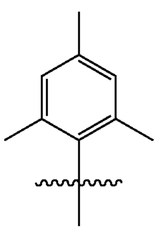 | 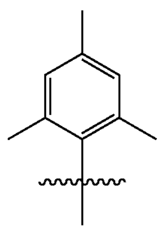 | H | H | 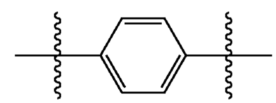 [SMILES: *c1ccc(*)cc1] | 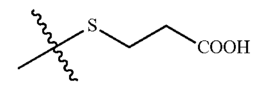 [SMILES: *SCCC(=O)O] |

-continued
| Dye | $R_1$ | $R_2$ | $R_3$ | $R_4$ | Ar | $R_5$—$(X)_m$ |
|---|---|---|---|---|---|---|
| 388 | 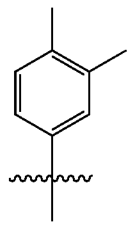 [SMILES: *c1ccc(C)c(C)c1] | 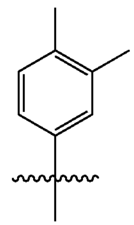 [SMILES: *c1ccc(C)c(C)c1] | H | H | 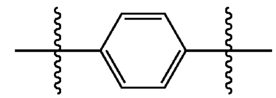 | 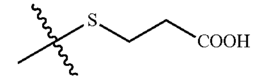 |
| 389 | 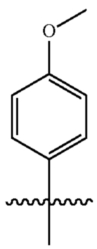 [SMILES: *c1ccc(OC)cc1] | 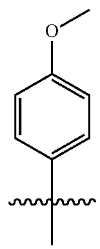 | H | H | 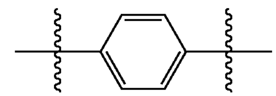 | 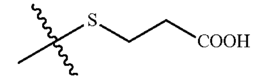 |
| 390 | 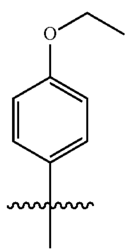 [SMILES: *c1ccc(OCC)cc1] | 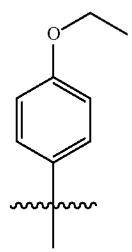 | H | H | 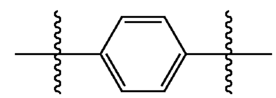 [SMILES: *c1ccc(*)cc1] | 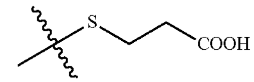 [SMILES: *SCCC(=O)O] |
| 391 | 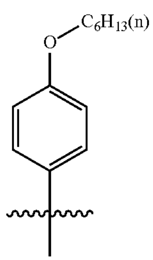 | 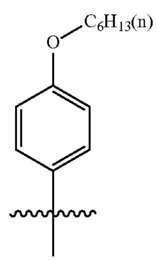 | H | H | 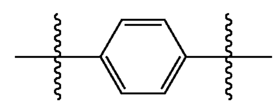 | 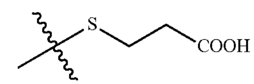 [SMILES: *SCCC(=O)O] |

-continued
| Dye | $R_1$ | $R_2$ | $R_3$ | $R_4$ | Ar | $R_5$—$(X)_m$ |
|---|---|---|---|---|---|---|
| 392 | 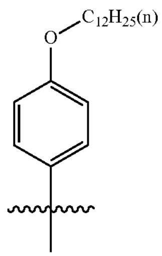 | 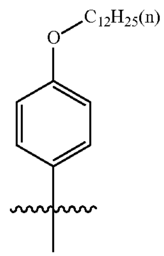 | H | H | 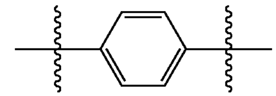 [SMILES: *c1ccc(*)cc1] | 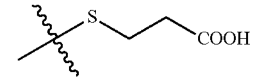 [SMILES: *SCCC(=O)O] |
| 393 | 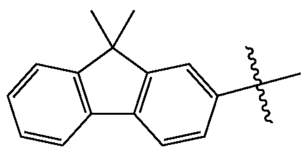 [SMILES: *c1ccc2c(c1)C(C)(C)c1ccccc1-2] | 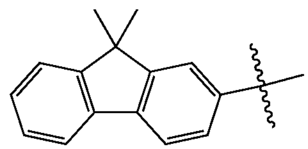 [SMILES: *c1ccc2c(c1)C(C)(C)c1ccccc1-2] | H | H | 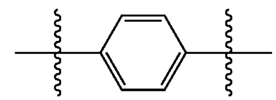 [SMILES: *c1ccc(*)cc1] | 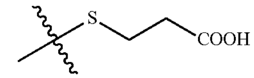 [SMILES: *SCCC(=O)O] |
| 394 | 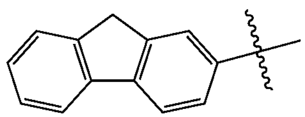 [SMILES: *c1ccc2c(c1)Cc1ccccc1-2] | 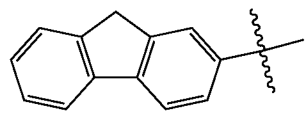 [SMILES: *c1ccc2c(c1)Cc1ccccc1-2] | H | H | 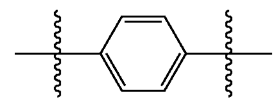 [SMILES: *c1ccc(*)cc1] | 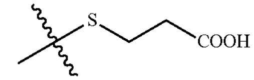 |
| 395 | 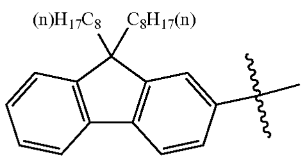 | 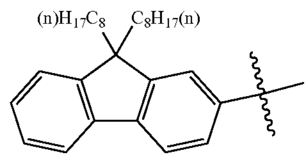 | H | H | 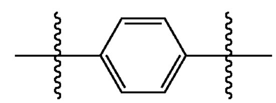 | 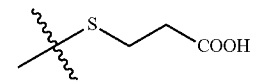 [SMILES: *SCCC(=O)O] |
| 396 | 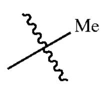 | 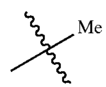 | H | H | 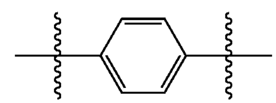 | 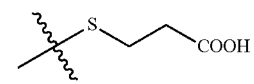 [SMILES: *SCCC(=O)O] |
| 397 | 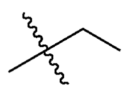 | 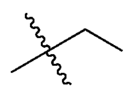 [SMILES: *CC] | H | H | 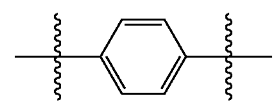 [SMILES: *c1ccc(*)cc1] | 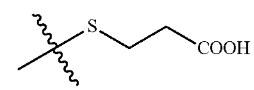 [SMILES: *SCCC(=O)O] |

-continued
| Dye | $R_1$ | $R_2$ | $R_3$ | $R_4$ | Ar | 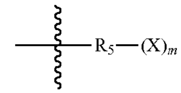 |
|---|---|---|---|---|---|---|
| 398 | 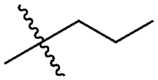 [SMILES: *CCC] | 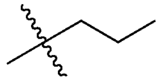 [SMILES: *CCC] | H | H | 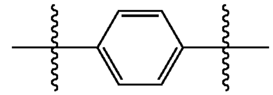 | 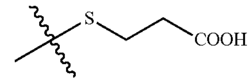 [SMILES: *SCCC(=O)O] |
| 399 | 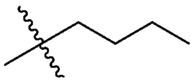 [SMILES: *CCCC] | 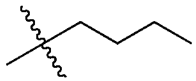 [SMILES: *CCCC] | H | H | 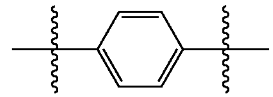 | 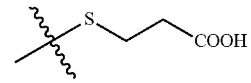 [SMILES: *SCCC(=O)O] |
| 400 | $C_6H_{13}$(n) | $C_6H_{13}$(n) | H | H | 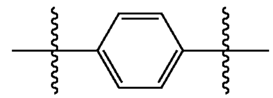 | 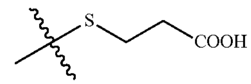 |
| 401 | $C_8H_{17}$(n) | $C_8H_{17}$(n) | H | H | 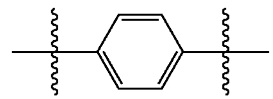 | 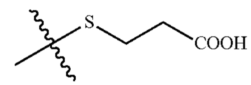 [SMILES: *SCCC(=O)O] |
| 402 | $C_{12}H_{25}$(n) | $C_{12}H_{25}$(n) | H | H | 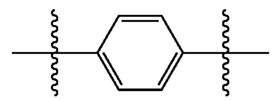 | 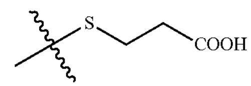 [SMILES: *SCCC(=O)O] |
| 403 | 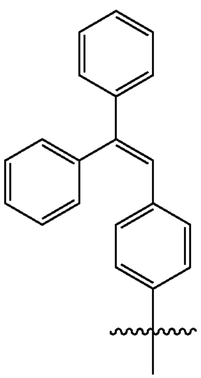 [SMILES: *c1ccc(C=C(c2ccccc2)c2ccccc2)cc1] | 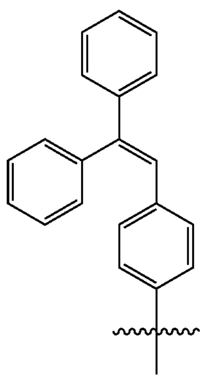 [SMILES: *c1ccc(C=C(c2ccccc2)c2ccccc2)cc1] | H | H | 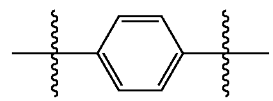 [SMILES: *c1ccc(*)cc1] | 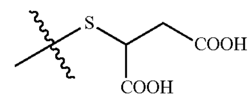 [SMILES: *SC(CC(=O)O)C(=O)O] |

-continued
| Dye | R$_1$ | R$_2$ | R$_3$ | R$_4$ | Ar | 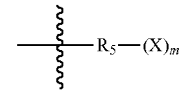 |
|---|---|---|---|---|---|---|
| 404 | 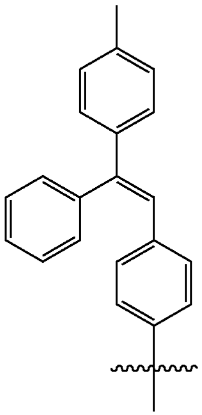 [SMILES: *c1ccc(/C=C(\c2ccccc2)c2ccc(C)cc2)cc1] | 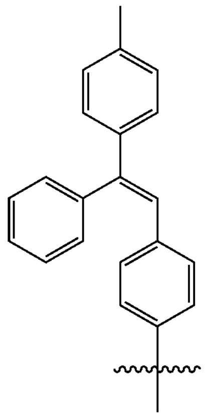 [SMILES: *c1ccc(/C=C(\c2ccccc2)c2ccc(C)cc2)cc1] | H | H | 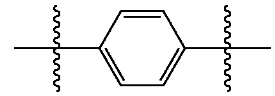 [SMILES: *c1ccc(*)cc1] | 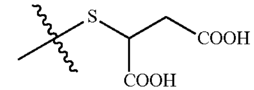 [SMILES: *SC(CC(=O)O)C(=O)O] |
| 405 | 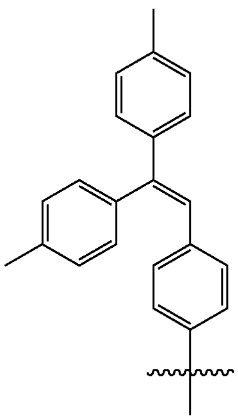 [SMILES: *c1ccc(C=C(c2ccc(C)cc2)c2ccc(C)cc2)cc1] | 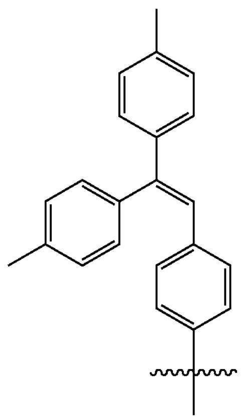 [SMILES: *c1ccc(C=C(c2ccc(C)cc2)c2ccc(C)cc2)cc1] | H | H | 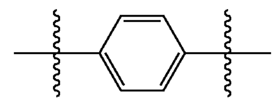 [SMILES: *c1ccc(*)cc1] | 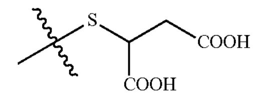 [SMILES: *SC(CC(=O)O)C(=O)O] |

-continued
| Dye | $R_1$ | $R_2$ | $R_3$ | $R_4$ | Ar | 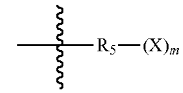 |
|---|---|---|---|---|---|---|
| 406 | 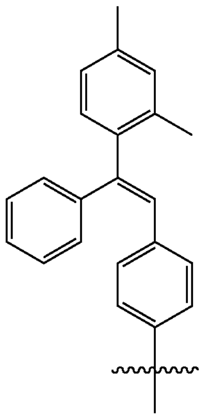 [SMILES: *c1ccc(/C=C(\c2ccccc2)c2ccc(C)cc2C)cc1] | 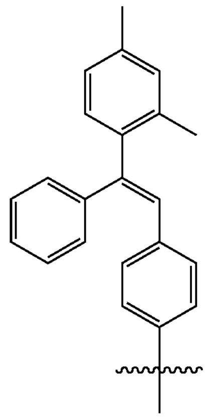 | H | H | 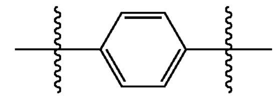 [SMILES: *c1ccc(*)cc1] | 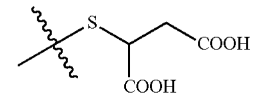 [SMILES: *SC(CC(=O)O)C(=O)O] |
| 407 | 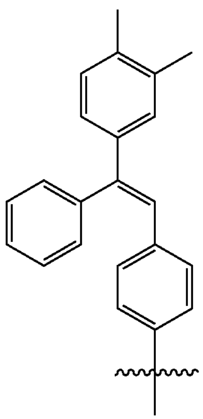 [SMILES: *c1ccc(/C=C(\c2ccccc2)c2ccc(C)c(C)c2)cc1] | 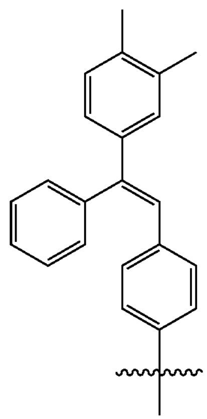 | H | H | 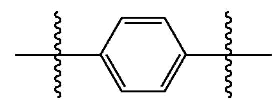 | 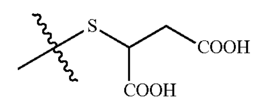 [SMILES: *SC(CC(=O)O)C(=O)O] |

-continued
| Dye | $R_1$ | $R_2$ | $R_3$ | $R_4$ | Ar | 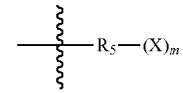 |
|---|---|---|---|---|---|---|
| 408 | 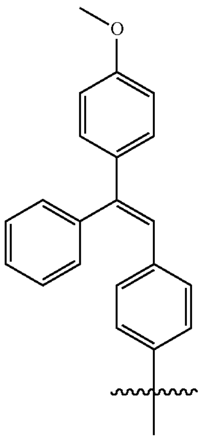 [SMILES: *c1ccc(/C=C(\c2ccccc2)c2ccc(OC)cc2)cc1] | 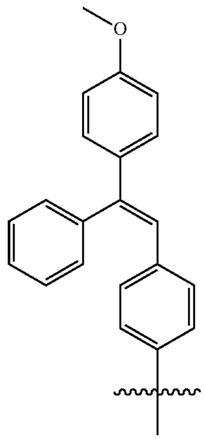 [SMILES: *c1ccc(/C=C(\c2ccccc2)c2ccc(OC)cc2)cc1] | H | H | 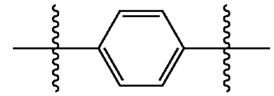 [SMILES: *c1ccc(*)cc1] | 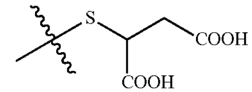 [SMILES: *SC(CC(=O)O)C(=O)O] |
| 409 | 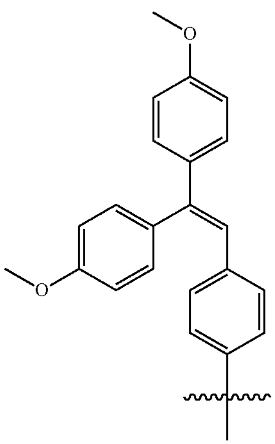 [SMILES: *c1ccc(C=C(c2ccc(OC)cc2)c2ccc(OC)cc2)cc1] | 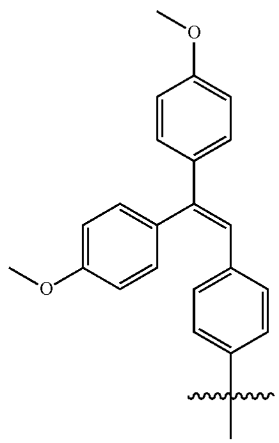 [SMILES: *c1ccc(C=C(c2ccc(OC)cc2)c2ccc(OC)cc2)cc1] | H | H | 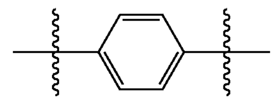 [SMILES: *c1ccc(*)cc1] | 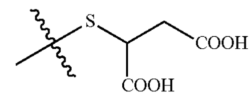 [SMILES: *SC(CC(=O)O)C(=O)O] |

-continued
| Dye | $R_1$ | $R_2$ | $R_3$ | $R_4$ | Ar | 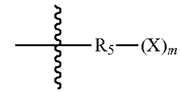 |
|---|---|---|---|---|---|---|
| 410 | 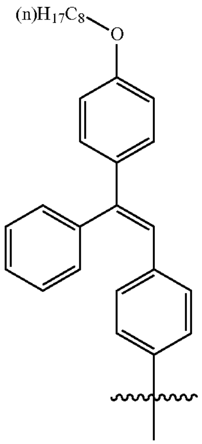 | 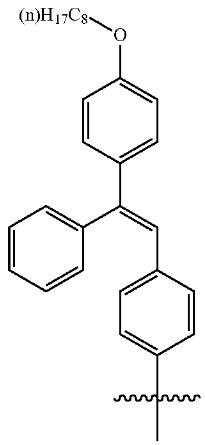 | H | H | 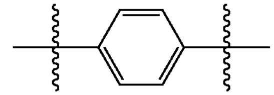 | 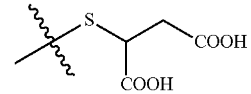 [SMILES: *SC(CC(=O)O)C(=O)O] |
| 411 | 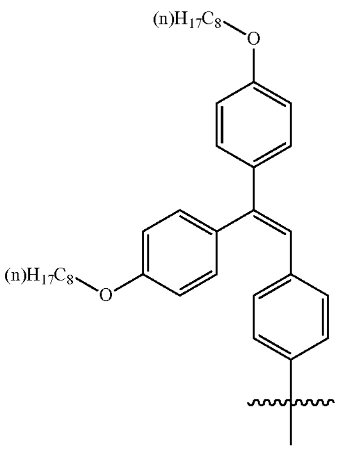 | 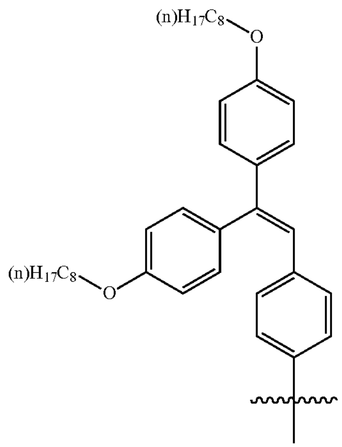 | H | H | 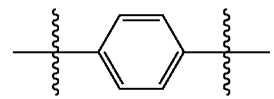 [SMILES: *c1ccc(*)cc1] | 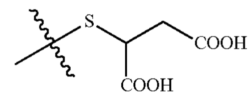 [SMILES: *SC(CC(=O)O)C(=O)O] |

-continued
| Dye | $R_1$ | $R_2$ | $R_3$ | $R_4$ | Ar | 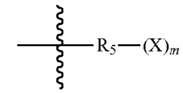 |
|---|---|---|---|---|---|---|
| 412 | 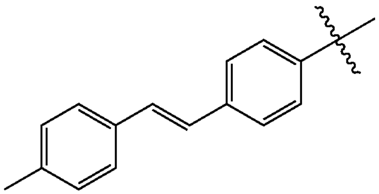 [SMILES: *c1ccc(/C=C/c2ccc(C)cc2)cc1] | 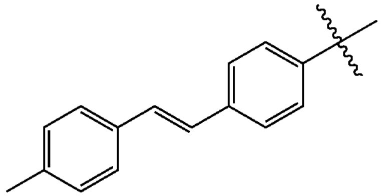 [SMILES: *c1ccc(/C=C/c2ccc(C)cc2)cc1] | H | H | 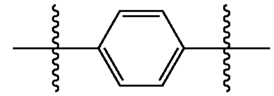 [SMILES: *c1ccc(*)cc1] | 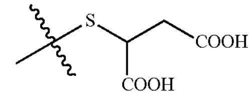 [SMILES: *SC(CC(=O)O)C(=O)O] |
| 413 | 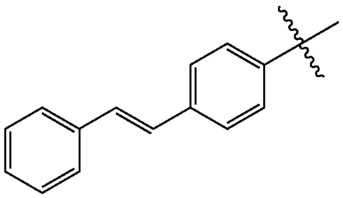 [SMILES: *c1ccc(/C=C/c2ccccc2)cc1] | 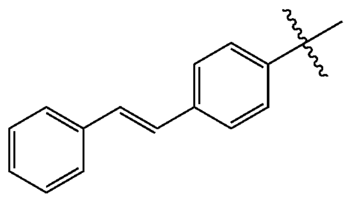 [SMILES: *c1ccc(/C=C/c2ccccc2)cc1] | H | H | 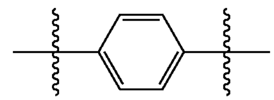 [SMILES: *c1ccc(*)cc1] | 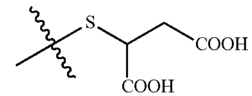 [SMILES: *SC(CC(=O)O)C(=O)O] |
| 414 | 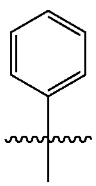 [SMILES: *c1ccccc1] | 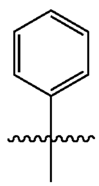 | H | H | 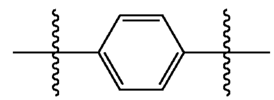 [SMILES: *c1ccc(*)cc1] | 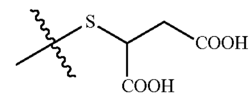 [SMILES: *SC(CC(=O)O)C(=O)O] |
| 415 | 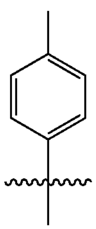 [SMILES: *c1ccc(C)cc1] | 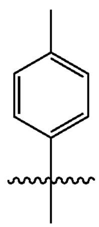 | H | H | 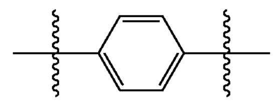 [SMILES: *c1ccc(*)cc1] | 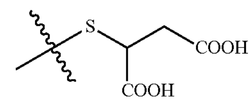 [SMILES: *SC(CC(=O)O)C(=O)O] |

-continued
| Dye | $R_1$ | $R_2$ | $R_3$ | $R_4$ | Ar | 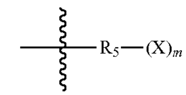 |
|---|---|---|---|---|---|---|
| 416 | 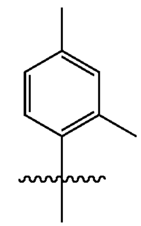 [SMILES: *c1ccc(C)cc1C] | 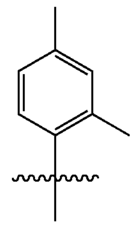 [SMILES: *c1ccc(C)cc1C] | H | H | 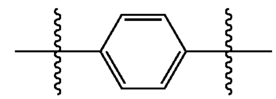 [SMILES: *c1ccc(*)cc1] | 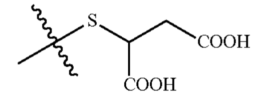 |
| 417 | 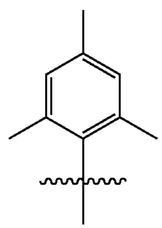 | 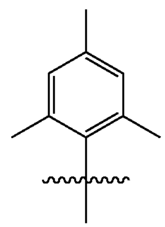 | H | H | 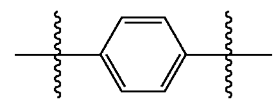 [SMILES: *c1ccc(*)cc1] | 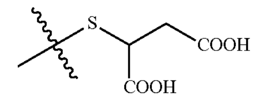 |
| 418 | 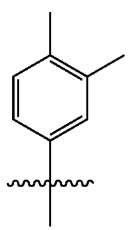 [SMILES: *c1ccc(C)c(C)c1] | 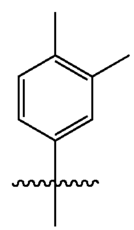 [SMILES: *c1ccc(C)c(C)c1] | H | H | 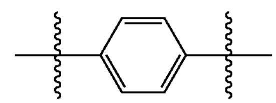 [SMILES: *c1ccc(*)cc1] | 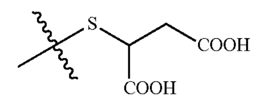 [SMILES: *SC(CC(=O)O)C(=O)O] |
| 419 | 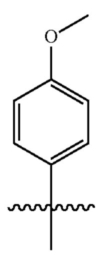 [SMILES: *c1ccc(OC)cc1] | 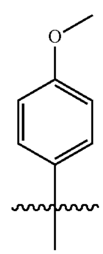 | H | H | 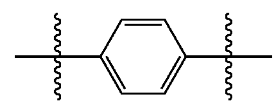 | 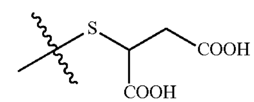 [SMILES: *SC(CC(=O)O)C(=O)O] |

-continued
| Dye | $R_1$ | $R_2$ | $R_3$ | $R_4$ | Ar |  $R_5$—$(X)_m$ |
|---|---|---|---|---|---|---|
| 420 | 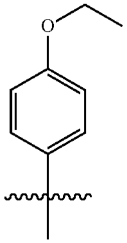 [SMILES: *c1ccc(OCC)cc1] | 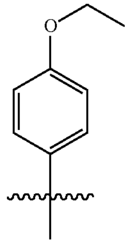 | H | H | 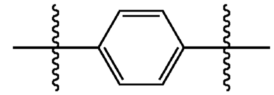 | 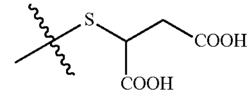 [SMILES: *SC(CC(=O)O)C(=O)O] |
| 421 | 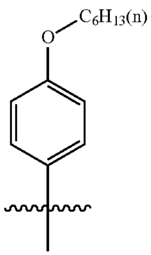 | 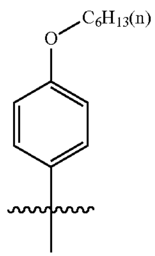 | H | H | 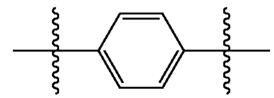 | 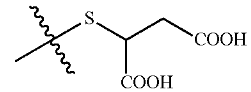 [SMILES: *SC(CC(=O)O)C(=O)O] |
| 422 | 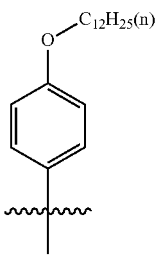 | 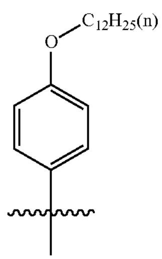 | H | H | 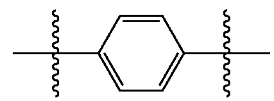 [SMILES: *c1ccc(*)cc1] | 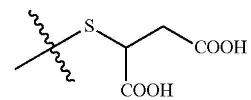 [SMILES: *SC(CC(=O)O)C(=O)O] |
| 423 | 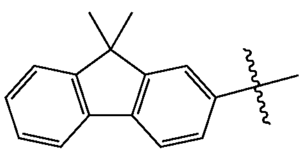 [SMILES: *c1ccc2c(c1)C(C)(C)c1ccccc1-2] | 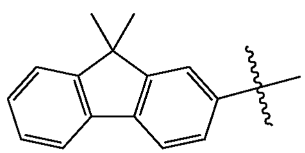 [SMILES: *c1ccc2c(c1)C(C)(C)c1ccccc1-2] | H | H | 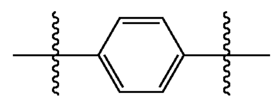 [SMILES: *c1ccc(*)cc1] | 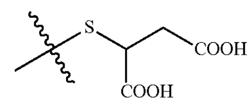 [SMILES: *SC(CC(=O)O)C(=O)O] |

-continued
| Dye | $R_1$ | $R_2$ | $R_3$ | $R_4$ | Ar | 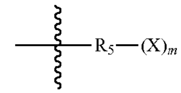 |
|---|---|---|---|---|---|---|
| 424 | 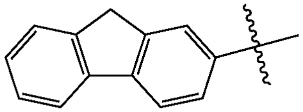 [SMILES: *c1ccc2c(c1)Cc1ccccc1-2] | 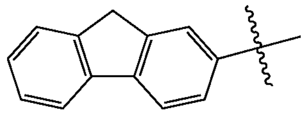 [SMILES: *c1ccc2c(c1)Cc1ccccc1-2] | H | H | 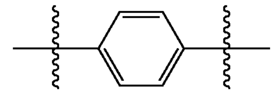 | 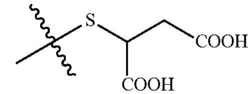 |
| 425 | 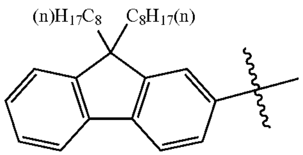 | 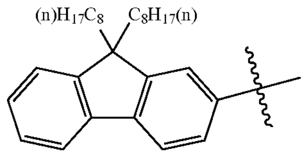 | H | H | 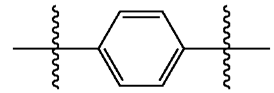 | 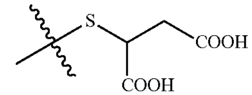 [SMILES: *SC(CC(=O)O)C(=O)O] |
| 426 | 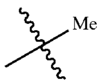 | 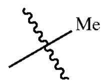 | H | H | 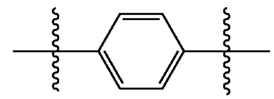 | 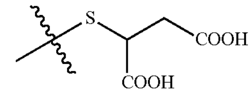 [SMILES: *SC(CC(=O)O)C(=O)O] |
| 427 | 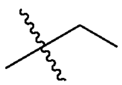 [SMILES: *CC] | 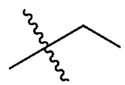 | H | H | 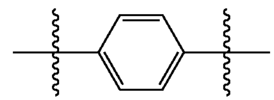 [SMILES: *c1ccc(*)cc1] | 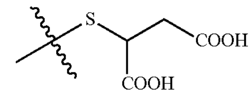 [SMILES: *SC(CC(=O)O)C(=O)O] |
| 428 | 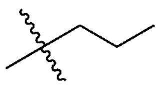 [SMILES: *CCC] | 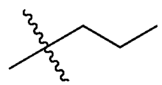 [SMILES: *CCC] | H | H | 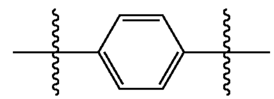 [SMILES: *c1ccc(*)cc1] | 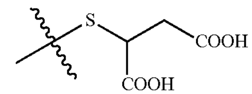 [SMILES: *SC(CC(=O)O)C(=O)O] |
| 429 | 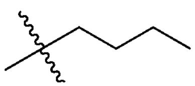 [SMILES: *CCCC] | 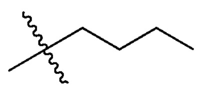 [SMILES: *CCCC] | H | H | 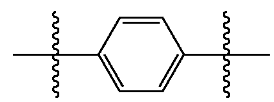 [SMILES: *c1ccc(*)cc1] | 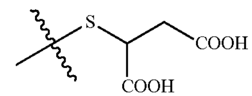 [SMILES: *SC(CC(=O)O)C(=O)O] |
| 430 | 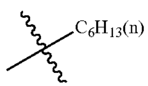 | 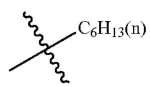 | H | H | 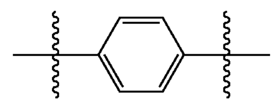 [SMILES: *c1ccc(*)cc1] | 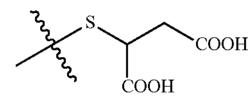 [SMILES: *SC(CC(=O)O)C(=O)O] |
| 431 | 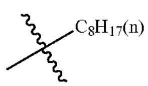 | 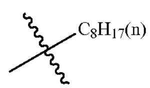 | H | H | 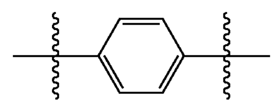 [SMILES: *c1ccc(*)cc1] | 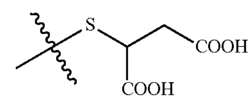 [SMILES: *SC(CC(=O)O)C(=O)O] |

-continued
| Dye | R1 | R2 | R3 | R4 | Ar | 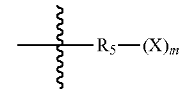 |
|---|---|---|---|---|---|---|
| 432 | 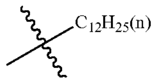 | 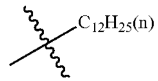 | H | H | 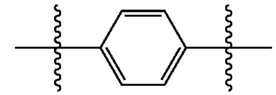 [SMILES: *c1ccc(*)cc1] | 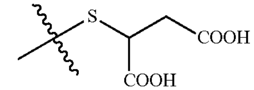 [SMILES: *SC(CC(=O)O)C(=O)O] |
| 433 | 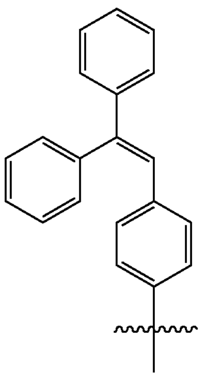 [SMILES: *c1ccc(C=C(c2ccccc2)c2ccccc2)cc1] | 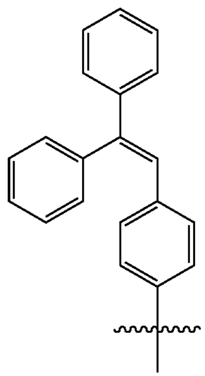 [SMILES: *c1ccc(C=C(c2ccccc2)c2ccccc2)cc1] | H | H | 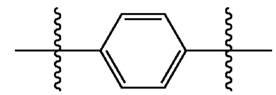 | 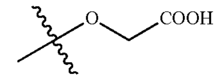 |
| 434 | 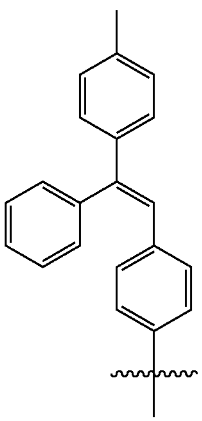 [SMILES: *c1ccc(/C=C(\c2ccccc2)c2ccc(C)cc2)cc1] | 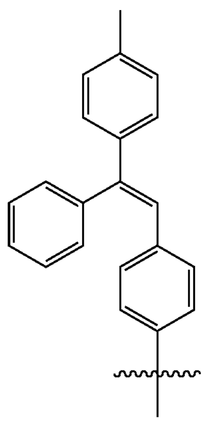 [SMILES: *c1ccc(/C=C(\c2ccccc2)c2ccc(C)cc2)cc1] | H | H | 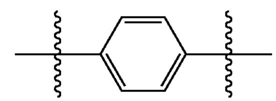 | 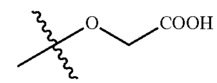 [SMILES: *OCC(=O)O] |

-continued
| Dye | $R_1$ | $R_2$ | $R_3$ | $R_4$ | Ar |  $R_5$—$(X)_m$ |
|---|---|---|---|---|---|---|
| 435 | 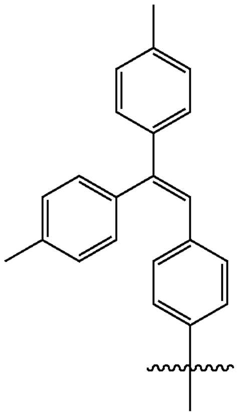 [SMILES: *c1ccc(C=C(c2ccc(C)cc2)c2ccc(C)cc2)cc1] | 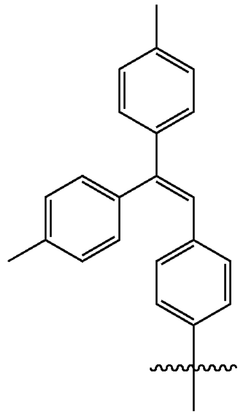 [SMILES: *c1ccc(C=C(c2ccc(C)cc2)c2ccc(C)cc2)cc1] | H | H | 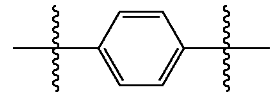 [SMILES: *c1ccc(*)cc1] | 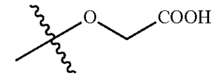 [SMILES: *OCC(=O)O] |
| 436 | 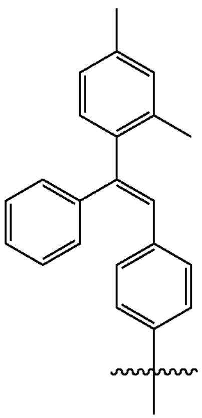 | 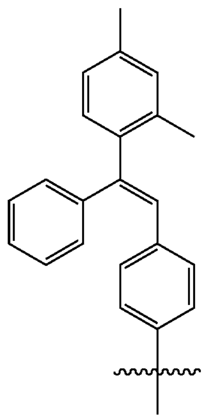 | H | H | 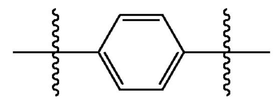 | 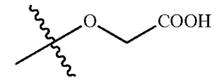 |

-continued
| Dye | $R_1$ | $R_2$ | $R_3$ | $R_4$ | Ar | 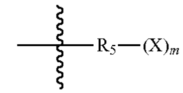 |
|---|---|---|---|---|---|---|
| 437 | 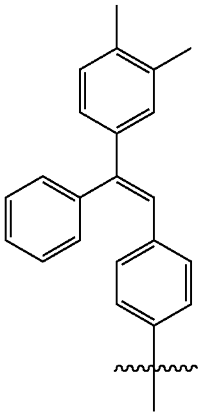 [SMILES: *c1ccc(/C=C(\c2ccccc2)c2ccc(C)c(C)c2)cc1] | 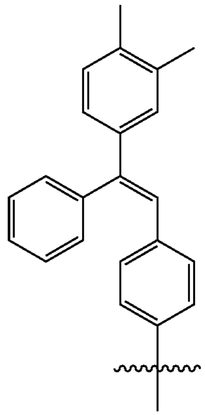 | H | H | 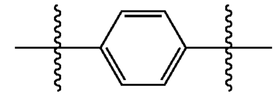 [SMILES: *c1ccc(*)cc1] | 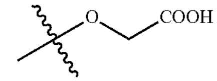 |
| 438 | 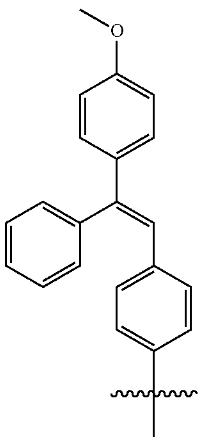 [SMILES: *c1ccc(/C=C(\c2ccccc2)c2ccc(OC)cc2)cc1] | 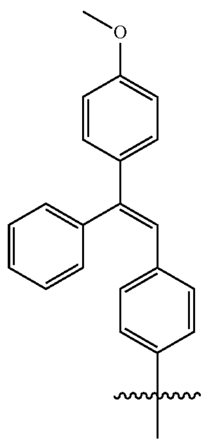 [SMILES: *c1ccc(/C=C(\c2ccccc2)c2ccc(OC)cc2)cc1] | H | H | 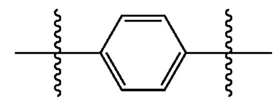 | 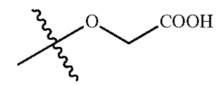 |

-continued
| Dye | $R_1$ | $R_2$ | $R_3$ | $R_4$ | Ar | 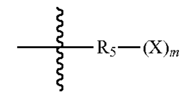 |
|---|---|---|---|---|---|---|
| 439 | 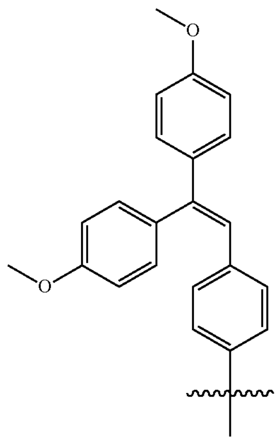 [SMILES: *c1ccc(C=C(c2ccc(OC)cc2)c2ccc(OC)cc2)cc1] | 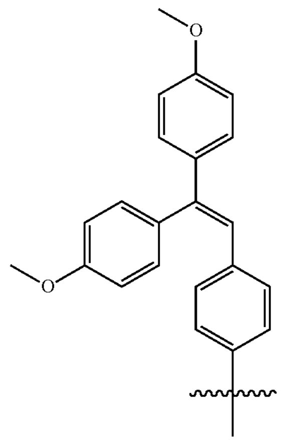 [SMILES: *c1ccc(C=C(c2ccc(OC)cc2)c2ccc(OC)cc2)cc1] | H | H | 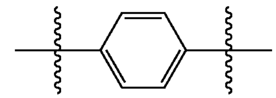 [SMILES: *c1ccc(*)cc1] | 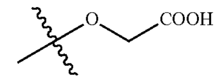 |
| 440 | 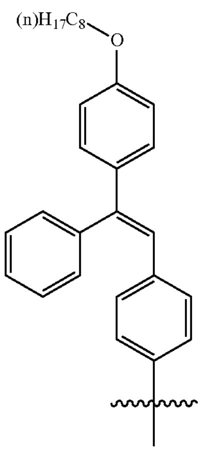 | 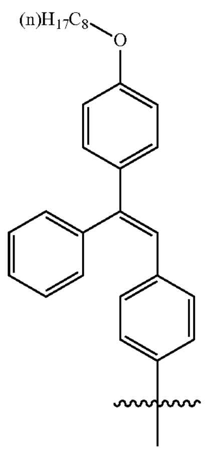 | H | H | 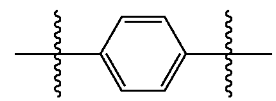 [SMILES: *c1ccc(*)cc1] | 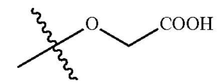 |

-continued
| Dye | $R_1$ | $R_2$ | $R_3$ | $R_4$ | Ar | $R_5$—$(X)_m$ |
|---|---|---|---|---|---|---|
| 441 | 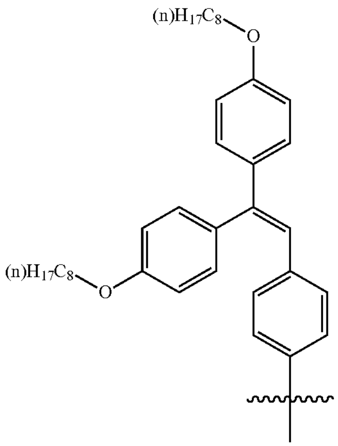 | 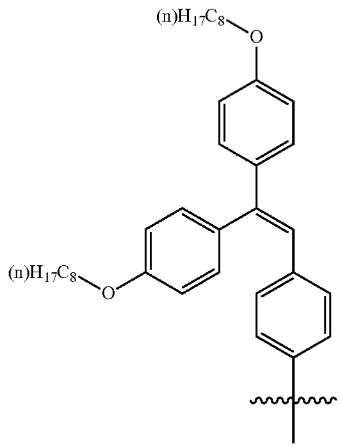 | H | H | 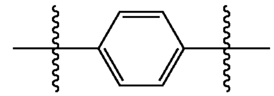 [SMILES: *c1ccc(*)cc1] | 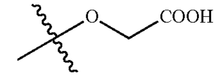 [SMILES: *OCC(=O)O] |
| 442 | 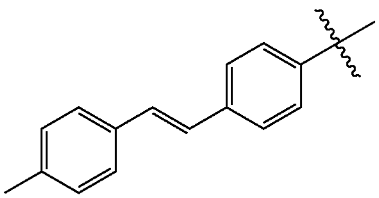 [SMILES: *c1ccc(/C=C/c2ccc(C)cc2)cc1] | 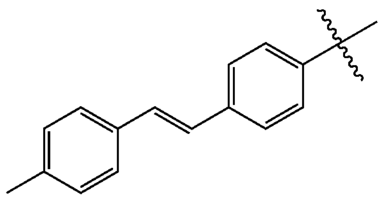 [SMILES: *c1ccc(/C=C/c2ccc(C)cc2)cc1] | H | H | 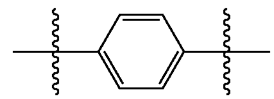 | 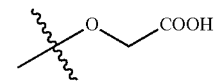 |
| 443 | 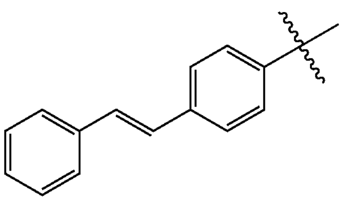 [SMILES: *c1ccc(/C=C/c2ccccc2)cc1] | 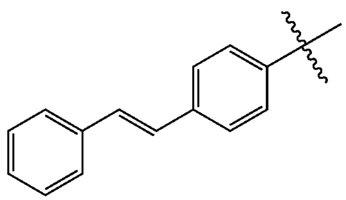 [SMILES: *c1ccc(/C=C/c2ccccc2)cc1] | H | H | 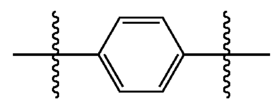 | 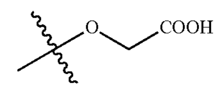 |

-continued
| Dye | $R_1$ | $R_2$ | $R_3$ | $R_4$ | Ar | 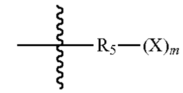 |
|---|---|---|---|---|---|---|
| 444 | 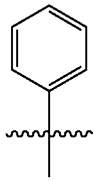 [SMILES: *c1ccccc1] | 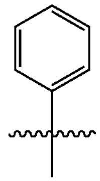 | H | H | 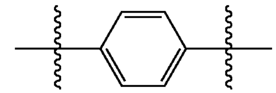 | 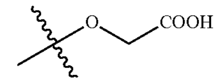 [SMILES: *OCC(=O)O] |
| 445 | 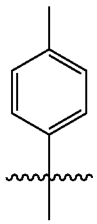 [SMILES: *c1ccc(C)cc1] | 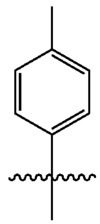 | H | H | 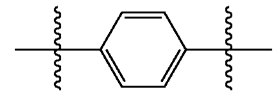 | 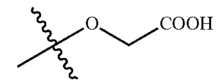 |
| 446 | 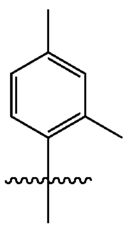 [SMILES: *c1ccc(C)cc1C] | 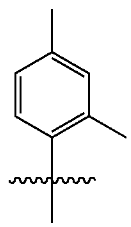 [SMILES: *c1ccc(C)cc1C] | H | H | 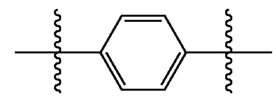 | 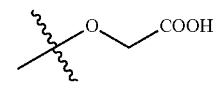 |
| 447 | 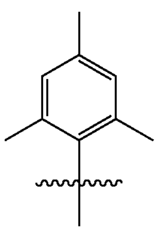 | 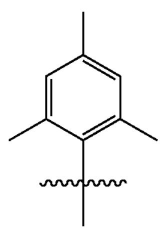 | H | H | 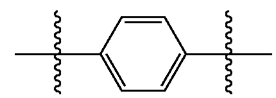 [SMILES: *c1ccc(*)cc1] | 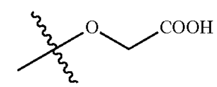 |

-continued
| Dye | $R_1$ | $R_2$ | $R_3$ | $R_4$ | Ar | 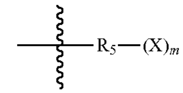  |
|---|---|---|---|---|---|---|
| 448 | 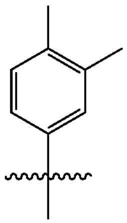 [SMILES: *c1ccc(C)c(C)c1] | 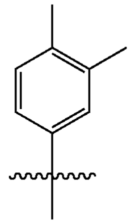 [SMILES: *c1ccc(C)c(C)c1] | H | H | 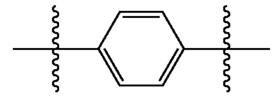 [SMILES: *c1ccc(*)cc1] | 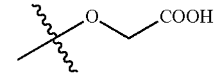 [SMILES: *OCC(=O)O]  |
| 449 | 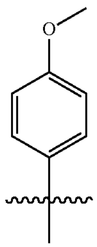 [SMILES: *c1ccc(OC)cc1]  | 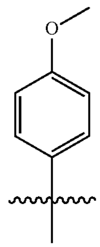  | H | H | 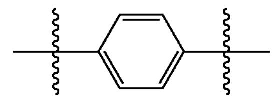 [SMILES: *c1ccc(*)cc1] | 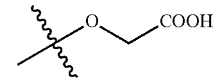  |
| 450 | 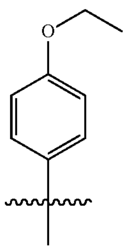 [SMILES: *c1ccc(OCC)cc1]  | 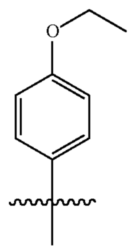  | H | H | 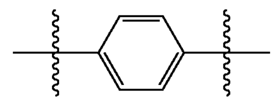 [SMILES: *c1ccc(*)cc1] | 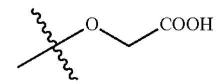 [SMILES: *OCC(=O)O]  |
| 451 | 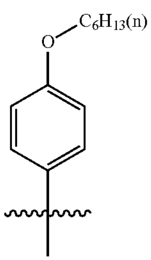  | 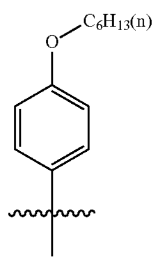  | H | H | 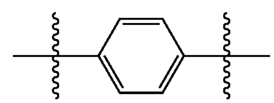 [SMILES: *c1ccc(*)cc1] | 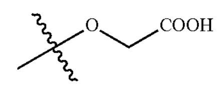 [SMILES: *OCC(=O)O]  |

-continued
| Dye | $R_1$ | $R_2$ | $R_3$ | $R_4$ | Ar | 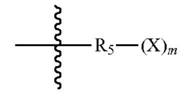  |
|---|---|---|---|---|---|---|
| 452 | 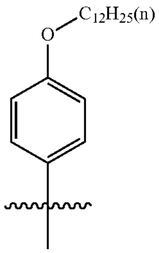  | 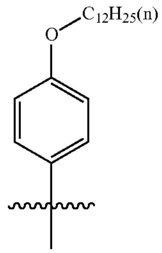  | H | H | 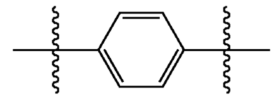 | 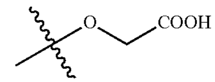 [SMILES: *OCC(=O)O]  |
| 453 | 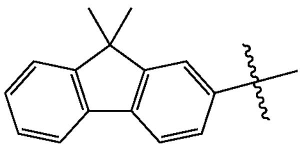 [SMILES: *c1ccc2c(c1)C(C)(C)c1ccccc1-2] | 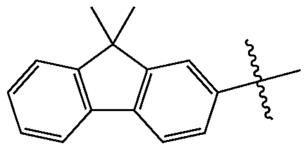 [SMILES: *c1ccc2c(c1)C(C)(C)c1ccccc1-2] | H | H | 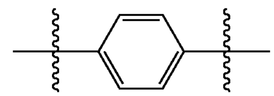 | 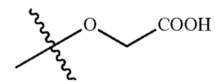 [SMILES: *OCC(=O)O]  |
| 454 | 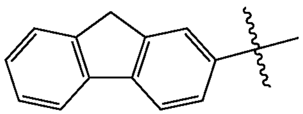 [SMILES: *c1ccc2c(c1)Cc1ccccc1-2] | 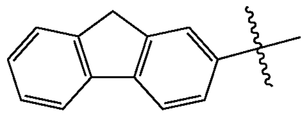 [SMILES: *c1ccc2c(c1)Cc1ccccc1-2] | H | H | 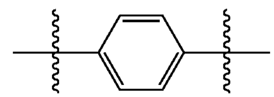 | 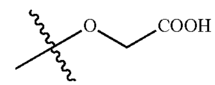  |
| 455 | 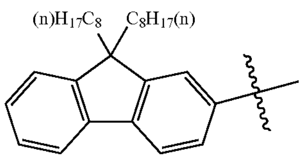  | 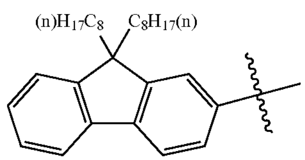  | H | H | 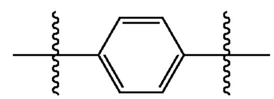 | 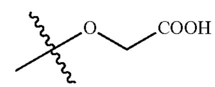  |
| 456 | 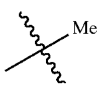  | 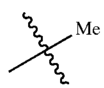  | H | H | 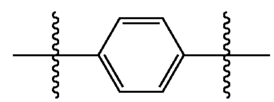 [SMILES: *c1ccc(*)cc1] | 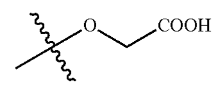  |
| 457 | 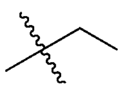 [SMILES: *CC] | 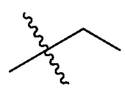 [SMILES: *CC] | H | H | 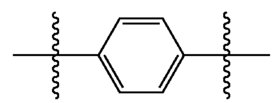 [SMILES: *c1ccc(*)cc1] | 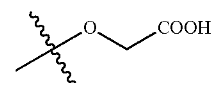 [SMILES: *OCC(=O)O]  |

-continued
| Dye | $R_1$ | $R_2$ | $R_3$ | $R_4$ | Ar |   |
|---|---|---|---|---|---|---|
| 458 | 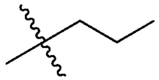 [SMILES: *CCC] |  | H | H | 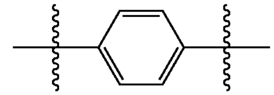 [SMILES: *c1ccc(*)cc1] | 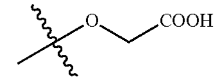 [SMILES: *OCC(=O)O]  |
| 459 | 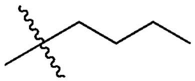 [SMILES: *CCCC] | 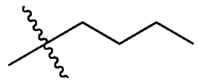 [SMILES: *CCCC] | H | H | 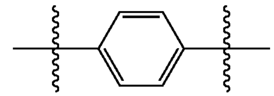 | 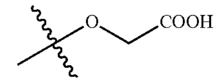 [SMILES: *OCC(=O)O]  |
| 460 | $C_6H_{13}(n)$ | $C_6H_{13}(n)$ | H | H | 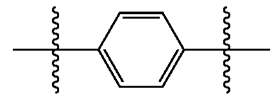 [SMILES: *c1ccc(*)cc1] | 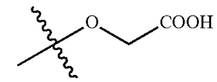 [SMILES: *OCC(=O)O]  |
| 461 | $C_8H_{17}(n)$ | $C_8H_{17}(n)$ | H | H | 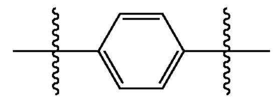 [SMILES: *c1ccc(*)cc1] | 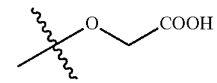 [SMILES: *OCC(=O)O]  |
| 462 | $C_{12}H_{25}(n)$ | $C_{12}H_{25}(n)$ | H | H | 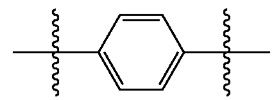 [SMILES: *c1ccc(*)cc1] | 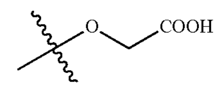 [SMILES: *OCC(=O)O]  |
| 463 | 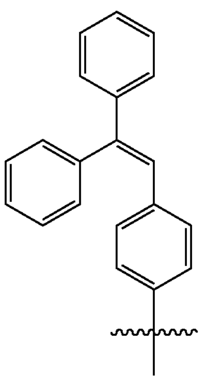 [SMILES: *c1ccc(C=C(c2ccccc2)c2ccccc2)cc1] | 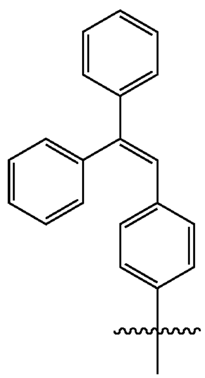 [SMILES: *c1ccc(C=C(c2ccccc2)c2ccccc2)cc1] | H | H | 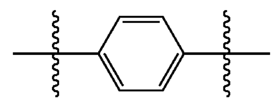 [SMILES: *c1ccc(*)cc1] | 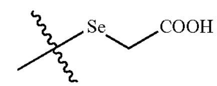 [SMILES: *[Se]CC(=O)O]  |

-continued
| Dye | $R_1$ | $R_2$ | $R_3$ | $R_4$ | Ar | 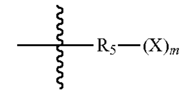 |
|---|---|---|---|---|---|---|
| 464 | 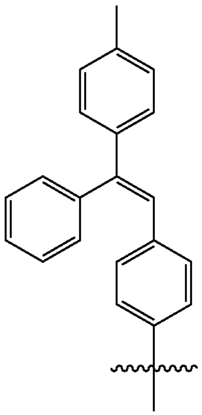 [SMILES: *c1ccc(/C=C(\c2ccccc2)c2ccc(C)cc2)cc1] | 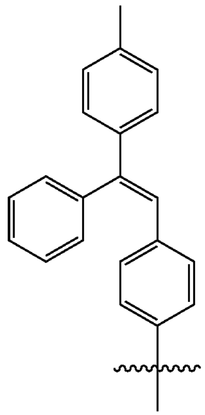 [SMILES: *c1ccc(/C=C(\c2ccccc2)c2ccc(C)cc2)cc1] | H | H | 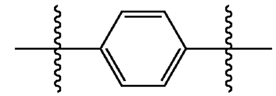 [SMILES: *c1ccc(*)cc1] | 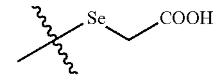 |
| 465 | 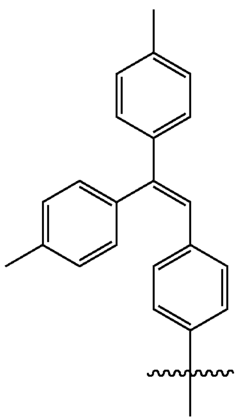 [SMILES: *c1ccc(C=C(c2ccc(C)cc2)c2ccc(C)cc2)cc1] | 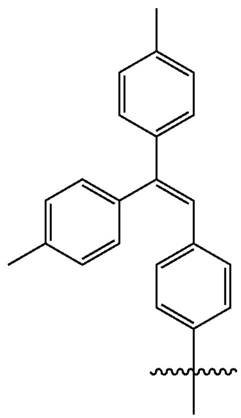 [SMILES: *c1ccc(C=C(c2ccc(C)cc2)c2ccc(C)cc2)cc1] | H | H | 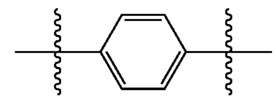 [SMILES: *c1ccc(*)cc1] | 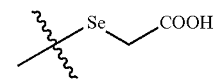 |

-continued
| Dye | $R_1$ | $R_2$ | $R_3$ | $R_4$ | Ar | 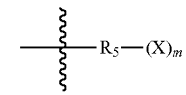 |
|---|---|---|---|---|---|---|
| 466 | 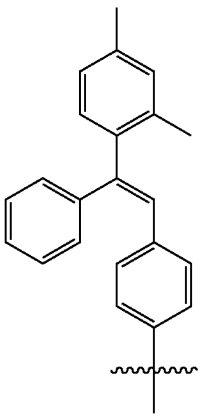 [SMILES: *c1ccc(/C=C(\c2ccccc2)c2ccc(C)cc2C)cc1] | 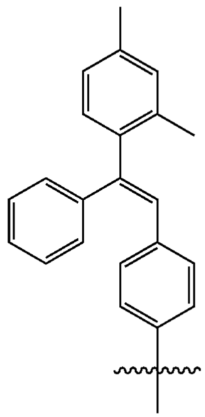 | H | H | 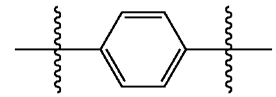 [SMILES: *c1ccc(*)cc1] | 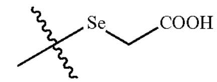 |
| 467 | 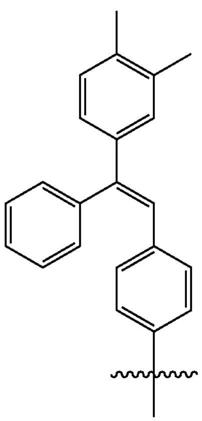 [SMILES: *c1ccc(/C=C(\c2ccccc2)c2ccc(C)c(C)c2)cc1] | 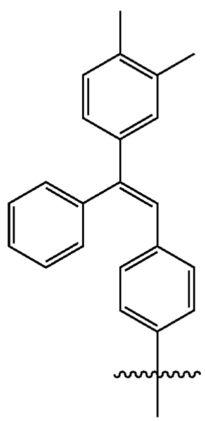 | H | H | 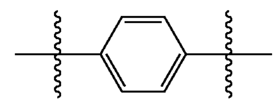 | 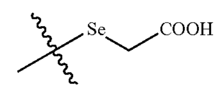 |

-continued
| Dye | $R_1$ | $R_2$ | $R_3$ | $R_4$ | Ar |  |
|---|---|---|---|---|---|---|
| 468 | 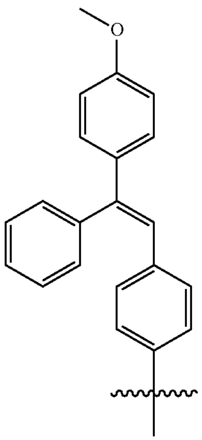 [SMILES: *c1ccc(/C=C(\c2ccccc2)c2ccc(OC)cc2)cc1] | 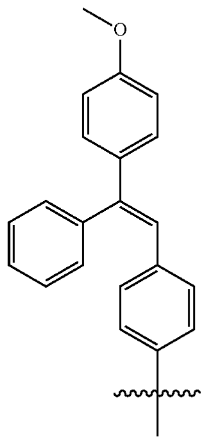 [SMILES: *c1ccc(/C=C(\c2ccccc2)c2ccc(OC)cc2)cc1] | H | H | 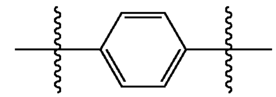 [SMILES: *c1ccc(*)cc1] | 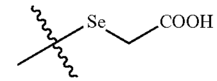 |
| 469 | 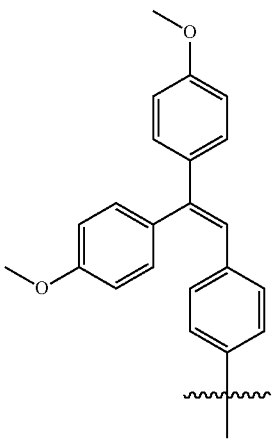 [SMILES: *c1ccc(C=C(c2ccc(OC)cc2)c2ccc(OC)cc2)cc1] | 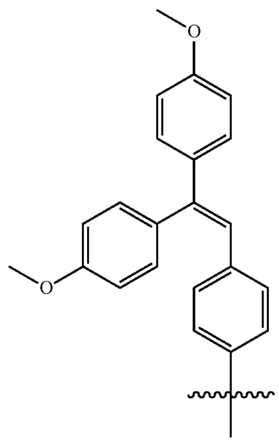 [SMILES: *c1ccc(C=C(c2ccc(OC)cc2)c2ccc(OC)cc2)cc1] | H | H | 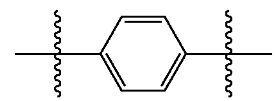 [SMILES: *c1ccc(*)cc1] | 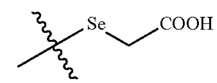 |

-continued
| Dye | $R_1$ | $R_2$ | $R_3$ | $R_4$ | Ar | 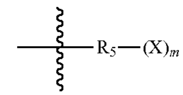 |
| --- | --- | --- | --- | --- | --- | --- |
| 470 | 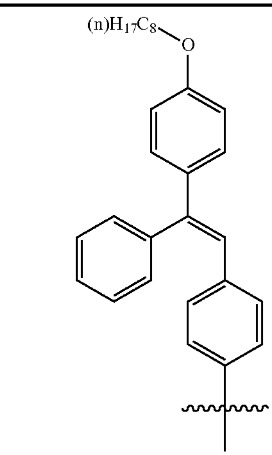 | 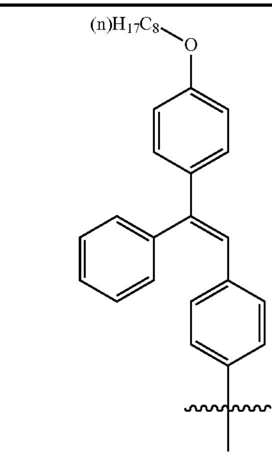 | H | H | 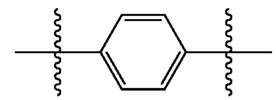 [SMILES: *c1ccc(*)cc1] | 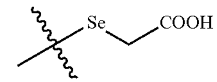 |
| 471 | 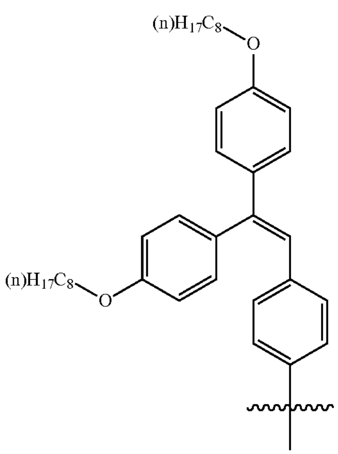 | 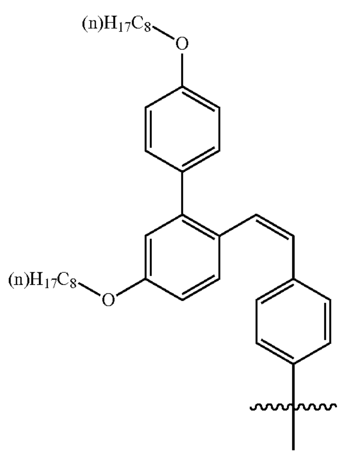 | H | H | 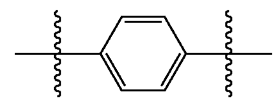 [SMILES: *c1ccc(*)cc1] | 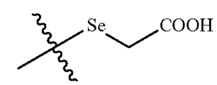 |

-continued
| Dye | $R_1$ | $R_2$ | $R_3$ | $R_4$ | Ar | 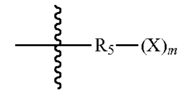 |
|---|---|---|---|---|---|---|
| 472 | 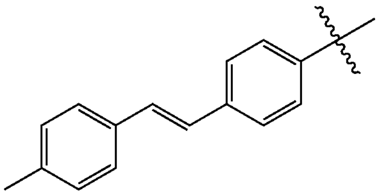 [SMILES: *c1ccc(/C=C/c2ccc(C)cc2)cc1] | 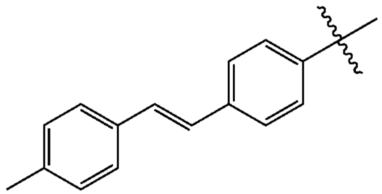 [SMILES: *c1ccc(/C=C/c2ccc(C)cc2)cc1] | H | H | 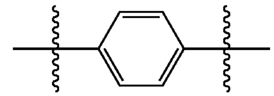 | 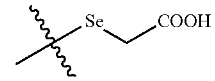 |
| 473 | 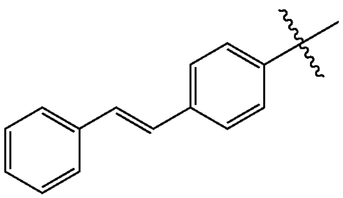 [SMILES: *c1ccc(/C=C/c2ccccc2)cc1] | 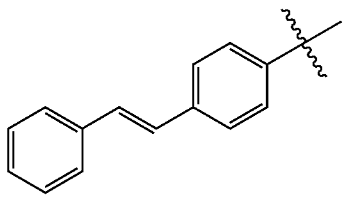 [SMILES: *c1ccc(/C=C/c2ccccc2)cc1] | H | H | 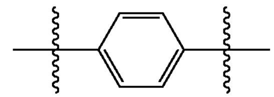 [SMILES: *c1ccc(*)cc1] | 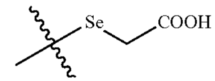 |
| 474 | 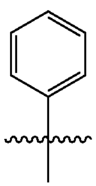 | 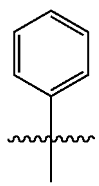 | H | H | 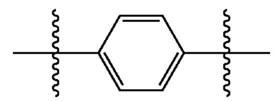 [SMILES: *c1ccc(*)cc1] | 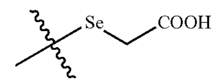 |
| 475 | 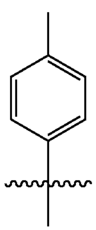 [SMILES: *c1ccc(C)cc1] | 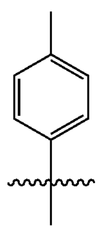 | H | H | 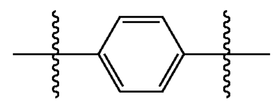 [SMILES: *c1ccc(*)cc1] | 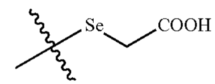 [SMILES: *[Se]CC(=O)O] |

-continued
| Dye | $R_1$ | $R_2$ | $R_3$ | $R_4$ | Ar | $-R_5-(X)_m$ |
|---|---|---|---|---|---|---|
| 476 | 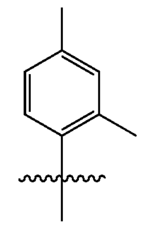 [SMILES: *c1ccc(C)cc1C] | 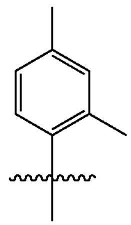 | H | H | 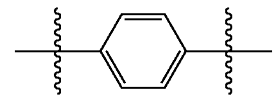 | 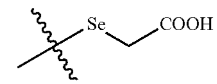 [SMILES: *[Se]CC(=O)O] |
| 477 | 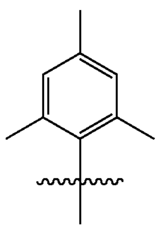 | 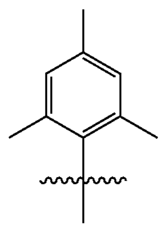 | H | H | 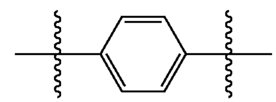 [SMILES: *c1ccc(*)cc1] | 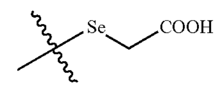 [SMILES: *[Se]CC(=O)O] |
| 478 | 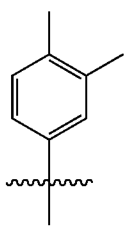 [SMILES: *c1ccc(C)c(C)c1] | 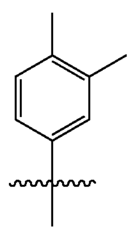 [SMILES: *c1ccc(C)c(C)c1] | H | H | 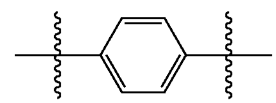 [SMILES: *c1ccc(*)cc1] | 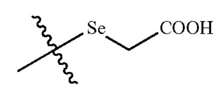 |
| 479 | 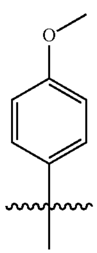 [SMILES: *c1ccc(OC)cc1] | 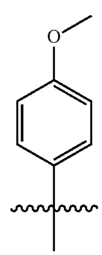 | H | H | 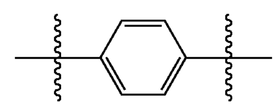 | 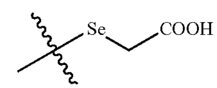 |

-continued
| Dye | $R_1$ | $R_2$ | $R_3$ | $R_4$ | Ar | 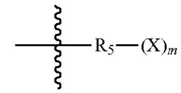 |
|---|---|---|---|---|---|---|
| 480 | 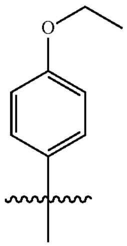 [SMILES: *c1ccc(OCC)cc1] | 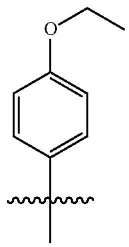 | H | H | 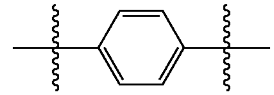 | 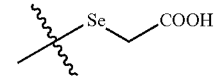 |
| 481 | 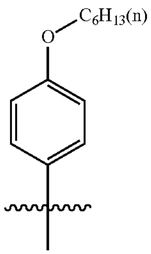 | 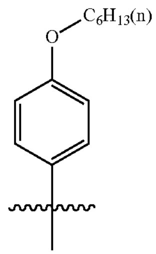 | H | H | 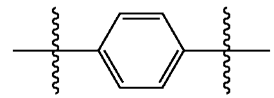 [SMILES: *c1ccc(*)cc1] | 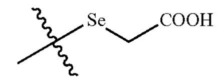 [SMILES: *[Se]CC(=O)O] |
| 482 | 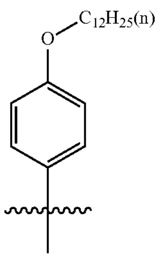 | 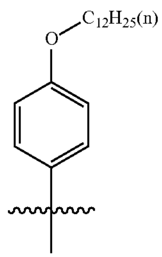 | H | H | 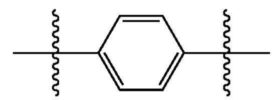 [SMILES: *c1ccc(*)cc1] | 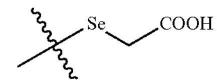 |
| 483 | 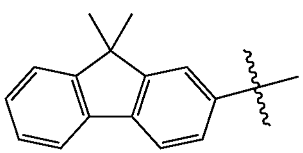 [SMILES: *c1ccc2c(c1)C(C)(C)c1ccccc1-2] | 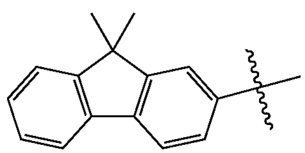 [SMILES: *c1ccc2c(c1)C(C)(C)c1ccccc1-2] | H | H | 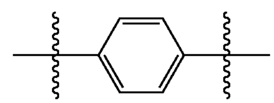 [SMILES: *c1ccc(*)cc1] | 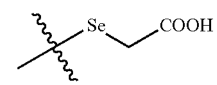 |

-continued
| Dye | $R_1$ | $R_2$ | $R_3$ | $R_4$ | Ar |  $R_5$—$(X)_m$ |
|---|---|---|---|---|---|---|
| 484 | 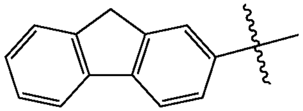 [SMILES: *c1ccc2c(c1)Cc1ccccc1-2] | 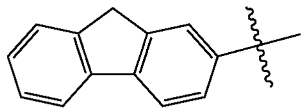 [SMILES: *c1ccc2c(c1)Cc1ccccc1-2] | H | H | 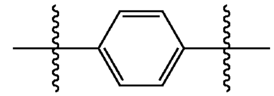 [SMILES: *c1ccc(*)cc1] | 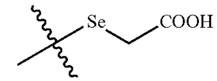  |
| 485 | 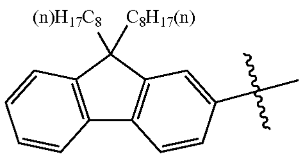  | 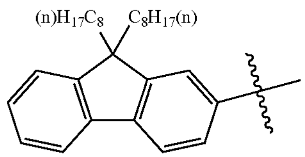  | H | H | 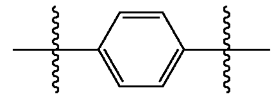 | 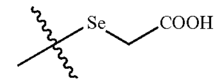  |
| 486 | 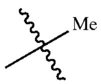  | 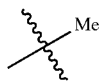  | H | H | 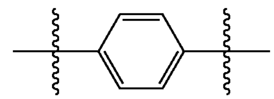 [SMILES: *c1ccc(*)cc1] | 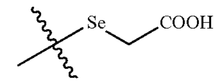  |
| 487 | 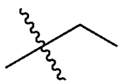 [SMILES: *CC] | 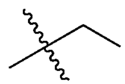 [SMILES: *CC] | H | H | 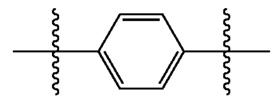 | 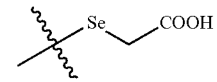  |
| 488 | 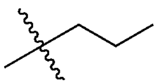 [SMILES: *CCC] |  | H | H | 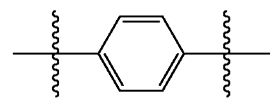 [SMILES: *c1ccc(*)cc1] | 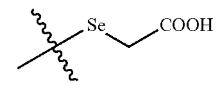  |
| 489 | 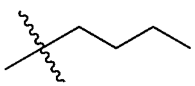 | 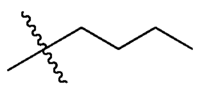 [SMILES: *CCCC] | H | H | 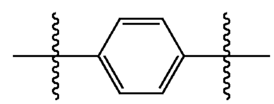 [SMILES: *c1ccc(*)cc1] | 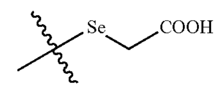  |
| 490 | 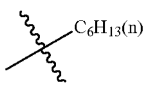  | 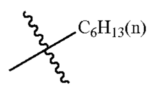  | H | H | 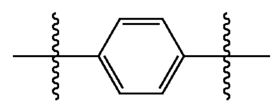 [SMILES: *c1ccc(*)cc1] | 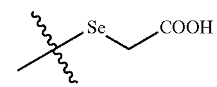  |
| 491 | 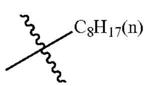  | 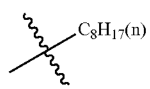  | H | H | 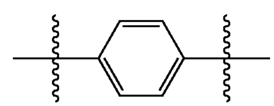 [SMILES: *c1ccc(*)cc1] | 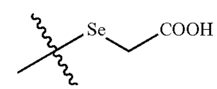 [SMILES: *[Se]CC(=O)O]  |

-continued
| Dye | $R_1$ | $R_2$ | $R_3$ | $R_4$ | Ar | 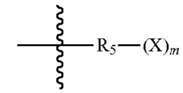 |
|---|---|---|---|---|---|---|
| 492 | 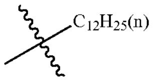 | 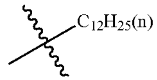 | H | H | 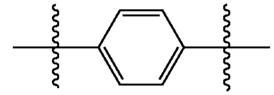 | 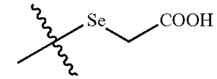 |
| 493 | 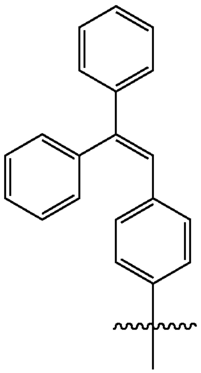 [SMILES: *c1ccc(C=C(c2ccccc2)c2ccccc2)cc1] | 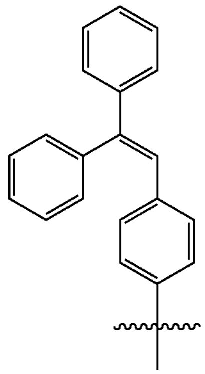 [SMILES: *c1ccc(C=C(c2ccccc2)c2ccccc2)cc1] | H | H | 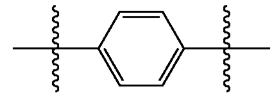 [SMILES: *c1ccc(*)cc1] | 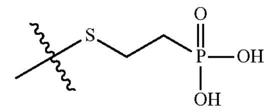 [SMILES: *SCCP(=O)(O)O] |
| 494 | 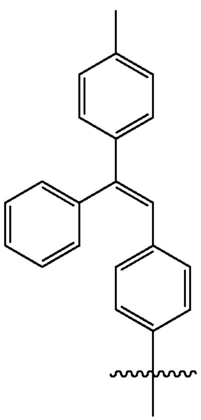 [SMILES: *c1ccc(/C=C(\c2ccccc2)c2ccc(C)cc2)cc1] | 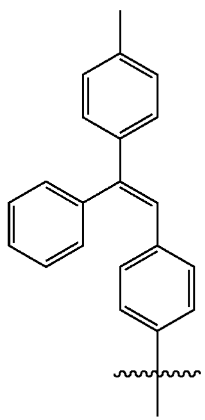 [SMILES: *c1ccc(/C=C(\c2ccccc2)c2ccc(C)cc2)cc1] | H | H | 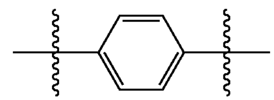 [SMILES: *c1ccc(*)cc1] | 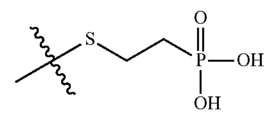 [SMILES: *SCCP(=O)(O)O] |

-continued
| Dye | $R_1$ | $R_2$ | $R_3$ | $R_4$ | Ar | 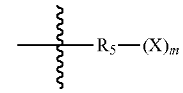 |
|---|---|---|---|---|---|---|
| 495 | 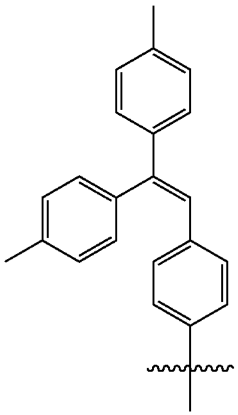 [SMILES: *c1ccc(C=C(c2ccc(C)cc2)c2ccc(C)cc2)cc1] | 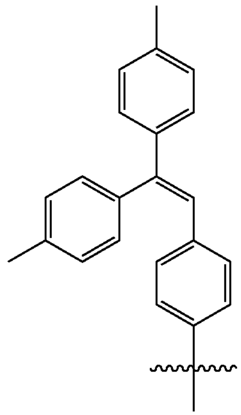 [SMILES: *c1ccc(C=C(c2ccc(C)cc2)c2ccc(C)cc2)cc1] | H | H | 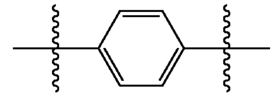 | 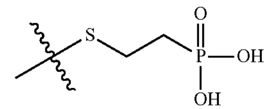 |
| 496 | 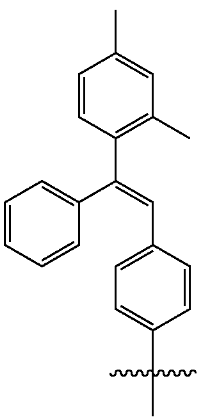 | 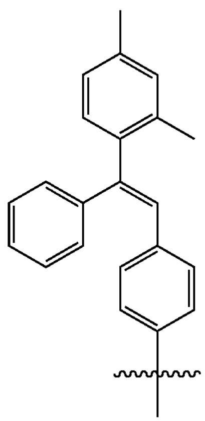 | H | H | 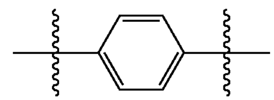 | 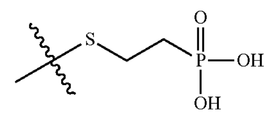 |

-continued
| Dye | $R_1$ | $R_2$ | $R_3$ | $R_4$ | Ar | 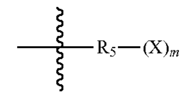 |
|---|---|---|---|---|---|---|
| 497 | 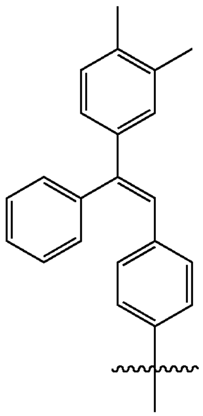 | 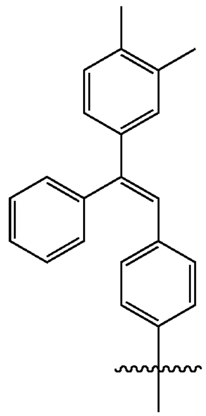 | H | H | 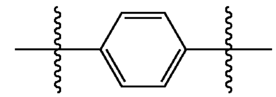 | 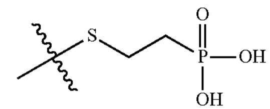 [SMILES: *SCCP(=O)(O)O] |
| 498 | 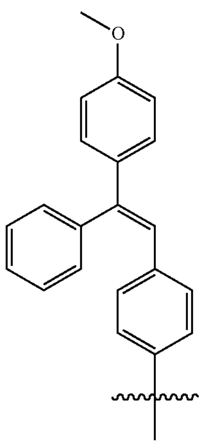 [SMILES: *c1ccc(/C=C(\c2ccccc2)c2ccc(OC)cc2)cc1] | 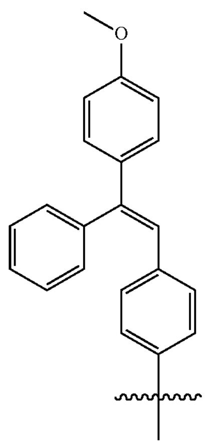 [SMILES: *c1ccc(/C=C(\c2ccccc2)c2ccc(OC)cc2)cc1] | H | H | 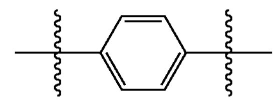 [SMILES: *c1ccc(*)cc1] | 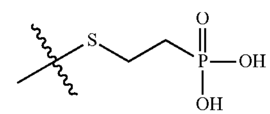 |

-continued
| Dye | $R_1$ | $R_2$ | $R_3$ | $R_4$ | Ar |  $R_5$—$(X)_m$ |
|---|---|---|---|---|---|---|
| 499 | 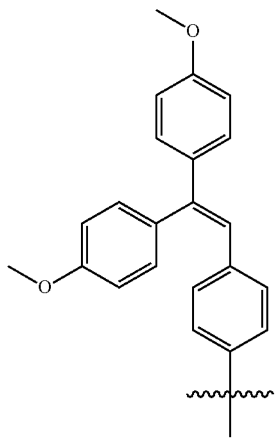 [SMILES: *c1ccc(C=C(c2ccc(OC)cc2)c2ccc(OC)cc2)cc1] | 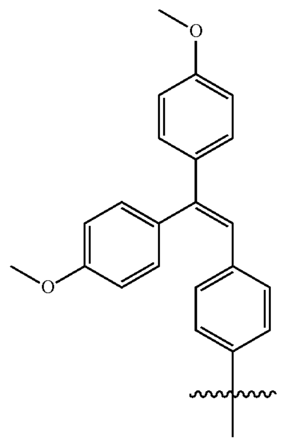 [SMILES: *c1ccc(C=C(c2ccc(OC)cc2)c2ccc(OC)cc2)cc1] | H | H | 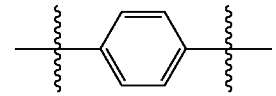 [SMILES: *c1ccc(*)cc1] | 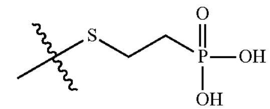 [SMILES: *SCCP(=O)(O)O] |
| 500 | 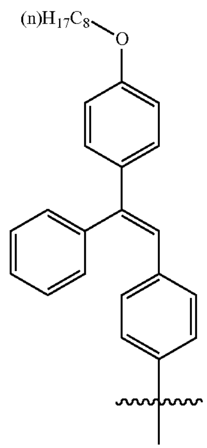 | 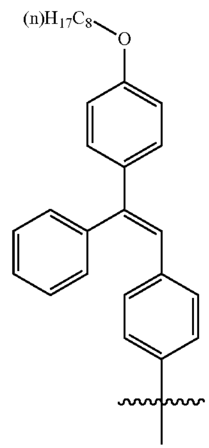 | H | H | 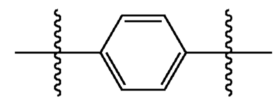 | 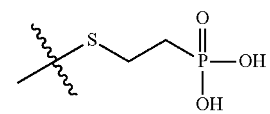 |

-continued
| Dye | $R_1$ | $R_2$ | $R_3$ | $R_4$ | Ar | $R_5$—$(X)_m$ |
|---|---|---|---|---|---|---|
| 501 | 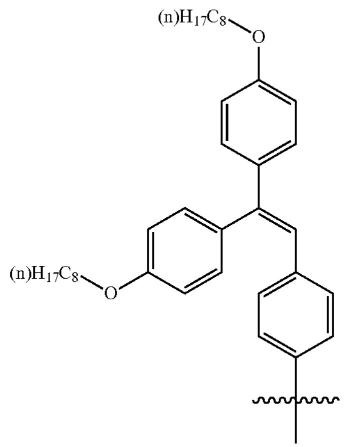 | 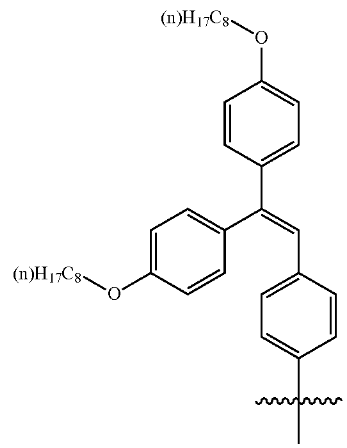 | H | H | 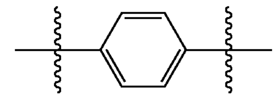 [SMILES: *c1ccc(*)cc1] | 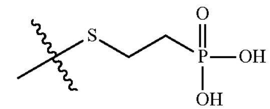 |
| 502 | 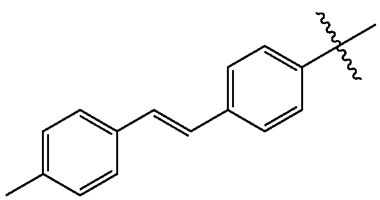 [SMILES: *c1ccc(/C=C/c2ccc(C)cc2)cc1] | 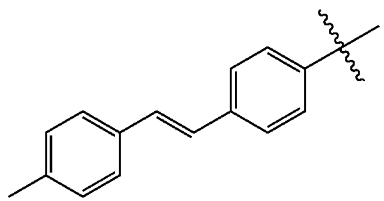 [SMILES: *c1ccc(/C=C/c2ccc(C)cc2)cc1] | H | H | 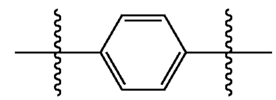 | 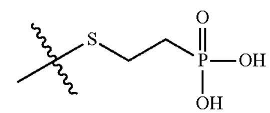 |
| 503 | 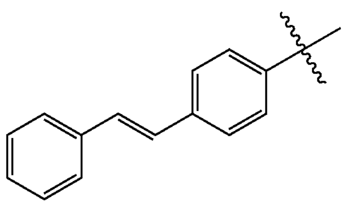 [SMILES: *c1ccc(/C=C/c2ccccc2)cc1] | 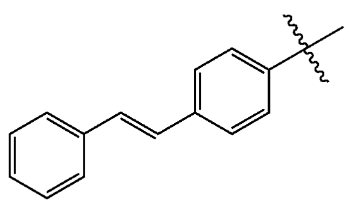 [SMILES: *c1ccc(/C=C/c2ccccc2)cc1] | H | H | 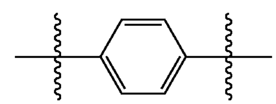 [SMILES: *c1ccc(*)cc1] | 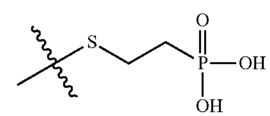 [SMILES: *SCCP(=O)(O)O] |

-continued
| Dye | $R_1$ | $R_2$ | $R_3$ | $R_4$ | Ar | $R_5-(X)_m$ |
|---|---|---|---|---|---|---|
| 504 | 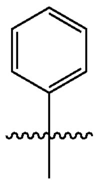 [SMILES: *c1ccccc1] | 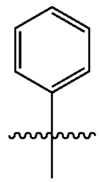 [SMILES: *c1ccccc1] | H | H | 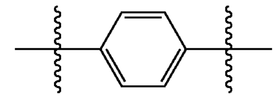 [SMILES: *c1ccc(*)cc1] | 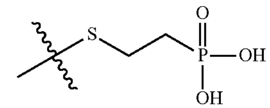 |
| 505 | 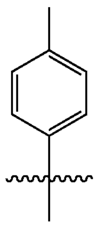 [SMILES: *c1ccc(C)cc1] | 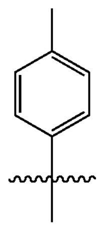 | H | H | 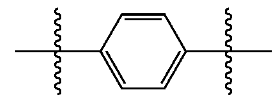 | 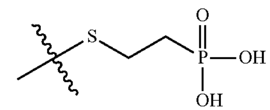 [SMILES: *SCCP(=O)(O)O] |
| 506 | 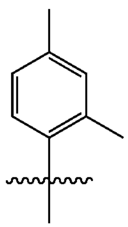 [SMILES: *c1ccc(C)cc1C] | 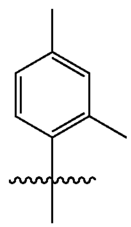 | H | H | 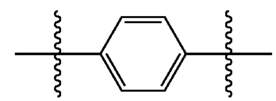 | 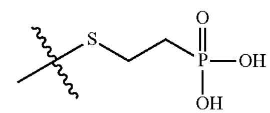 [SMILES: *SCCP(=O)(O)O] |
| 507 | 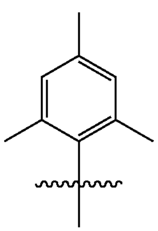 | 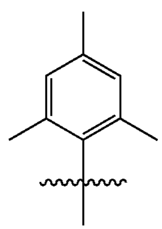 | H | H | 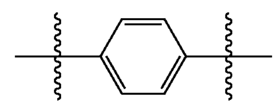 [SMILES: *c1ccc(*)cc1] | 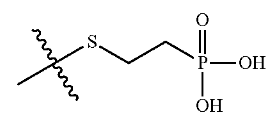 [SMILES: *SCCP(=O)(O)O] |

-continued
| Dye | $R_1$ | $R_2$ | $R_3$ | $R_4$ | Ar | $R_5$—$(X)_m$ |
|---|---|---|---|---|---|---|
| 508 | 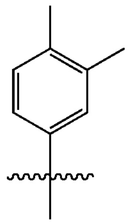 [SMILES: *c1ccc(C)c(C)c1] | 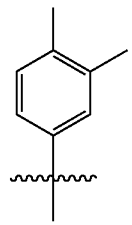 [SMILES: *c1ccc(C)c(C)c1] | H | H | 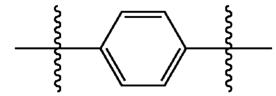 | 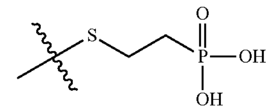 [SMILES: *SCCP(=O)(O)O] |
| 509 | 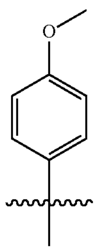 [SMILES: *c1ccc(OC)cc1] | 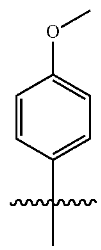 | H | H | 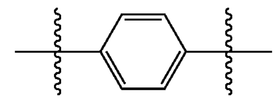 | 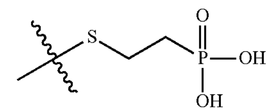 |
| 510 | 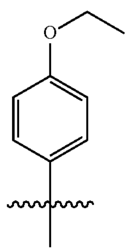 [SMILES: *c1ccc(OCC)cc1] | 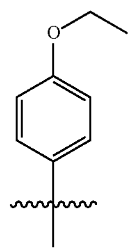 | H | H | 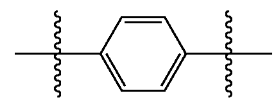 [SMILES: *c1ccc(*)cc1] | 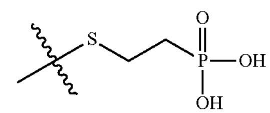 |
| 511 | 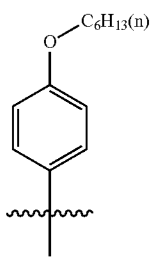 | 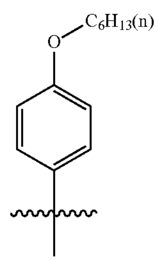 | H | H | 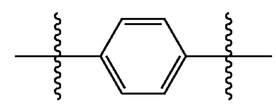 [SMILES: *c1ccc(*)cc1] | 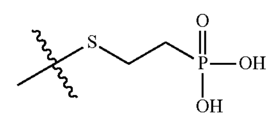 [SMILES: *SCCP(=O)(O)O] |

-continued
| Dye | $R_1$ | $R_2$ | $R_3$ | $R_4$ | Ar | 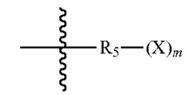 |
|---|---|---|---|---|---|---|
| 512 | 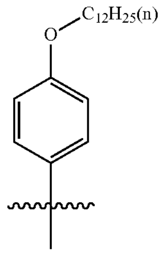 | 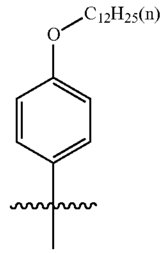 | H | H | 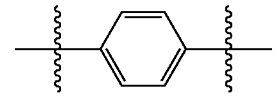 [SMILES: *c1ccc(*)cc1] | 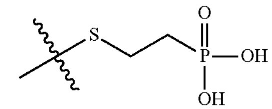 |
| 513 | 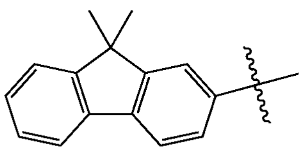 [SMILES: *c1ccc2c(c1)C(C)(C)c1ccccc1-2] | 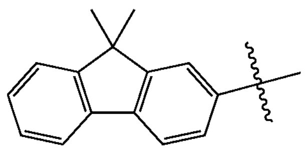 [SMILES: *c1ccc2c(c1)C(C)(C)c1ccccc1-2] | H | H | 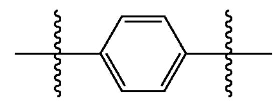 [SMILES: *c1ccc(*)cc1] | 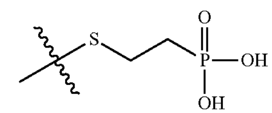 [SMILES: *SCCP(=O)(O)O] |
| 514 | 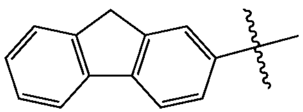 [SMILES: *c1ccc2c(c1)Cc1ccccc1-2] | 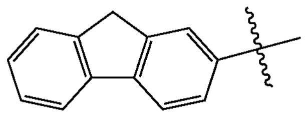 [SMILES: *c1ccc2c(c1)Cc1ccccc1-2] | H | H | 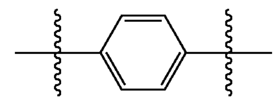 [SMILES: *c1ccc(*)cc1] | 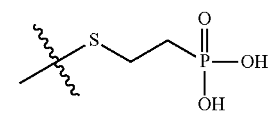 [SMILES: *SCCP(=O)(O)O] |
| 515 | 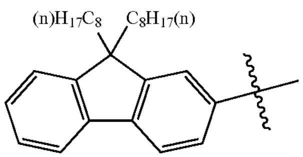 | 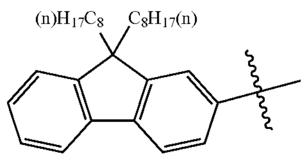 | H | H | 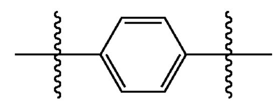 [SMILES: *c1ccc(*)cc1] | 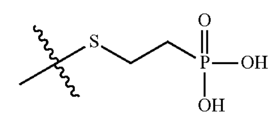 |
| 516 | 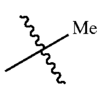 | 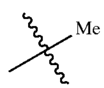 | H | H | 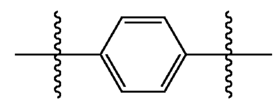 [SMILES: *c1ccc(*)cc1] | 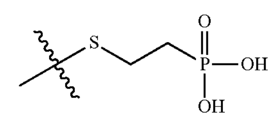 |
| 517 | 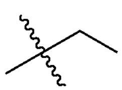 [SMILES: *CC] | 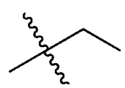 [SMILES: *CC] | H | H | 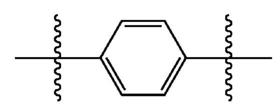 [SMILES: *c1ccc(*)cc1] | 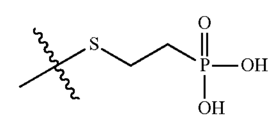 |

-continued
| Dye | $R_1$ | $R_2$ | $R_3$ | $R_4$ | Ar | $-R_5-(X)_m$ |
|---|---|---|---|---|---|---|
| 518 |  |  | H | H | 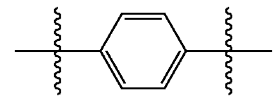 [SMILES: *c1ccc(*)cc1] | 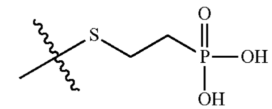 [SMILES: *SCCP(=O)(O)O] |
| 519 | 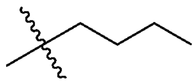 [SMILES: *CCCC] | 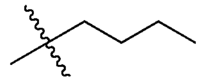 [SMILES: *CCCC] | H | H | 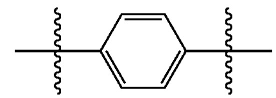 [SMILES: *c1ccc(*)cc1] | 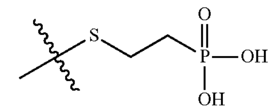 [SMILES: *SCCP(=O)(O)O] |
| 520 | 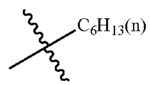 | 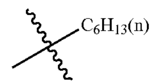 | H | H | 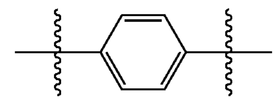 [SMILES: *c1ccc(*)cc1] | 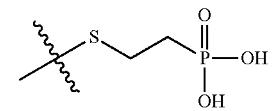 [SMILES: *SCCP(=O)(O)O] |
| 521 | 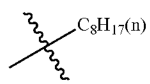 | 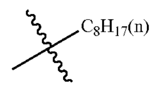 | H | H | 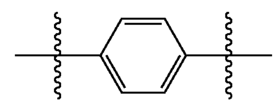 [SMILES: *c1ccc(*)cc1] | 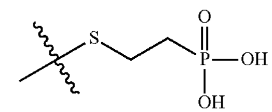 [SMILES: *SCCP(=O)(O)O] |
| 522 | 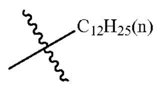 | 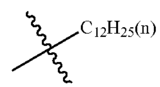 | H | H | 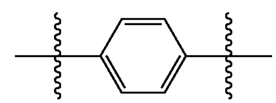 [SMILES: *c1ccc(*)cc1] | 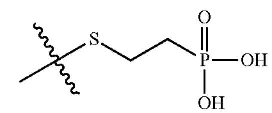 |
| 523 | 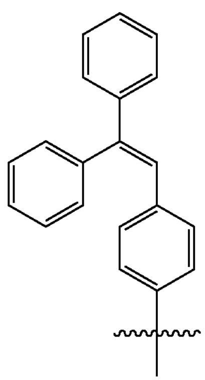 [SMILES: *c1ccc(C=C(c2ccccc2)c2ccccc2)cc1] | 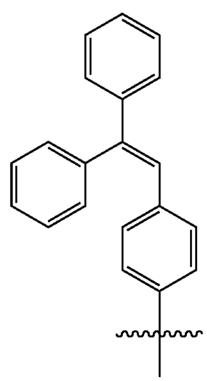 [SMILES: *c1ccc(C=C(c2ccccc2)c2ccccc2)cc1] | H | H | 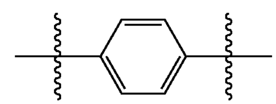 | 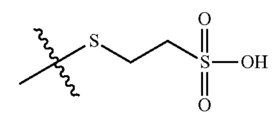 [SMILES: *SCCS(=O)(=O)O] |

-continued
| Dye | $R_1$ | $R_2$ | $R_3$ | $R_4$ | Ar | 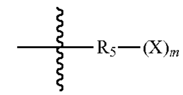 |
|---|---|---|---|---|---|---|
| 524 | 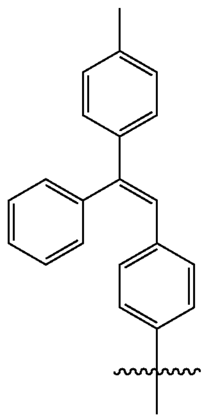 [SMILES: *c1ccc(/C=C(\c2ccccc2)c2ccc(C)cc2)cc1] | 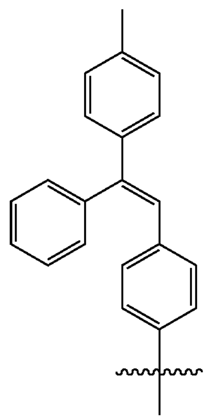 [SMILES: *c1ccc(/C=C(\c2ccccc2)c2ccc(C)cc2)cc1] | H | H | 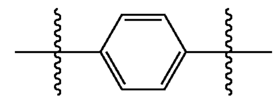 [SMILES: *c1ccc(*)cc1] | 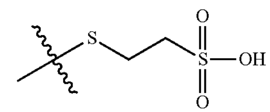 [SMILES: *SCCS(=O)(=O)O] |
| 525 | 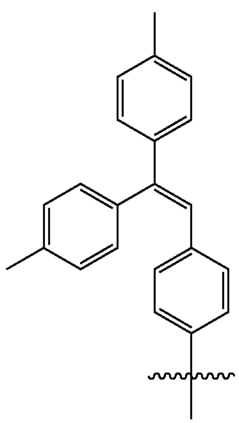 [SMILES: *c1ccc(C=C(c2ccc(C)cc2)c2ccc(C)cc2)cc1] | 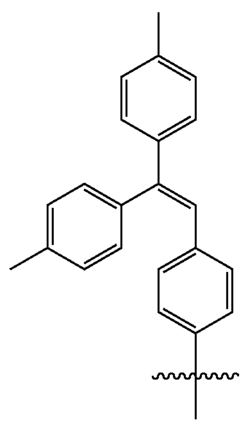 [SMILES: *c1ccc(C=C(c2ccc(C)cc2)c2ccc(C)cc2)cc1] | H | H | 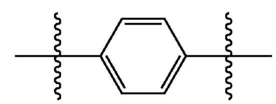 [SMILES: *c1ccc(*)cc1] | 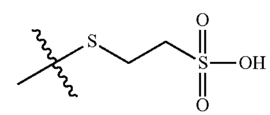 |

-continued
| Dye | $R_1$ | $R_2$ | $R_3$ | $R_4$ | Ar | 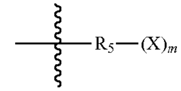 |
|---|---|---|---|---|---|---|
| 526 | 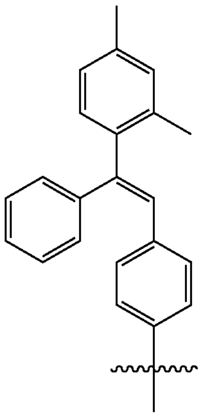 [SMILES: *c1ccc(/C=C(\c2ccccc2)c2ccc(C)cc2C)cc1] | 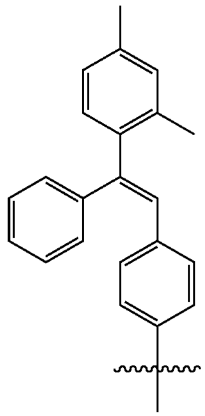 | H | H | 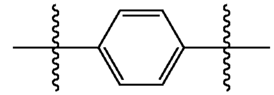 [SMILES: *c1ccc(*)cc1] | 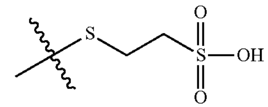 |
| 527 | 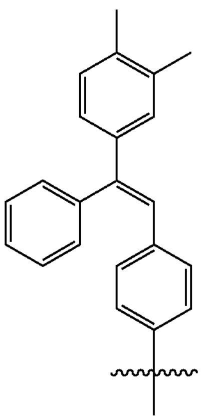 [SMILES: *c1ccc(/C=C(\c2ccccc2)c2ccc(C)c(C)c2)cc1] | 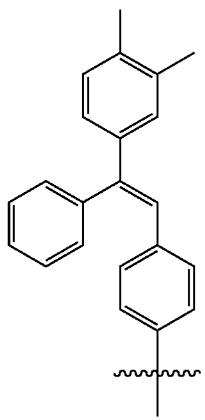 | H | H | 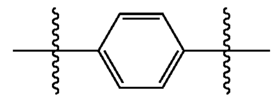 [SMILES: *c1ccc(*)cc1] | 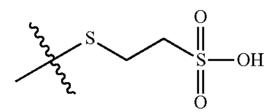 |

-continued
| Dye | $R_1$ | $R_2$ | $R_3$ | $R_4$ | Ar | 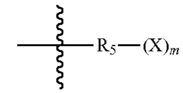  |
| --- | --- | --- | --- | --- | --- | --- |
| 528 | 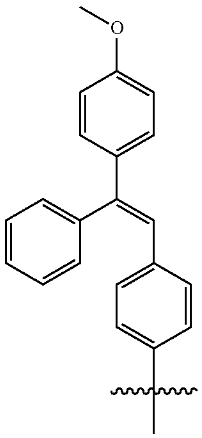 [SMILES: *c1ccc(/C=C(\c2ccccc2)c2ccc(OC)cc2)cc1]  | 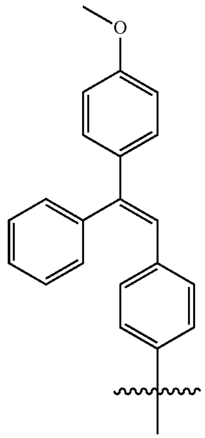 [SMILES: *c1ccc(/C=C(\c2ccccc2)c2ccc(OC)cc2)cc1]  | H | H | 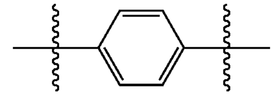 [SMILES: *c1ccc(*)cc1] | 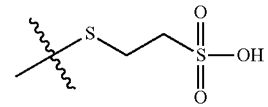  |
| 529 | 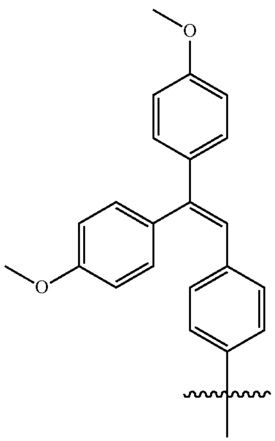 [SMILES: *c1ccc(C=C(c2ccc(OC)cc2)c2ccc(OC)cc2)cc1]  | 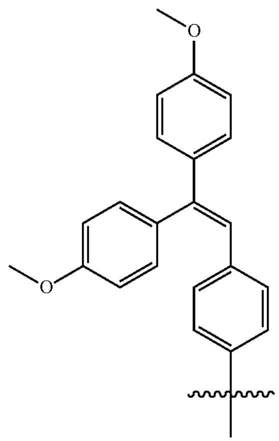 [SMILES: *c1ccc(C=C(c2ccc(OC)cc2)c2ccc(OC)cc2)cc1]  | H | H | 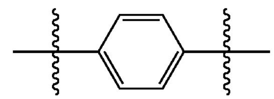 | 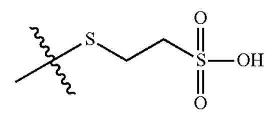  |

-continued
| Dye | $R_1$ | $R_2$ | $R_3$ | $R_4$ | Ar | 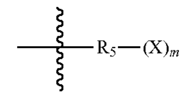 |
|---|---|---|---|---|---|---|
| 530 | 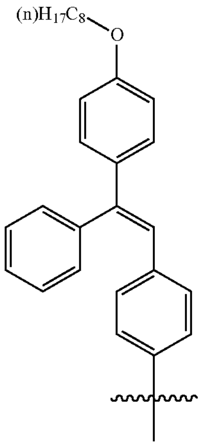 | 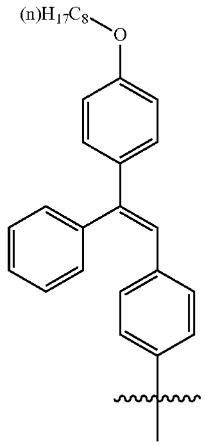 | H | H | 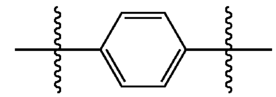 | 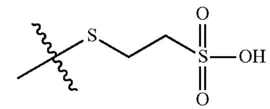 |
| 531 | 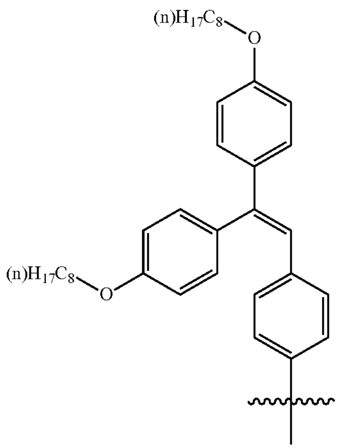 | 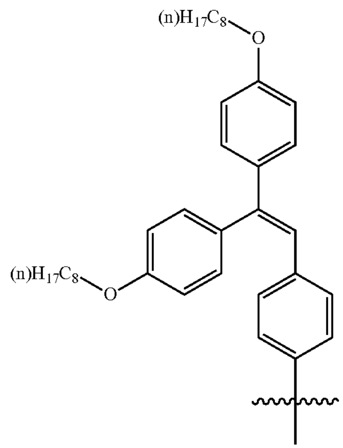 | H | H | 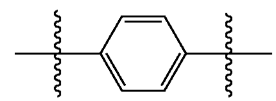 [SMILES: *c1ccc(*)cc1] | 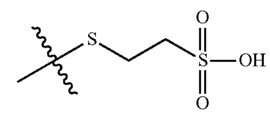 |

-continued
| Dye | $R_1$ | $R_2$ | $R_3$ | $R_4$ | Ar | 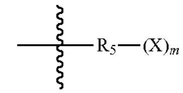 |
|---|---|---|---|---|---|---|
| 532 | 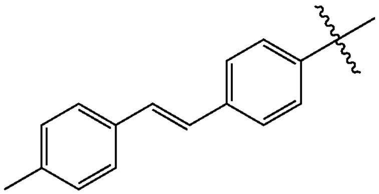 [SMILES: *c1ccc(/C=C/c2ccc(C)cc2)cc1] | 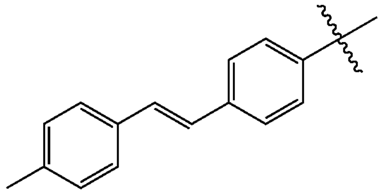 [SMILES: *c1ccc(/C=C/c2ccc(C)cc2)cc1] | H | H | 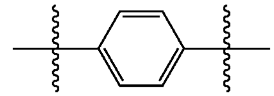 | 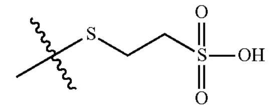 |
| 533 | 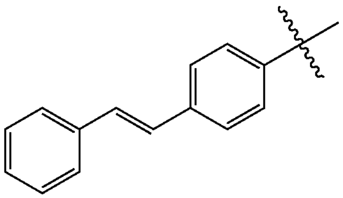 [SMILES: *c1ccc(/C=C/c2ccccc2)cc1] | 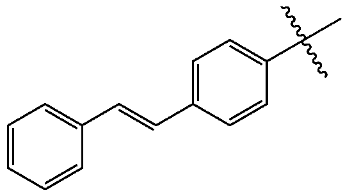 [SMILES: *c1ccc(/C=C/c2ccccc2)cc1] | H | H | 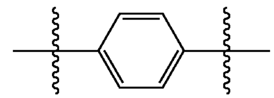 [SMILES: *c1ccc(*)cc1] | 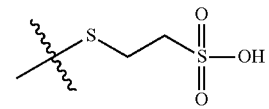 [SMILES: *SCCS(=O)(=O)O] |
| 534 | 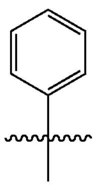 [SMILES: *c1ccccc1] | 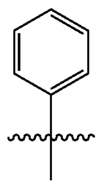 | H | H | 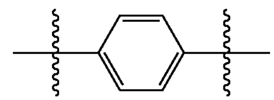 [SMILES: *c1ccc(*)cc1] | 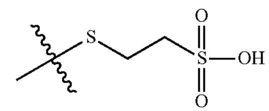 [SMILES: *SCCS(=O)(=O)O] |
| 535 | 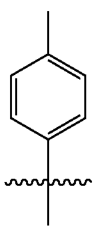 [SMILES: *c1ccc(C)cc1] | 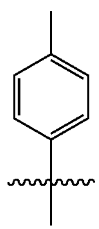 | H | H | 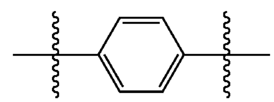 | 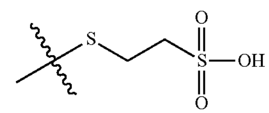 |

-continued
| Dye | $R_1$ | $R_2$ | $R_3$ | $R_4$ | Ar | $R_5-(X)_m$ |
|---|---|---|---|---|---|---|
| 536 | 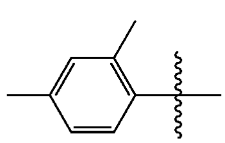 | 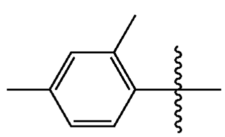 | H | H | 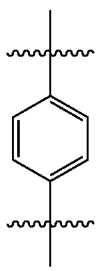 | 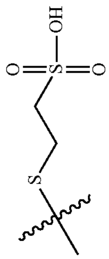 |
| 537 | 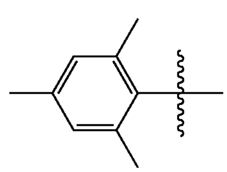 | 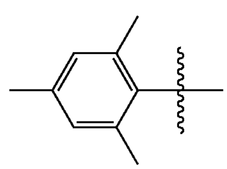 | H | H | 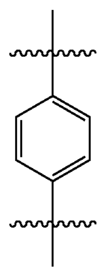 | 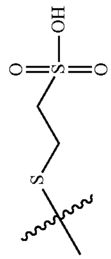 |
| 538 | 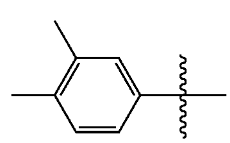 | 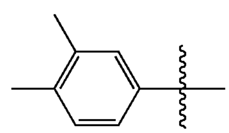 | H | H | 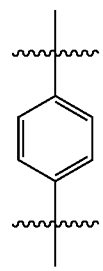 | 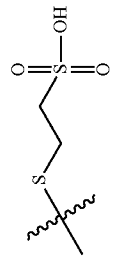 |
| 539 | 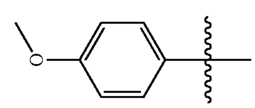 | 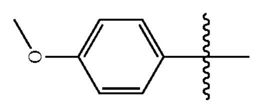 | H | H | 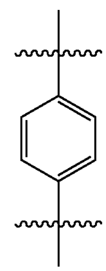 | 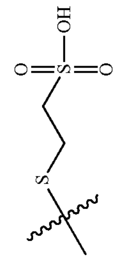 |

-continued
| Dye | $R_1$ | $R_2$ | $R_3$ | $R_4$ | Ar | 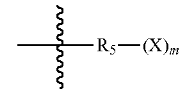 |
|---|---|---|---|---|---|---|
| 540 | 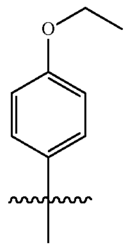 [SMILES: *c1ccc(OCC)cc1] | 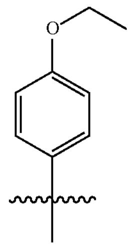 | H | H | 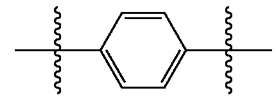 [SMILES: *c1ccc(*)cc1] | 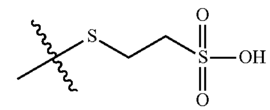 |
| 541 | 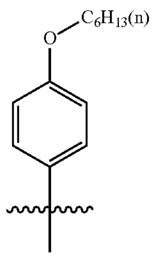 | 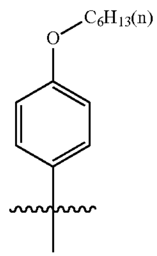 | H | H | 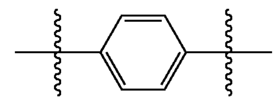 | 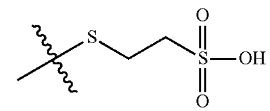 |
| 542 | 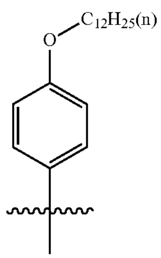 | 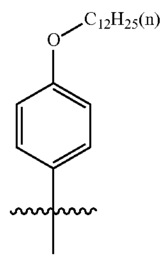 | H | H | 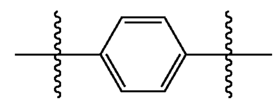 [SMILES: *c1ccc(*)cc1] | 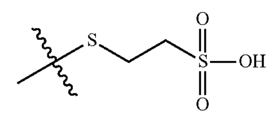 [SMILES: *SCCS(=O)(=O)O] |
| 543 | 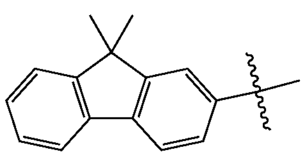 [SMILES: *c1ccc2c(c1)C(C)(C)c1ccccc1-2] | 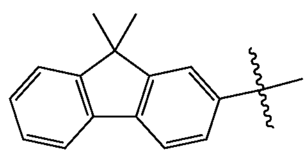 [SMILES: *c1ccc2c(c1)C(C)(C)c1ccccc1-2] | H | H | 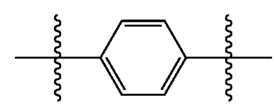 | 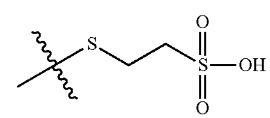 [SMILES: *SCCS(=O)(=O)O] |

-continued
| Dye | $R_1$ | $R_2$ | $R_3$ | $R_4$ | Ar | 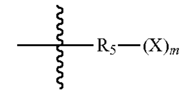 |
|---|---|---|---|---|---|---|
| 544 | 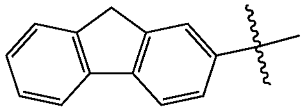 [SMILES: *c1ccc2c(c1)Cc1ccccc1-2] | 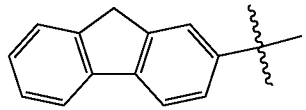 [SMILES: *c1ccc2c(c1)Cc1ccccc1-2] | H | H | 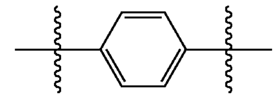 | 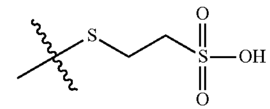 [SMILES: *SCCS(=O)(=O)O] |
| 545 | 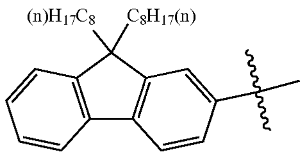 | 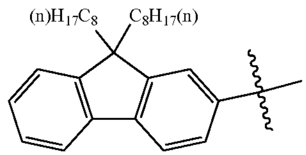 | H | H | 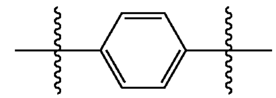 [SMILES: *c1ccc(*)cc1] | 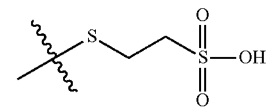 [SMILES: *SCCS(=O)(=O)O] |
| 546 | 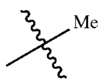 | 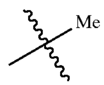 | H | H | 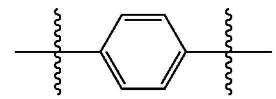 | 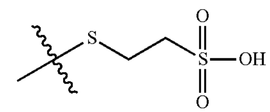 |
| 547 | 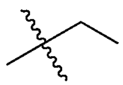 [SMILES: *CC] | 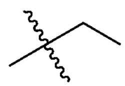 [SMILES: *CC] | H | H | 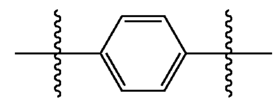 [SMILES: *c1ccc(*)cc1] | 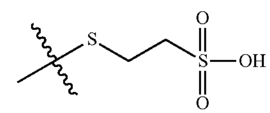 |
| 548 | 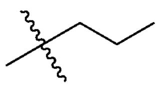 [SMILES: *CCC] | 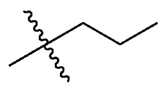 [SMILES: *CCC] | H | H | 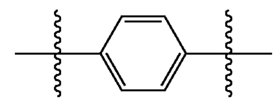 | 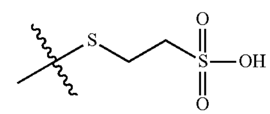 |
| 549 | 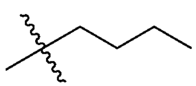 [SMILES: *CCCC] | 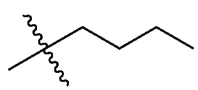 [SMILES: *CCCC] | H | H | 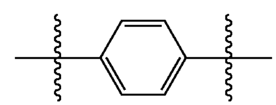 [SMILES: *c1ccc(*)cc1] | 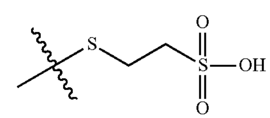 |

-continued
| Dye | $R_1$ | $R_2$ | $R_3$ | $R_4$ | Ar | 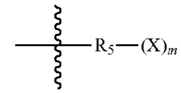 |
|---|---|---|---|---|---|---|
| 550 | $C_6H_{13}$(n) | $C_6H_{13}$(n) | H | H | 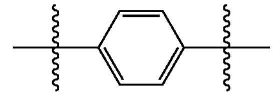 | 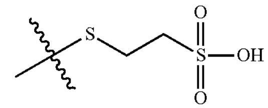 |
| 551 | $C_8H_{17}$(n) | $C_8H_{17}$(n) | H | H | 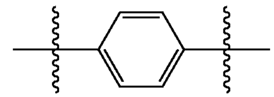 [SMILES: *c1ccc(*)cc1] | 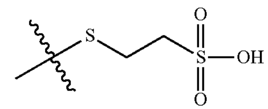 |
| 552 | $C_{12}H_{25}$(n) | $C_{12}H_{25}$(n) | H | H | 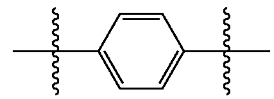 [SMILES: *c1ccc(*)cc1] | 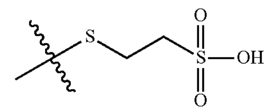 [SMILES: *SCCS(=O)(=O)O] |

| Dye | 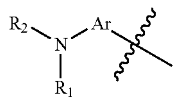 | R3 | R4 | 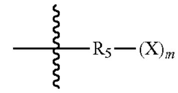 |
|---|---|---|---|---|
| 601 | 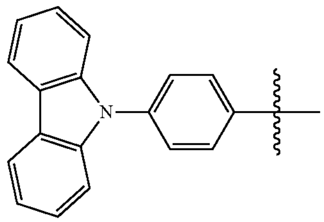 [SMILES: *c1ccc(-n2c3ccccc3c3ccccc32)cc1] | H | H | 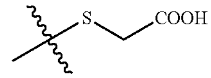 [SMILES: *SCC(=O)O] |
| 602 | 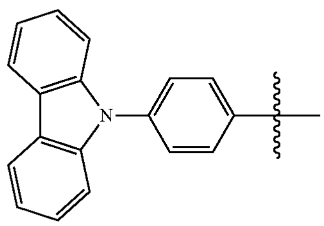 [SMILES: *c1ccc(-n2c3ccccc3c3ccccc32)cc1] | 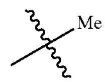 | H | 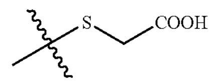 [SMILES: *SCC(=O)O] |
| 603 | 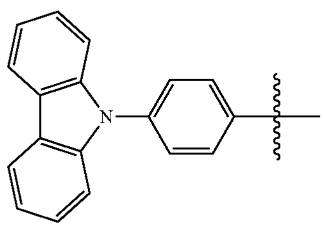 [SMILES: *c1ccc(-n2c3ccccc3c3ccccc32)cc1] | H | 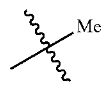 | 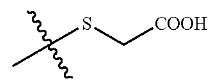 [SMILES: *SCC(=O)O] |
| 604 | 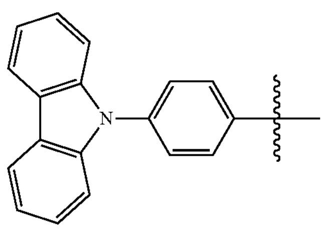 [SMILES: *c1ccc(-n2c3ccccc3c3ccccc32)cc1] | 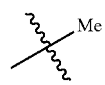 | 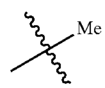 | 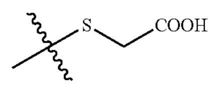 |
| 605 | 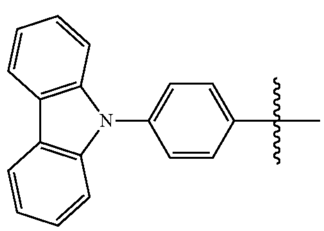 [SMILES: *c1ccc(-n2c3ccccc3c3ccccc32)cc1] | 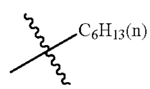 | H | 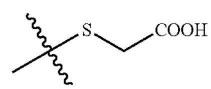 [SMILES: *SCC(=O)O] |
| 606 | 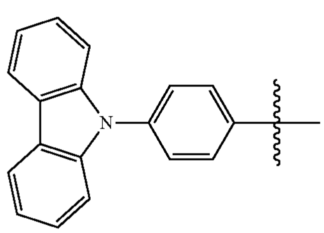 [SMILES: *c1ccc(-n2c3ccccc3c3ccccc32)cc1] | 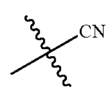 | H | 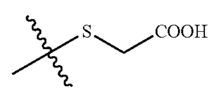 |

-continued
| Dye | 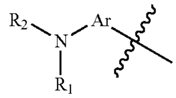  | R3 | R4 | 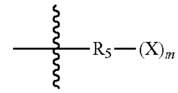  |
|---|---|---|---|---|
| 607 | 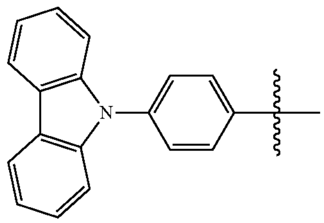 [SMILES: *c1ccc(-n2c3ccccc3c3ccccc32)cc1]  | H | H | 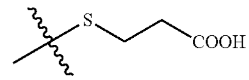 [SMILES: *SCCC(=O)O]  |
| 608 | 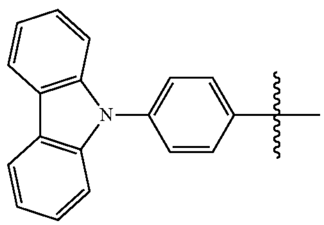 [SMILES: *c1ccc(-n2c3ccccc3c3ccccc32)cc1]  | H | H | 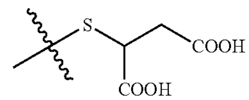 [SMILES: *SC(CC(=O)O)C(=O)O]  |
| 609 | 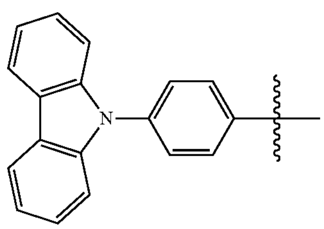 [SMILES: *c1ccc(-n2c3ccccc3c3ccccc32)cc1]  | H | H | 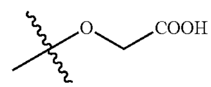  |
| 610 | 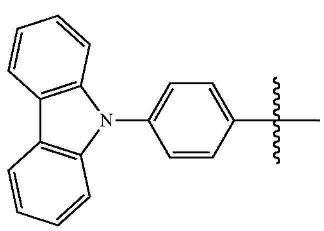 [SMILES: *c1ccc(-n2c3ccccc3c3ccccc32)cc1]  | H | H | 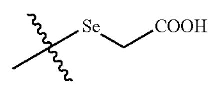 [SMILES: *[Se]CC(=O)O]  |
| 611 | 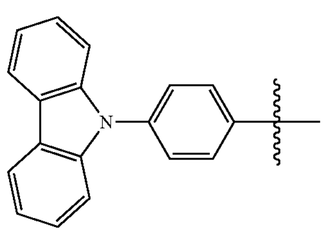 [SMILES: *c1ccc(-n2c3ccccc3c3ccccc32)cc1]  | H | H | 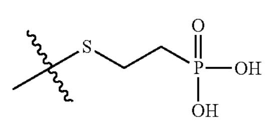 [SMILES: *SCCP(=O)(O)O]  |
| 612 | 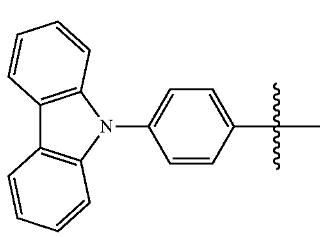 [SMILES: *c1ccc(-n2c3ccccc3c3ccccc32)cc1]  | H | H | 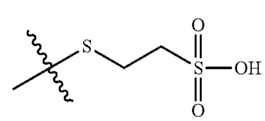 [SMILES: *SCCS(=O)(=O)O]  |

-continued
| Dye | 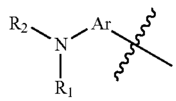 | $R_3$ | $R_4$ | 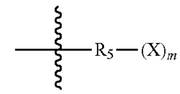 |
|---|---|---|---|---|
| 613 | 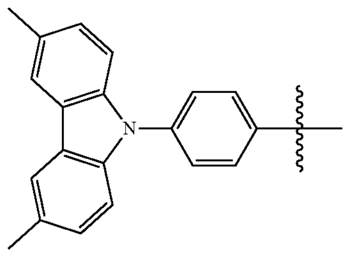 [SMILES: *c1ccc(-n2c3ccc(C)cc3c3cc(C)ccc32)cc1] | H | H | 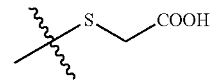 |
| 614 | 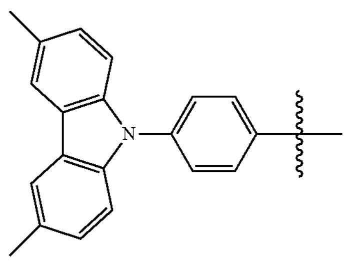 [SMILES: *c1ccc(-n2c3ccc(C)cc3c3cc(C)ccc32)cc1] | 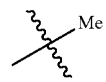 | H | 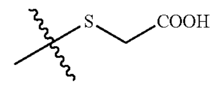 |
| 615 | 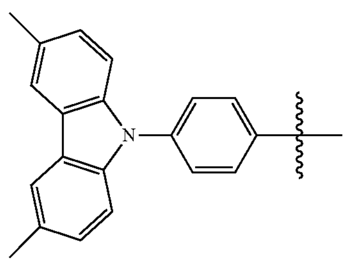 [SMILES: *c1ccc(-n2c3ccc(C)cc3c3cc(C)ccc32)cc1] | H | 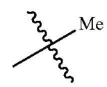 | 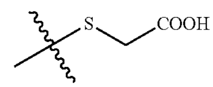 |
| 616 | 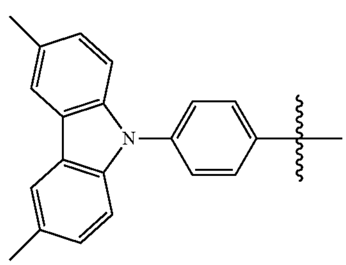 [SMILES: *c1ccc(-n2c3ccc(C)cc3c3cc(C)ccc32)cc1] | 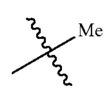 | 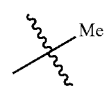 | 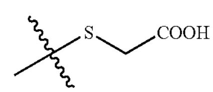 |
| 617 | 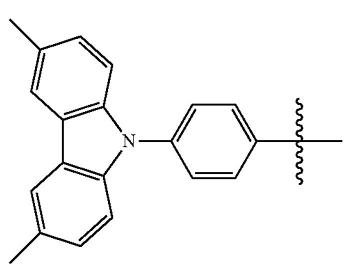 [SMILES: *c1ccc(-n2c3ccc(C)cc3c3cc(C)ccc32)cc1] | 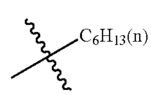 | H | 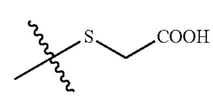 [SMILES: *SCC(=O)O] |

-continued
| Dye | 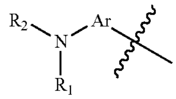 | R3 | R4 | 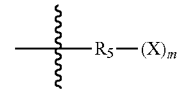 |
|---|---|---|---|---|
| 618 | 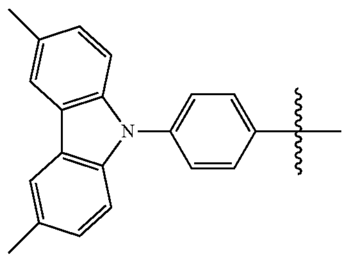 [SMILES: *c1ccc(-n2c3ccc(C)cc3c3cc(C)ccc32)cc1] | 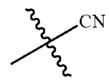 | H | 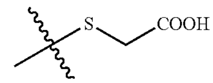 |
| 619 | 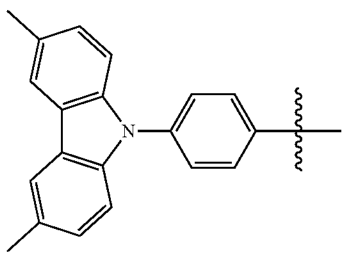 [SMILES: *c1ccc(-n2c3ccc(C)cc3c3cc(C)ccc32)cc1] | H | H | 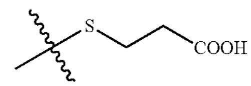 |
| 620 | 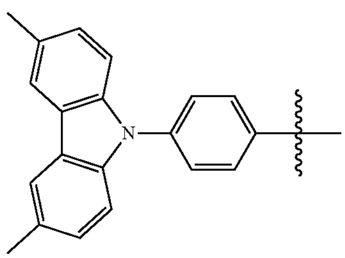 [SMILES: *c1ccc(-n2c3ccc(C)cc3c3cc(C)ccc32)cc1] | H | H | 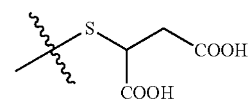 [SMILES: *SC(CC(=O)O)C(=O)O] |
| 621 | 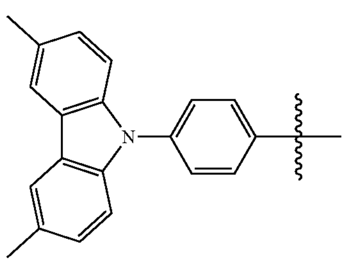 [SMILES: *c1ccc(-n2c3ccc(C)cc3c3cc(C)ccc32)cc1] | H | H | 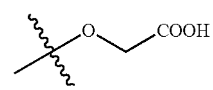 |
| 622 | 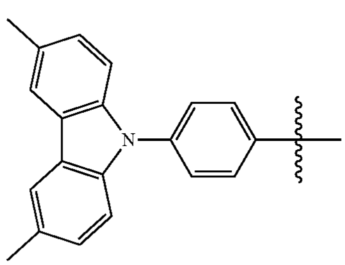 [SMILES: *c1ccc(-n2c3ccc(C)cc3c3cc(C)ccc32)cc1] | H | H | 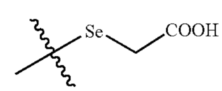 [SMILES: *[Se]CC(=O)O] |

-continued
| Dye | 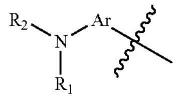 | $R_3$ | $R_4$ | 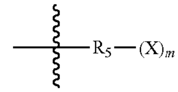 |
|---|---|---|---|---|
| 623 | 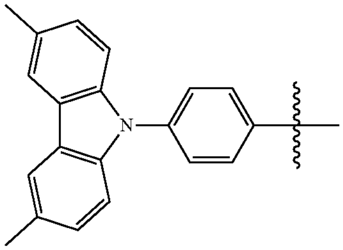 [SMILES: *c1ccc(-n2c3ccc(C)cc3c3cc(C)ccc32)cc1] | H | H | 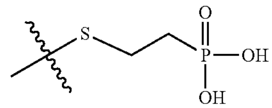 [SMILES: *SCCP(=O)(O)O] |
| 624 | 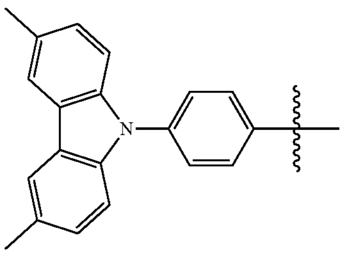 [SMILES: *c1ccc(-n2c3ccc(C)cc3c3cc(C)ccc32)cc1] | H | H | 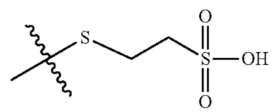 [SMILES: *SCCS(=O)(=O)O] |
| 625 | 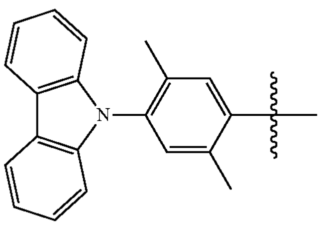 [SMILES: *c1cc(C)c(-n2c3ccccc3c3ccccc32)cc1C] | H | H | 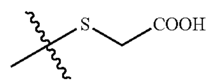 |
| 626 | 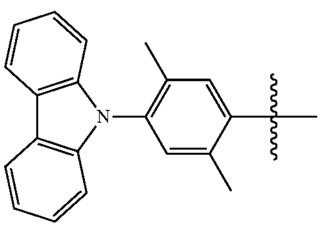 [SMILES: *c1cc(C)c(-n2c3ccccc3c3ccccc32)cc1C] | 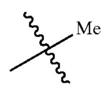 | H | 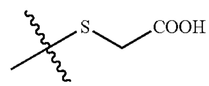 [SMILES: *SCC(=O)O] |
| 627 | 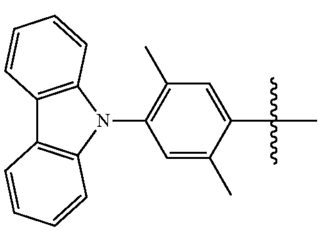 [SMILES: *c1cc(C)c(-n2c3ccccc3c3ccccc32)cc1C] | H | 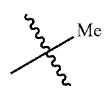 | 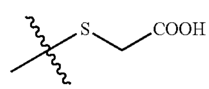 |
| 628 | 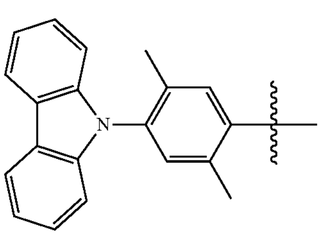 [SMILES: *c1cc(C)c(-n2c3ccccc3c3ccccc32)cc1C] | 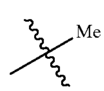 | 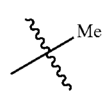 | 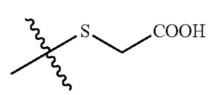 [SMILES: *SCC(=O)O] |

-continued
| Dye | 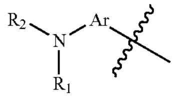 | R3 | R4 | 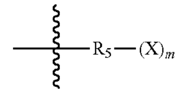 |
|---|---|---|---|---|
| 629 | 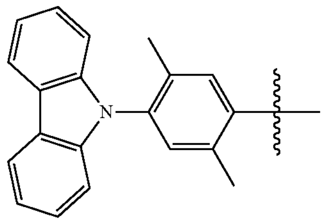 [SMILES: *c1cc(C)c(-n2c3ccccc3c3ccccc32)cc1C] | 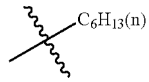 | H | 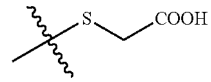 [SMILES: *SCC(=O)O] |
| 630 | 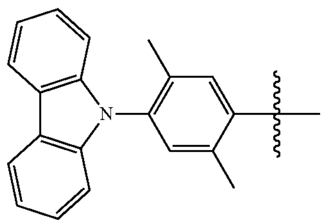 [SMILES: *c1cc(C)c(-n2c3ccccc3c3ccccc32)cc1C] | 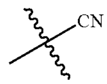 [SMILES: *C#N] | H | 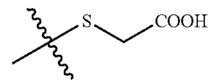 [SMILES: *SCC(=O)O] |
| 631 | 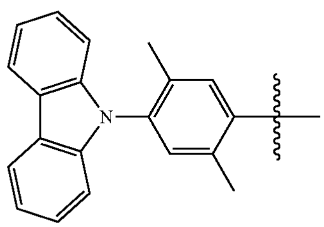 [SMILES: *c1cc(C)c(-n2c3ccccc3c3ccccc32)cc1C] | H | H | 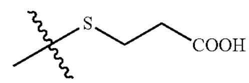 [SMILES: *SCCC(=O)O] |
| 632 | 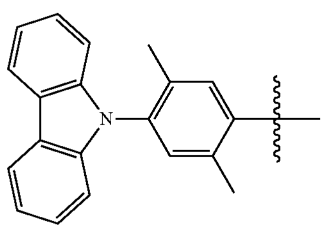 [SMILES: *c1cc(C)c(-n2c3ccccc3c3ccccc32)cc1C] | H | H | 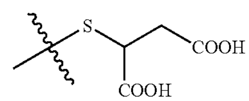 [SMILES: *SC(CC(=O)O)C(=O)O] |
| 633 | 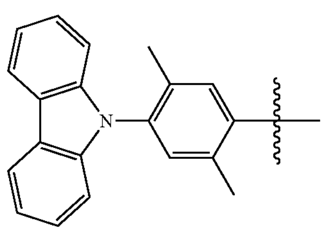 [SMILES: *c1cc(C)c(-n2c3ccccc3c3ccccc32)cc1C] | H | H | 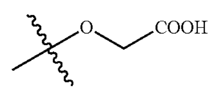 |
| 634 | 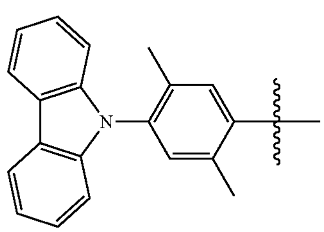 [SMILES: *c1cc(C)c(-n2c3ccccc3c3ccccc32)cc1C] | H | H | 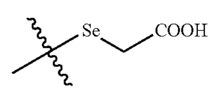 |

-continued
| Dye | 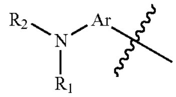 | $R_3$ | $R_4$ | 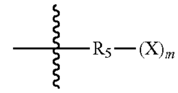 |
|---|---|---|---|---|
| 635 | 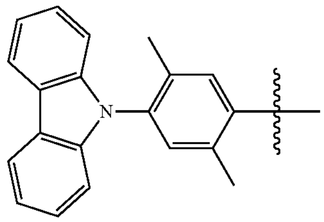 [SMILES: *c1cc(C)c(-n2c3ccccc3c3ccccc32)cc1C] | H | H | 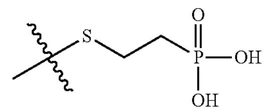 [SMILES: *SCCP(=O)(O)O] |
| 636 | 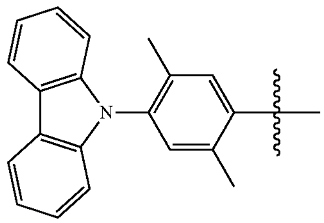 [SMILES: *c1cc(C)c(-n2c3ccccc3c3ccccc32)cc1C] | H | H | 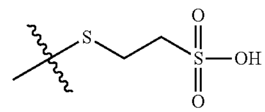 [SMILES: *SCCS(=O)(=O)O] |
| 637 | 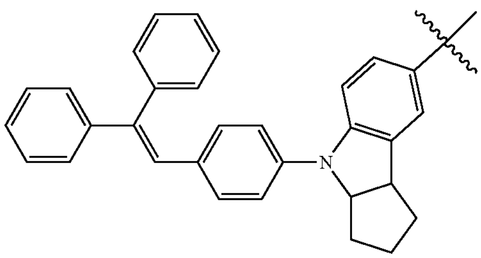 [SMILES: *c1ccc2c(c1)C1CCCC1N2c1ccc(C=C(c2ccccc2)c2ccccc2)cc1] | H | H | 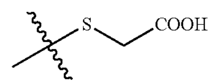 |
| 638 | 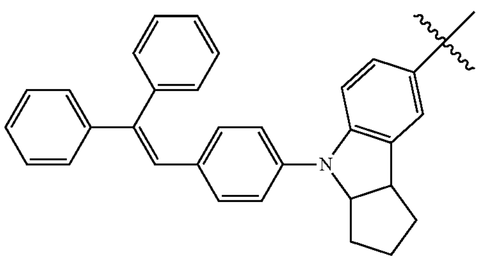 [SMILES: *c1ccc2c(c1)C1CCCC1N2c1ccc(C=C(c2ccccc2)c2ccccc2)cc1] | 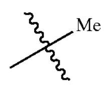 | H | 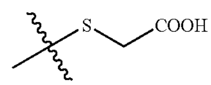 [SMILES: *SCC(=O)O] |
| 639 | 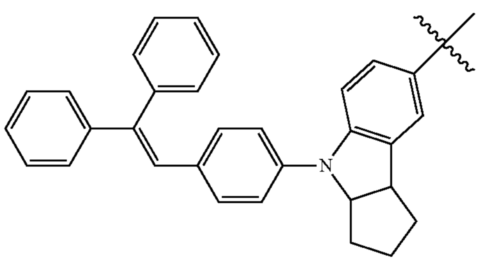 [SMILES: *c1ccc2c(c1)C1CCCC1N2c1ccc(C=C(c2ccccc2)c2ccccc2)cc1] | H | 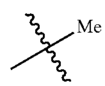 | 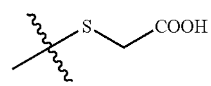 [SMILES: *SCC(=O)O] |
| 640 | 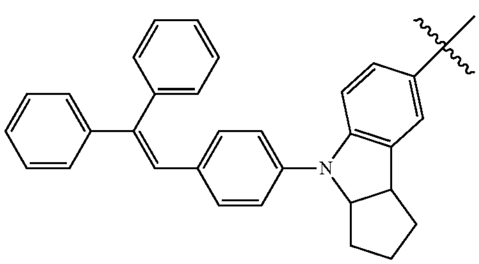 [SMILES: *c1ccc2c(c1)C1CCCC1N2c1ccc(C=C(c2ccccc2)c2ccccc2)cc1] | 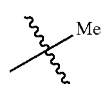 | 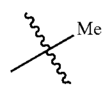 | 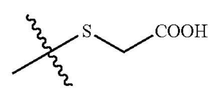 |

-continued
| Dye | 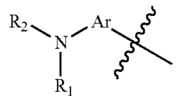 | $R_3$ | $R_4$ | 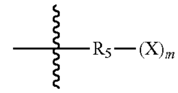 |
|---|---|---|---|---|
| 641 | 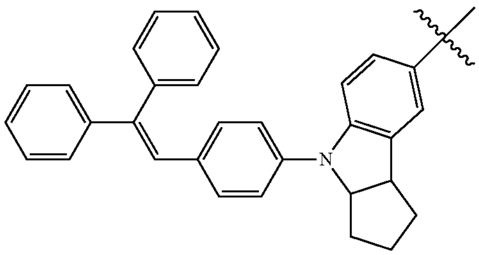 [SMILES: *c1ccc2c(c1)C1CCCC1N2c1ccc(C=C(c2ccccc2)c2ccccc2)cc1] | 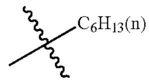 | H | 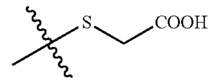 [SMILES: *SCC(=O)O] |
| 642 | 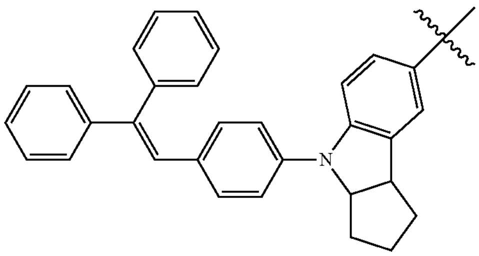 [SMILES: *c1ccc2c(c1)C1CCCC1N2c1ccc(C=C(c2ccccc2)c2ccccc2)cc1] | 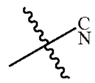 [SMILES: *C#N] | H | 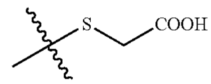 [SMILES: *SCC(=O)O] |
| 643 | 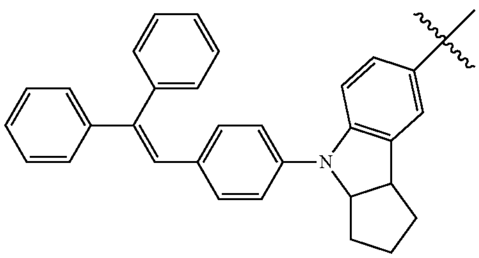 [SMILES: *c1ccc2c(c1)C1CCCC1N2c1ccc(C=C(c2ccccc2)c2ccccc2)cc1] | H | H | 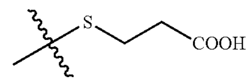 [SMILES: *SCCC(=O)O] |
| 644 | 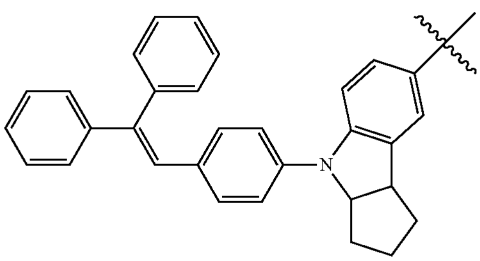 [SMILES: *c1ccc2c(c1)C1CCCC1N2c1ccc(C=C(c2ccccc2)c2ccccc2)cc1] | H | H | 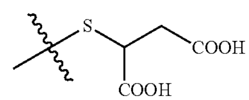 [SMILES: *SC(CC(=O)O)C(=O)O] |
| 645 | 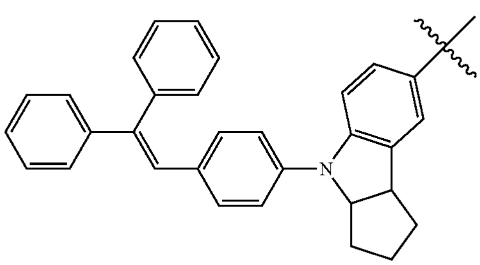 [SMILES: *c1ccc2c(c1)C1CCCC1N2c1ccc(C=C(c2ccccc2)c2ccccc2)cc1] | H | H | 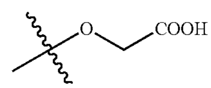 [SMILES: *OCC(=O)O] |

-continued
| Dye | 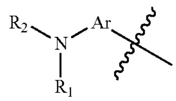 | $R_3$ | $R_4$ | 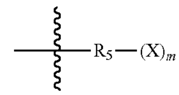 |
|---|---|---|---|---|
| 646 | 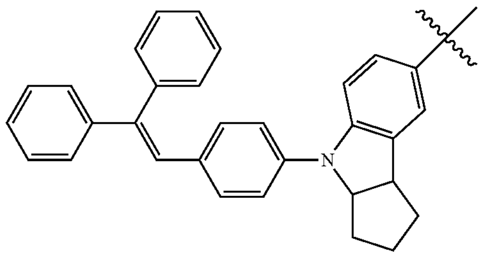 [SMILES: *c1ccc2c(c1)C1CCCC1N2c1ccc(C=C(c2ccccc2)c2ccccc2)cc1] | H | H | 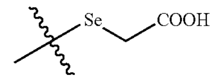 |
| 647 | 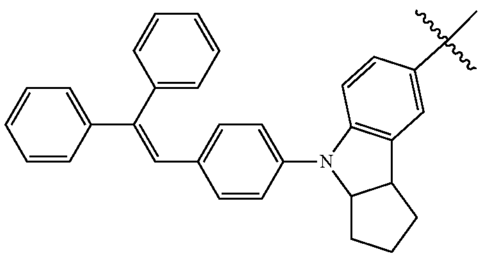 [SMILES: *c1ccc2c(c1)C1CCCC1N2c1ccc(C=C(c2ccccc2)c2ccccc2)cc1] | H | H | 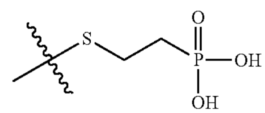 [SMILES: *SCCP(=O)(O)O] |
| 648 | 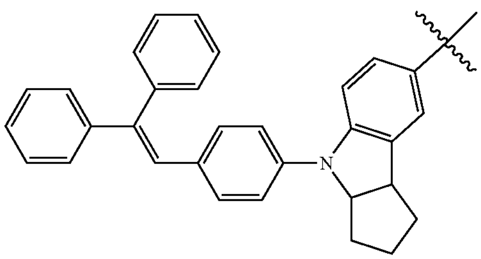 [SMILES: *c1ccc2c(c1)C1CCCC1N2c1ccc(C=C(c2ccccc2)c2ccccc2)cc1] | H | H | 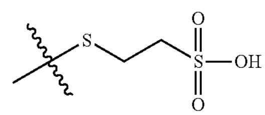 [SMILES: *SCCS(=O)(=O)O] |
| 649 | 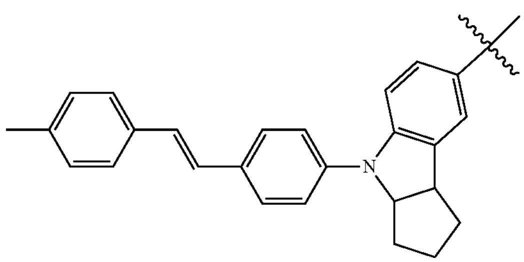 [SMILES: *c1ccc2c(c1)C1CCCC1N2c1ccc(/C=C/c2ccc(C)cc2)cc1] | H | H | 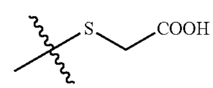 |
| 650 | 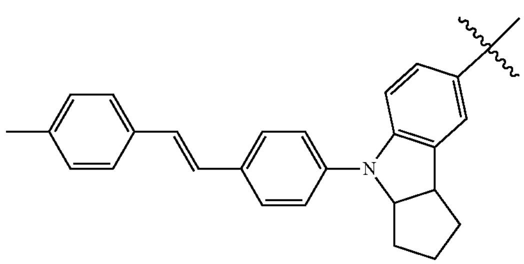 [SMILES: *c1ccc2c(c1)C1CCCC1N2c1ccc(/C=C/c2ccc(C)cc2)cc1] | 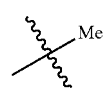 | H | 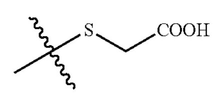 |

-continued
| Dye | 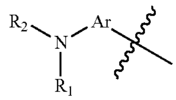 | R3 | R4 | 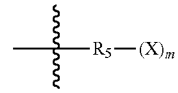 |
|---|---|---|---|---|
| 651 | 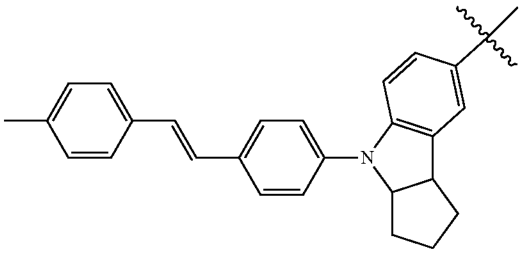 [SMILES: *c1ccc2c(c1)C1CCCC1N2c1ccc(/C=C/c2ccc(C)cc2)cc1] | H | 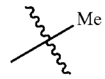 | 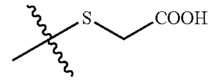 |
| 652 | 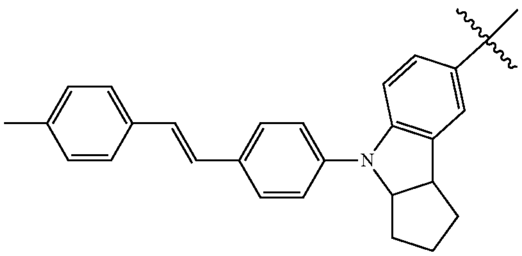 [SMILES: *c1ccc2c(c1)C1CCCC1N2c1ccc(/C=C/c2ccc(C)cc2)cc1] | 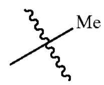 |  | 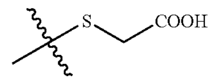 [SMILES: *SCC(=O)O] |
| 653 | 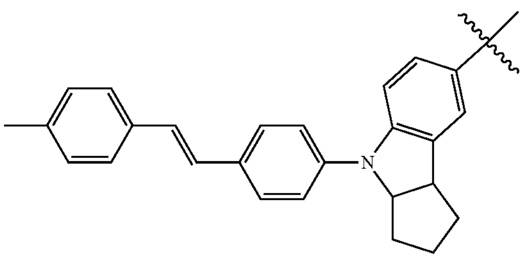 [SMILES: *c1ccc2c(c1)C1CCCC1N2c1ccc(/C=C/c2ccc(C)cc2)cc1] | 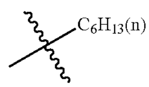 | H | 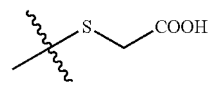 |
| 654 | 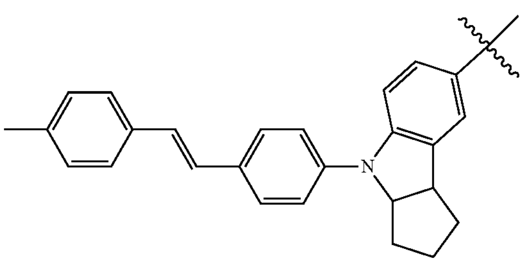 [SMILES: *c1ccc2c(c1)C1CCCC1N2c1ccc(/C=C/c2ccc(C)cc2)cc1] | 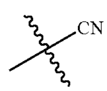 | H | 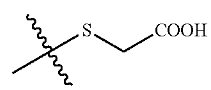 [SMILES: *SCC(=O)O] |
| 655 | 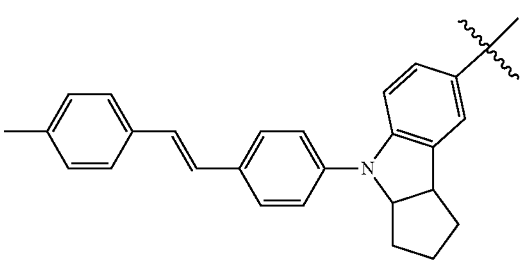 [SMILES: *c1ccc2c(c1)C1CCCC1N2c1ccc(/C=C/c2ccc(C)cc2)cc1] | H | H | 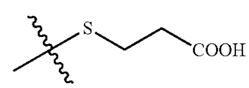 [SMILES: *SCCC(=O)O] |

-continued
| Dye | 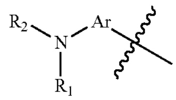 | $R_3$ | $R_4$ | 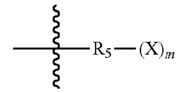 |
|---|---|---|---|---|
| 656 | 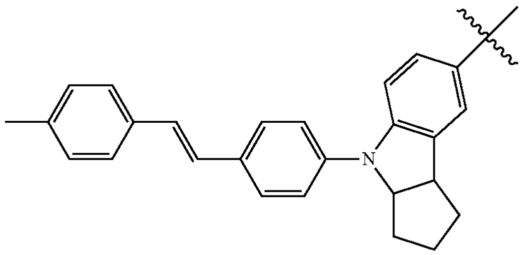 [SMILES: *c1ccc2c(c1)C1CCCC1N2c1ccc(/C=C/c2ccc(C)cc2)cc1] | H | H | 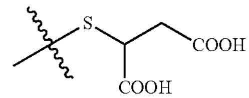 |
| 657 | 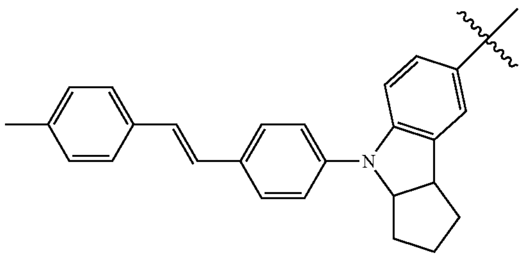 [SMILES: *c1ccc2c(c1)C1CCCC1N2c1ccc(/C=C/c2ccc(C)cc2)cc1] | H | H | 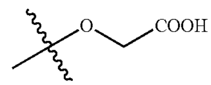 |
| 658 | 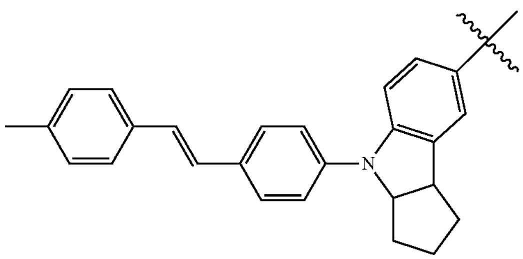 [SMILES: *c1ccc2c(c1)C1CCCC1N2c1ccc(/C=C/c2ccc(C)cc2)cc1] | H | H | 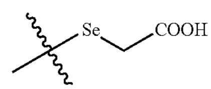 |
| 659 | 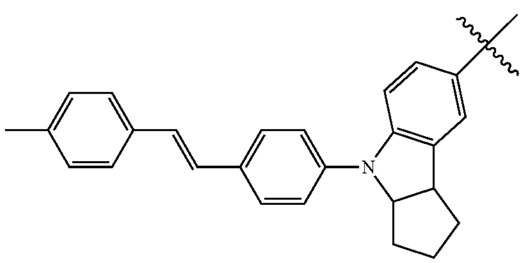 [SMILES: *c1ccc2c(c1)C1CCCC1N2c1ccc(/C=C/c2ccc(C)cc2)cc1] | H | H | 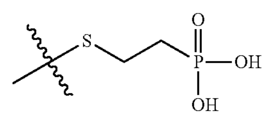 [SMILES: *SCCP(=O)(O)O] |
| 660 | 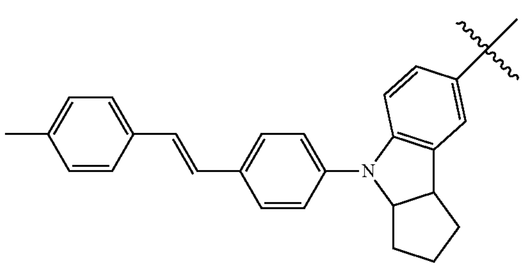 [SMILES: *c1ccc2c(c1)C1CCCC1N2c1ccc(/C=C/c2ccc(C)cc2)cc1] | H | H | 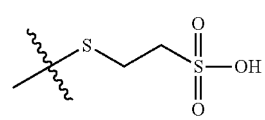 [SMILES: *SCCS(=O)(=O)O] |

-continued
| Dye | 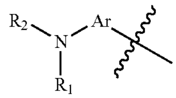 | $R_3$ | $R_4$ | 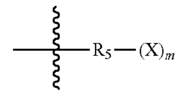 |
|---|---|---|---|---|
| 661 | 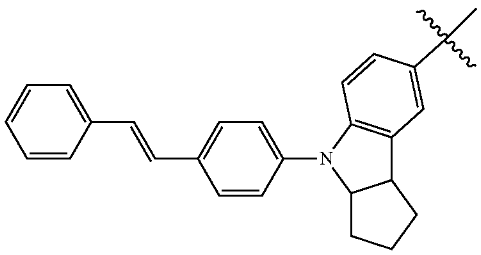 [SMILES: *c1ccc2c(c1)C1CCCC1N2c1ccc(/C=C/c2ccccc2)cc1] | H | H | 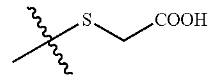 |
| 662 | 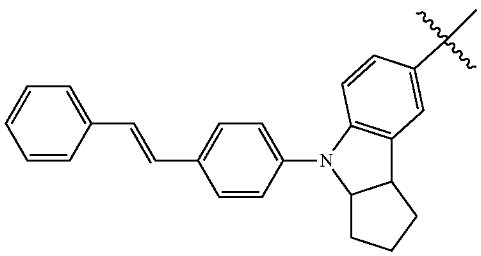 [SMILES: *c1ccc2c(c1)C1CCCC1N2c1ccc(/C=C/c2ccccc2)cc1] | 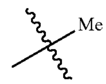 | H | 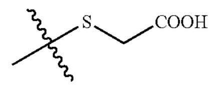 |
| 663 | 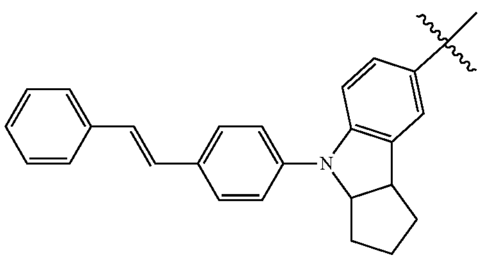 [SMILES: *c1ccc2c(c1)C1CCCC1N2c1ccc(/C=C/c2ccccc2)cc1] | H | 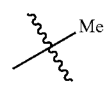 | 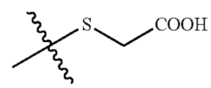 [SMILES: *SCC(=O)O] |
| 664 | 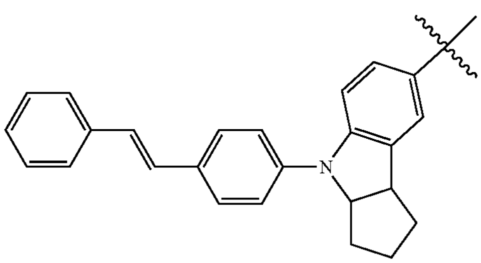 [SMILES: *c1ccc2c(c1)C1CCCC1N2c1ccc(/C=C/c2ccccc2)cc1] | 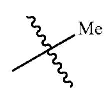 | 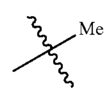 | 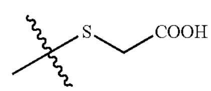 [SMILES: *SCC(=O)O] |
| 665 | 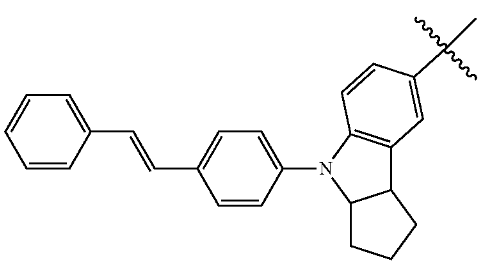 [SMILES: *c1ccc2c(c1)C1CCCC1N2c1ccc(/C=C/c2ccccc2)cc1] | 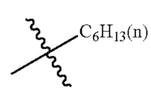 | H | 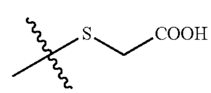 [SMILES: *SCC(=O)O] |

-continued
| Dye | 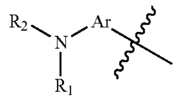 | $R_3$ | $R_4$ | 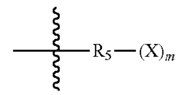 |
|---|---|---|---|---|
| 666 | 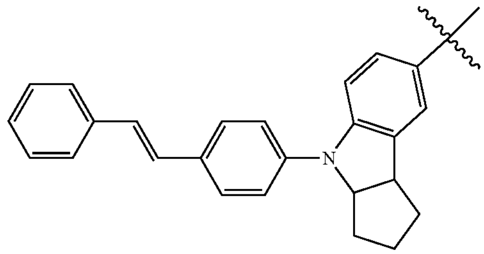 [SMILES: *c1ccc2c(c1)C1CCCC1N2c1ccc(/C=C/c2ccccc2)cc1] | 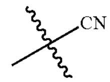 | H | 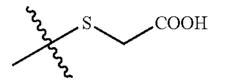 |
| 667 | 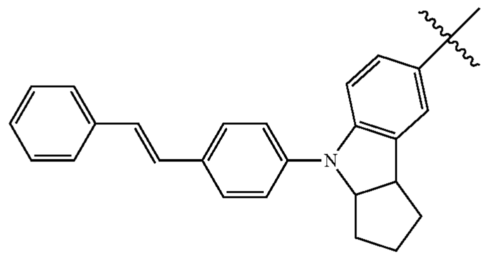 [SMILES: *c1ccc2c(c1)C1CCCC1N2c1ccc(/C=C/c2ccccc2)cc1] | H | H | 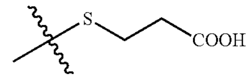 [SMILES: *SCCC(=O)O] |
| 668 | 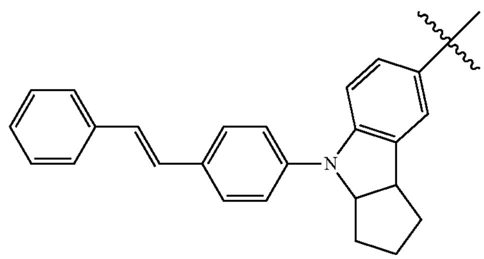 [SMILES: *c1ccc2c(c1)C1CCCC1N2c1ccc(/C=C/c2ccccc2)cc1] | H | H | 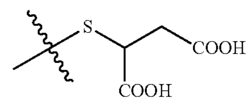 [SMILES: *SC(CC(=O)O)C(=O)O] |
| 669 | 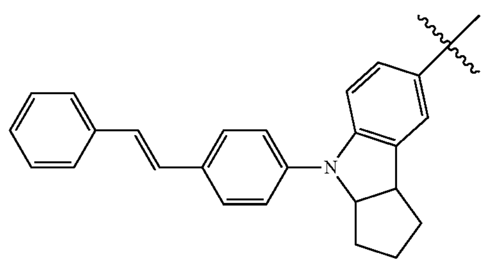 [SMILES: *c1ccc2c(c1)C1CCCC1N2c1ccc(/C=C/c2ccccc2)cc1] | H | H | 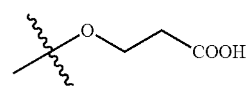 [SMILES: *OCCC(=O)O] |
| 670 | 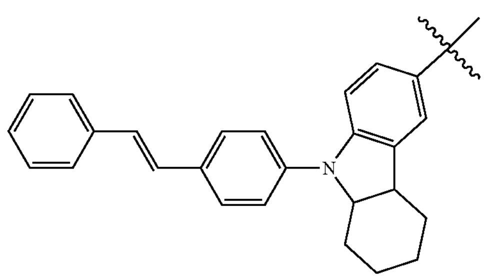 [SMILES: *c1ccc2c(c1)C1CCCCC1N2c1ccc(/C=C/c2ccccc2)cc1] | H | H | 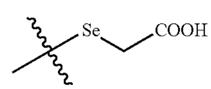 |

-continued
| Dye | 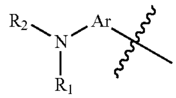 | $R_3$ | $R_4$ | 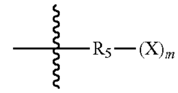 |
|---|---|---|---|---|
| 671 | 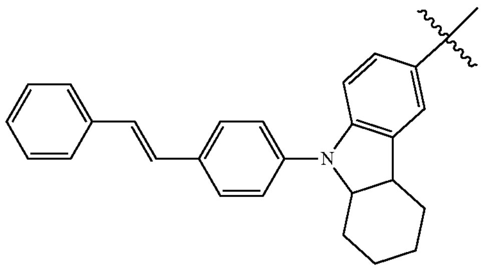 [SMILES: *c1ccc2c(c1)C1CCCCC1N2c1ccc(/C=C/c2ccccc2)cc1] | H | H | 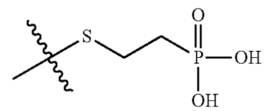 [SMILES: *SCCP(=O)(O)O] |
| 672 | 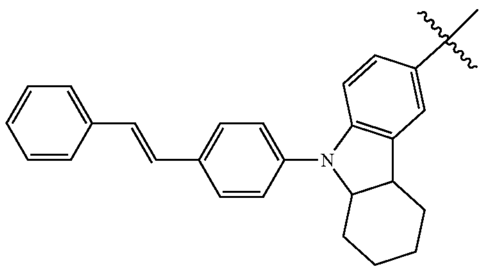 [SMILES: *c1ccc2c(c1)C1CCCCC1N2c1ccc(/C=C/c2ccccc2)cc1] | H | H | 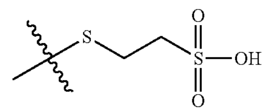 [SMILES: *SCCS(=O)(=O)O] |
| 673 | 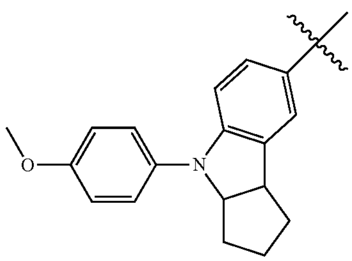 [SMILES: *c1ccc2c(c1)C1CCCC1N2c1ccc(OC)cc1] | H | H | 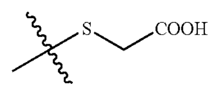 |
| 674 | 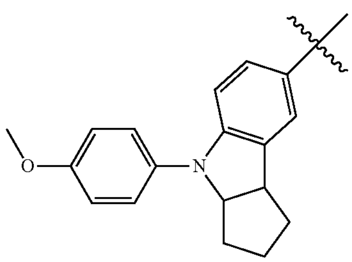 [SMILES: *c1ccc2c(c1)C1CCCC1N2c1ccc(OC)cc1] | 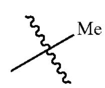 | H | 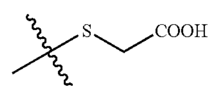 [SMILES: *SCC(=O)O] |
| 675 | 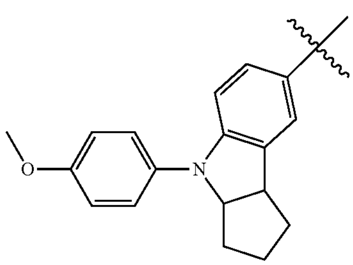 [SMILES: *c1ccc2c(c1)C1CCCC1N2c1ccc(OC)cc1] | H | 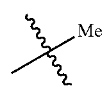 | 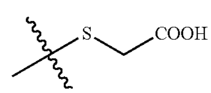 |

-continued
| Dye | 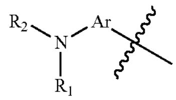 | $R_3$ | $R_4$ | 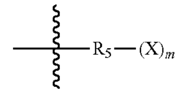 |
|---|---|---|---|---|
| 676 | 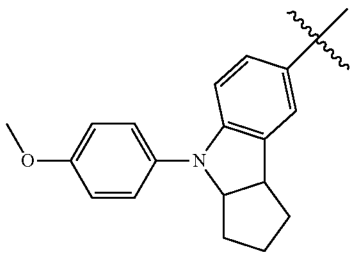 [SMILES: *c1ccc2c(c1)C1CCCC1N2c1ccc(OC)cc1] | 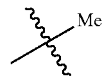 | 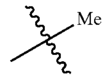 | 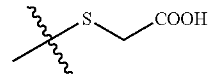 |
| 677 | 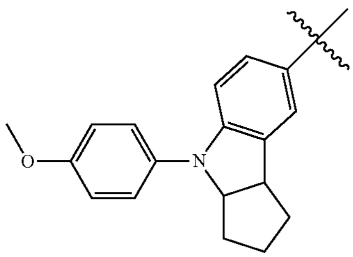 [SMILES: *c1ccc2c(c1)C1CCCC1N2c1ccc(OC)cc1] | 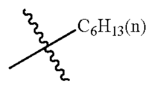 | H | 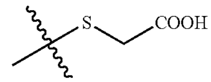 |
| 678 | 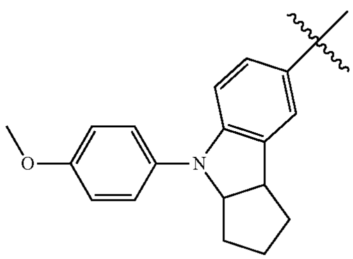 [SMILES: *c1ccc2c(c1)C1CCCC1N2c1ccc(OC)cc1] | 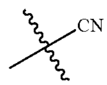 | H | 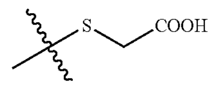 |
| 679 | 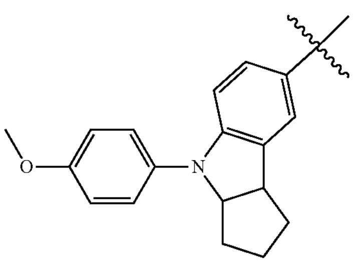 [SMILES: *c1ccc2c(c1)C1CCCC1N2c1ccc(OC)cc1] | H | H | 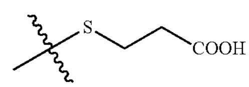 [SMILES: *SCCC(=O)O] |
| 680 | 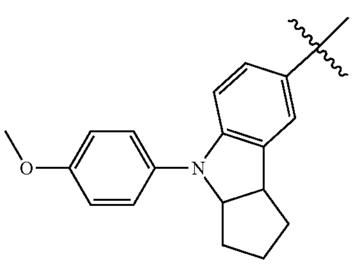 [SMILES: *c1ccc2c(c1)C1CCCC1N2c1ccc(OC)cc1] | H | H | 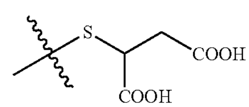 [SMILES: *SC(CC(=O)O)C(=O)O] |

-continued
| Dye | 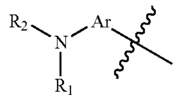 | $R_3$ | $R_4$ | 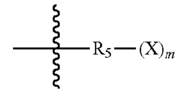 |
|---|---|---|---|---|
| 681 | 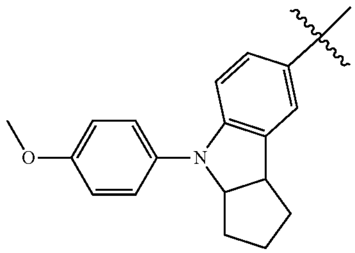 [SMILES: *c1ccc2c(c1)C1CCCC1N2c1ccc(OC)cc1] | H | H | 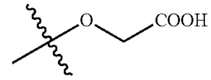 [SMILES: *OCC(=O)O] |
| 682 | 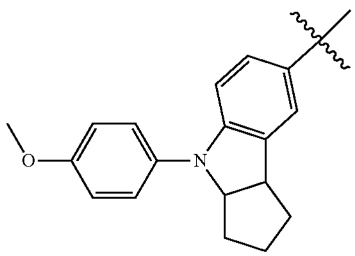 [SMILES: *c1ccc2c(c1)C1CCCC1N2c1ccc(OC)cc1] | H | H | 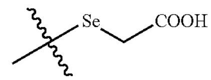 |
| 683 | 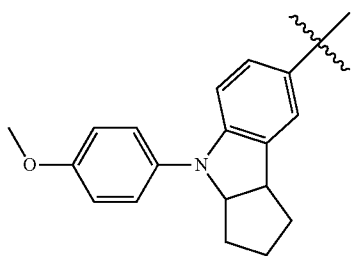 [SMILES: *c1ccc2c(c1)C1CCCC1N2c1ccc(OC)cc1] | H | H | 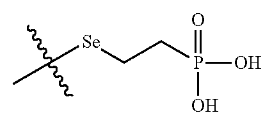 |
| 684 | 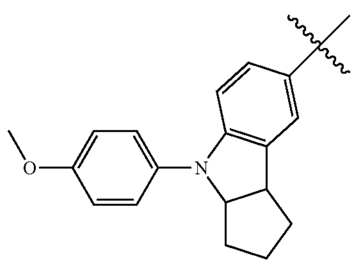 [SMILES: *c1ccc2c(c1)C1CCCC1N2c1ccc(OC)cc1] | H | H | 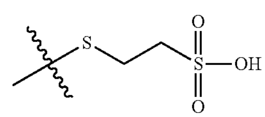 [SMILES: *SCCS(=O)(=O)O] |
| 685 | 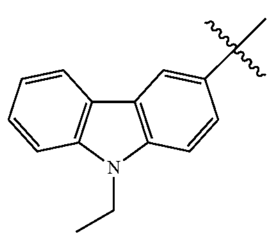 [SMILES: *c1ccc2c(c1)c1ccccc1n2CC] | H | H | 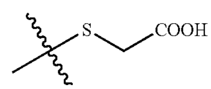 |
| 686 | 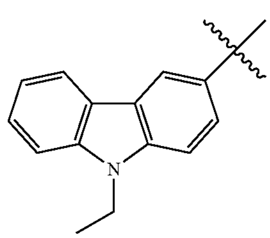 [SMILES: *c1ccc2c(c1)c1ccccc1n2CC] | 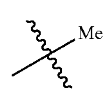 | H | 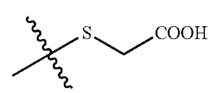 [SMILES: *SCC(=O)O] |

-continued
| Dye | 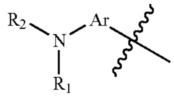  | $R_3$ | $R_4$ | 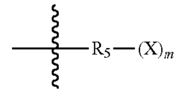  |
|---|---|---|---|---|
| 687 | 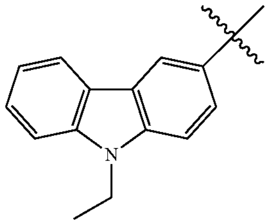 [SMILES: *c1ccc2c(c1)c1ccccc1n2CC]  | H |   | 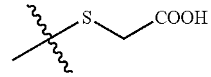 [SMILES: *SCC(=O)O]  |
| 688 | 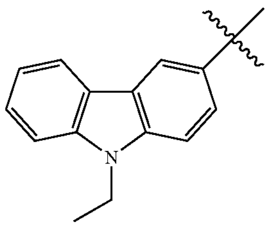 [SMILES: *c1ccc2c(c1)c1ccccc1n2CC]  | 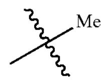  | 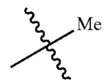  | 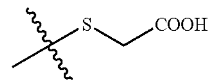  |
| 689 | 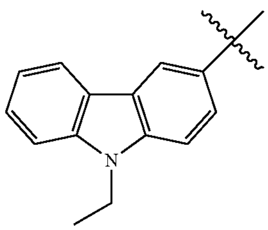 [SMILES: *c1ccc2c(c1)c1ccccc1n2CC]  | 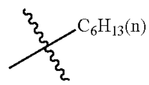  | H | 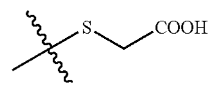  |
| 690 | 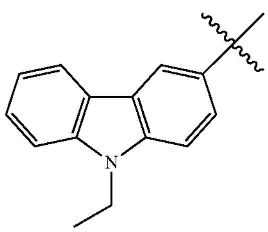 [SMILES: *c1ccc2c(c1)c1ccccc1n2CC]  | 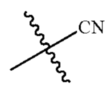 [SMILES: *C#N]  | H | 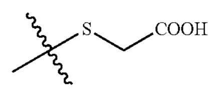  |
| 691 | 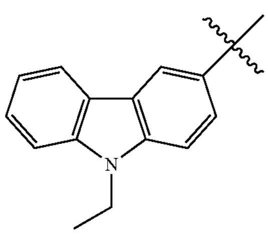 [SMILES: *c1ccc2c(c1)c1ccccc1n2CC]  | H | H | 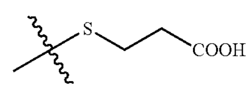 [SMILES: *SCCC(=O)O]  |
| 692 | 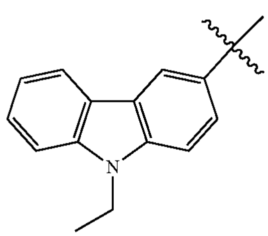 [SMILES: *c1ccc2c(c1)c1ccccc1n2CC]  | H | H | 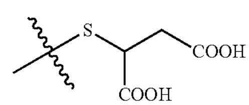 [SMILES: *SC(CC(=O)O)C(=O)O]  |

-continued
| Dye | 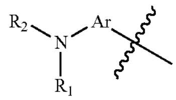 | $R_3$ | $R_4$ | 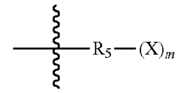 |
|---|---|---|---|---|
| 693 | 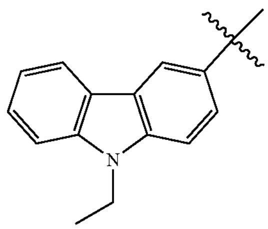 [SMILES: *c1ccc2c(c1)c1ccccc1n2CC] | H | H | 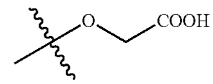 |
| 694 | 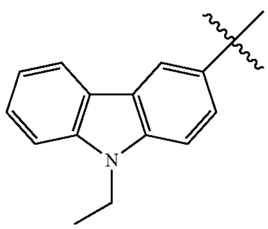 [SMILES: *c1ccc2c(c1)c1ccccc1n2CC] | H | H | 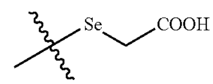 [SMILES: *[Se]CC(=O)O] |
| 695 | 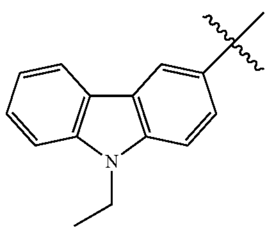 [SMILES: *c1ccc2c(c1)c1ccccc1n2CC] | H | H | 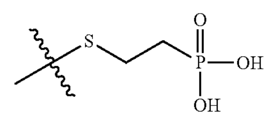 [SMILES: *SCCP(=O)(O)O] |
| 696 | 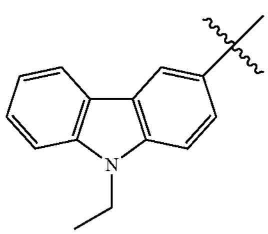 [SMILES: *c1ccc2c(c1)c1ccccc1n2CC] | H | H | 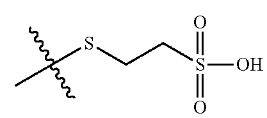 [SMILES: *SCCS(=O)(=O)O] |
| 697 | 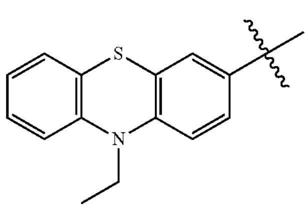 [SMILES: *c1ccc2c(c1)Sc1ccccc1N2CC] | H | H | 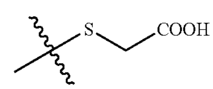 |
| 698 | 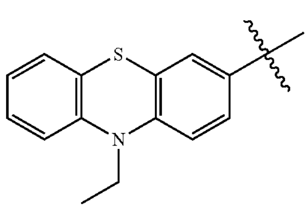 [SMILES: *c1ccc2c(c1)Sc1ccccc1N2CC] | 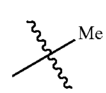 | H | 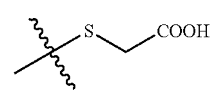 [SMILES: *SCC(=O)O] |

-continued
| Dye | 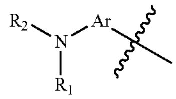 | $R_3$ | $R_4$ | 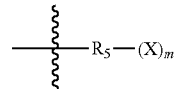 |
|---|---|---|---|---|
| 699 | 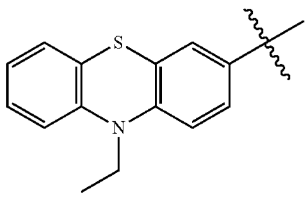 [SMILES: *c1ccc2c(c1)Sc1ccccc1N2CC] | H | 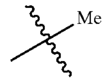 | 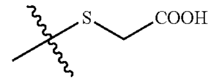 [SMILES: *SCC(=O)O] |
| 700 | 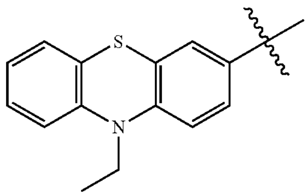 [SMILES: *c1ccc2c(c1)Sc1ccccc1N2CC] | 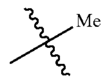 |  | 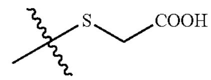 |
| 701 | 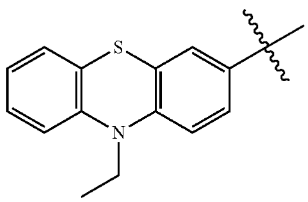 [SMILES: *c1ccc2c(c1)Sc1ccccc1N2CC] | 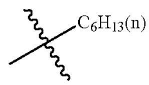 | H | 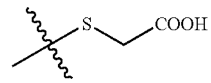 |
| 702 | 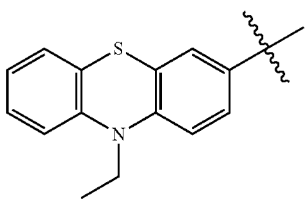 [SMILES: *c1ccc2c(c1)Sc1ccccc1N2CC] | 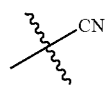 [SMILES: *C#N] | H | 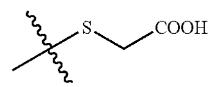 |
| 703 | 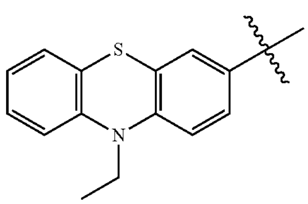 [SMILES: *c1ccc2c(c1)Sc1ccccc1N2CC] | H | H | 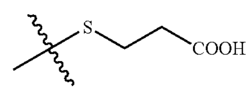 [SMILES: *SCCC(=O)O] |
| 704 | 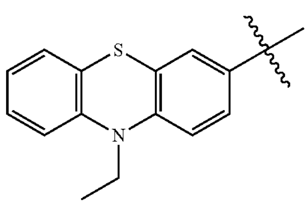 [SMILES: *c1ccc2c(c1)Sc1ccccc1N2CC] | H | H | 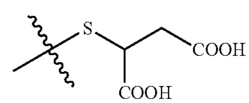 [SMILES: *SC(CC(=O)O)C(=O)O] |
| 705 | 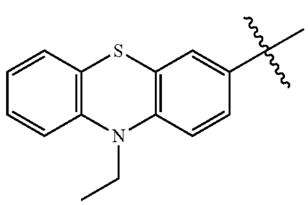 [SMILES: *c1ccc2c(c1)Sc1ccccc1N2CC] | H | H | 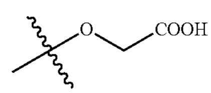 [SMILES: *OCC(=O)O] |

-continued
| Dye | 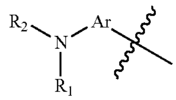 | $R_3$ | $R_4$ | 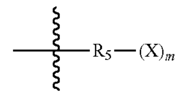 |
|---|---|---|---|---|
| 706 | 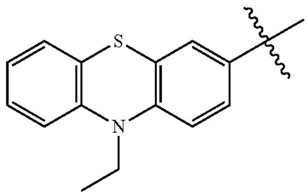 [SMILES: *c1ccc2c(c1)Sc1ccccc1N2CC] | H | H | 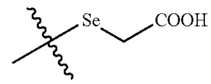 |
| 707 | 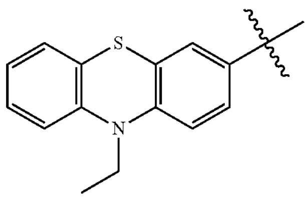 [SMILES: *c1ccc2c(c1)Sc1ccccc1N2CC] | H | H | 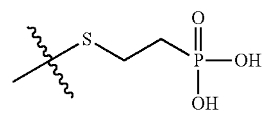 [SMILES: *SCCP(=O)(O)O] |
| 708 | 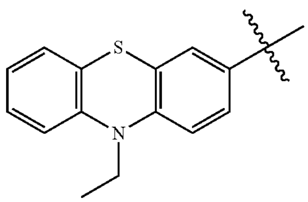 [SMILES: *c1ccc2c(c1)Sc1ccccc1N2CC] | H | H | 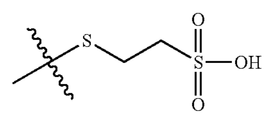 [SMILES: *SCCS(=O)(=O)O] |
| 709 | 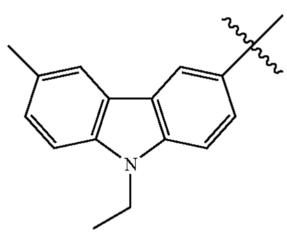 [SMILES: *c1ccc2c(c1)c1cc(C)ccc1n2CC] | H | H | 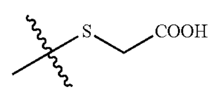 [SMILES: *SCC(=O)O] |
| 710 | 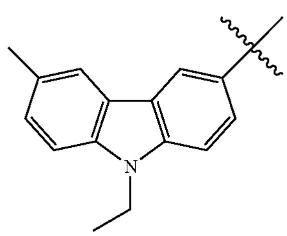 [SMILES: *c1ccc2c(c1)c1cc(C)ccc1n2CC] | 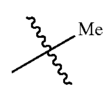 | H | 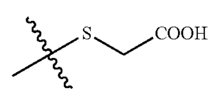 |
| 711 | 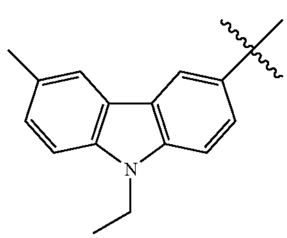 [SMILES: *c1ccc2c(c1)c1cc(C)ccc1n2CC] | H | 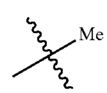 | 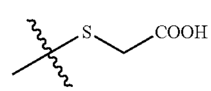 [SMILES: *SCC(=O)O] |

-continued
| Dye | 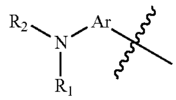 | $R_3$ | $R_4$ | 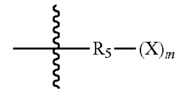 |
|---|---|---|---|---|
| 712 | 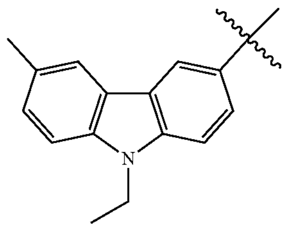 [SMILES: *c1ccc2c(c1)c1cc(C)ccc1n2CC] |  |  | 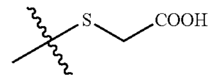 |
| 713 | 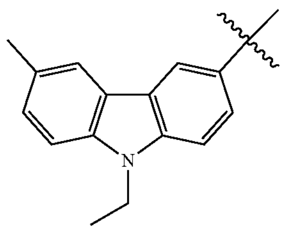 [SMILES: *c1ccc2c(c1)c1cc(C)ccc1n2CC] | 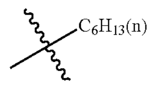 | H | 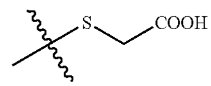 |
| 714 | 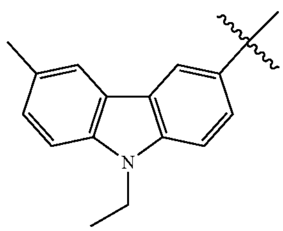 [SMILES: *c1ccc2c(c1)c1cc(C)ccc1n2CC] | 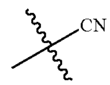 [SMILES: *C#N] | H | 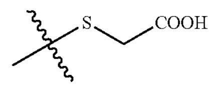 |
| 715 | 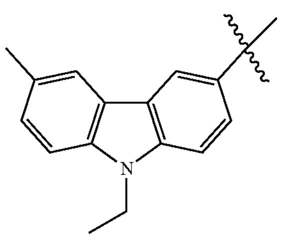 [SMILES: *c1ccc2c(c1)c1cc(C)ccc1n2CC] | H | H | 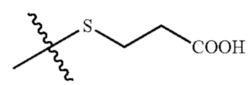 [SMILES: *SCCC(=O)O] |
| 716 | 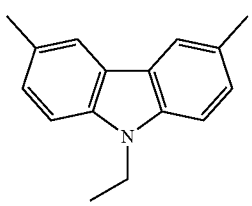 | H | H | 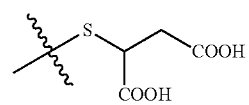 [SMILES: *SC(CC(=O)O)C(=O)O] |
| 717 | 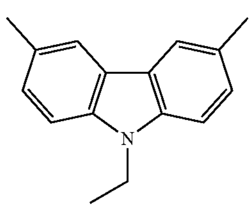 | H | H | 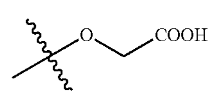 [SMILES: *OCC(=O)O] |

-continued
| Dye | 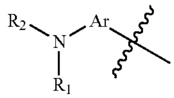 | $R_3$ | $R_4$ | 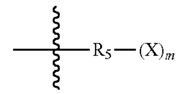 |
|---|---|---|---|---|
| 718 | 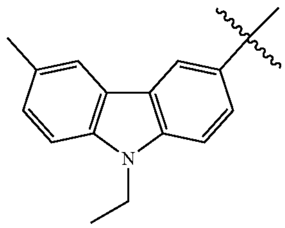 [SMILES: *c1ccc2c(c1)c1cc(C)ccc1n2CC] | H | H | 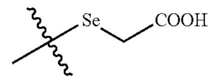 |
| 719 | 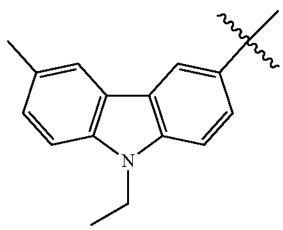 [SMILES: *c1ccc2c(c1)c1cc(C)ccc1n2CC] | H | H | 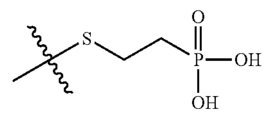 [SMILES: *SCCP(=O)(O)O] |
| 720 | 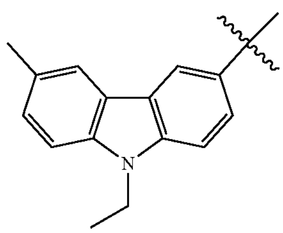 [SMILES: *c1ccc2c(c1)c1cc(C)ccc1n2CC] | H | H | 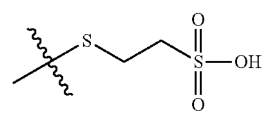 [SMILES: *SCCS(=O)(=O)O] |
| 721 | 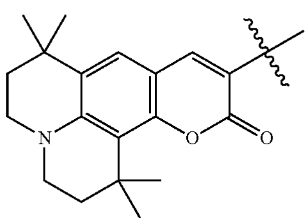 [SMILES: *c1cc2cc3c4c(c2oc1=O)C(C)(C)CCN4CCC3(C)C] | H | H | 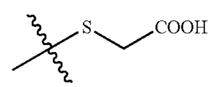 |
| 722 | 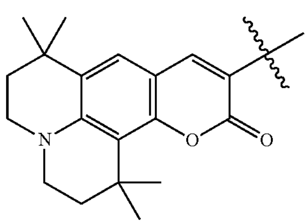 [SMILES: *c1cc2cc3c4c(c2oc1=O)C(C)(C)CCN4CCC3(C)C] | 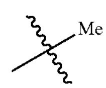 | H | 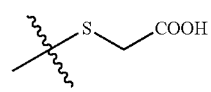 |
| 723 | 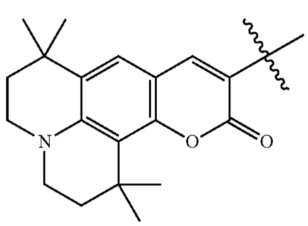 [SMILES: *c1cc2cc3c4c(c2oc1=O)C(C)(C)CCN4CCC3(C)C] | H | 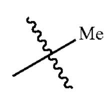 | 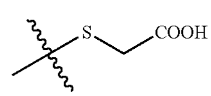 |

-continued
| Dye | 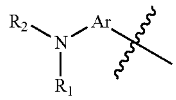 | $R_3$ | $R_4$ | 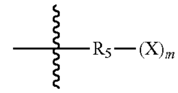 |
|---|---|---|---|---|
| 724 | 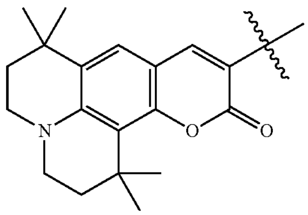 [SMILES: *c1cc2cc3c4c(c2oc1=O)C(C)(C)CCN4CCC3(C)C] | Me | Me | 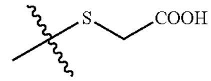 [SMILES: *SCC(=O)O] |
| 725 | 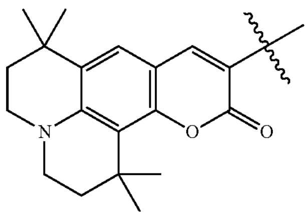 [SMILES: *c1cc2cc3c4c(c2oc1=O)C(C)(C)CCN4CCC3(C)C] | $C_6H_{13}$(n) | H | 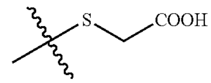 [SMILES: *SCC(=O)O] |
| 726 | 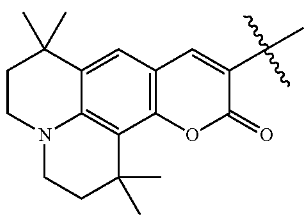 [SMILES: *c1cc2cc3c4c(c2oc1=O)C(C)(C)CCN4CCC3(C)C] | CN | H | 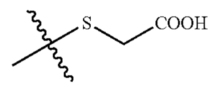 [SMILES: *SCC(=O)O] |
| 727 | 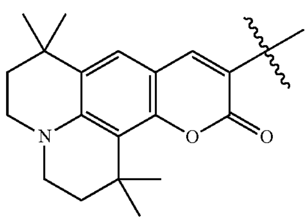 [SMILES: *c1cc2cc3c4c(c2oc1=O)C(C)(C)CCN4CCC3(C)C] | H | H | 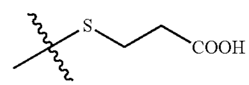 [SMILES: *SCCC(=O)O] |
| 728 | 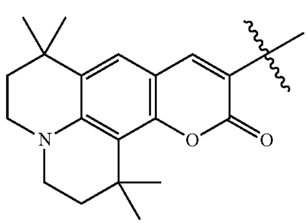 [SMILES: *c1cc2cc3c4c(c2oc1=O)C(C)(C)CCN4CCC3(C)C] | H | H | 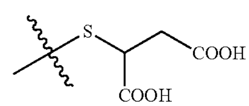 [SMILES: *SC(CC(=O)O)C(=O)O] |
| 729 | 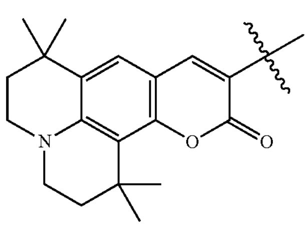 [SMILES: *c1cc2cc3c4c(c2oc1=O)C(C)(C)CCN4CCC3(C)C] | H | H | 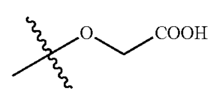 [SMILES: *OCC(=O)O] |

-continued
| Dye | 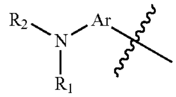 | $R_3$ | $R_4$ | 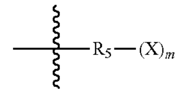 |
|---|---|---|---|---|
| 730 | 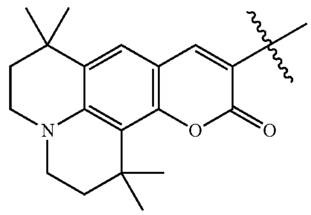 [SMILES: *c1cc2cc3c4c(c2oc1=O)C(C)(C)CCN4CCC3(C)C] | H | H | 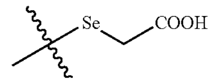 |
| 731 | 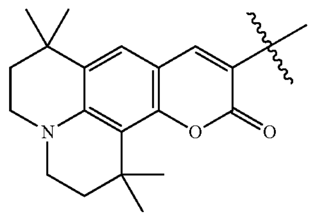 [SMILES: *c1cc2cc3c4c(c2oc1=O)C(C)(C)CCN4CCC3(C)C] | H | H | 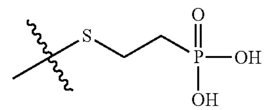 [SMILES: *SCCP(=O)(O)O] |
| 732 | 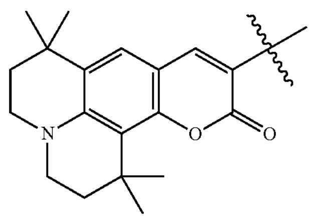 [SMILES: *c1cc2cc3c4c(c2oc1=O)C(C)(C)CCN4CCC3(C)C] | H | H | 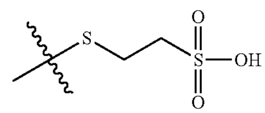 [SMILES: *SCCS(=O)(=O)O] |
| 733 | 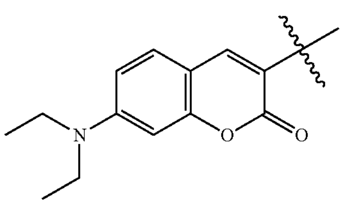 [SMILES: *c1cc2ccc(N(CC)CC)cc2oc1=O] | H | H | 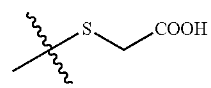 |
| 734 | 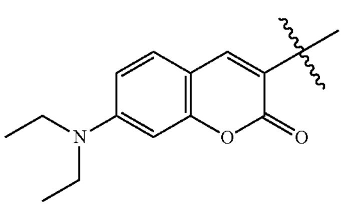 [SMILES: *c1cc2ccc(N(CC)CC)cc2oc1=O] | 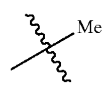 | H | 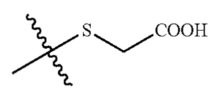 |
| 735 | 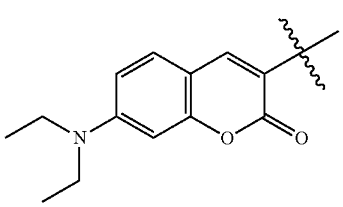 [SMILES: *c1cc2ccc(N(CC)CC)cc2oc1=O] | H | 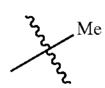 | 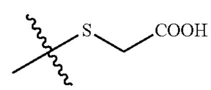 [SMILES: *SCC(=O)O] |
| 736 | 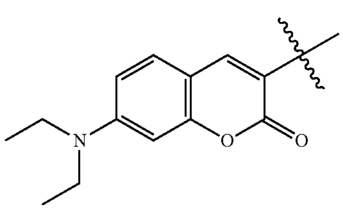 [SMILES: *c1cc2ccc(N(CC)CC)cc2oc1=O] | 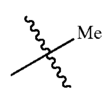 | 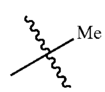 | 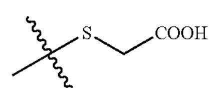 |

-continued
| Dye | 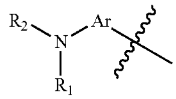 | $R_3$ | $R_4$ | 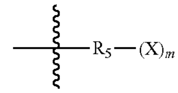 |
|---|---|---|---|---|
| 737 | 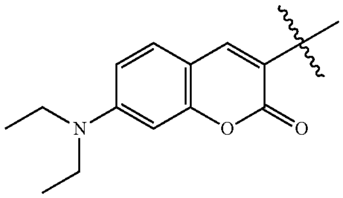 [SMILES: *c1cc2ccc(N(CC)CC)cc2oc1=O] | 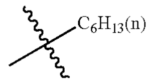 | H | 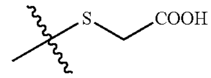 [SMILES: *SCC(=O)O] |
| 738 | 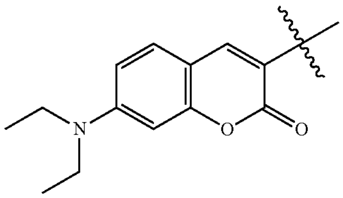 [SMILES: *c1cc2ccc(N(CC)CC)cc2oc1=O] | 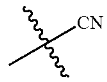 | H | 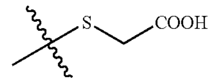 |
| 739 | 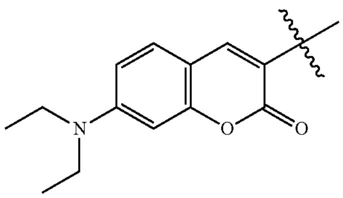 [SMILES: *c1cc2ccc(N(CC)CC)cc2oc1=O] | H | H | 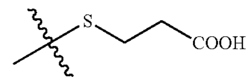 [SMILES: *SCCC(=O)O] |
| 740 | 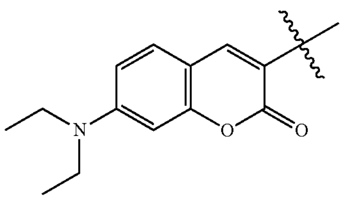 [SMILES: *c1cc2ccc(N(CC)CC)cc2oc1=O] | H | H | 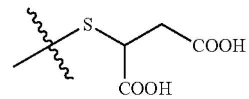 [SMILES: *SC(CC(=O)O)C(=O)O] |
| 741 | 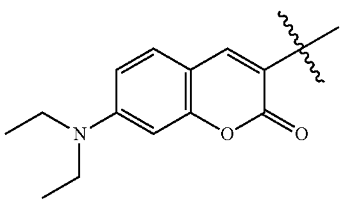 [SMILES: *c1cc2ccc(N(CC)CC)cc2oc1=O] | H | H | 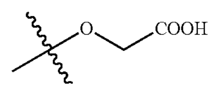 |
| 742 | 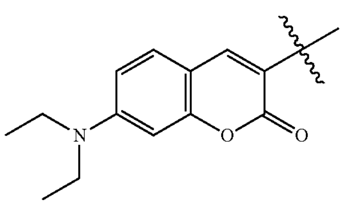 [SMILES: *c1cc2ccc(N(CC)CC)cc2oc1=O] | H | H | 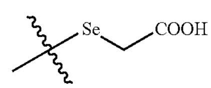 |
| 743 | 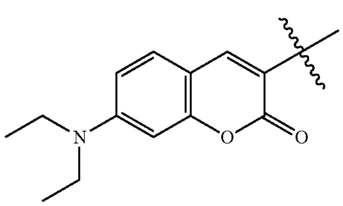 [SMILES: *c1cc2ccc(N(CC)CC)cc2oc1=O] | H | H | 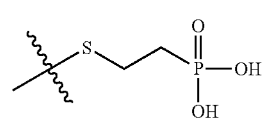 [SMILES: *SCCP(=O)(O)O] |

-continued
| Dye | 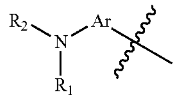 | $R_3$ | $R_4$ | 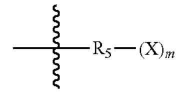 |
|---|---|---|---|---|
| 744 | 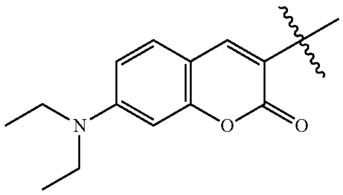 [SMILES: *c1cc2ccc(N(CC)CC)cc2oc1=O] | H | H | 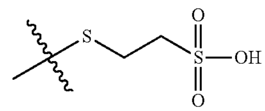 [SMILES: *SCCS(=O)(=O)O] |
| 745 | 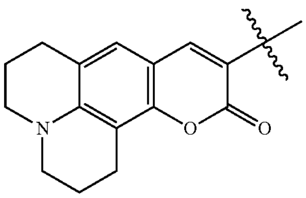 [SMILES: *c1cc2cc3c4c(c2oc1=O)CCCN4CCC3] | H | H | 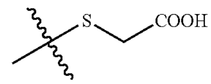 [SMILES: *SCC(=O)O] |
| 746 | 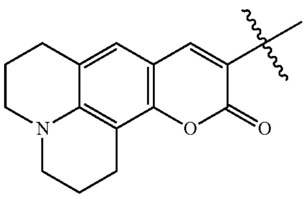 [SMILES: *c1cc2cc3c4c(c2oc1=O)CCCN4CCC3] | 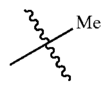 | H | 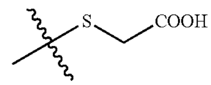 [SMILES: *SCC(=O)O] |
| 747 | 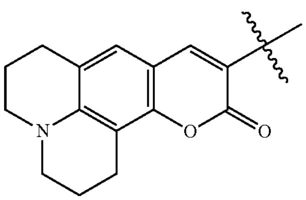 [SMILES: *c1cc2cc3c4c(c2oc1=O)CCCN4CCC3] | H | 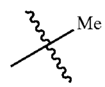 | 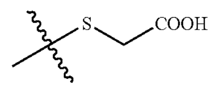 [SMILES: *SCC(=O)O] |
| 748 | 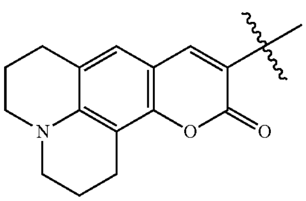 [SMILES: *c1cc2cc3c4c(c2oc1=O)CCCN4CCC3] | 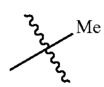 | 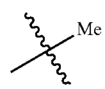 | 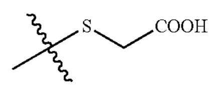 |
| 749 | 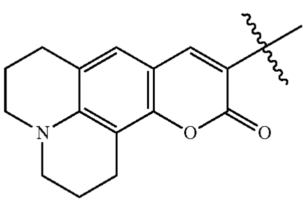 [SMILES: *c1cc2cc3c4c(c2oc1=O)CCCN4CCC3] | 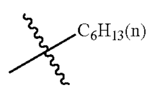 | H | 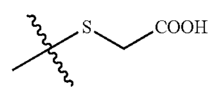 [SMILES: *SCC(=O)O] |
| 750 | 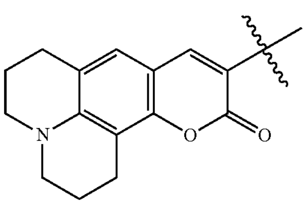 [SMILES: *c1cc2cc3c4c(c2oc1=O)CCCN4CCC3] | 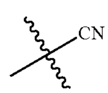 [SMILES: *C#N] | H | 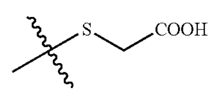 [SMILES: *SCC(=O)O] |

-continued

| Dye | 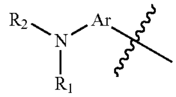 | $R_3$ | $R_4$ | 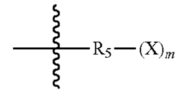 |
|---|---|---|---|---|
| 751 | 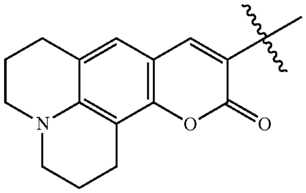 [SMILES: *c1cc2cc3c4c(c2oc1=O)CCCN4CCC3] | H | H | 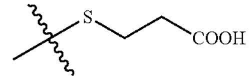 [SMILES: *SCCC(=O)O] |
| 752 | 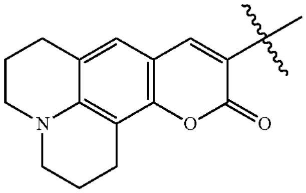 [SMILES: *c1cc2cc3c4c(c2oc1=O)CCCN4CCC3] | H | H | 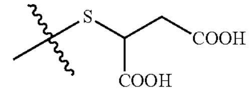 [SMILES: *SC(CC(=O)O)C(=O)O] |
| 753 | 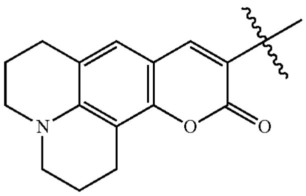 [SMILES: *c1cc2cc3c4c(c2oc1=O)CCCN4CCC3] | H | H | 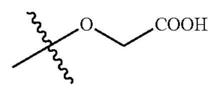 |
| 754 | 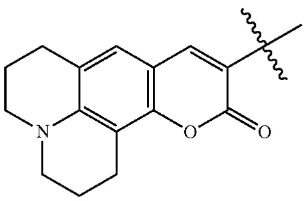 [SMILES: *c1cc2cc3c4c(c2oc1=O)CCCN4CCC3] | H | H | 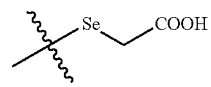 [SMILES: *[Se]CC(=O)O] |
| 755 | 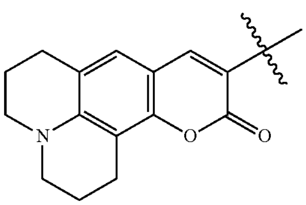 [SMILES: *c1cc2cc3c4c(c2oc1=O)CCCN4CCC3] | H | H | 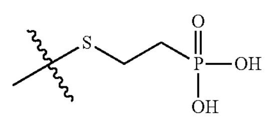 [SMILES: *SCCP(=O)(O)O] |
| 756 | 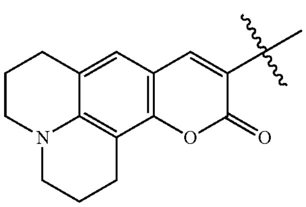 [SMILES: *c1cc2cc3c4c(c2oc1=O)CCCN4CCC3] | H | H | 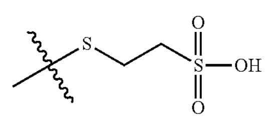 [SMILES: *SCCS(=O)(=O)O] |

Dyes represented by Formulae (1)-(6) (hereinafter, referred to also as dye of the present invention) can be synthesized by a conventional synthetic method, and be synthesized specifically by methods disclosed in Japanese Patent O.P.I. Publication No. 7-5709 and Japanese Patent O.P.I. Publication No. 7-5706.

SYNTHETIC EXAMPLE

Synthetic Example 1

Synthesis of Dye 1

Compound A was added to a DMF solution containing 2.5 equivalents of diethyl benzhydrylphosphonate and 3 equiva lents of K-OtBu, followed by stirring at 120° C. for one hour. After adding water into the reaction solution, extraction with ethyl acetate, washing with water and drying with magnesium sulfate were conducted, concentrating/drying by a rotary evaporator was subsequently carried out to obtain compound B having been subjected to a treatment with a silica gel chromatography.

To a toluene solution containing compound B was added 1.5 equivalents of phosphorous oxychloride and 3 equivalents of DMF, followed by stirring at 60° C. for one hour. After adding cold water in the reaction solution, and stirring at room temperature for one hour, extraction with ethyl acetate, washing with water and drying with magnesium sulfate were conducted, and concentrating/drying by a rotary evaporator was subsequently carried out to obtain compound C having been subjected to a treatment with a silica gel chromatography.

An acetic acid solution containing compound C, 1.2 equivalents of thiohydantoin and 3 equivalents of ammonium acetate was stirred at 120° C. for one hour. After adding water into the reaction solution, extraction with ethyl acetate, washing with water and drying with magnesium sulfate were conducted, and concentrating/drying by a rotary evaporator was subsequently carried out to obtain compound D having been subjected to a treatment with a silica gel chromatography.

To an ethanol solution containing compound D was added 1.05 equivalents of a bromoacetic acid and 3 equivalents of potassium hydroxide, followed by stirring at 70° C. for one hour. After conducting concentrating/drying by a rotary evaporator, water and ethyl acetate were added to remove an organic layer employing a separating funnel. After adding an excessive amount of a 1 mol/liter hydrochloric acid into the water layer, followed by stirring for 5 minutes, extraction with ethyl acetate, washing with water and drying with magnesium sulfate were conducted, and concentrating/drying by a rotary evaporator was subsequently carried out to obtain dye 1 having been subjected to a treatment with a silica gel chromatography.

Dye 1 was examined via nuclear magnetic resonance spectrum and mass spectrum to confirm the structure.

Compound A

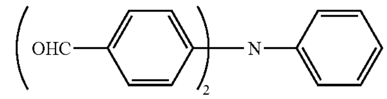

Compound B

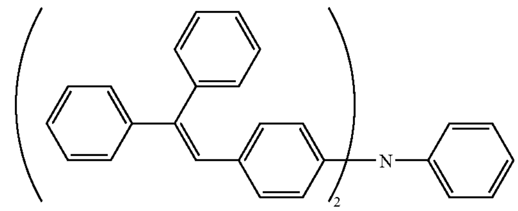

Compound C

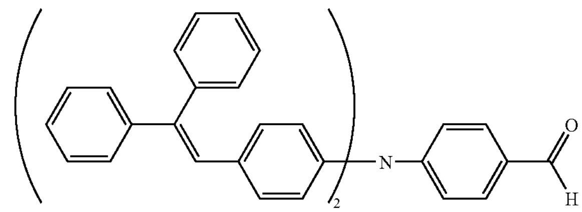

Compound D

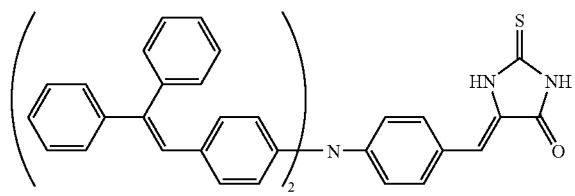

Synthetic Example 2

Synthesis of Dye 32

Dye 32 was synthesized via the following scheme.

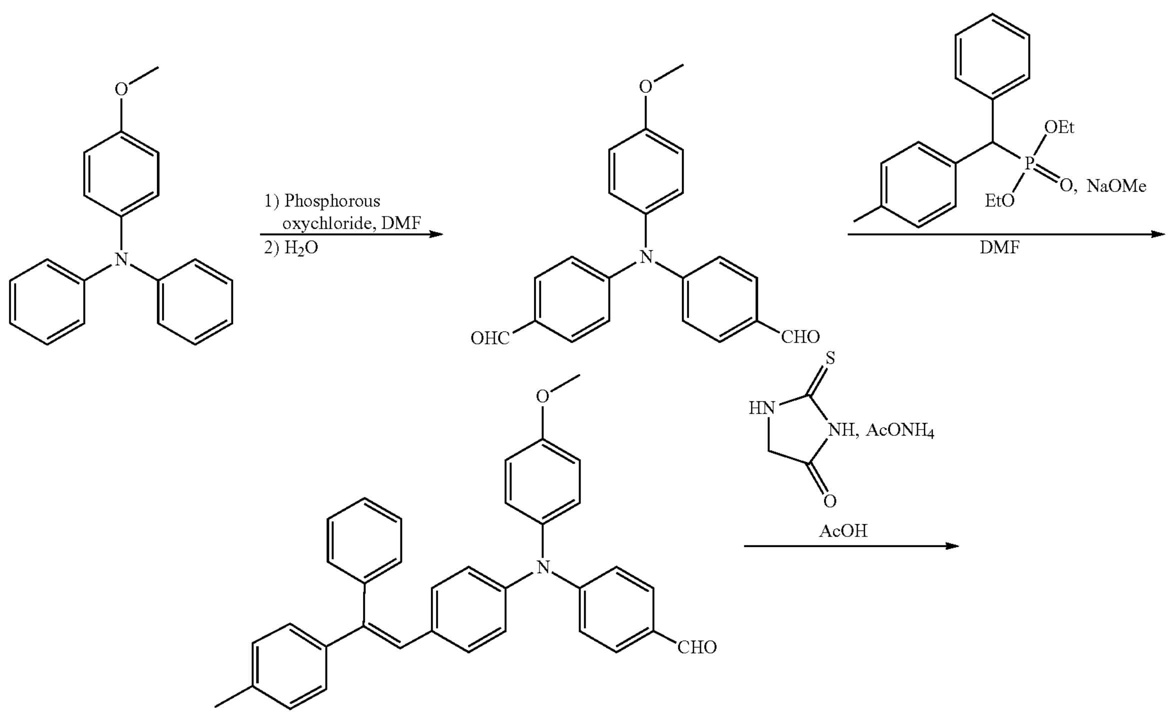

-continued

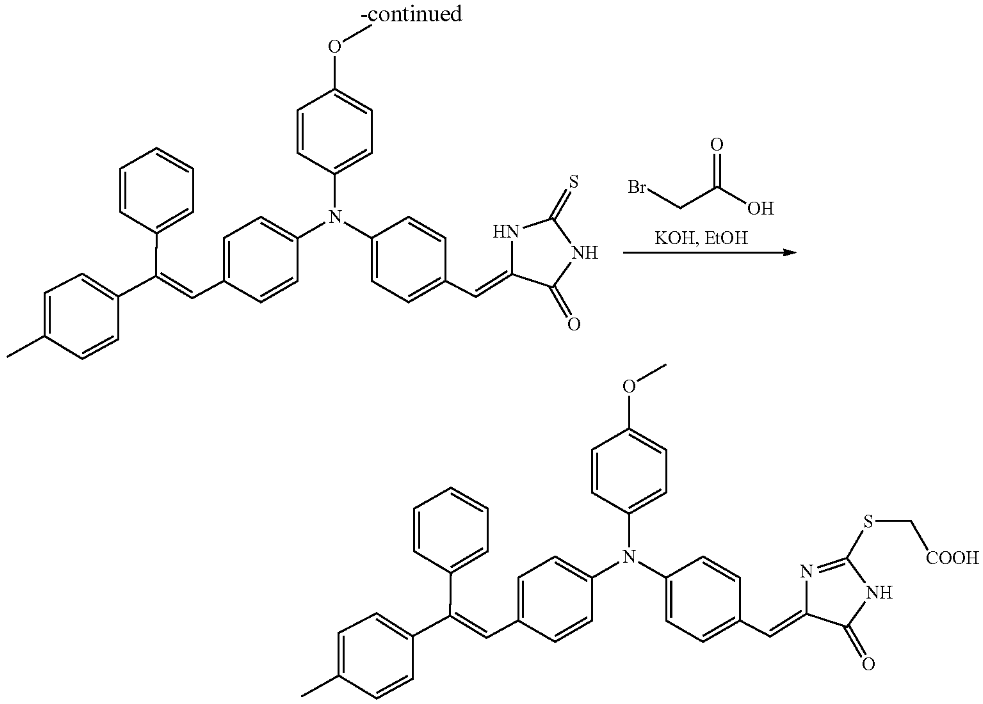

Dye 32

Three equivalents of phosphorous oxychloride were dropped in DMF, followed by stirring at room temperature for 30 minutes, the DMF solution of p-methoxytriphenylamine was dropped at 0° C., followed by stirring at room temperature for 3 hours. After adding cold water in the reaction solution, extraction with ethyl acetate, washing with water and drying with magnesium sulfate were conducted, and concentrating/drying by a rotary evaporator was subsequently carried out to obtain compound E having been subjected to a treatment with a silica gel chromatography.

A DMF solution of compound E and 1.05 equivalents of diethylphenyl(p-tolyl)methylphosphonate was cooled to 0° C., and 1.1 equivalents of sodium methoxide were added into the solution, followed by stirring for 3 hours. After adding an aqueous 0.1 mol/liter hydrochloric acid solution into the reaction solution, extraction with ethyl acetate, washing with water and drying with magnesium sulfate were conducted, and concentrating/drying by a rotary evaporator was subsequently carried out to obtain compound F having been subjected to a treatment with a silica gel chromatography. An acetic acid solution containing compound F, 1.2 equivalents of thiohydantoin and 3 equivalents of ammonium acetate was stirred at 120° C. for one hour. After adding water into the reaction solution, extraction with ethyl acetate, washing with water and drying with magnesium sulfate were conducted, and concentrating/drying by a rotary evaporator was subsequently carried out to obtain compound G having been subjected to a treatment with a silica gel chromatography.

To an ethanol solution containing compound G was added 1.1 equivalents of a bromoacetic acid and 3 equivalents of potassium hydroxide, followed by stirring at 70° C. for one hour. After conducting concentrating/drying by a rotary evaporator, water and ethyl acetate were added to remove an organic layer employing a separating funnel. After adding an excessive amount of a 1 mol/liter hydrochloric acid into the water layer, followed by stirring for 5 minutes, extraction with ethyl acetate, washing with water and drying with magnesium sulfate were conducted, and concentrating/drying by a rotary evaporator was subsequently carried out to obtain dye 32 having been subjected to a treatment with a silica gel chromatography.

Dye 32 was examined via nuclear magnetic resonance spectrum and mass spectrum to confirm the structure.

Compound E

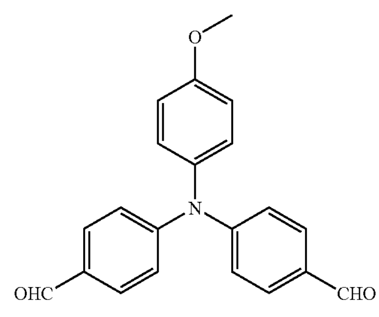

Compound F

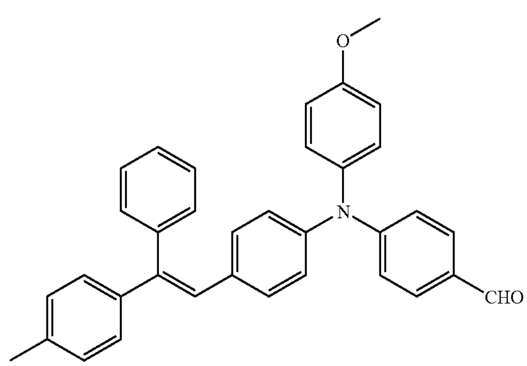

-continued

Compound G

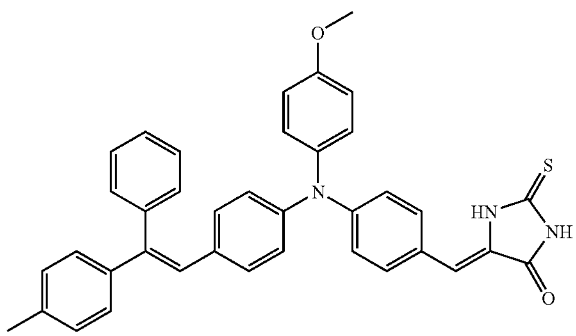

Similarly, other compounds can be also synthesized.

Sensitizing is carried out by carrying a dye of the present invention, obtained in such a manner, to a semiconductor, and it is possible to produce the effect described in the present invention. A dye supported on a semiconductor as described above means that the dye adsorbs onto the surface of a semiconductor, but in cases where the semiconductor has a porous structure, the dye is filled in pores of the semiconductor.

The total dye-carrying amount of the present invention of a semiconductor layer (which may be a semiconductor) is preferably 0.01-100 millimol/$m^2$, more preferably 0.1-50 millimol/$m^2$, and still more preferably 0.5-20 millimol/$m^2$.

When a sensitization treatment is conducted employing a dye of the present invention, the dye may be used singly or plural kinds of dyes may be used in combination. Further, the dye may be used in combination with commonly known other compounds. Examples of the commonly known other compounds include compounds disclosed in U.S. Pat. No. 4,684,537, U.S. Pat. No. 4,927,721, U.S. Pat. No. 5,084,365, U.S. Pat. No. 5,350,644, U.S. Pat. No. 5,463,057, U.S. Pat. No. 5,525,440, Japanese Patent O.P.I. Publication No. 7-249790, and Japanese Patent O.P.I. Publication No. 2000-150007.

In the case of the photoelectric conversion element of the present invention used for a solar cell, at least two dyes differing in absorption wavelength ranges are preferably used, so that the wavelength region for photoelectric conversion is expanded as broad as possible to achieve effective utilization of solar light.

In order to carry a dye of the present invention to a semiconductor, in general, the compound is dissolved in an appropriate solvent (ethanol or the like) and a well-dried semiconductor is immersed into the solution for a long duration.

When using plural kinds of dyes of the present invention or using the dye in combination with other sensitizing dyes, a mixed solution of the dyes may be prepared or solutions of the individual dyes are prepared, in which a semiconductor is immersed. In the latter, immersion in the individual solutions may be conducted in any order. Further, semiconductor particles which are previously adsorbed with the dyes may be mixed.

Details of the sensitization treatment of a semiconductor in the present invention will be described in the after-mentioned photoelectric conversion element.

In the case of a semiconductor having high porosity, it is preferred to subject the semiconductor to an adsorption treatment of the dye before moisture or water vapor is adsorbed onto the semiconductor surface or into pores in the interior of the semiconductor.

Next, a photoelectric conversion element of the present invention will be described.

[Photoelectric Conversion Element]

The photoelectric conversion element of the present invention possesses at least a semiconductor layer comprising a semiconductor and a dye supported on the semiconductor, a charge transport layer, and facing electrodes. Next, the semiconductor, the charge transport layer and the facing electrodes will be described in order.

<<Semiconductor>>

Examples of the semiconductor employed for a semiconductor electrode include an elemental substance such as silicon, germanium or the like, a compound containing an element in Groups 3-5 and Groups 13-15 of the periodic table (referred to also as the element periodic table), a metal chalcogenide such as oxide, sulfide, selenide or the like, a metal nitride, and so forth.

Preferable examples of metal chalcogenide include an oxide of titanium, tin, zinc, iron, tungsten, zirconium, hafnium, strontium, indium, cerium, yttrium, lanthanum, vanadium, niobium or tantalum; a sulfide of cadmium, zinc, lead, silver, antimony or bismuth; a selenide of cadmium or lead; a telluride of cadmium; and so forth. Examples of other compound-semiconductors include a phosphide of zinc, gallium, indium, cadmium or the like; a selenide of gallium-arsenic or copper-indium; a sulfide of copper-indium; a nitride of titanium; and so forth.

As specific examples, provided are $TiO_2$, $SnO_2$, $Fe_2O_3$, $WO_3$, ZnO, $Nb_2O_5$, CdS, ZnS, PbS, $Bi_2S_3$, CdSe, CdTe, GaP, Inp, GaAs, $CuInS_2$, $CuInSe_2$, $Ti_3N_4$ and so forth. Of these, $TiO_2$, ZnO, $SnO_2$, $Fe_2O_3$, $WO_3$, $Nb_2O_5$, CdS and PbS are preferably usable, $TiO_2$ and $Nb_2O_5$ are more preferably usable, and $TiO_2$ (titanium dioxide) is most preferably usable.

As a semiconductor employed for a semiconductor layer, the above-described plural semiconductors may be used in combination. For example, several kinds of the above-described metal oxide or metal sulfide may be used in combination, and 20% by weight of titanium nitride ($Ti_3N_4$) may be mixed in titanium oxide semiconductor to be used. The zinc oxide/tin oxide composite described in J. Chem. Soc., Chem. Commun., 15 (1999) may also be applied. In this case, when a component other than metal oxide or metal sulfide is added as a semiconductor, a content of such the addition component is preferably 30% by weight with respect to the metal oxide or metal sulfide semiconductor.

A semiconductor of the present invention may be subjected to a surface treatment employing an organic base. Preferable examples of the foregoing organic base include diarylamine, triarylamine, pyridine, 4-t-butylpyridine, polyvinylpyridine, quinoline, piperidine, amidine and so forth. Among them, pyridine, 4-t-butylpyridine and polyvinylpyridine are preferable.

In cases where the above-described organic base is liquid, a solution dissolved in an organic solvent is prepared when the organic base is solid. A surface treatment can be conducted by immersing a semiconductor of the present invention in liquid amine or an amine solution. <<Conductive Support>>

A structure in which a conductive substance is provided in a conductive material like a metal plate or a nonconductive material like a glass plate and a plastic film can be utilized for a conductive support employed for a photoelectric conversion element of the present invention and a solar cell of the present invention. Examples of the material used for the conductive support include a metal such as platinum, gold, silver, copper, aluminum, rhodium and indium or conductive metal oxide such as indium-tin oxide composite oxide and fluorine-doped tin oxide, and carbon. The conductive support preferably has a thickness of 0.3-5 mm, but the thickness is not specifically limited.

It is preferable that the conductive support on the side where light is taken in is substantially transparent. The term "substantially transparent" means that transmittance is at least 10%, preferably at least 50%, and more preferably at least 80%. In order to obtain a transparent conductive support, a conductive layer made of conductive metal oxide is preferably provided on the surface of a glass plate or a plastic film. When the transparent conductive support is employed, light should enter from the support side.

The conductive support preferably has a surface resistance of 50 $\Omega/cm^2$ or less and more preferably has a surface resistance of 10 $\Omega/cm^2$ or less.

<<Preparation of Semiconductor Layer>>

A method of preparing a semiconductor layer of the present invention will be described.

In cases where a semiconductor for a semiconductor layer of the present invention is particle-shaped, a photoelectrode may be prepared by coating or spraying particles onto a conductive support. Further, in cases where the semiconductor of the present invention is in the form of a film, and is not supported on the conductive support, the photoelectrode is preferably prepared by attaching the semiconductor onto the conductive support.

A preferable embodiment of a semiconductor of the present invention, is a forming method via calcination employing semiconductor particles provided on the above-described conductive support.

When a semiconductor of the present invention is prepared via calcination, the semiconductor is preferably subjected to a sensitization (adsorption, filling in a porous layer, and so forth) treatment employing a dye after calcination. After the calcination, specifically, the compound is preferably subjected to an adsorption treatment rapidly before adsorbing water to the semiconductor.

Next, a method of forming a semiconductor electrode via calcination employing semiconductor particles, which is preferably utilized in the present invention, will be described in detail.

(Preparation of Semiconductor Powder-Containing Coating Solution)

First, a semiconductor powder-containing coating solution is prepared. The primary particle diameter of this semiconductor powder is preferably as fine as possible. The semiconductor powder preferably has a primary particle diameter of 1-5,000 nm, and more preferably has a primary particle diameter of 2-50 nm. The coating solution containing the semiconductor powder can be prepared by dispersing the semiconductor powder in a solvent. The semiconductor powder dispersed in the solvent is dispersed in the form of the primary particle. The solvent is not specifically limited as long as it can disperse the semiconductor powder.

As the foregoing solvent, water, an organic solvent, and a mixture of water and an organic solvent are included. As the organic solvent, alcohol such as methanol, ethanol or the like, ketone such as methyl ethyl ketone, acetone, acetylacetone, or the like and hydrocarbon such as hexane, cyclohexane or the like are usable. A surfactant and a viscosity controlling agent (polyhydric alcohol such as polyethylene glycol or the like) can be added into a coating solution, if desired. The content of the semiconductor powder in the solvent is preferably 0.1-70% by weight, and more preferably 0.1-30% by weight.

(Coating of Semiconductor Powder-Containing Coating Solution and Calcination Treatment of Formed Semiconductor Layer)

The semiconductor powder-containing coating solution obtained as described above is coated or sprayed onto the conductive support, followed by drying, and then burned in air or inactive gas to form a semiconductor layer (referred to also as a semiconductor film) on the conductive support.

The layer formed via coating the semiconductor powder-containing coating solution onto the conductive support, followed by drying is composed of an aggregate of semiconductor particles, and the particle diameter corresponds to the primary particle diameter of the utilized semiconductor powder.

The semiconductor particle layer formed on a conductive layer of the conductive support or the like in such the way is subjected to a calcination treatment in order to increase mechanical strength and to produce a semiconductor layer firmly attached to a substrate, since the semiconductor particle layer exhibits bonding force with the conductive support, as well as bonding force between particles, and also exhibits weak mechanical strength.

In the present invention, this semiconductor layer may have any structure, but a porous structure layer (referred to also as a porous layer possessing pores) is preferable.

The semiconductor layer preferably has a porosity of 10% by volume or less, more preferably has a porosity of 8% by volume or less, and most preferably has a porosity of 0.01-5% by volume. In addition, the porosity of the semiconductor layer means a through-hole porosity in the direction of thickness of a dielectric, and it can be measured by a commercially available device such as a mercury porosimeter (Shimadzu Pore Analyzer 9220 type) or the like.

A semiconductor layer as a calcine film having a porous structure preferably has a thickness of at least 10 nm, and more preferably has a thickness of 500-30000 nm.

A calcination temperature of 1,000° C. or less is preferable, a calcination temperature of 200-800° C. is more preferable, and a calcination temperature of 300-800° C. is still more preferable in view acquisition of a calcine film having the above-described porosity by suitably preparing real surface area of the calcine film during calcination treatment.

Further, a ratio of the real surface area to the apparent surface area can be controlled by a diameter and specific surface area of the semiconductor particle, the calcination temperature and so forth. After conducting a heat treatment, chemical plating employing an aqueous solution of titanium tetrachloride or electrochemical plating employing an aqueous solution of titanium trichloride may be conducted in order to increase the surface area of a semiconductor particle and purity in the vicinity of the semiconductor particle, and to increase an electron injection efficiency from a dye to a semiconductor particle.

(Sensitization Treatment of Semiconductor)

The sensitization treatment of the semiconductor is carried out by immersing a substrate burned with the foregoing semiconductor into a solution prepared after dissolving a sensitizing dye in a suitable solvent as described before. In this case, Bubbles in the layer are preferably removed by conducting a reduced pressure treatment or a heat treatment for a substrate on which a semiconductor layer (referred to also as a semiconductor film) is formed via calcination. Through such the treatment, a dye of the present invention easily penetrates deeply into the inside of the semiconductor layer (semiconductor film), and such the treatment is specifically preferable when the semiconductor layer (semiconductor film) possesses a porous structure film.

The solvent to dissolve a dye of the present invention is not specifically limited as long as the solvent can dissolve the foregoing compound, and neither dissolve the semiconductor nor react with the semiconductor. However, the solvent is preferably subjected to deaeration and purification via distillation to prevent penetration of moisture and gas dissolved in the solvent into the semiconductor layer so as to avoid the sensitization treatment such as adsorption of the foregoing compound or the like.

Examples of preferably usable solvents to dissolve the foregoing compound include a nitrile based solvent such as acetonitrile or the like; an alcohol based solvent such as methanol, ethanol, n-propanol or the like; a ketone type solvent such as acetone, methylethyl ketone or the like; an ether based solvent such as diethyl ether, diisopropyl ether, tetrahydrofuran, 1,4-dioxane or the like; and a halogenated hydrocarbon solvent such as methylene chloride, 1,1,2-trichloroethane or the like, and a plurality of solvents may also be mixed. Specifically preferred are methanol, ethanol, acetone, methylethyl ketone, tetrahydrofuran and methylene chloride.

(Temperature and Time for Sensitization Treatment)

As to time to immerse a substrate on which the semiconductor layer is formed via calcination in a solution containing a sensitizing dye of the present invention, it is preferable to sufficiently sensitize the semiconductor by sufficiently making progress of adsorption by penetrating deeply into the semiconductor layer (semiconductor film). The time is preferably 3-48 hours at 25° C., and more preferably 4-24 hours in order to inhibit that decomposed products prepared via decomposition of a sensitizing dye in a solution obstruct adsorption of the sensitizing dye formed by decomposition of the dye in the solvent. This effect is remarkable when the semiconductor film is specifically a porous structure film. However, the immersion time is that at 25° C. and is not always applied when the temperature is varied.

In the case of the immersion, a solution containing a dye of the present invention may be heated up to the temperature of no boiling, as long as the foregoing dye is not decomposed. The temperature range is preferably 5-100° C., and more preferably 25-80° C., as long as the solution is not boiled in the foregoing temperature range.

<<Charge Transport Layer>>

The charge transport layer of the present invention will be described.

The charge transport layer is a layer serving with a function to rapidly reduce an oxidant of a dye, and to transport holes injected at the interface to the dye.

The charge transport layer of the present invention is principally composed of a p-type compound semiconductor (charge transport agent) as a redox electrolyte dispersion or a hole transport material.

As the redox electrolyte, system, $I^-/I_3^-$ system, $Br^-/Br_3^-$ system and quinone/hydroquinone system are cited. Such the redox electrolyte can be obtained by a commonly known method, and the electrolyte of $I^-/I_3^-$ system, for example, can be obtained by mixing an ammonium salt of iodine and iodine. When such the dispersion is a solution, the dispersion is called a liquid electrolyte; when one being a solid at room temperature is dispersed in a polymer, it is called a solid polymer electrolyte; and when it is dispersed in a material in the form of a gel, it is called a gel electrolyte. When the liquid electrolyte is employed as a liquid electrolyte, an electrochemically inactive substance is used as the solvent such as acetonitrile, propylene carbonate, ethylene carbonate and so forth. Examples of the solid polymer electrolyte are disclosed in Japanese Patent O.P.I. Publication No. 2001-160427, and examples of the gel electrolyte are disclosed in "Hyomen Kagaku (Surface Science)" Vol. 21, No. 5, pages 288-293.

In order not to inhibit dye absorption, it is preferred that the charge transport agency has a large bandgap. The charge transport agency preferably has a bandgap of at least 2 eV, and more preferably has a bandgap of at least 2.5 eV. Further, ionization potential of the charge transport agency is desired to be smaller than ionization potential of a dye-absorbed electrode. The preferred range of ionization potential of a charge transport agency employed for a charge transport layer differs depending on the utilized dye, but is preferably 4.5-5.5 eV, and is more preferably 4.7-5.3 eV.

As the charge transport agent, an aromatic amine derivative exhibiting excellent hole-transporting ability is preferable. For this reason, when a charge transport layer is formed mainly from the aromatic amine derivative, photoelectric conversion efficiency can be further improved. A triphenyldiamine derivative is preferably usable specifically as the aromatic amine derivative. The triphenyldiamine derivative among aromatic amine derivatives exhibits specifically excellent hole-transporting ability. For such the aromatic amine derivatives, any of a monomer, an oligomer, a prepolymer and a polymer may be used, and these may be used as a mixture of these. In addition, since each of a monomer, an oligomer and a prepolymer comparatively has a low molecular weight, high solubility in a solvent such as an organic solvent results. Therefore, when the charge transport layer is formed by a coating method, it is advantageous that preparation of a charge transport layer material can be conducted more easily. In this case, as the oligomer, a dimer or a trimer is preferably used.

Typical examples of an aromatic tertiary amine compound include N,N,N',N'-tetraphenyl-4,4'-diaminophenyl; N,N'-diphenyl-N,N'-bis(3-methylphenyl)-(1,1'-biphenyl)-4,4'-diamine (TDP); 2,2-bis(4-di-p-tolylaminophenyl)propane; 1,1-bis(4-di-p-tolylaminophenyl)cyclohexane; N,N,N',N'-tetra-p-tolyl 4,4'-diaminobiphenyl; 1,1-bis(4-di-p-tolylaminophenyl)-4-phenylcyclohexane; bis(4-dimethylamino-2-metyl)phenylmethane; bis(4-di-p-tolylaminophenyl) phenylmethane; N,N'-diphenyl-N,N'-di(4-methoxyphenyl)-4,4'-diaminobiphenyl; N,N,N',N'-tetraphenyl-4,4'-diaminophenylether; 4,4'-bis(diphenylamino)quadriphenyl; N,N,N-tri(p-tolyl)amine; 4-(di-p-tolylamino)-4'-[4-(di-p-triamino)styryl]stilbene; 4-N, N-diphenylamino-(2-diphenylvinyl)benzene; 3-methoxy-4'-N,N-diphenylaminostilbene; and N-phenylcarbazole, in addition to those having two condensed aromatic rings in a molecule described in U.S. Pat. No. 5,061,569, such as 4,4'-bis[N-(1-naphthyl)-N-phenylamino]biphenyl (NPD), and 4,4',4"-tris[N-(3-methylphenyl)-N-phenylamino]triphenylamine (MTDATA), in which three of triphenylamine units are bonded in a star burst form, disclosed in Japanese Patent O.P.I. Publication No. 4-308688.

Polymer materials, in which the foregoing materials are introduced into a polymer chain or are placed as the main chain of a polymer, are also usable.

Examples of the charge transport agent other than aromatic amine derivatives include a thiophene derivative, a pyrrole derivative and a stilbene derivative.

Specific examples of the charge transport agent are shown below, but the present invention is not limited thereto.
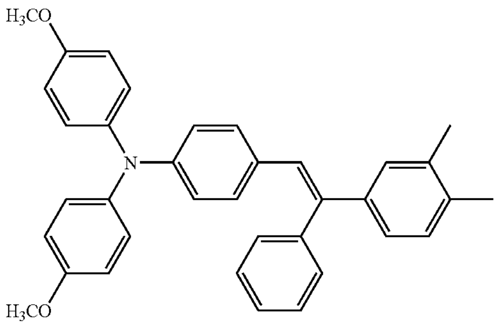
D-1
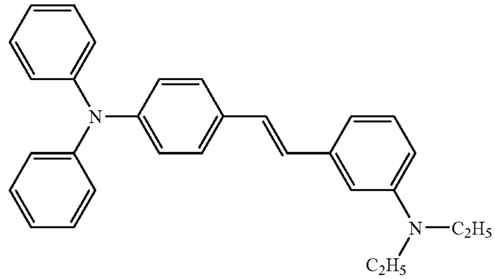
D-2
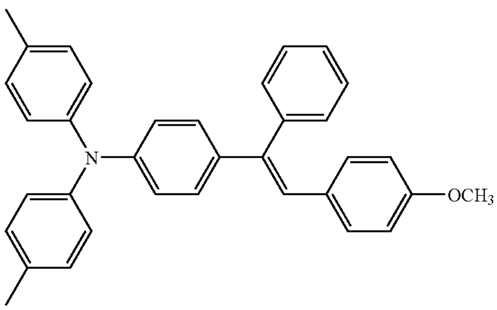
D-3
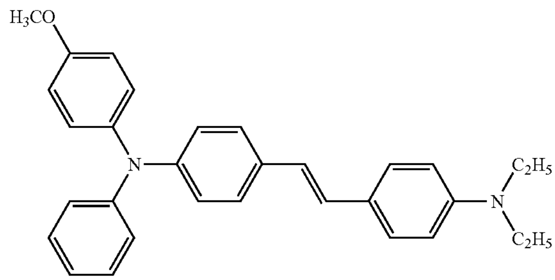
D-4
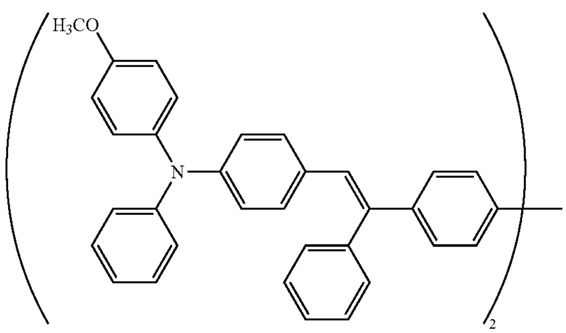
D-5
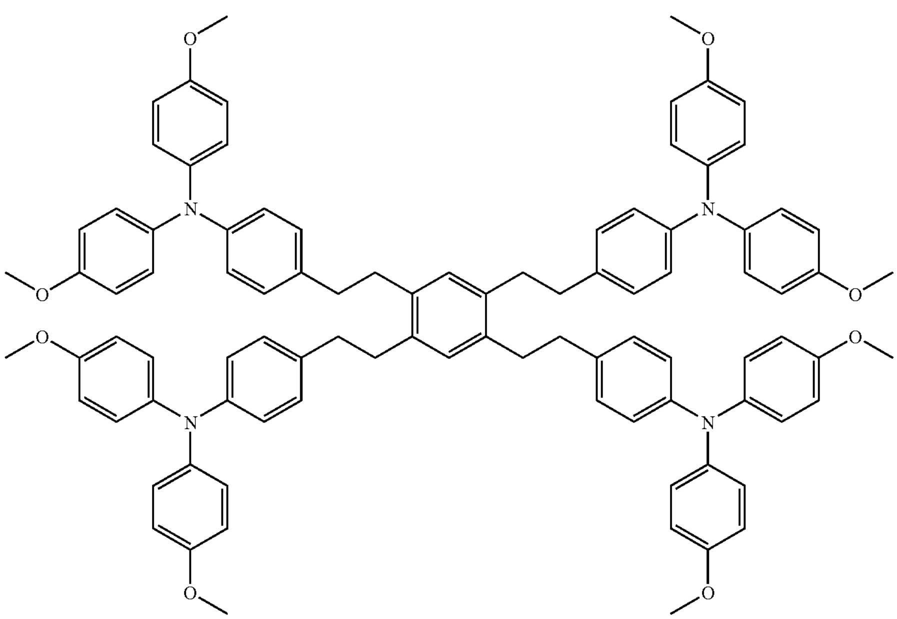
D-6

-continued
D-7
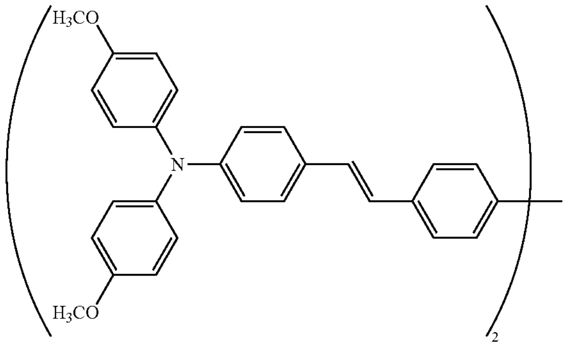
D-8
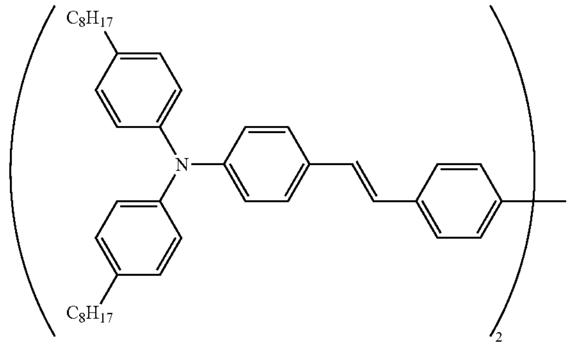
D-9
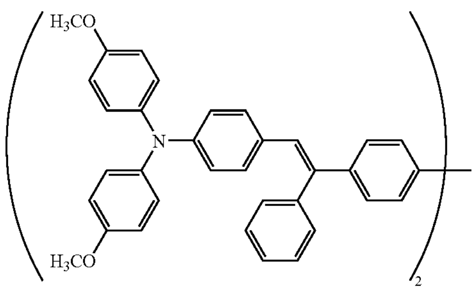
D-10
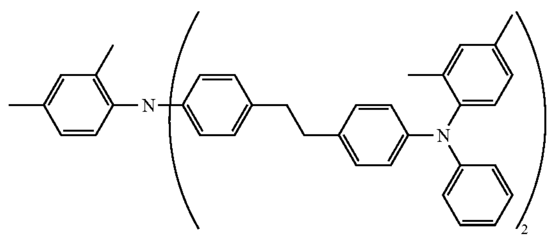
D-11
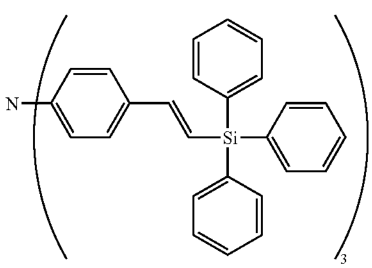
D-12
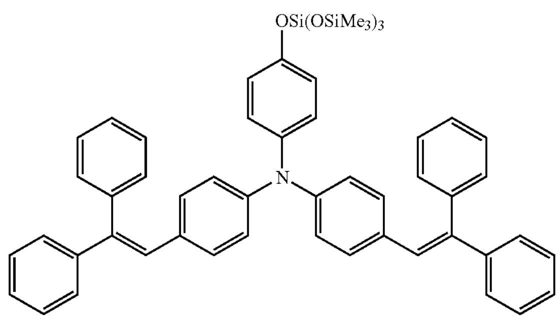
D-13
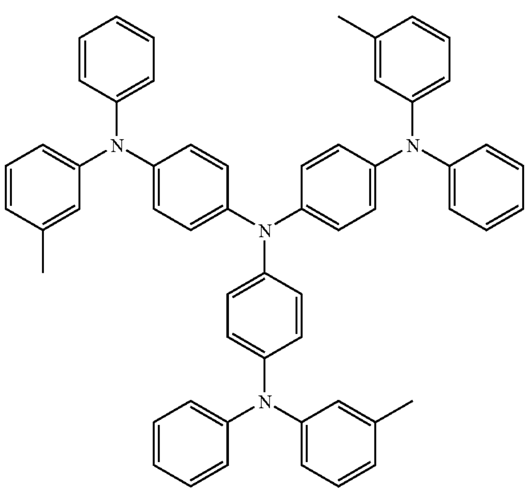
D-14
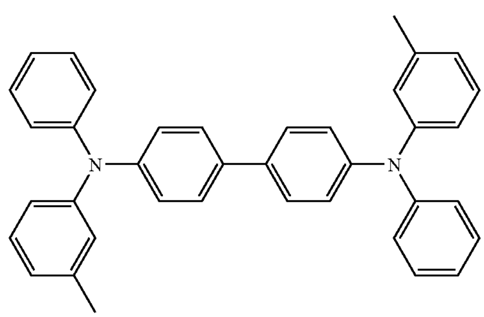

-continued

D-15

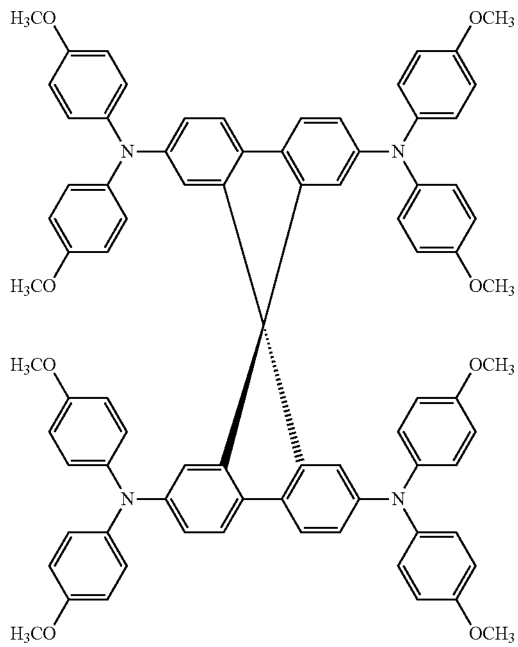

<<Facing Electrode>>

The facing electrodes of the present invention will be described.

Any conductive material is optionally usable for the facing electrode, but preferable is one exhibiting catalytic ability to perform oxidation of a redox ion of $I_3^-$ and reducing reaction of another ion at sufficient speed. As such the electrode, a platinum electrode, those subjected to platinum plating or platinum evaporation on the surface of a conductive material, rhodium metal, ruthenium metal, ruthenium oxide, carbon and so forth are cited.

<<Solar Cell>>

Next, the solar cell of the present invention will be described.

As an embodiment of a photoelectric conversion element in the present invention, the solar cell of the present invention is designed to be optimized for circuit design to solar light, and possesses a structure capable of performing optimum photoelectric conversion when solar light is utilized as a light source. That is, the solar cell possesses a structure in which a dye-sensitized semiconductor is capable of being exposed to solar light. When a solar cell of the present invention is to be designed, the foregoing semiconductor electrode, the charge transport layer and the facing electrodes are stored in a case and sealed, or they are entirely sealed with a resin.

When the solar cell of the present invention is exposed to solar light or electromagnetic waves identical to solar light, a dye of the present invention supported on a semiconductor absorbs exposure light or electromagnetic waves for exitation. Electrons generated via excitation, generated electrons are moved to the semiconductor and subsequently to the facing electrode via a conductive support to reduce a redox electrolyte in a charge transfer layer. On the other hand, the dye of the present invention by which electrons are moved to the semiconductor has become an oxidant, but electrons are supplied from the facing electrode via the redox electrolyte in the charge transport layer to conduct reducing, and returned to the original state. At the same time, the redox electrolyte in the charge transport layer is oxidized so as to be returned to a state where it is possible to be reduced again by electrons supplied from the facing electrode. Electrons flow in such the mechanism, whereby a solar cell fitted with a photoelectric conversion element of the present invention can be constituted.

EXAMPLE

Next, the present invention will be described referring to examples, but the present invention is not limited thereto.

[Preparation of Photoelectric Conversion Element 1]

Titanium dioxide paste {anatase type, primary average particle diameter of 18 nm (mean value obtained via electron microscopic observation), and polyethylene glycol dispersion} was coated on a fluorine-doped tin oxide (FTO) conductive glass substrate (a coating area of 5×5 $mm^2$) employing a screen printing method. Coating and drying of the resulting at 120° C. for 3 minutes were repeated 3 times, and heating steps were conducted at 200° C. for 10 minutes and at 500° C. for 15 minutes to obtain a titanium dioxide film having a thickness of 15 μm. Another titanium dioxide paste {anatase type, primary average particle diameter of 400 nm (mean value obtained via electron microscopic observation) was further coated on the resulting film, followed by burning steps by a similar method to form a titanium dioxide film having a thickness of 5 μm.

A $5\times10^{-4}$ mol/liter solution obtained by dissolving dye 1 of the present invention in a mixed solvent of acetonitrile:t-butylalcohol=1:1 was prepared. An FTO glass substrate obtained by coating and heating the above-described titanium dioxide was immersed in the above solution at room temperature for 3 hours for a dye adsorption treatment to prepare a semiconductor electrode.

As the charge transport layer (electrolytic solution), used was a acetonitrile:valeronitrile=85:15 solution containing 0.6 mol/liter of 1-methyl-3-butylimidazolium iodide, 0.1 mol/liter of guanidine thiocyanate, 0.05 mol/liter of iodine and 0.5 mol/liter of 4-(t-butyl)pyridine. The glass plate on which platinum and chromium were vapor deposited was used as an opposed electrode. The opposed electrode, the oxide semiconductor electrode and the electrolyte solution each prepared above were assembled by a clump to prepare photoelectric conversion element 1.

[Preparation of Photoelectric Conversion Elements 2-38]

Photoelectric conversion elements 2-38 were prepared similarly to preparation of photoelectric conversion element 1, except that dye 1 was replaced by each of dyes described in Table 1.

[Preparation of Photoelectric Conversion Element 39]

Photoelectric conversion element 39 was prepared similarly to preparation of photoelectric conversion element 1, except that a $5\times10^{-4}$ mol/liter solution obtained by dissolving dye 1 in a mixed solvent of acetonitrile:t-butylalcohol=1:1 was replaced by a dye solution in which a $5\times10^{-4}$ mol/liter solution obtained by dissolving dye 1 in a mixed solvent of acetonitrile:t-butylalcohol=1:1, and a $5\times10^{-4}$ mol/liter solution obtained by dissolving dye 757 in a mixed solvent of acetonitrile:t-butylalcohol=1:1 were mixed in a ratio of 1:1.

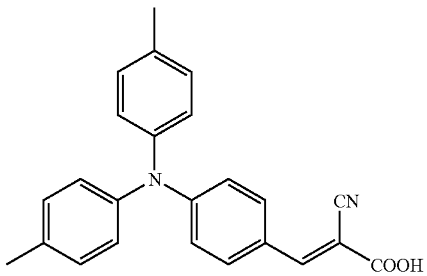

Dye 757

[Preparation of Photoelectric Conversion Element 40]

Photoelectric conversion element 40 was prepared similarly to preparation of photoelectric conversion element 1, except that a $5\times10^{-4}$ mol/liter solution obtained by dissolving dye 1 in a mixed solvent of acetonitrile:t-butylalcohol=1:1 was replaced by a dye solution in which a $5\times10^{-4}$ mol/liter solution obtained by dissolving dye 65 in a mixed solvent of acetonitrile:t-butylalcohol=1:1, and a $5\times10^{-4}$ mol/liter solution obtained by dissolving dye 76 in a mixed solvent of acetonitrile:t-butylalcohol=1:1 were mixed in a ratio of 1:1.

[Preparation of Photoelectric Conversion Element 41]

Photoelectric conversion element 41 was prepared similarly to preparation of photoelectric conversion element 1, except that dye 1 was replaced by dye 801, and as a charge transport layer (electrolytic solution), used was a 3-methoxypropionitrile solution containing 0.6 mol/liter of 1-methyl-3-butylimidazolium iodide, 0.1 mol/liter of lithium iodide, 0.05 mol/liter of iodine and 0.5 mol/liter of 4-(t-butyl)pyridine.

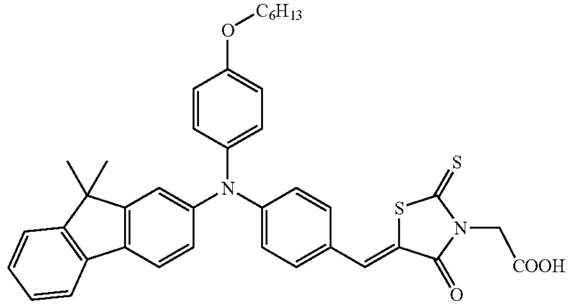

Dye 801

[Preparation of Photoelectric Conversion Element 42]

Photoelectric conversion element 42 was prepared similarly to preparation of photoelectric conversion element 41, except that dye 801 was replaced by dye 802.

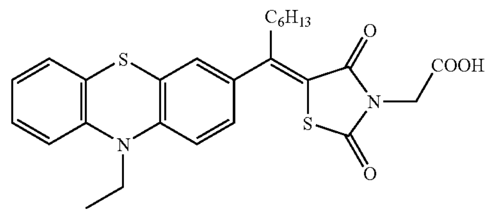

Dye 802

[Preparation of Photoelectric Conversion Element 43]

Titanium dioxide paste {anatase type, primary average particle diameter of 18 nm (mean value obtained via electron microscopic observation), and polyethylene glycol dispersion} was coated on a fluorine-doped tin oxide (FTO) conductive glass substrate (a coating area of 5×5 $mm^2$) employing a screen printing method, and heating steps were conducted at 200° C. for 10 minutes and at 450° C. for 15 minutes to obtain a titanium dioxide film having a thickness of 1.5 μm.

A $5\times10^{-4}$ mol/liter solution obtained by dissolving dye 5 of the present invention in a mixed solvent of acetonitrile:t-butylalcohol=1:1 was prepared. An FTO glass substrate obtained by coating and heating the above-described titanium dioxide was immersed in the above solution at room temperature for 3 hours for a dye adsorption treatment to prepare a semiconductor electrode.

Next, prepared was a hole layer formation coating solution in which 0.17 mol/liter of an aromatic amine derivative 2,2',7,7'-tetrakis(N,N'-di(4-methoxyphenyl)amine)-9,9'-spirobifluorene(Spiro-OMeTAD) as a hole transport material, 0.33 millimol/liter of $N(PhBr)_3SbCl_6$ as a hole-doping agent, 15 millimol/liter of $Li[CF_3SO_2]_2N]$, and 50 millimol/liter of t-butylpyridine were dissolved in a mixed solvent of chlorobenzene:acetonitrile=19:1. The resulting hole layer formation coating solution was coated on the upper surface of a semiconductor layer to which the foregoing photosensitizing dye was adsorbed or bonded, by a spin coating method to form a charge transport layer. Coating was carried out by adjusting the number of rotation of spin coating to 1000 rpm. Further, gold having a thickness of 90 nm was deposited with a vacuum vapor deposition method to form an opposite electrode.

[Preparation of Photoelectric Conversion Element 44]

Photoelectric conversion element 44 was prepared similarly to preparation of photoelectric conversion element 43, except that the dye of the photoelectric conversion element was replaced by dye 801.

[Evaluation of Photoelectric Conversion Element]

The resulting photoelectric conversion element was exposed to quasi sunlight of 100 mW/$cm^2$ output from a xenon lamp, which has passed through an AM filter (AM-1.5), employing a solar simulator spectroradiometer (manufactured by EKO INSTRUMENTS CO. LTD.) to evaluate the photoelectric conversion element. That is, as to the photoelectric conversion element, current-voltage characteristics were measured at room temperature employing an I-V tester, short-circuit current density (Jsc), open-circuit voltage (Voc) and fill factor (F. F.) were obtained to determine photoelectric conversion efficiency {η (%)}.

Evaluated results are shown in Table 1.

TABLE 1

| Photo-electric conversion element No. | Dye | Open-circuit voltage (mV) | Short-circuit current density (mA/cm$^2$) | Photo-electric conversion efficiency (%) | Remarks |
|---|---|---|---|---|---|
| 1 | 1 | 720 | 14.4 | 6.6 | Inv. |
| 2 | 3 | 710 | 14.6 | 6.9 | Inv. |
| 3 | 5 | 750 | 16.1 | 8.7 | Inv. |
| 4 | 8 | 760 | 12.6 | 5.5 | Inv. |
| 5 | 12 | 690 | 13.8 | 6.3 | Inv. |
| 6 | 21 | 730 | 14.1 | 6.6 | Inv. |
| 7 | 22 | 660 | 11.3 | 4.9 | Inv. |
| 8 | 32 | 700 | 14.9 | 7.0 | Inv. |
| 9 | 54 | 700 | 12.1 | 6.1 | Inv. |
| 10 | 57 | 670 | 11.9 | 5.1 | Inv. |
| 11 | 76 | 690 | 13.5 | 5.9 | Inv. |
| 12 | 95 | 690 | 13.3 | 5.9 | Inv. |
| 13 | 128 | 670 | 10.5 | 4.9 | Inv. |
| 14 | 171 | 740 | 10.1 | 4.5 | Inv. |
| 15 | 193 | 700 | 9.5 | 4.0 | Inv. |
| 16 | 223 | 700 | 13.3 | 6.0 | Inv. |
| 17 | 245 | 740 | 10.8 | 5.3 | Inv. |
| 18 | 278 | 670 | 9.9 | 4.1 | Inv. |
| 19 | 316 | 719 | 12.9 | 6.0 | Inv. |
| 20 | 406 | 660 | 14.6 | 6.4 | Inv. |
| 21 | 409 | 630 | 12.1 | 4.6 | Inv. |
| 22 | 418 | 700 | 14.2 | 6.5 | Inv. |
| 23 | 447 | 650 | 8.9 | 3.9 | Inv. |
| 24 | 510 | 670 | 7.9 | 3.8 | Inv. |
| 25 | 550 | 650 | 7.8 | 3.7 | Inv. |
| 26 | 609 | 690 | 13.2 | 6.2 | Inv. |
| 27 | 630 | 670 | 8.7 | 3.8 | Inv. |
| 28 | 637 | 740 | 14.1 | 7.6 | Inv. |
| 29 | 638 | 720 | 13.2 | 7.1 | Inv. |
| 30 | 649 | 730 | 13.3 | 7.3 | Inv. |
| 31 | 661 | 740 | 13.8 | 7.4 | Inv. |
| 32 | 673 | 700 | 13.2 | 6.9 | Inv. |
| 33 | 685 | 690 | 14.3 | 6.9 | Inv. |
| 34 | 701 | 670 | 9.0 | 4.3 | Inv. |
| 35 | 715 | 680 | 11.1 | 5.1 | Inv. |
| 36 | 721 | 680 | 11.3 | 5.1 | Inv. |
| 37 | 733 | 670 | 11.8 | 5.2 | Inv. |
| 38 | 745 | 660 | 9.9 | 4.3 | Inv. |
| 39 | 1/757 | 740 | 14.8 | 6.6 | Inv. |
| 40 | 65/76 | 710 | 13.7 | 6.0 | Inv. |
| 41 | 801 | 670 | 7.9 | 3.1 | Comp. |
| 42 | 802 | 660 | 7.2 | 2.8 | Comp. |
| 43 | 5 | 830 | 9.1 | 3.8 | Inv. |
| 44 | 801 | 660 | 4.2 | 0.9 | Comp. |

Inv.: Present invention,
Comp.: Comparative example

As is clear from Table 1, it is to be understood that photoelectric conversion element 13 employing a dye containing an imidazolone moiety in the present invention has more improved short-circuit current density and photoelectric conversion efficiency than those of photoelectric conversion element 41 employing a dye containing a rhodanine moiety in a comparative example. Each of photoelectric conversion elements 39 and 40 employing a plurality of dyes exhibits higher photoelectric conversion efficiency, and photoelectric conversion element 43 has more improved short-circuit current density, open-circuit voltage and photoelectric conversion efficiency than those of photoelectric conversion element 44. It is seen in the present invention that photoelectric conversion efficiency of each of photoelectric conversion elements 1-38 employing a dye containing an imidazolone moiety is also improved. Further, as to a part of a dye of the present invention, absorption wavelength is shifted to the long-wavelength range because of development of agglutination caused by an intermolecular interaction, and an adsorbed dye amount is increased, whereby a larger amount of light in the wavelength range is presumably absorbed to improve the photoelectric conversion efficiency.

EFFECT OF THE INVENTION

A photoelectric conversion element for which a novel compound (dye) exhibiting excellent adsorption to an oxide semiconductor and exhibiting high photoelectric conversion efficiency is used, and a solar cell employing the photoelectric conversion element were possible to be provided in the present invention.

What is claimed is:

1. A dye-sensitizing type photoelectric conversion element comprising a pair of facing electrodes, a semiconductor layer comprising a semiconductor and a sensitizing dye supported on the semiconductor, and a charge transport layer, wherein the semiconductor layer and the charge transport layer are provided between the facing electrodes, and wherein the sensitizing dye comprises a compound represented by the following Formula (1)

Formula (1)

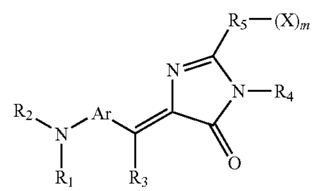

where Ar represents a substituted or unsubstituted arylene group or heterocylic group; each of $R_1$ and $R_2$ represents a substituted or unsubstituted alkyl group, alkenyl group, alkynyl group, aryl group or heterocyclic group; $R_1$, $R_2$ and Ar may form a cyclic structure via connection to each other; $R_3$ represents a hydrogen atom, a halogen atom, a cyano a substituted or unsubstituted alkyl group, an alkenyl group, an alkynyl group, an alkoxy group, an amino group, an aryl group or a heterocyclic group; $R_4$ represents a hydrogen atom, a substituted or unsubstituted alkyl group, an alkenyl group, an alkynyl group, an aryl group or a heterocyclic group; $R_5$ represents an alkyl group, an alkenyl group, an alkynyl group, an alkoxy group, an alkylthio group, an alkylseleno group, an amino group, an aryl group or a heterocyclic group, which is substituted by X, but $R_5$ may have a substituent other than X; X represents an acidic group; m is an integer of at least 1; in the case of m≧2, X may be the same or different; and a carbon-carbon double bond may be a cis type double bond or a trans type double bond.

2. The dye-sensitizing type photoelectric conversion element of claim 1, wherein

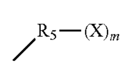

in Formula (1) is replaced by

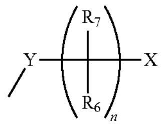

where and $R_7$ may form a cyclic structure via connection to each other; n is an integer of 0 or more; in the case of n≧2, $R_6$ and $R_7$ may be the same or different; Y represents a sulfur atom, and an oxygen atom or a selenium atom.

3. The dye-sensitizing type photoelectric conversion element of claim 2, wherein Y in the

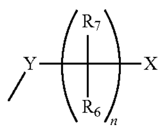

is a sulfur atom.

4. The dye-sensitizing type photoelectric conversion element of claim 3, wherein $R_4$ in the resulting

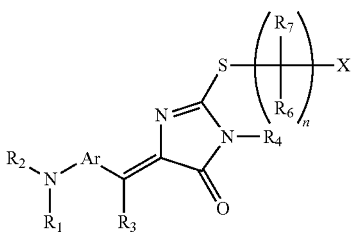

of claim 3 is a hydrogen atom.

5. The dye-sensitizing type photoelectric conversion element of claim 4, wherein Ar, $R_1$ and $R_2$ in the resulting

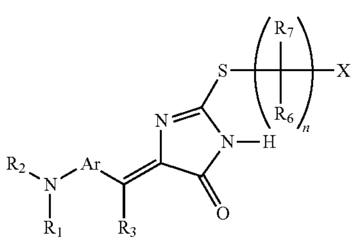

of claim 4 are

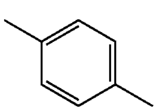
,
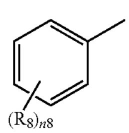
, and
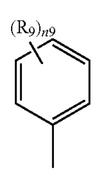
, respectively where each of $R_8$ and $R_9$ represents a hydrogen atom, a halogen atom, or a substituted or unsubstituted alkyl group, alkenyl group, alkynyl group, alkoxy group, alkyithio group, alkylseleno group, amino group, aryl group or heterocyclic group; each of n8 and n9 is an integer of 1-5; and in the case of n8≧2 and n9≧2, $R_8$ and $R_9$ may be the same or different.

6. The dye-sensitizing type photoelectric conversion element of claim 4, wherein

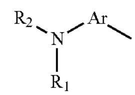

in the resulting

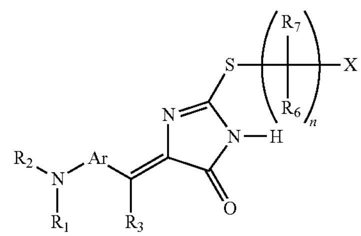

of claim 4 is replaced by

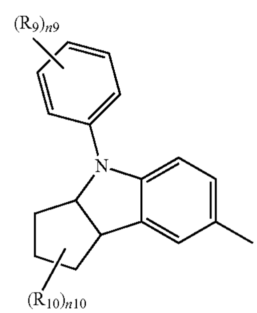

where each of $R_9$ and $R_{10}$ represents a hydrogen atom, a halogen atom, or a substituted or unsubstituted alkyl group, alkenyl group, alkynyl group, alkoxy group, alkyithio group, alkylseleno group, amino group, aryl group or heterocyclic group; n9 is an integer of 1-5; n10 is an integer of 1-8; and in the case of n9≧2 and n10≧2, $R_9$ and $R_{10}$ may be the same or different.

7. The dye-sensitizing type photoelectric conversion element of claim 1, wherein the sensitizing dye comprises at least two selected from compounds represented by Formula (1).

8. The dye-sensitizing type photoelectric conversion element of claim 1, wherein the semiconductor to form the semiconductor layer comprises titanium dioxide.

9. A solar cell comprising the dye-sensitizing type photoelectric conversion element of claim 1.

* * * * *